United States Patent
Lee et al.

(10) Patent No.: US 10,096,777 B2
(45) Date of Patent: Oct. 9, 2018

(54) COMPOSITION FOR ORGANIC OPTOELECTRIC DEVICE AND ORGANIC OPTOELECTRIC DEVICE AND DISPLAY DEVICE

(71) Applicants: SAMSUNG SDI CO., LTD., Yongin-si, Gyeonggi-do (KR); SAMSUNG ELECTRONICS CO., LTD., Suwon-si, Gyeonggi-do (KR)

(72) Inventors: Sangshin Lee, Suwon-si (KR); Dong Wan Ryu, Suwon-si (KR); Joohee Seo, Suwon-si (KR); Eun Sun Yu, Suwon-si (KR); Seungjae Lee, Suwon-si (KR); Chunkeun Jang, Suwon-si (KR); Sung-Hyun Jung, Suwon-si (KR)

(73) Assignees: Samsung SDI Co., Ltd., Yongin-Si, Gyeonggi-do (KR); Samsung Electronics Co., Ltd., Suwon-Si, Gyeonggi-do (KR)

(*) Notice: Subject to any disclaimer, the term of this patent is extended or adjusted under 35 U.S.C. 154(b) by 0 days.

(21) Appl. No.: 15/794,087

(22) Filed: Oct. 26, 2017

(65) Prior Publication Data
US 2018/0182970 A1    Jun. 28, 2018

(30) Foreign Application Priority Data

Dec. 22, 2016   (KR) .................. 10-2016-0176859

(51) Int. Cl.
*H01L 51/00*   (2006.01)
*H01L 51/50*   (2006.01)
*H01L 27/32*   (2006.01)

(52) U.S. Cl.
CPC ...... *H01L 51/0045* (2013.01); *H01L 27/3237* (2013.01); *H01L 51/50* (2013.01)

(58) Field of Classification Search
CPC .. H01L 51/0045; H01L 27/3237; H01L 51/50
See application file for complete search history.

(56) References Cited

U.S. PATENT DOCUMENTS

| | | | |
|---|---|---|---|
| 6,586,120 B2 * | 7/2003 | Tao | C07C 211/54 313/504 |
| 2004/0086745 A1 * | 5/2004 | Iwakuma | C07D 401/10 428/690 |

FOREIGN PATENT DOCUMENTS

| | | |
|---|---|---|
| JP | 2014-157947 A | 8/2014 |
| JP | WO2014/050904 A1 | 8/2016 |
| KR | 10-2008-0109000 A | 12/2008 |
| KR | 10-1074193 B1 | 10/2011 |
| KR | 10-2012-0021203 A | 3/2012 |
| KR | 10-2013-0050237 A | 5/2013 |
| KR | 10-1511072 B1 | 4/2015 |
| KR | 10-2015-0077513 A | 7/2015 |
| KR | 10-2015-0102759 A | 9/2015 |

(Continued)

*Primary Examiner* — Karen Kusumakar
(74) *Attorney, Agent, or Firm* — Lee & Morse, P.C.

(57) ABSTRACT

Disclosed are a composition for an organic optoelectric device including at least one first compound for an organic optoelectric device represented by Chemical Formula 1; and at least one second compound for an organic optoelectric device including a carbazole moiety represented by Chemical Formula 2, an organic optoelectric device include the same, and a display device. Details of Chemical Formula 1 and Chemical Formula 2 are the same as defined in the specification.

15 Claims, 1 Drawing Sheet

(56) References Cited

FOREIGN PATENT DOCUMENTS

| KR | 10-2015-0102760 A | 9/2015 |
| KR | 10-1552477 B1 | 9/2015 |
| KR | 10-1565200 B1 | 11/2015 |
| KR | 10-2016-0010333 A | 1/2016 |
| KR | 10-2016-0089033 A | 7/2016 |
| KR | 10-2016-0103488 A | 9/2016 |

* cited by examiner

COMPOSITION FOR ORGANIC OPTOELECTRIC DEVICE AND ORGANIC OPTOELECTRIC DEVICE AND DISPLAY DEVICE

CROSS-REFERENCE TO RELATED APPLICATION

This application claims priority to and the benefit of Korean Patent Application No. 10-2016-0176859 filed in the Korean Intellectual Property Office on Dec. 22, 2016, the entire contents of which are incorporated herein by reference.

TECHNICAL BACKGROUND

1. Field

A composition for an organic optoelectric device, an organic optoelectric device, and a display device are disclosed.

2. Description of the Related Art

An organic optoelectric device is a device that converts electrical energy into photoenergy, and vice versa.

An organic optoelectric device may be classified as follows in accordance with its driving principles. One is a photoelectric device where excitons are generated by photoenergy, separated into electrons and holes, and are transferred to different electrodes to generate electrical energy, and the other is a light emitting device where a voltage or a current is supplied to an electrode to generate photoenergy from electrical energy.

Examples of the organic optoelectric device are an organic photoelectric device, an organic light emitting diode, an organic solar cell, and an organic photo conductor drum.

Of these, an organic light emitting diode (OLED) has recently drawn attention due to an increase in demand for flat panel displays. The organic light emitting diode is a device converting electrical energy into light by applying current to an organic light emitting material, and has a structure in which an organic layer is disposed between an anode and a cathode. Herein, the organic layer may include a light emitting layer and optionally an Herein, the organic layer may include a light emitting layer and optionally an auxiliary layer, and the auxiliary layer may be, for example at least one layer selected from a hole injection layer, a hole transport layer, an electron blocking layer, an electron transport layer, an electron injection layer, and a hole blocking layer.

Performance of an organic light emitting diode may be affected by characteristics of the organic layer, and among them, may be mainly affected by characteristics of an organic material of the organic layer.

Particularly, development for an organic material being capable of increasing hole and electron mobility and simultaneously increasing electrochemical stability is needed so that the organic light emitting diode may be applied to a large-size flat panel display.

SUMMARY

An embodiment provides a composition for an organic optoelectric device capable of realizing an organic optoelectric device having high efficiency and long life-span.

Another embodiment provides an organic optoelectric device including the composition.

Yet another embodiment provides a display device including the organic optoelectric device.

According to an embodiment, a composition for an organic optoelectric device includes at least one first compound for an organic optoelectric device represented by Chemical Formula 1; and at least one second compound for an organic optoelectric device including a carbazole moiety represented by Chemical Formula 2.

[Chemical Formula 1]

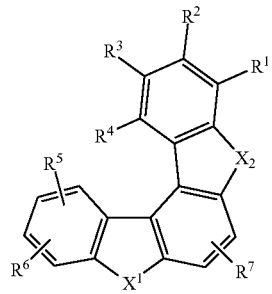

[Chemical Formula 2]

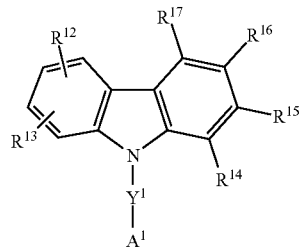

In Chemical Formula 1, $X^1$ and $X^2$ are independently N-$L^a$-$R^a$, O, or S, at least one of $X^1$ and $X^2$ is N-$L^a$-$R^a$, $R^a$ is independently a substituted or unsubstituted C6 to C30 aryl group or a substituted or unsubstituted C2 to C30 heterocyclic group, at least one of $R^a$ is a substituted or unsubstituted N-containing C2 to C30 heterocyclic group except a carbazolyl group, $R^1$ to $R^7$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, adjacent groups of $R^1$ to $R^4$ are linked with each other to form at least one of a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring, $L^a$ is independently a single bond, a substituted or unsubstituted C6 to C30 arylene group, or a substituted or unsubstituted C2 to C30 heteroarylene group;

wherein, in Chemical Formula 2, $Y^1$ is a single bond, a substituted or unsubstituted C6 to C30 arylene group, or a substituted or unsubstituted C2 to C30 heteroarylene group, $A^1$ is a substituted or unsubstituted C6 to C30 aryl group, or a substituted or unsubstituted C2 to C30 heterocyclic group, $R^{12}$ to $R^{17}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and $R^{14}$ to $R^{17}$ are independently present or adjacent groups of $R^{14}$ to $R^{17}$ are linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring;

wherein "substituted" refers to replacement of at least one hydrogen by deuterium, a C1 to C20 alkyl group, a C6 to C30 aryl group, or a C2 to C30 heteroaryl group.

According to another embodiment, an organic optoelectric device includes an anode and a cathode facing each other and at least one organic layer interposed between the anode and the cathode, wherein the organic layer includes the composition for an organic optoelectric device.

According to another embodiment, a display device includes the organic optoelectric device.

An organic optoelectric device having high efficiency and a long life-span may be realized.

DETAILED DESCRIPTION

Figure 1:
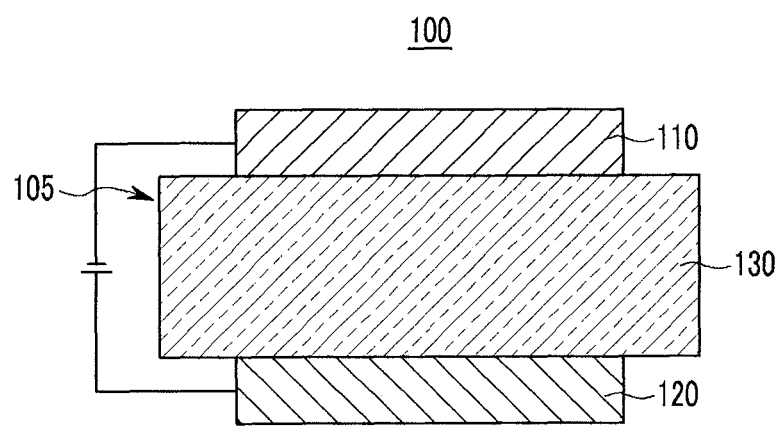
FIGS. 1 and 2 are cross-sectional views showing organic light emitting diodes according to embodiments.

Hereinafter, embodiments of the present disclosure are described in detail. However, these embodiments are exemplary, and this disclosure is not limited thereto.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example of the present disclosure, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, or a C2 to C30 heteroaryl group. In a specific example of the present disclosure, "substituted" refers to replacement of at least one hydrogen of a substituent or a compound by deuterium, a C1 to C20 alkyl group, a C6 to C30 aryl group, or a C2 to C30 heteroaryl group. In a specific example of the present disclosure, "substituted" refers to replacement of at least one hydrogen of a substituent or a compound by deuterium, a C1 to C5 alkyl group, a C6 to C18 aryl group, a pyridinyl group, a quinolinyl group, an isoquinolinyl group, a quinazolinyl group, a dibenzofuranyl group, a dibenzothiophenyl group, or a carbazolyl group. In a specific example of the present disclosure, "substituted" refers to replacement of at least one hydrogen of a substituent or a compound by deuterium, a C1 to C5 alkyl group, a C6 to C18 aryl group, a pyridinyl group, a quinazolinyl group, a dibenzofuranyl group, or a dibenzothiophenyl group. In a specific example of the present disclosure, "substituted" refers to replacement of at least one hydrogen of a substituent or a compound by deuterium, a methyl group, an ethyl group, a propanyl group, a butyl group, a phenyl group, a biphenyl group, a terphenyl group, a naphthyl group, a triphenyl group, a fluorenyl group, a pyridinyl group, a quinazolinyl group, a carbazolyl group, a dibenzofuranyl group, or a dibenzothiophenyl group.

As used herein, when a definition is not otherwise provided, "hetero" refers to one including one to three heteroatoms selected from N, O, S, P, and Si, and remaining carbons in one functional group.

As used herein, when a definition is not otherwise provided, "alkyl group" refers to an aliphatic hydrocarbon group. The alkyl group may be "a saturated alkyl group" without any double bond or triple bond.

The alkyl group may be a C1 to C30 alkyl group. More specifically, the alkyl group may be a C1 to C20 alkyl group or a C1 to C10 alkyl group. For example, a C1 to C4 alkyl group may have one to four carbon atoms in the alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

As used herein, "aryl group" refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring. For example, it may be a fluorenyl group.

The aryl group may include a monocyclic, polycyclic or fused ring polycyclic (i.e., rings sharing adjacent pairs of carbon atoms) functional group.

As used herein, "a heterocyclic group" is a generic concept of a heteroaryl group, and may include at least one heteroatom selected from N, O, S, P, and Si instead of carbon (C) in a cyclic compound such as aryl group, a cycloalkyl group, a fused ring thereof, or a combination thereof. When the heterocyclic group is a fused ring, the entire ring or each ring of the heterocyclic group may include one or more heteroatoms.

For example, "a heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

Specific examples of the heterocyclic group may be a pyridinyl group, a pyrimidinyl group, a pyrazinyl group, a pyridazinyl group, a triazinyl group, a quinolinyl group, an isoquinolinyl group, a quinazolinyl group, and the like.

More specifically, the substituted or unsubstituted C6 to C30 aryl group and/or the substituted or unsubstituted C2 to C30 heterocyclic group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted benzoquinolinyl group, a substituted or unsubstituted benzoisoquinolinyl group, a substituted or unsubstituted benzoquinazolinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, or a substituted or unsubstituted dibenzothiophenyl group, or a combination thereof, but are not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectric device according to an embodiment is described.

A composition for an organic optoelectric device according to an embodiment includes at least two hosts and a dopant, and the hosts include a first compound for an organic optoelectric device and a second compound for an organic optoelectric device.

The composition for an organic optoelectric device according to the present disclosure includes a first compound for an organic optoelectric device that has a fused indolocarbazole structure and a second compound for an organic optoelectric device that has a structure including a carbazole moiety, and thereby a device having a fast driving voltage, a long life-span, and high efficiency may be realized.

The first compound for an organic optoelectric device is represented by Chemical Formula 1.

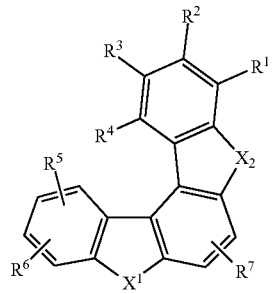

[Chemical Formula 1]

In Chemical Formula 1,
$X^1$ and $X^2$ are independently N-$L^a$-$R^a$, O, or S,
at least one of $X^1$ and $X^2$ is N-$L^a$-$R^a$,
$R^a$ is independently a substituted or unsubstituted C6 to C30 aryl group or a substituted or unsubstituted C2 to C30 heterocyclic group,
at least one of $R^a$ is a substituted or unsubstituted N-containing C2 to C30 heterocyclic group except a carbazolyl group,
$R^1$ to $R^7$ are independently hydrogen, deuterium, a substituted or unsubstituted C1 to C20 alkyl group, a substituted or unsubstituted C6 to C30 aryl group, or a substituted or unsubstituted C2 to C30 heterocyclic group,
adjacent groups of $R^1$ to $R^4$ are linked with each other to form at least one of a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring, and
$L^a$ is independently a single bond, a substituted or unsubstituted C6 to C30 arylene group, or a substituted or unsubstituted C2 to C30 heteroarylene group,
wherein "substituted" refers to replacement of at least one hydrogen by deuterium, a C1 to C20 alkyl group, a C6 to C30 aryl group, or a C2 to C30 heteroaryl group.

In one example of the present disclosure, the "substituted" refers to replacement of at least one hydrogen by deuterium, a C1 to C4 alkyl group, a C6 to C12 aryl group, or a C2 to C20 heteroaryl group. Specifically, at least one hydrogen may be replaced by a C1 to C4 alkyl group, a phenyl group, a biphenyl group, a naphthyl group, a terphenyl group, an anthracenyl group, a fluorenyl group, a phenanthrenyl group, a triphenylene group, a pyridinyl group, a pyrimidinyl group, a triazinyl group, a quinolinyl group, an isoquinolinyl group, a quinazolinyl group, a benzofuranpyrimidinyl group, a benzothiophenepyrimidinyl group, a dibenzofuranyl group, or a dibenzothiophenyl group, for example a phenyl group, a biphenyl group, a naphthyl group, a pyrimidinyl group, a triazinyl group, a quinazolinyl group, a dibenzofuranyl group, or a dibenzothiophenyl group.

The first compound for an organic optoelectric device includes at least one substituent having electron characteristics, that is, an N-containing heterocyclic group except for a carbazolyl group in the fused indolocarbazole structure and thus may be used as an electron injection material, an electron transport material, or a light emitting material, and particularly when used as the light emitting material, hole transport characteristics in the fused ring may be reinforced, and simultaneously, a fast driving voltage and high efficiency characteristics may be obtained due to a combination with the substituent having electron characteristics. It is more desirable that at least one of $R^a$ is a substituted or unsubstituted C4 to C30 heterocyclic group including at least two N's except a carbazolyl group.

In an example embodiment, a structure fused with indolocarbazole may be a structure where $R^1$ and $R^2$ of Chemical Formula 1 are linked with each other; $R^3$ and $R^4$ are linked with each other; or $R^1$ and $R^2$ are linked with each other and $R^3$ and $R^4$ are linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring.

In a specific example embodiment, fused indolocarbazole represented by Chemical Formula 1 may be represented by one of Chemical Formula 1A to Chemical Formula 1C.

[Chemical Formula 1A]

[Chemical Formula 1B]

[Chemical Formula 1C]

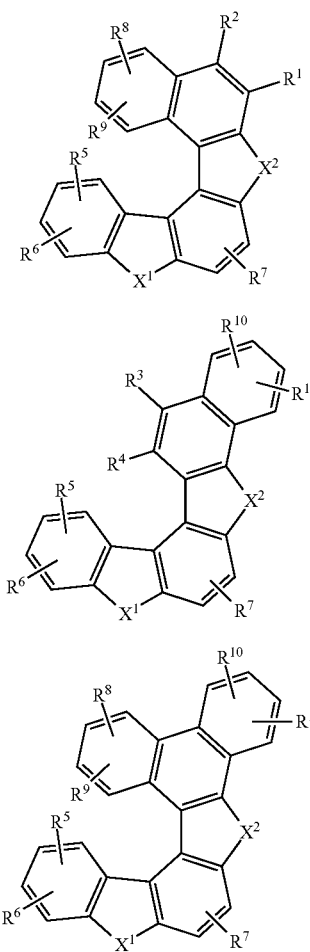

In Chemical Formula 1A to Chemical Formula 1C, $X^1$, $X^2$, and $R^1$ to $R^7$ are the same as described above and $R^8$ to $R^{11}$ are the same as $R^1$ to $R^7$.

In Chemical Formula 1, the substituted or unsubstituted N-containing C2 to C30 heterocyclic group except the carbazolyl group may be specifically a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group, more specifically a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, and more specifically a substituted or unsubstituted pyrimidinyl group, a substituted or unsubstituted triazinyl group, or a substituted or unsubstituted quinazolinyl group.

For example, the substituted or unsubstituted N-containing C2 to C30 heterocyclic group except the carbazolyl group may be selected from substituents of Group I.

[Group I]

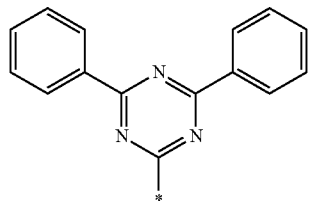

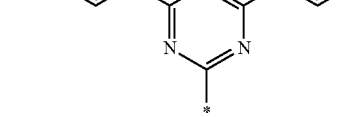

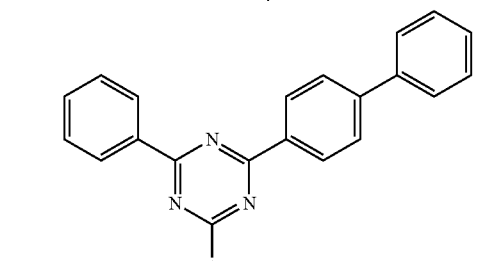

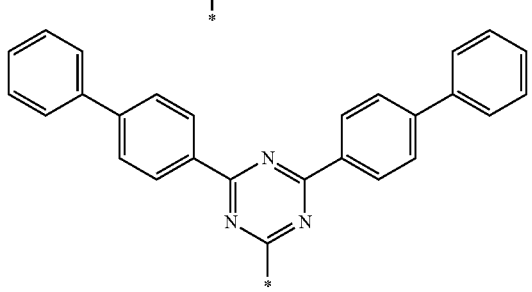

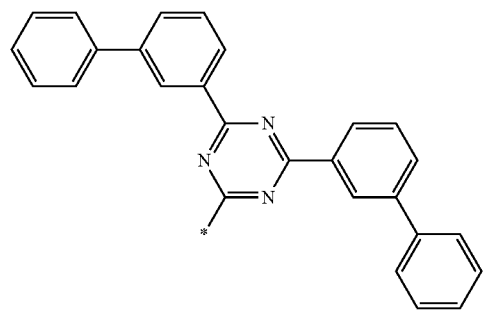

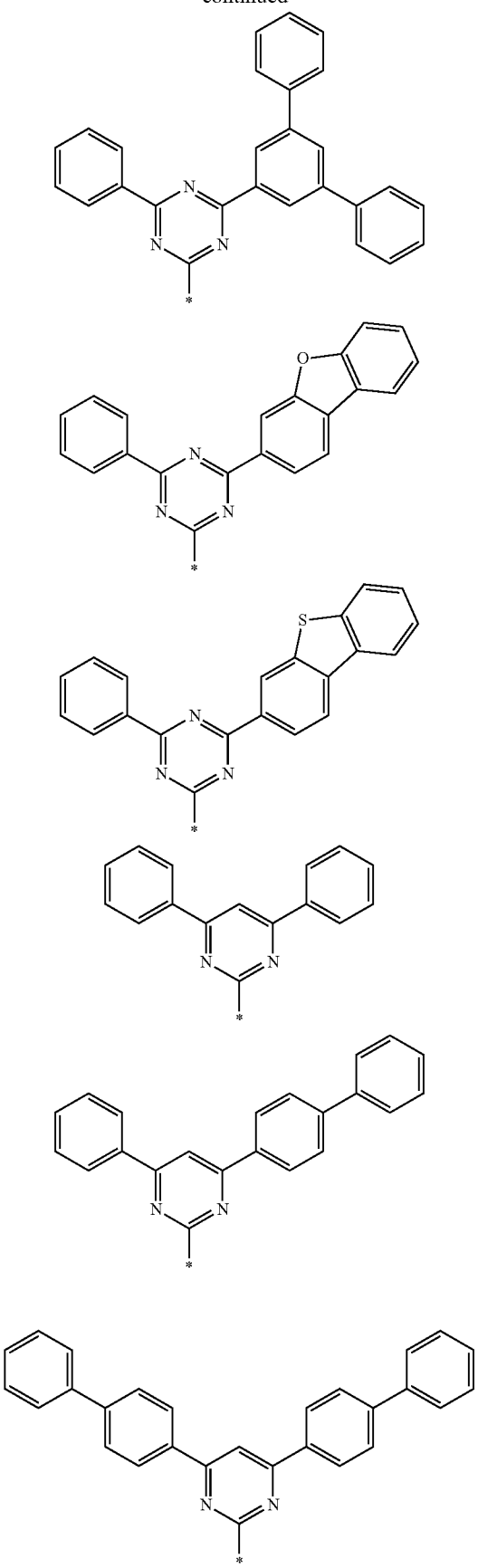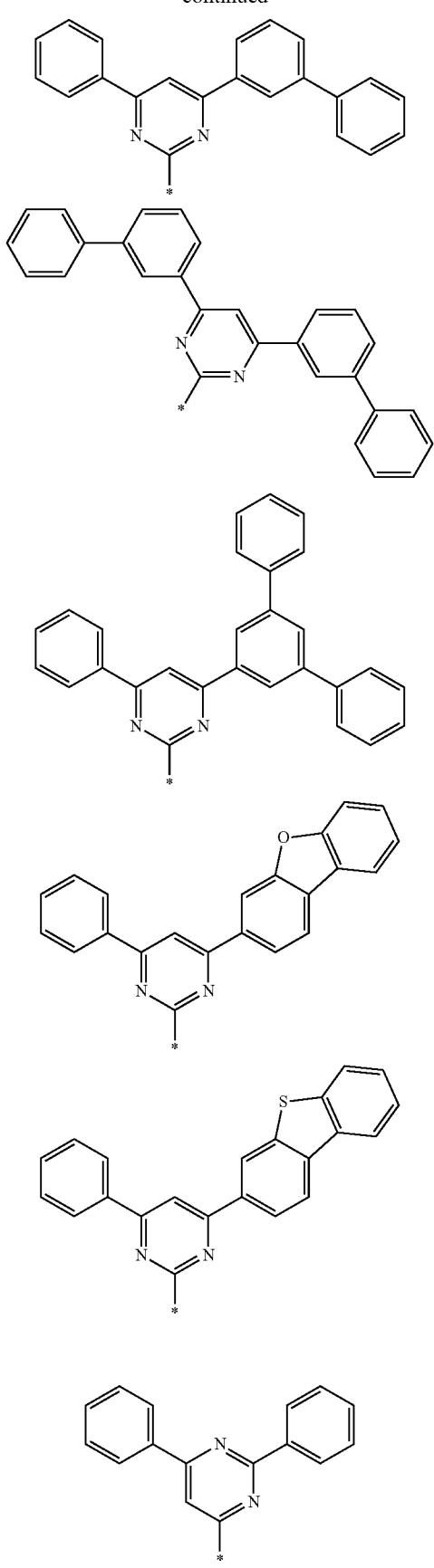

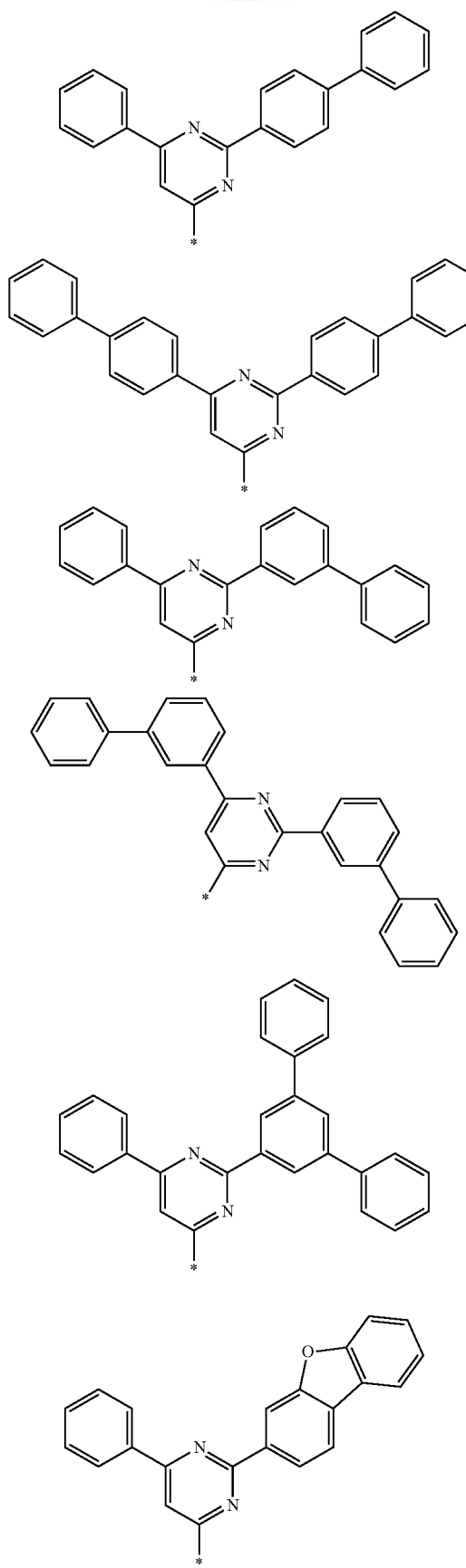
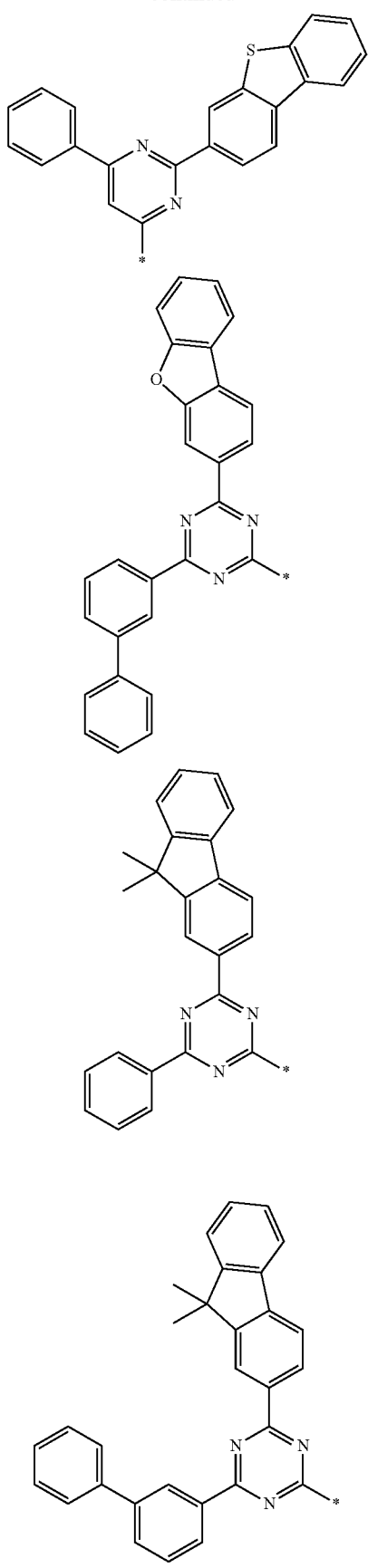

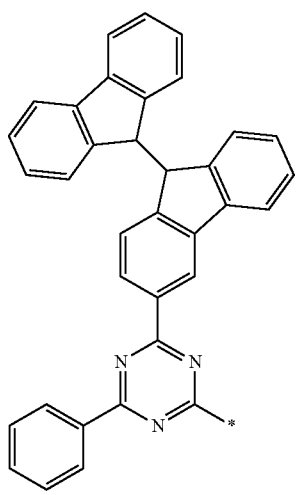
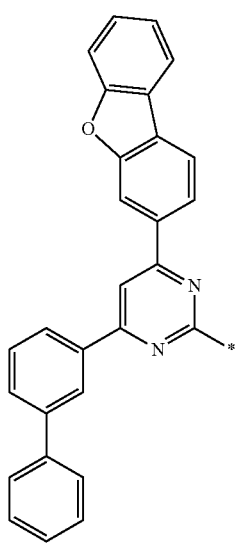
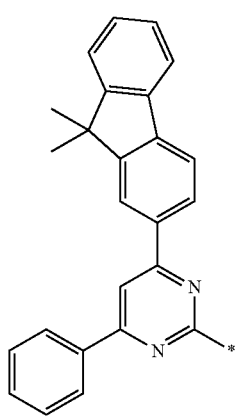
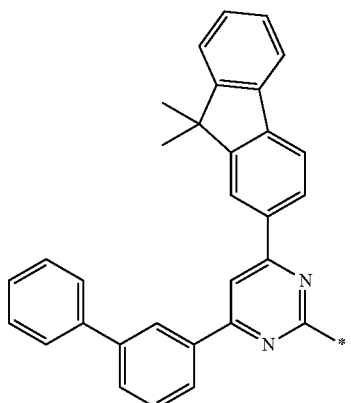
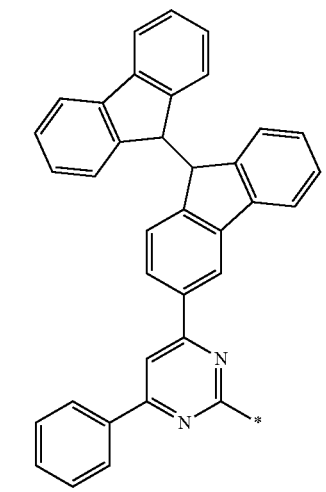
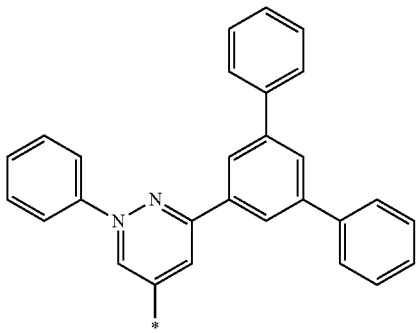
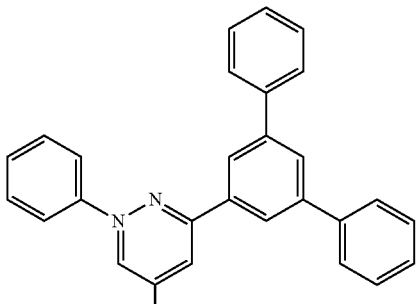
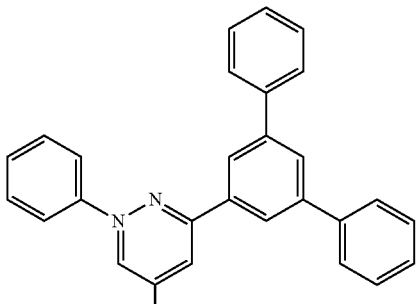
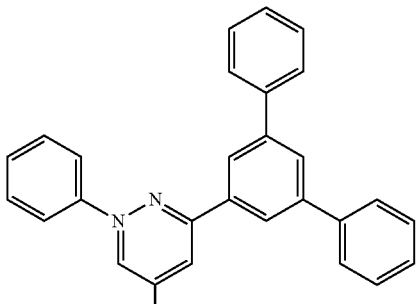

-continued
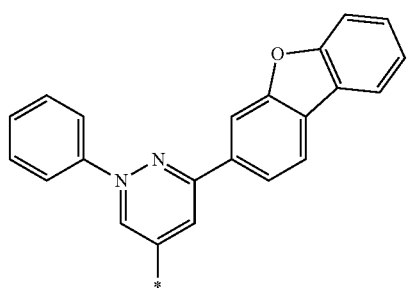
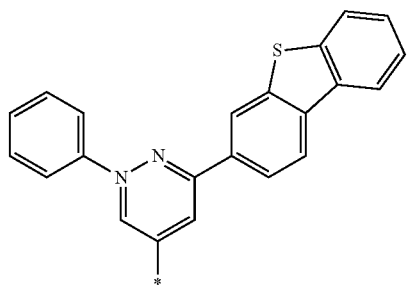
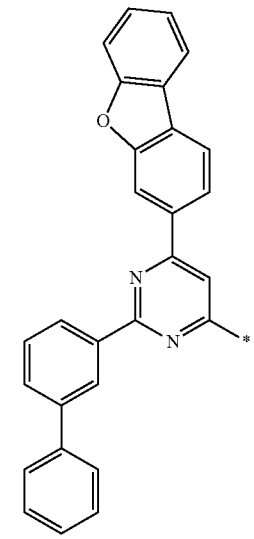
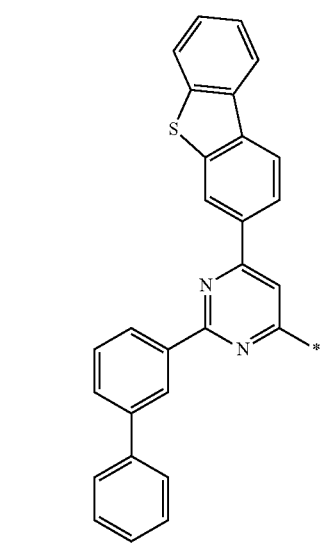
-continued
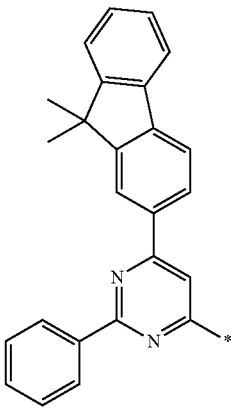
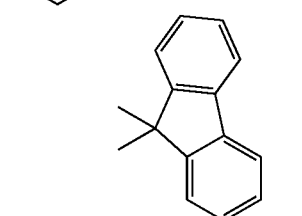
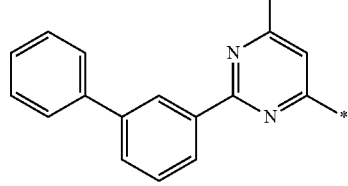
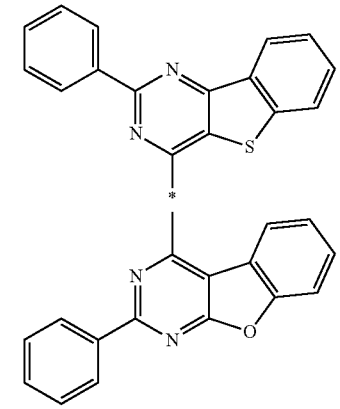

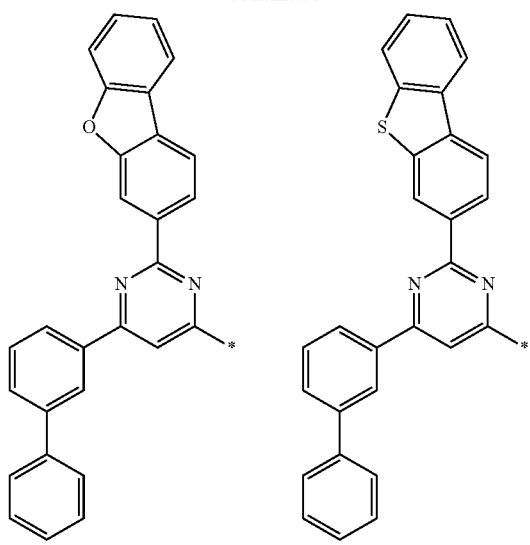
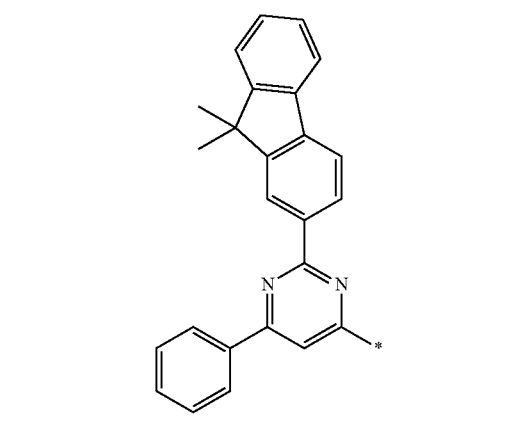
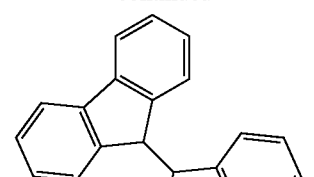
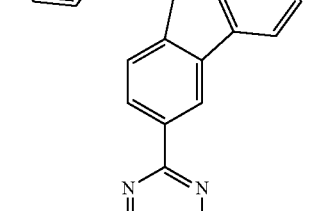
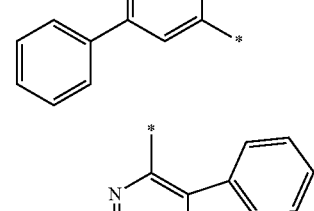
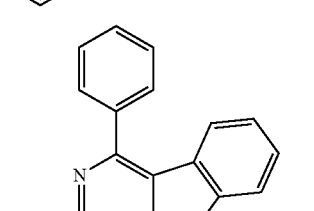
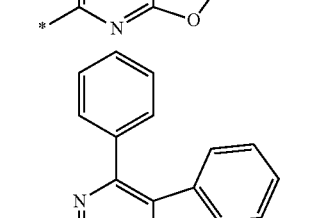
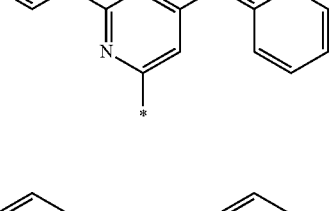
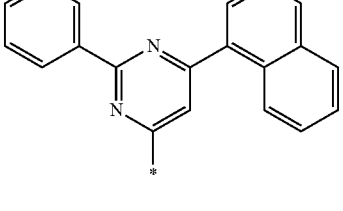

-continued
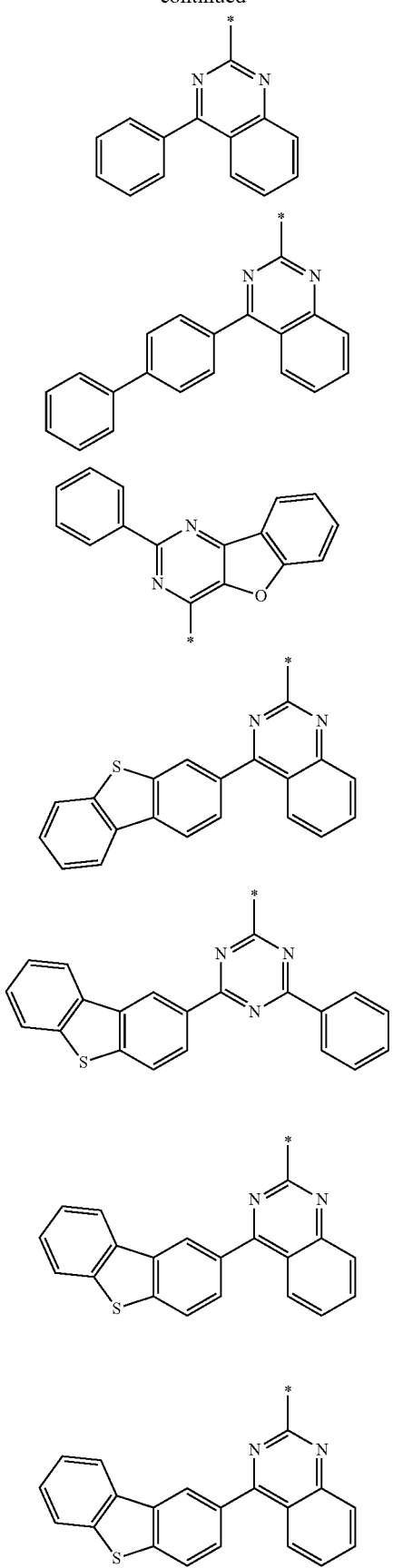
-continued
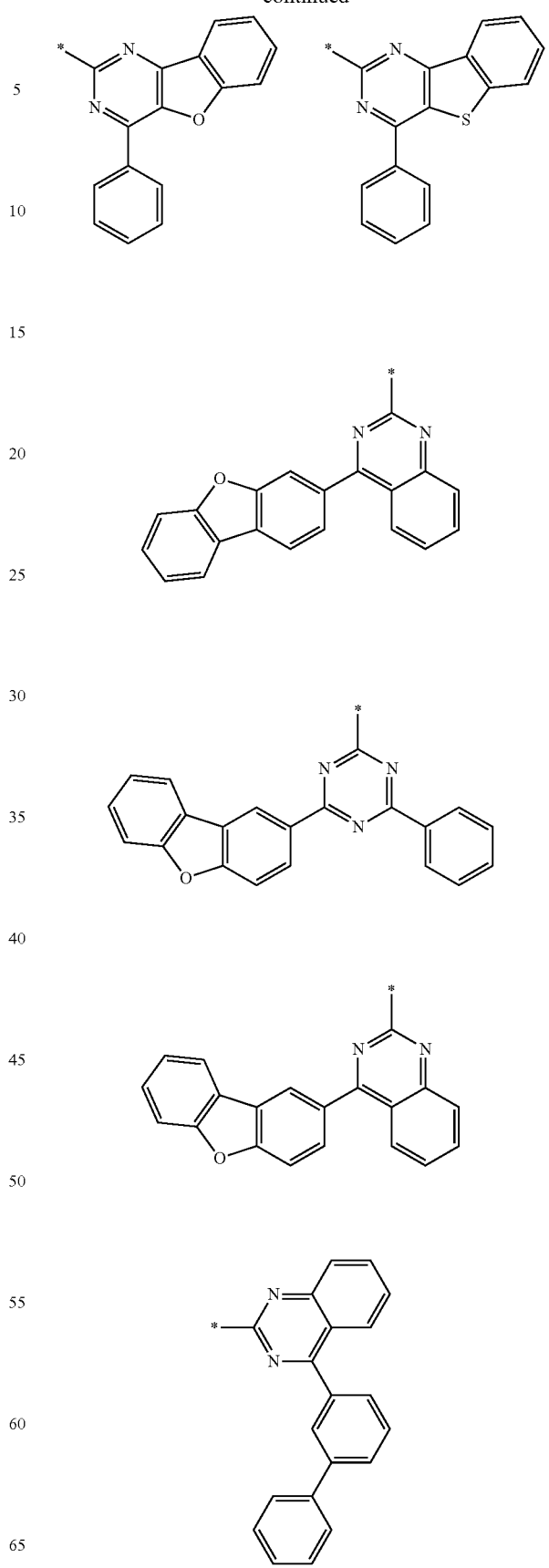

-continued

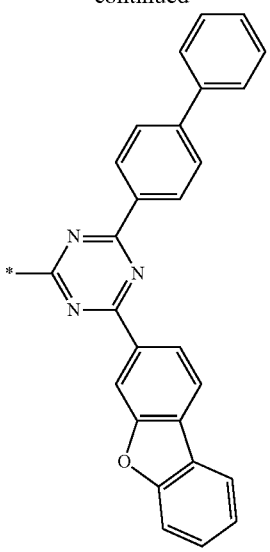

In Group I, * is a linking point.

In a specific example embodiment, the first compound for an organic optoelectric device is a compound having bipolar characteristics and at least one of $X^1$ and $X^2$ may be a substituent having electron characteristics. The substituent having electron characteristics may refer to the substituted or unsubstituted N-containing C2 to C30 heterocyclic group except the carbazolyl group.

When $X^1$ and $X^2$ are all N-$L^a$-$R^a$, one of $R^a$ may be a substituted or unsubstituted N-containing C2 to C30 heterocyclic group except a carbazolyl group and the other of $R^a$ may be a substituted or unsubstituted C6 to C30 aryl group.

For example, when $X^1$ and $X^2$ are all N-$L^a$-$R^a$, the first compound for an organic optoelectric device having the bipolar characteristics may be represented by one of Chemical Formula 1A-I, Chemical Formula 1B-I, and Chemical Formula 1C-I.

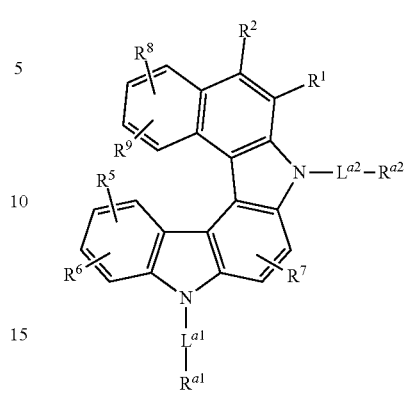

[Chemical Formula 1A-I]

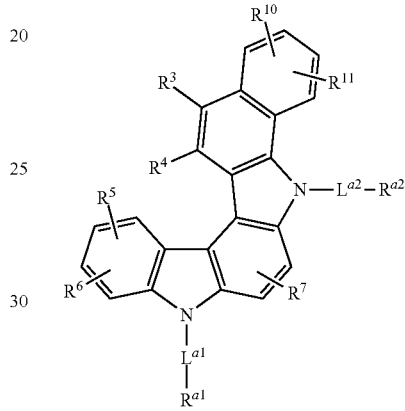

[Chemical Formula 1B-I]

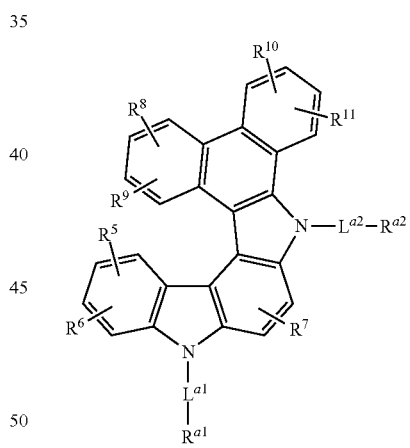

[Chemical Formula 1C-I]

In Chemical Formula 1A-I, Chemical Formula 1B-I, and Chemical Formula 1C-I, $R^1$ to $R^{11}$ are the same as described above, $R^{a1}$ and $R^{a2}$ may independently be a substituted or unsubstituted C6 to C30 aryl group, a substituted or unsubstituted pyridinyl group, a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, one of $R^{a1}$ and $R^{a2}$ may be a substituted or unsubstituted pyridinyl group, a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, and $L^{a1}$ and $L^{a2}$ may independently be a single bond, a substituted or unsubstituted C6 to C30 arylene group, or a substituted or unsubstituted C2 to C30 heteroarylene group.

For example, $R^{a1}$ may be a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group and $R^{a1}$ may be a substituted or unsubstituted C6 to C30 aryl group; or $R^{a2}$ may be a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group and $R^{a1}$ may be a substituted or unsubstituted C6 to C30 aryl group.

In a specific example embodiment, $R^{a2}$ of Chemical Formula 1A-I, Chemical Formula 1B-I and Chemical Formula 1C-I may be a substituted or unsubstituted phenyl group, a substituted or unsubstituted biphenyl group and $R^{a1}$ may be a substituted or unsubstituted triazinyl group or a substituted or unsubstituted quinazolinyl group.

In addition, when one of $X^1$ and $X^2$ is O or S, $R^a$ of $N-L^a-R^a$ may be a substituted or unsubstituted N-containing C2 to C30 heterocyclic group except a carbazolyl group.

For example, when one of $X^1$ and $X^2$ is O or S, the first compound for an organic optoelectric device having bipolar characteristics may be represented by one of Chemical Formula 1A-II, Chemical Formula 1A-III, Chemical Formula 1A-IV, Chemical Formula 1A-V, Chemical Formula 1B-II, Chemical Formula 1B-III, Chemical Formula 1B-IV, Chemical Formula 1B-V, Chemical Formula 1C-II, Chemical Formula 1C-III, Chemical Formula 1C-IV, and Chemical Formula 1C-V.

[Chemical Formula 1A-II]

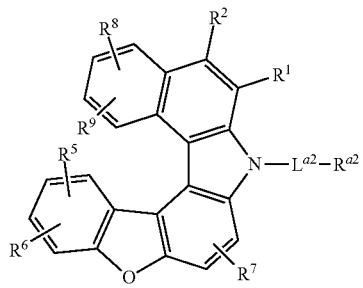

[Chemical Formula 1A-III]

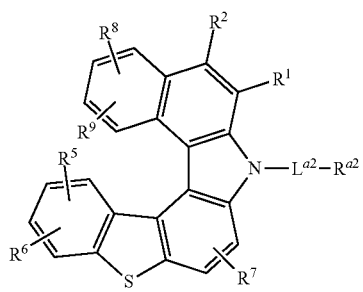

[Chemical Formula 1A-IV]

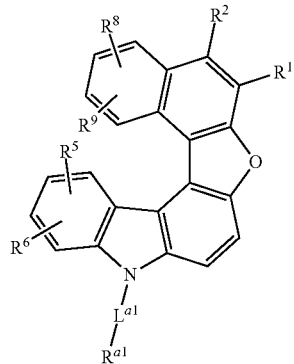

[Chemical Formula 1A-V]

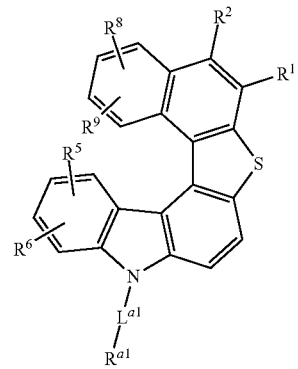

[Chemical Formula 1B-II]

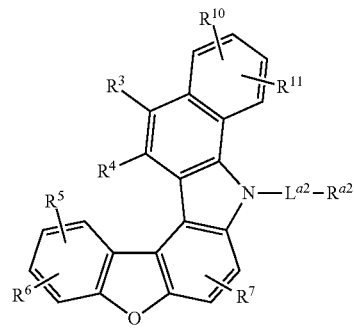

[Chemical Formula 1B-III]

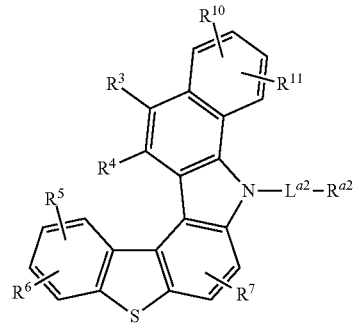

[Chemical Formula 1B-IV]

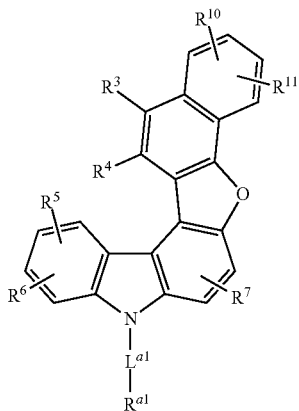

[Chemical Formula 1B-V]

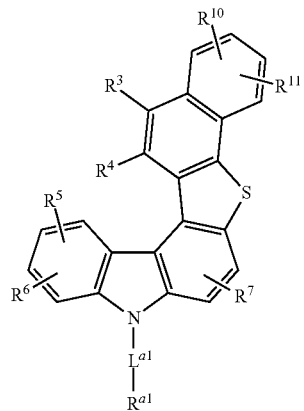

[Chemical Formula 1C-II]

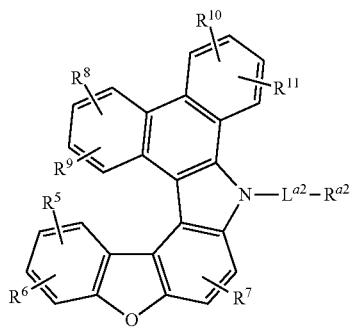

[Chemical Formula 1C-III]

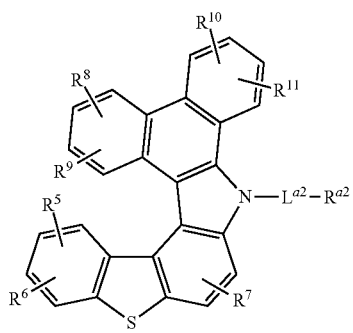

[Chemical Formula 1C-IV]

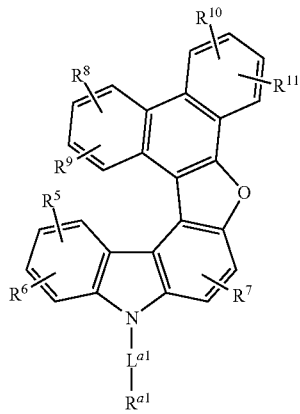

[Chemical Formula 1C-V]

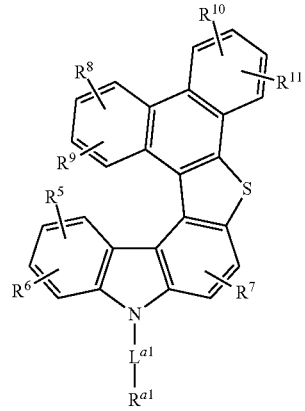

In Chemical Formula 1A-II, Chemical Formula 1A-III, Chemical Formula 1A-IV, Chemical Formula 1A-V, Chemical Formula 1B-II, Chemical Formula 1B-III, Chemical Formula 1B-IV, Chemical Formula 1B-V, Chemical Formula 1C-II, Chemical Formula 1C-III, Chemical Formula 1C-IV, and Chemical Formula 1C-V, $R^1$ to $R^{11}$ are the same as described above, $R^{a1}$ and $R^{a2}$ may independently be a substituted or unsubstituted pyridinyl group, a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, for example $R^{a1}$ and $R^{a2}$ are independently a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, and $L^{a1}$ and $L^{a2}$ may independently be a single bond, a substituted or unsubstituted C6 to C30 arylene group, or a substituted or unsubstituted C2 to C30 heteroarylene group.

In a more specific example embodiment, Chemical Formula 1 may be represented by Chemical Formula 1A-II, Chemical Formula 1A-III, Chemical Formula 1B-II, Chemical Formula 1B-III, Chemical Formula 1C-II, or Chemical Formula 1C-III, and in this case, $R^{a2}$ may be a substituted or unsubstituted triazinyl group or a substituted or unsubstituted quinazolinyl group.

In a specific example embodiment, $R^1$ to $R^{11}$ of Chemical Formula 1 may independently be hydrogen, deuterium, a substituted or unsubstituted C1 to C10 alkyl group, a substituted or unsubstituted C6 to C20 aryl group, or a substituted or unsubstituted C2 to C20 heterocyclic group, more specifically hydrogen, deuterium, a substituted or unsubstituted C1 to C4 alkyl group, or a substituted or unsubstituted C6 to C12 aryl group, and for example hydrogen, deuterium, a substituted or unsubstituted C1 to C4 alkyl group, a substituted or unsubstituted phenyl group, a substituted or unsubstituted biphenyl group, or a substituted or unsubstituted naphthyl group.

In a more specific example embodiment, $R^5$ to $R^{11}$ of Chemical Formula 1 may be all hydrogen, provided that adjacent groups of $R^1$ to $R^4$ are linked with each other to form at least one of a substituted or unsubstituted aliphatic, aromatic, or heteroaromatic monocyclic ring or a substituted or unsubstituted aliphatic, aromatic, or heteroaromatic polycyclic ring.

In a specific example embodiment, L, $L^{a1}$, and $L^{a2}$ of Chemical Formula 1 may independently be a single bond, or a substituted or unsubstituted C6 to C30 arylene group, more specifically single bond, a substituted or unsubstituted C6 to C12 arylene group, and for example, a single bond, a substituted or unsubstituted phenylene group, a substituted or unsubstituted para-biphenylene group, or a substituted or unsubstituted meta-biphenylene group.

The first compound for an organic optoelectric device may be for example compounds of Group 1, but is not limited thereto.

[Group 1]

1

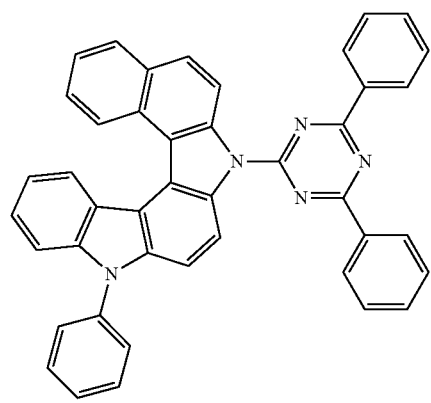

2

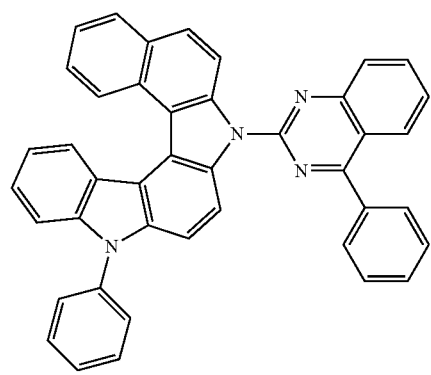

3

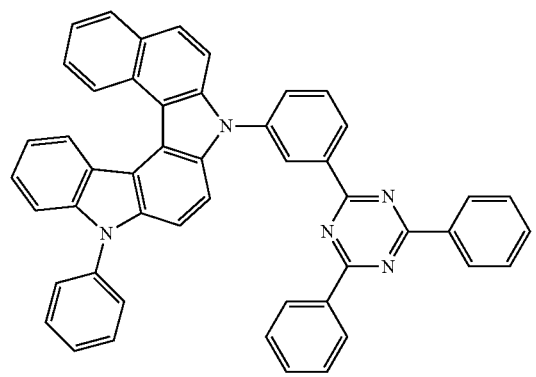

4

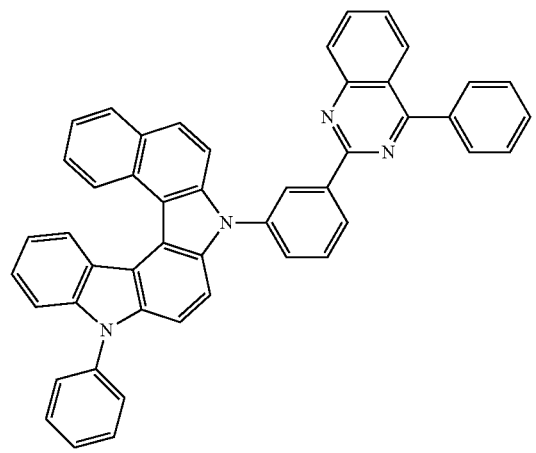

-continued
5
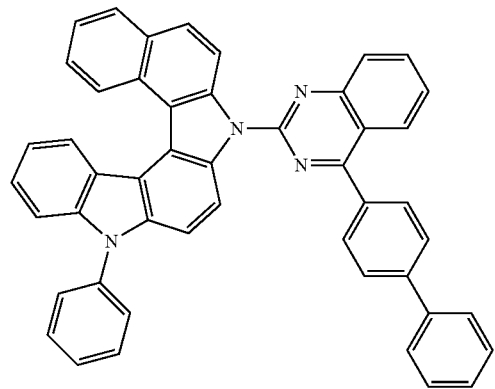
6
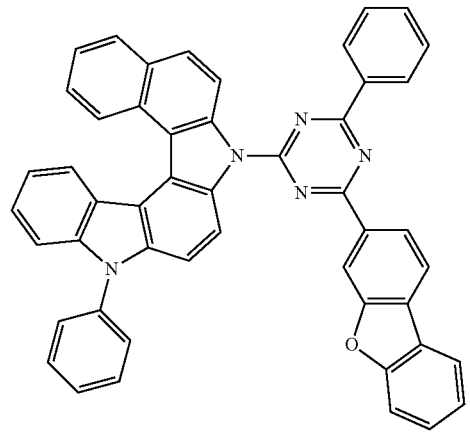
7
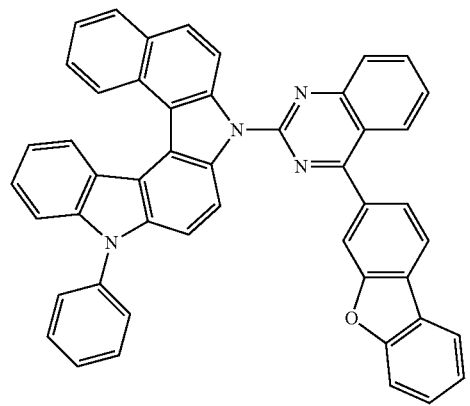
8
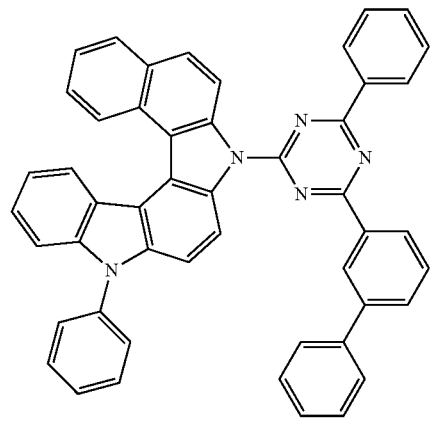
9
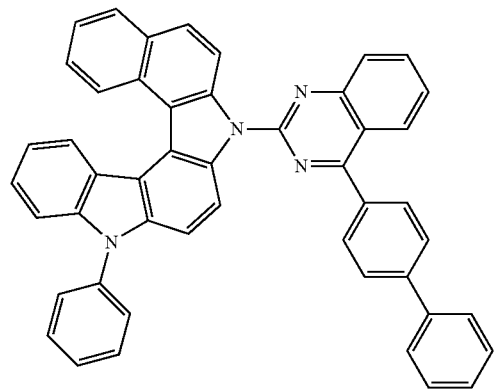
10
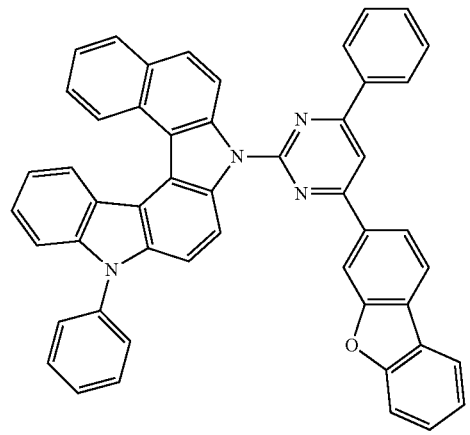

-continued
11
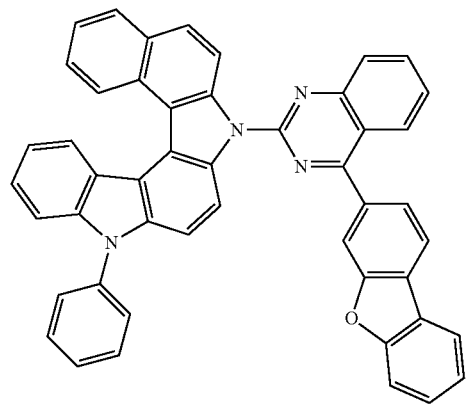
12
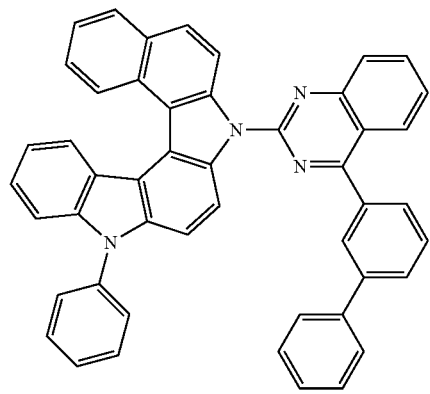
13
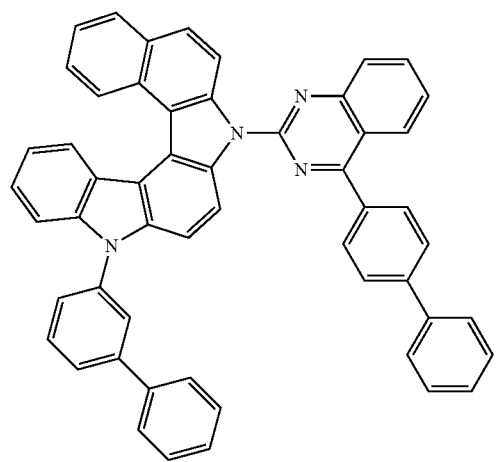
14
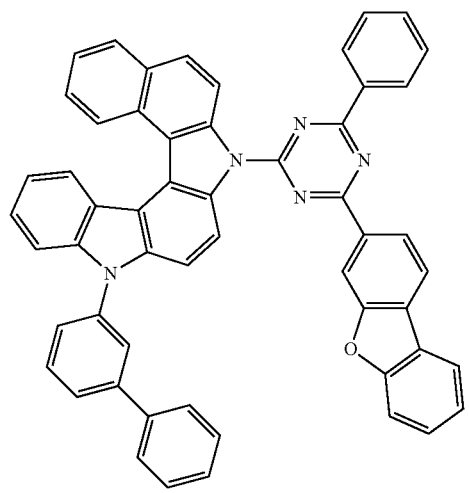
15
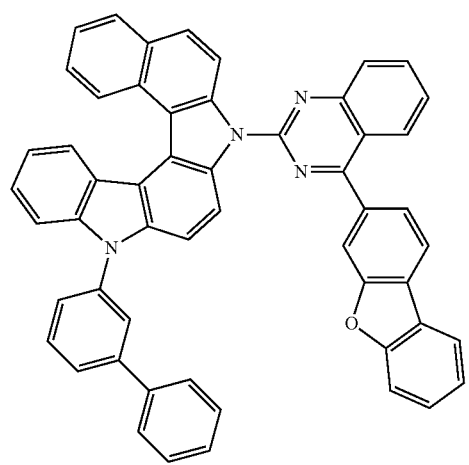
16
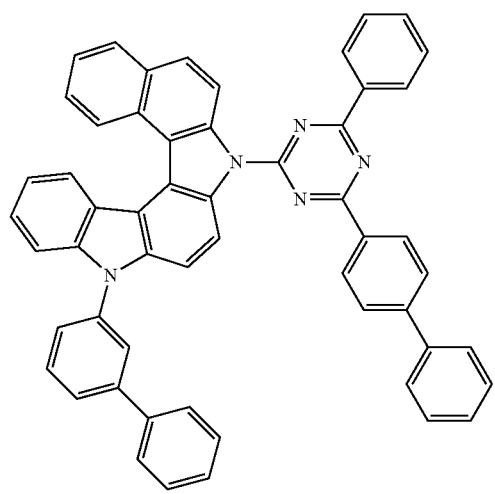

-continued
17
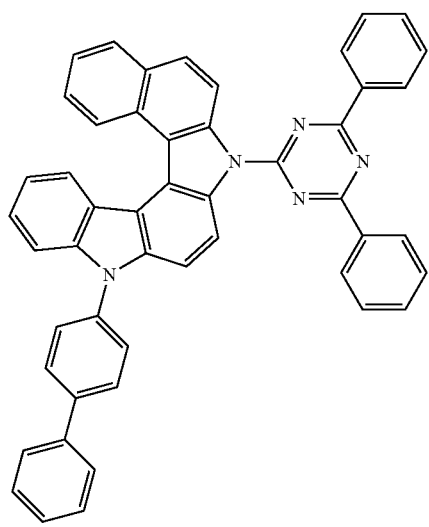
18
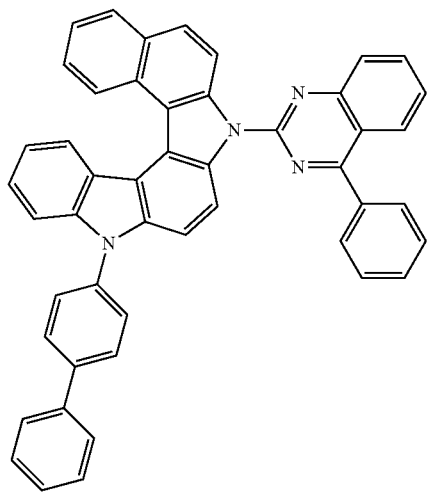
19
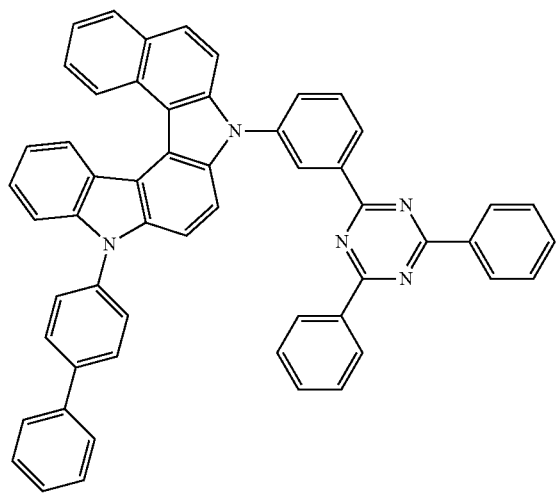
20
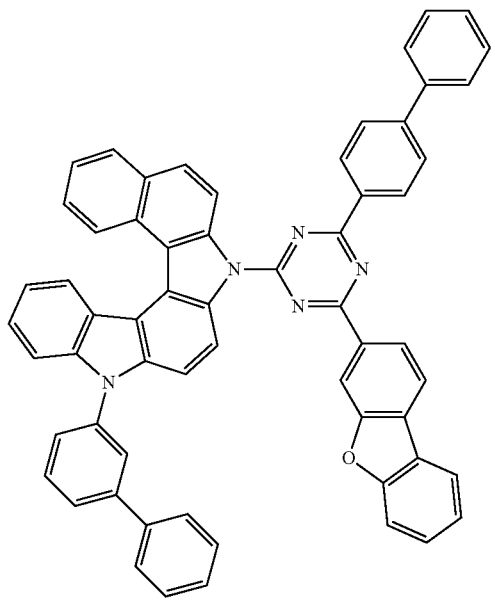
21
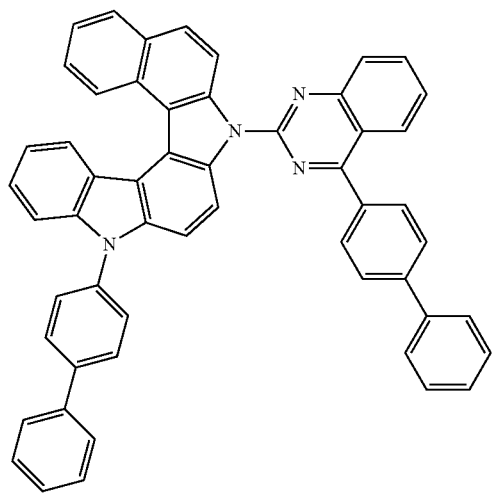
22
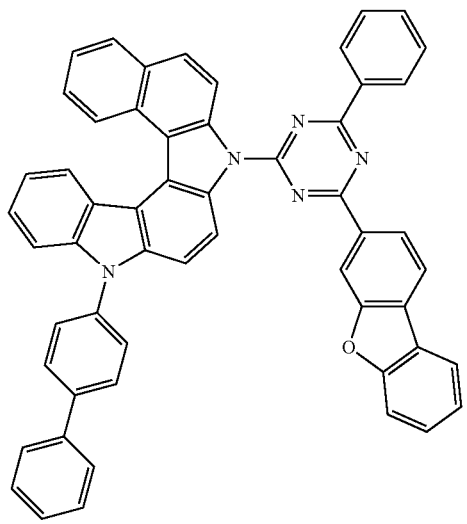

23
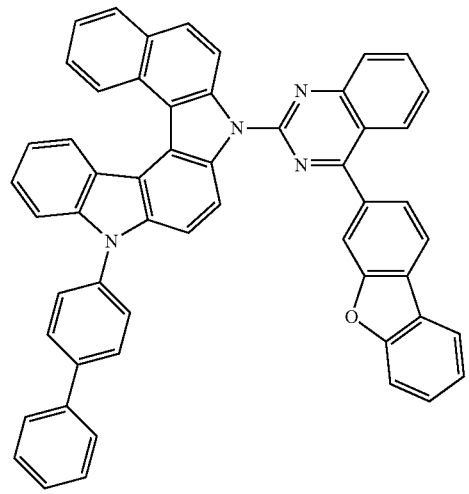
24
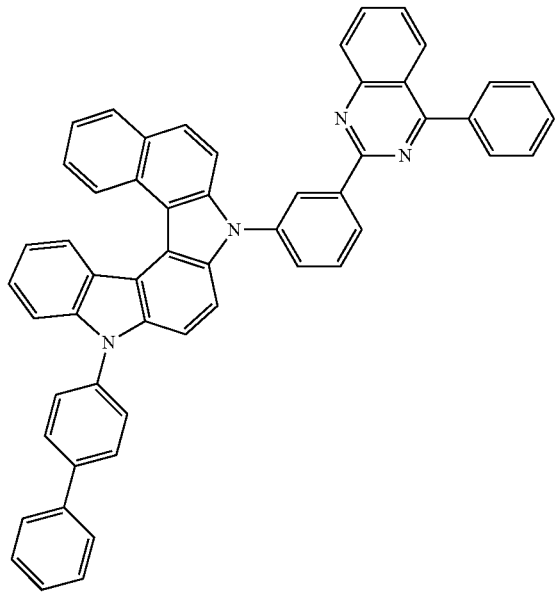
25
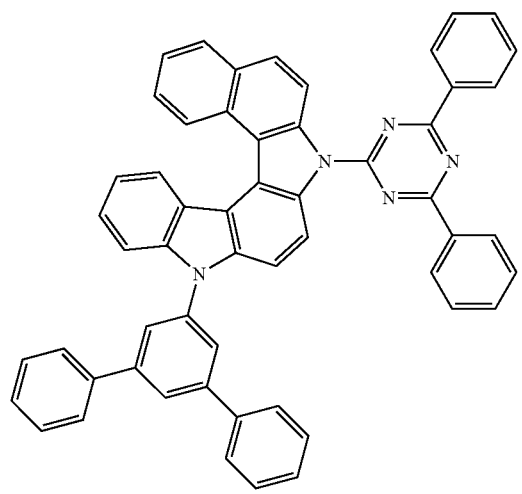
26
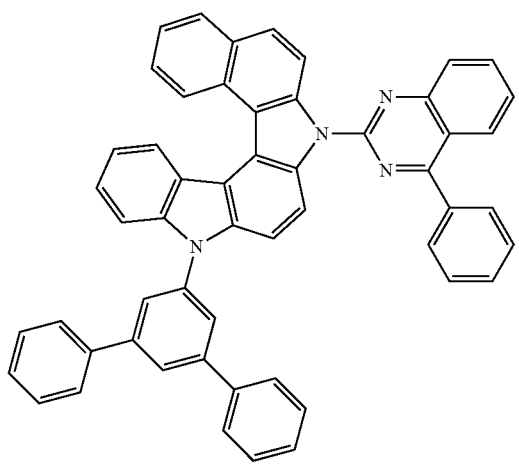

-continued
27
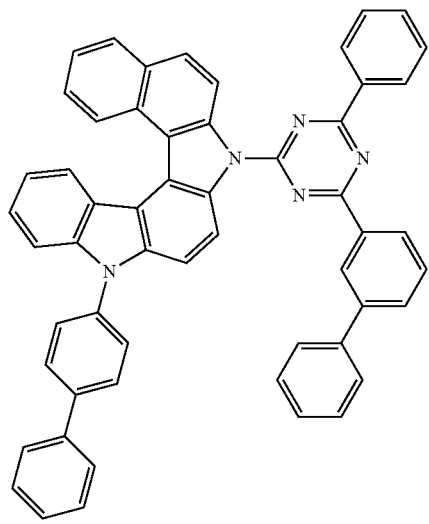
28
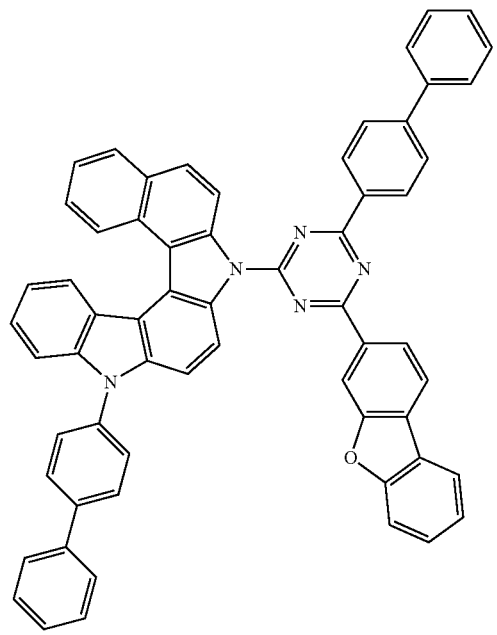
29
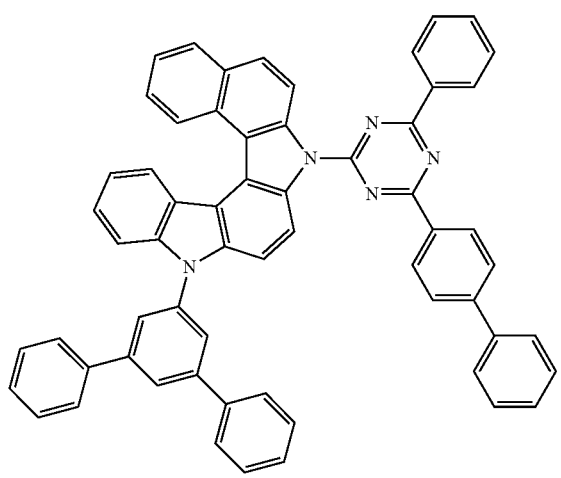
30
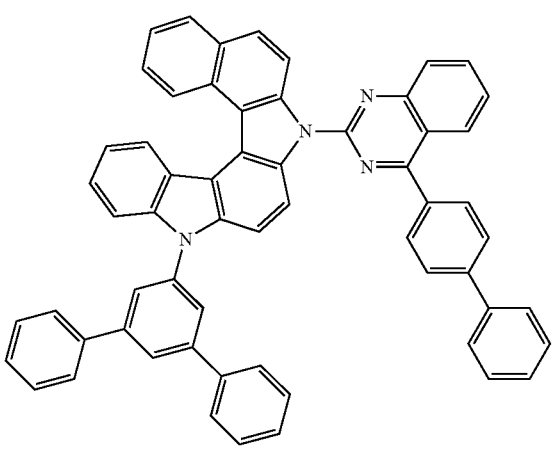
31
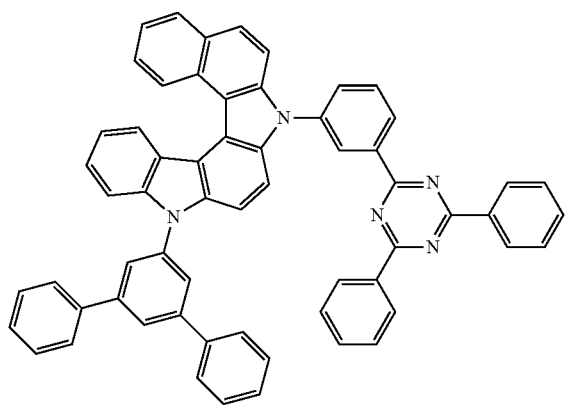
32
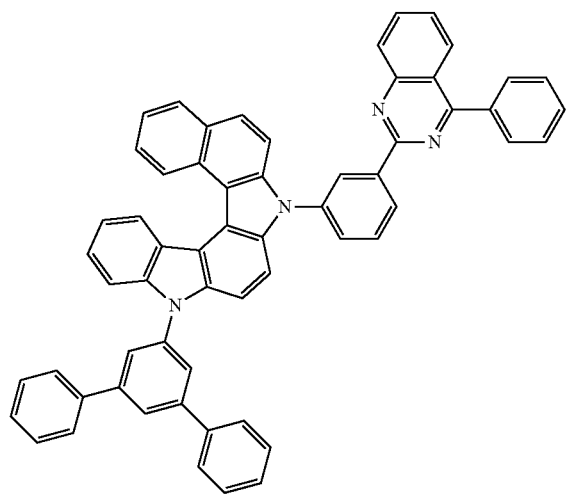

-continued
33
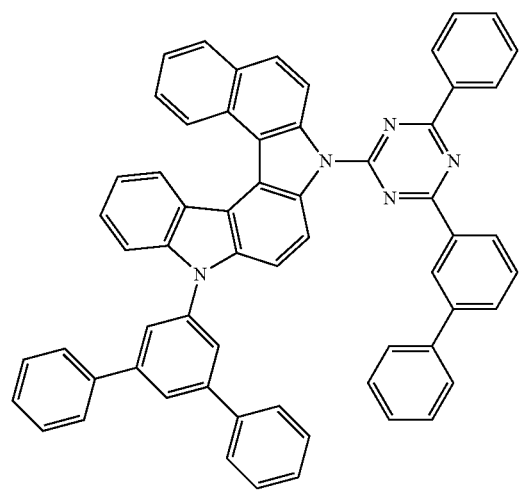
34
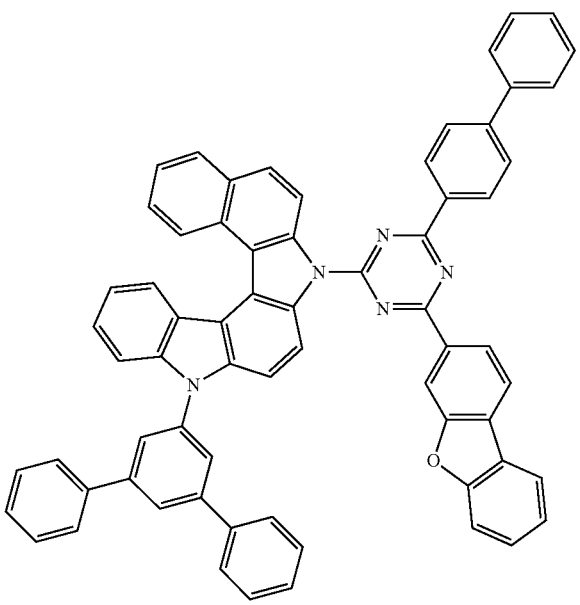
35
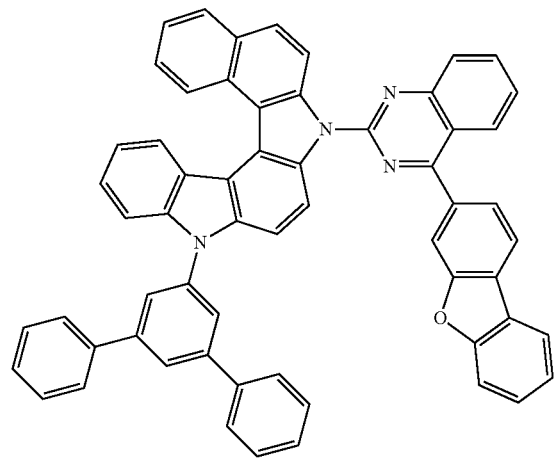
36
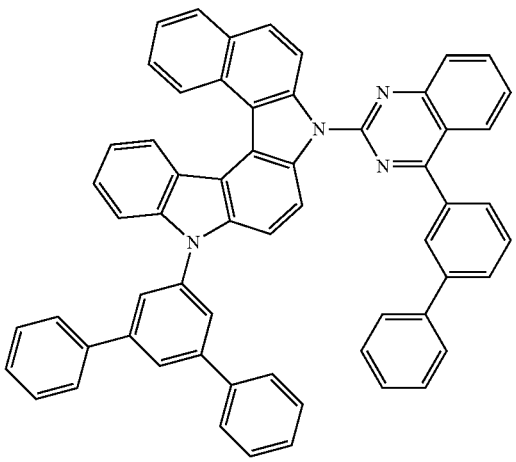
37
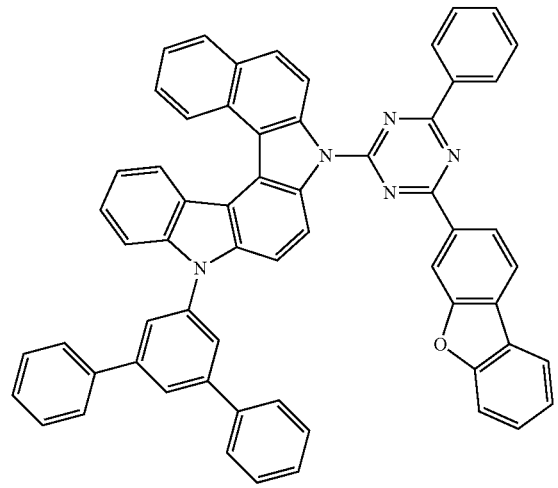
38
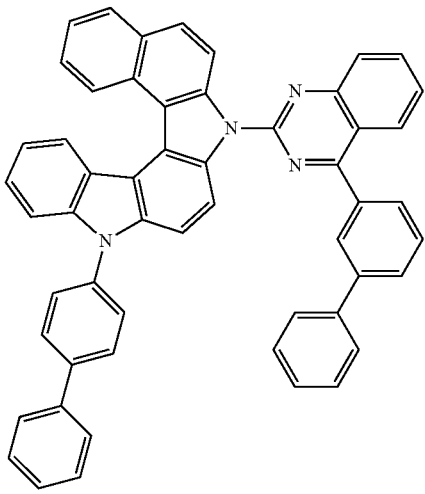

-continued
39
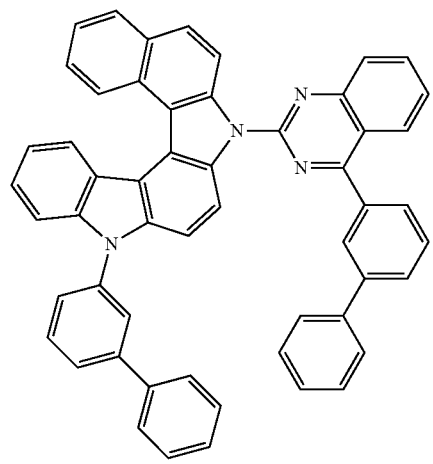
40
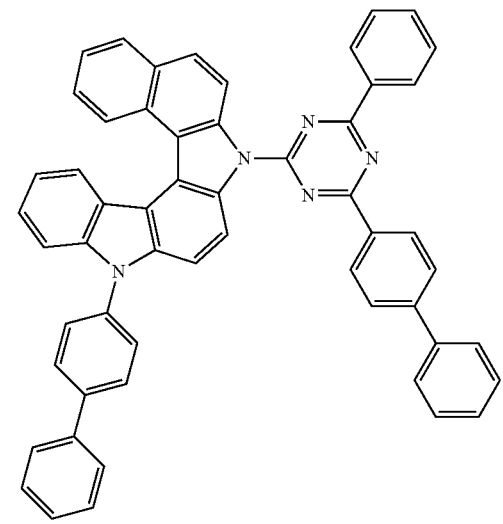
41
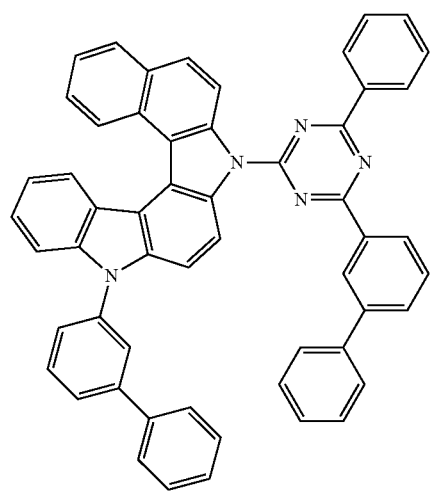
42
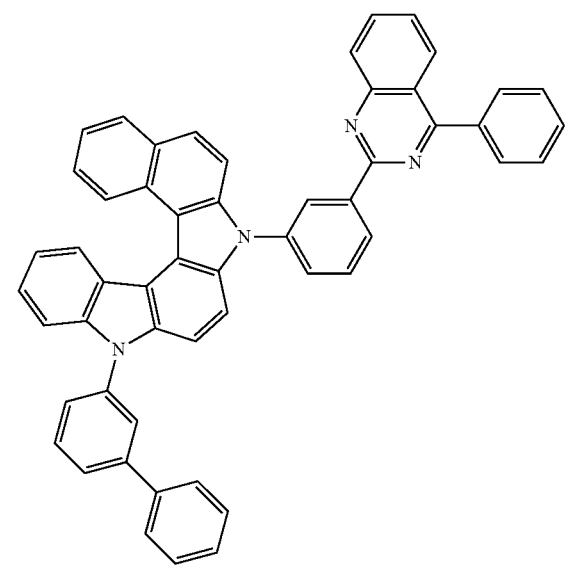
43
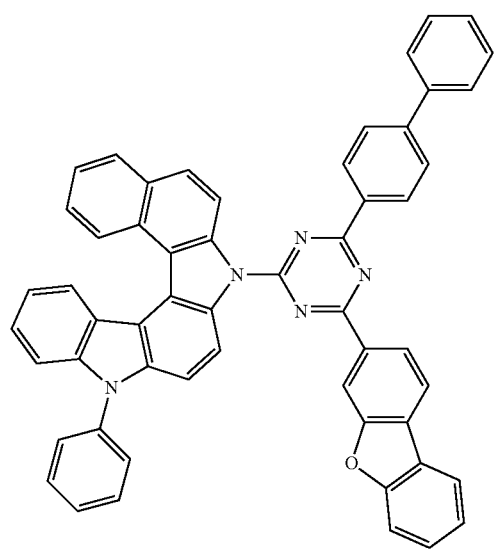
44
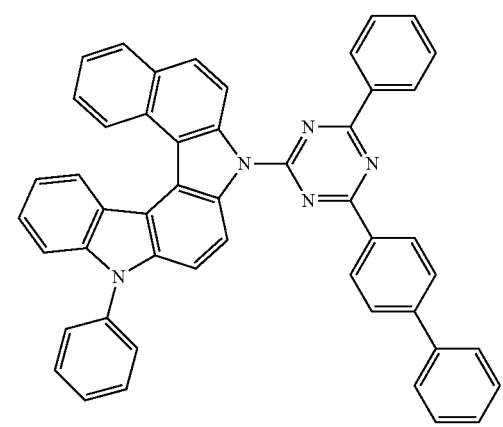

-continued
45
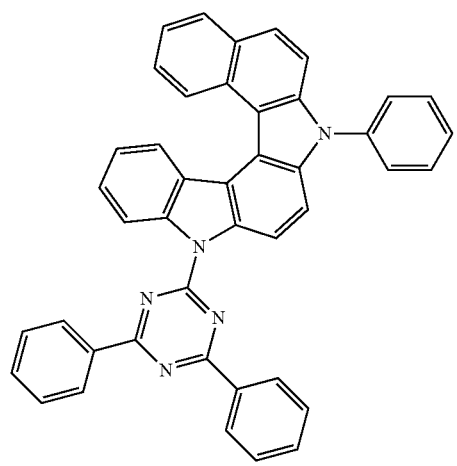
46
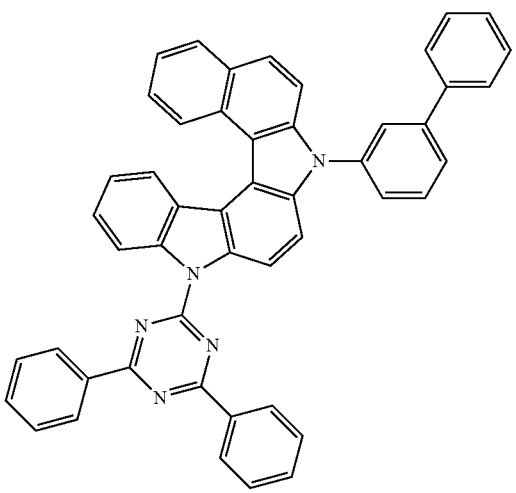
47
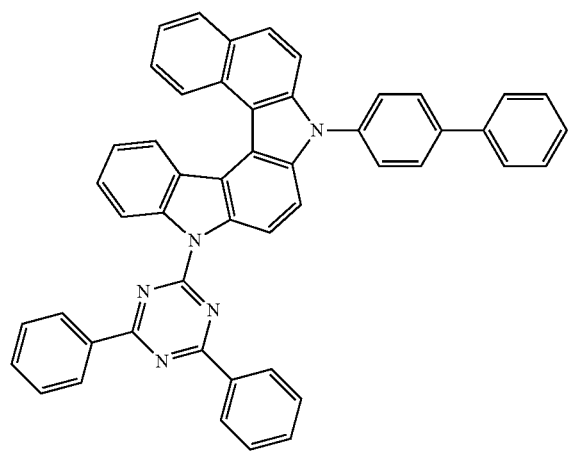
48
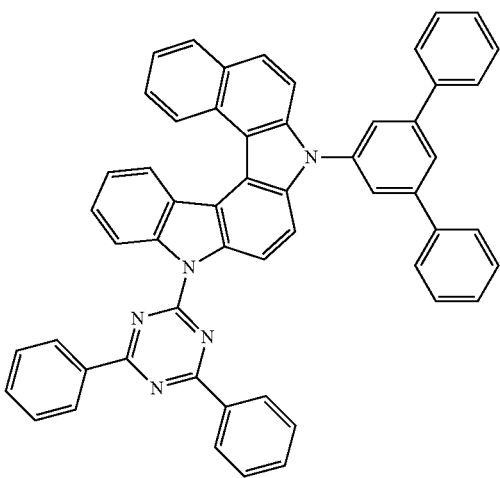
49
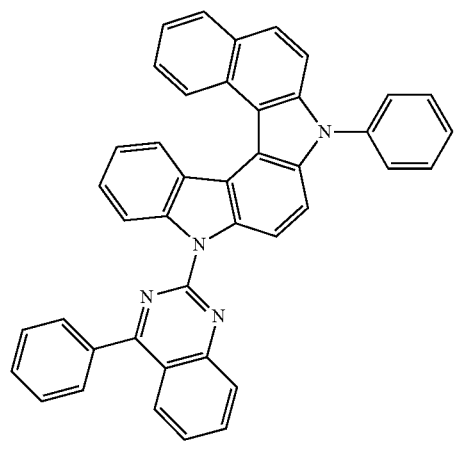
50
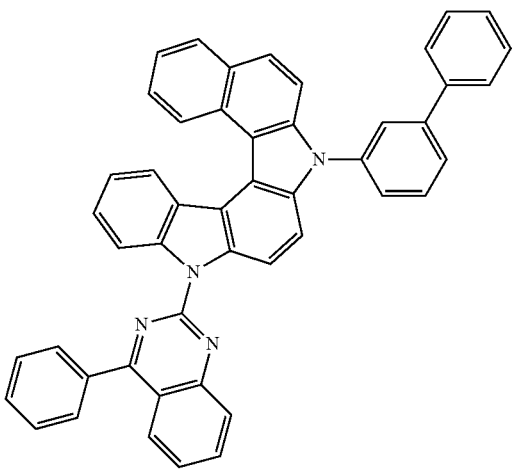

51
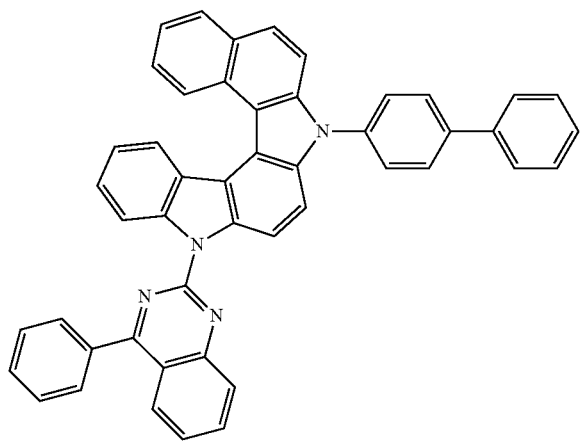
52
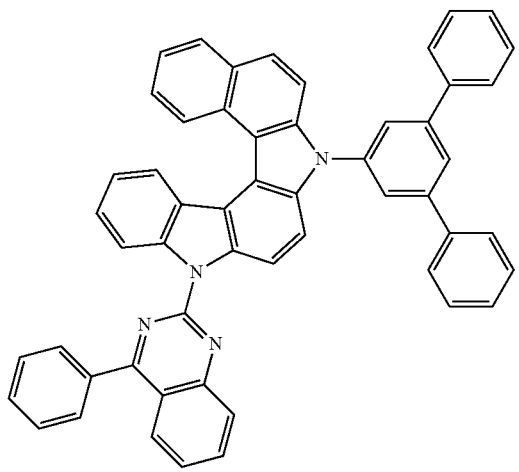
53
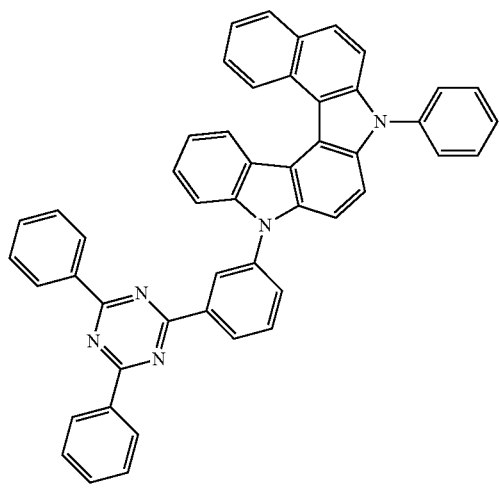
54
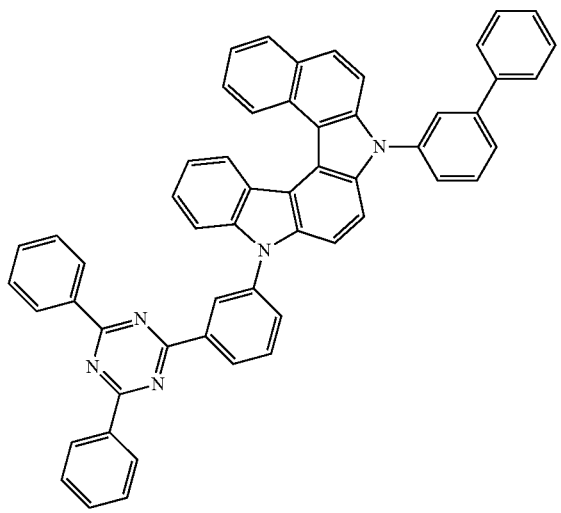
55
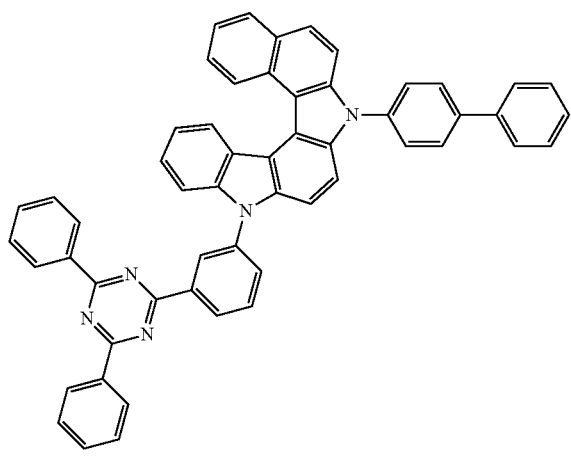
56
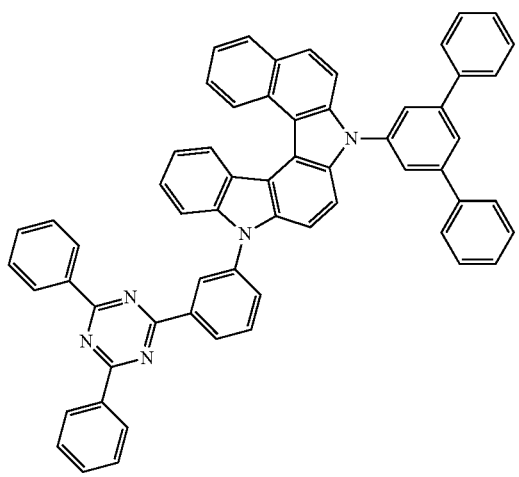

-continued
57
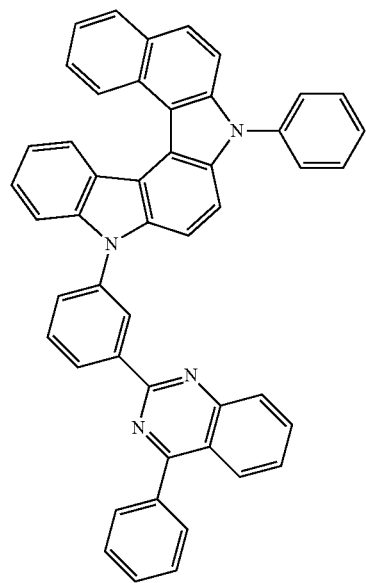
58
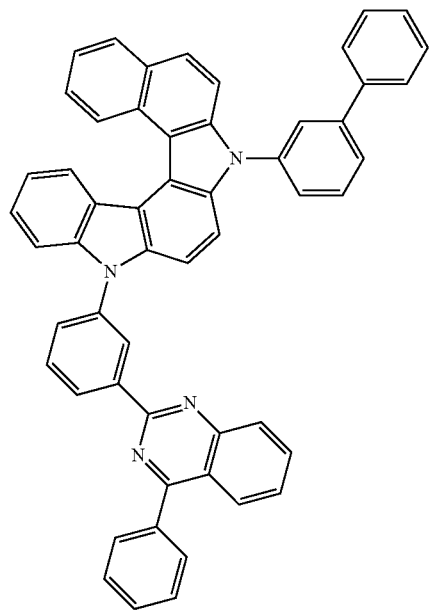
59
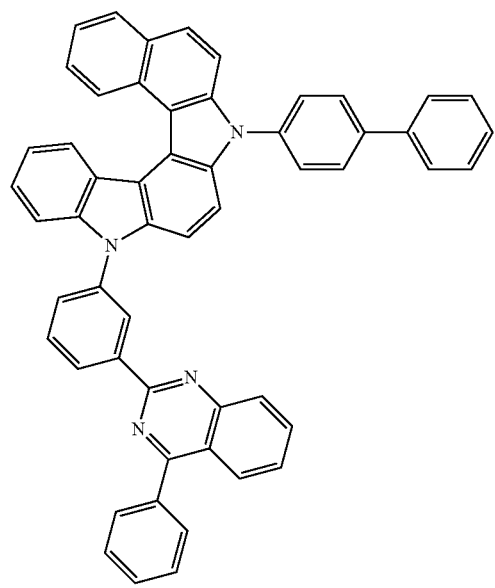
60
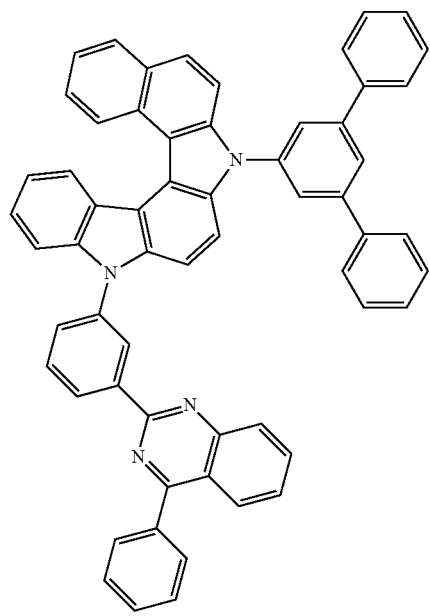
61
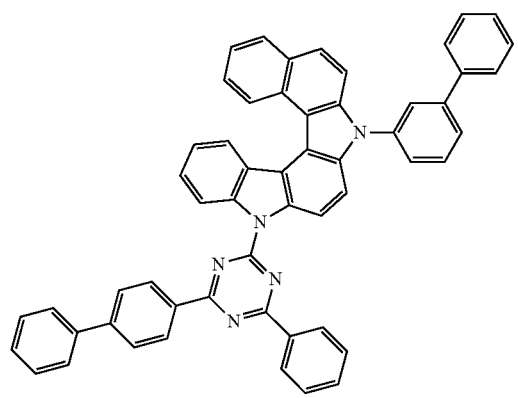
62
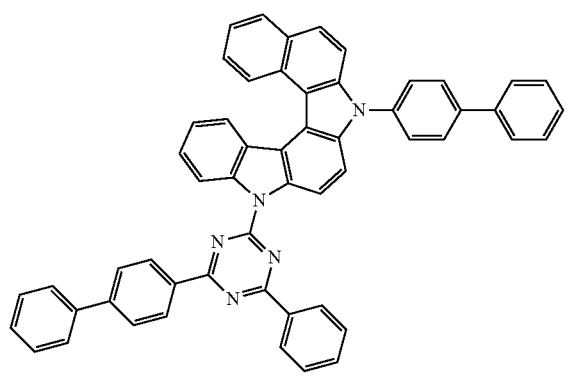

-continued
63
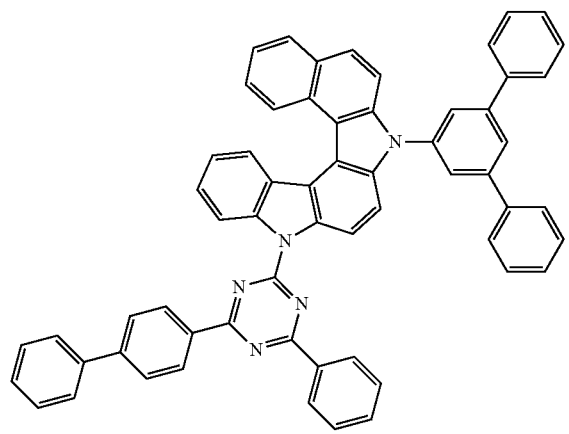
64
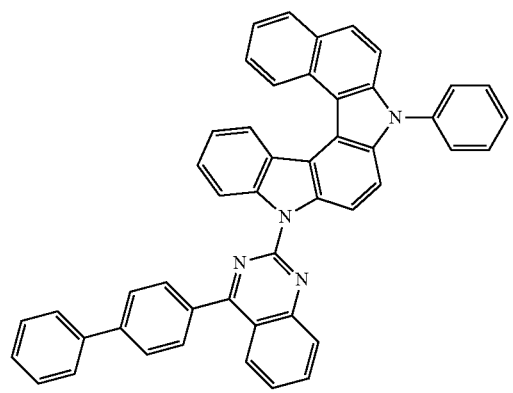
65
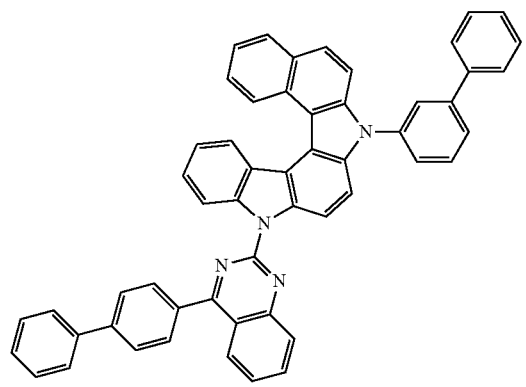
66
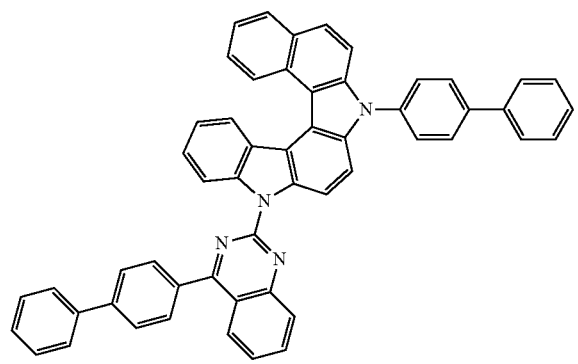
67
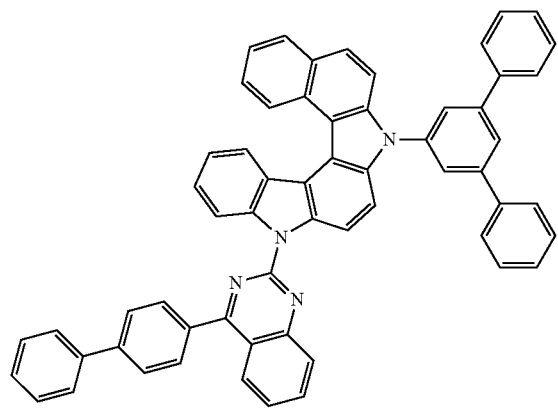
68
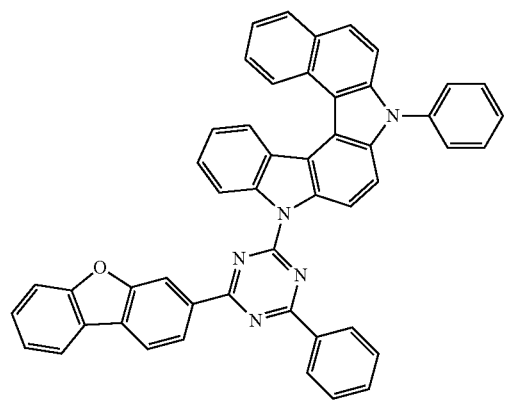

-continued
69
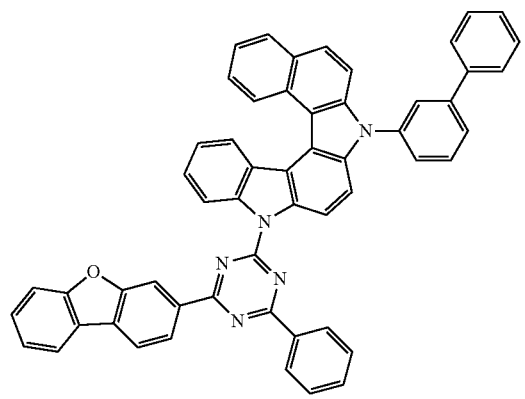
70
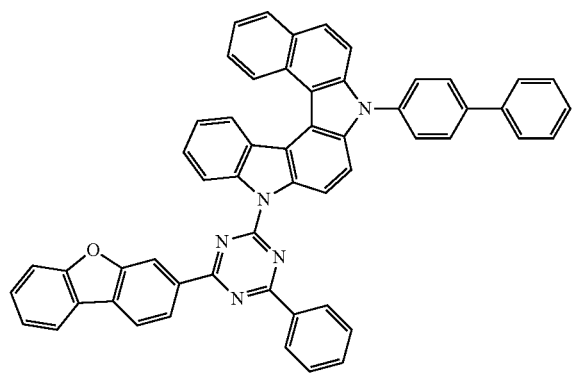
71
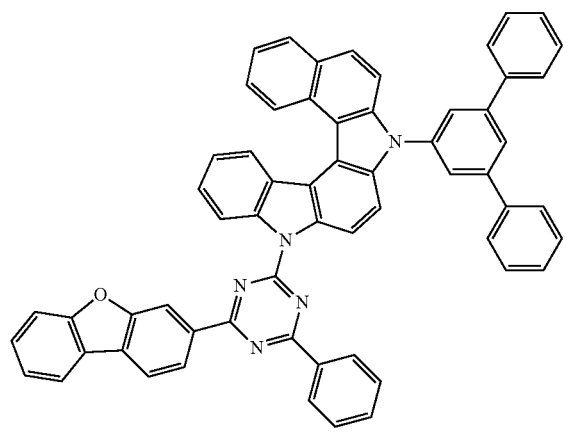
72
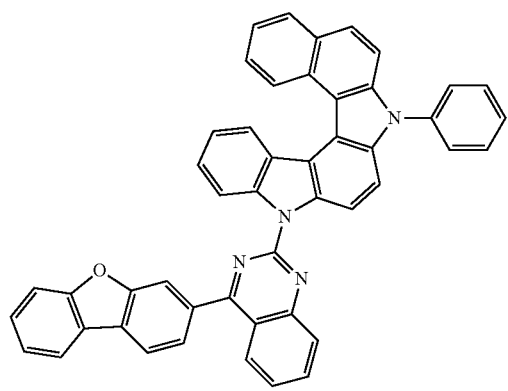
73
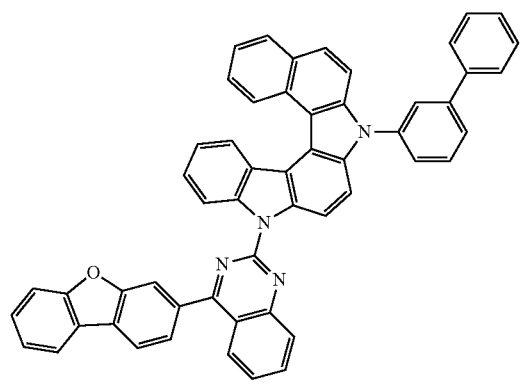
74
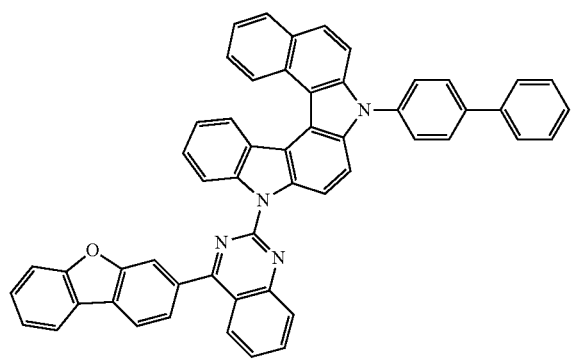

-continued
75
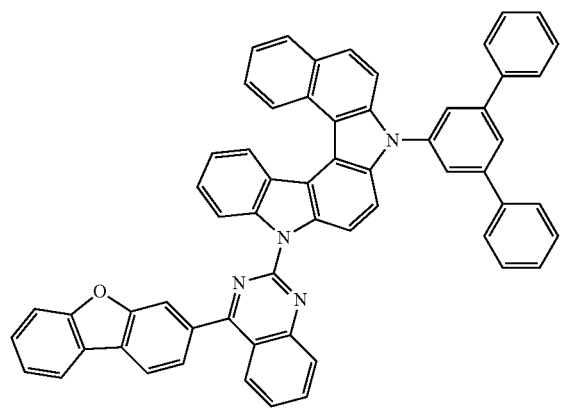
76
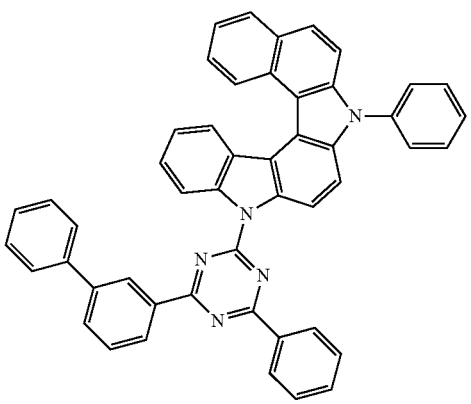
77
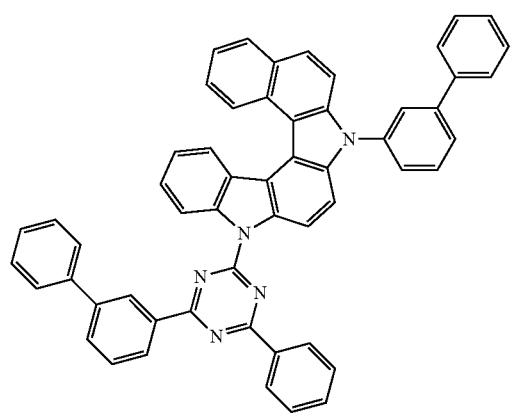
78
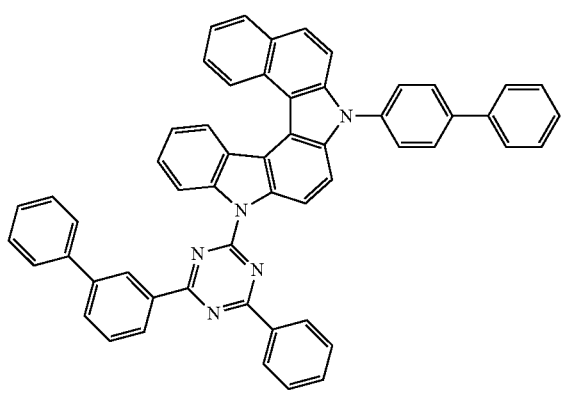
79
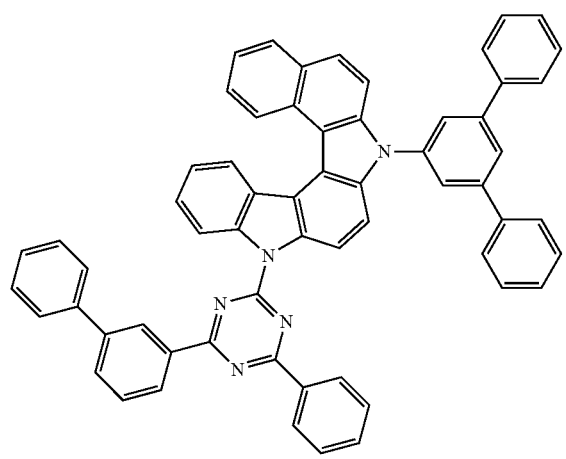
80
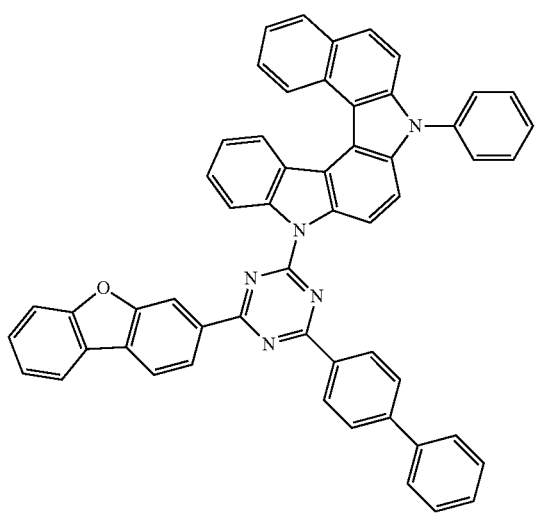

-continued
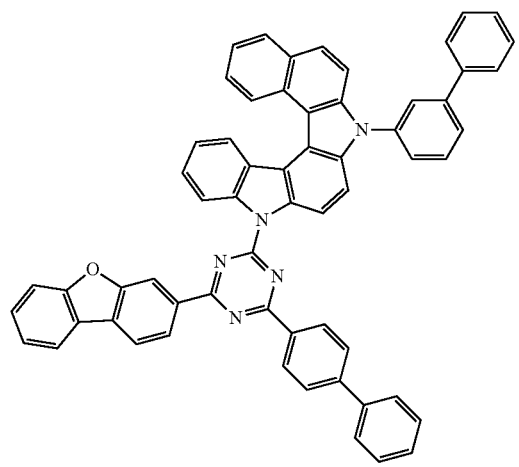
81
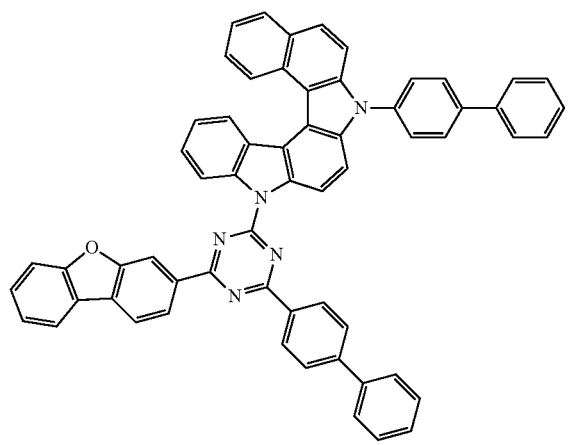
82
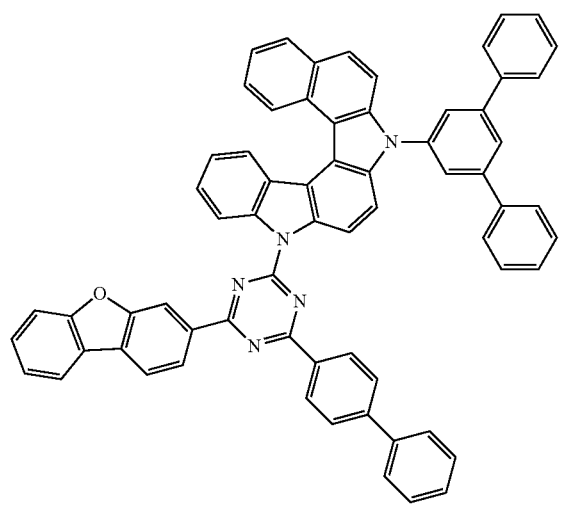
83
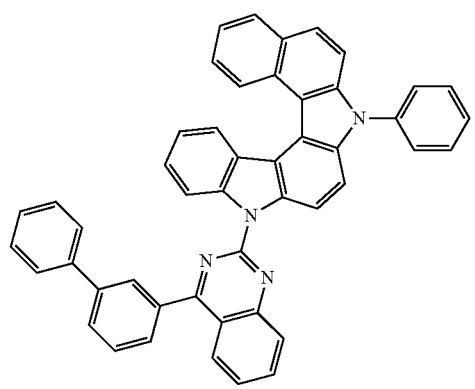
84
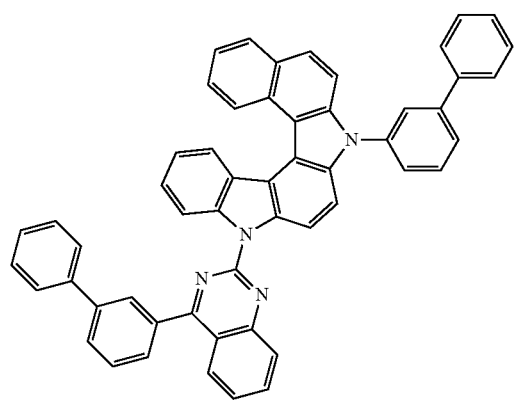
85
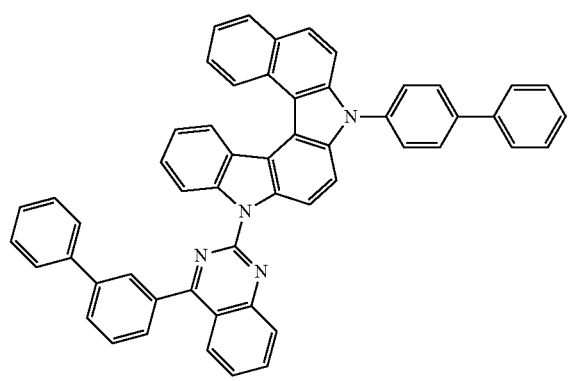
86

87
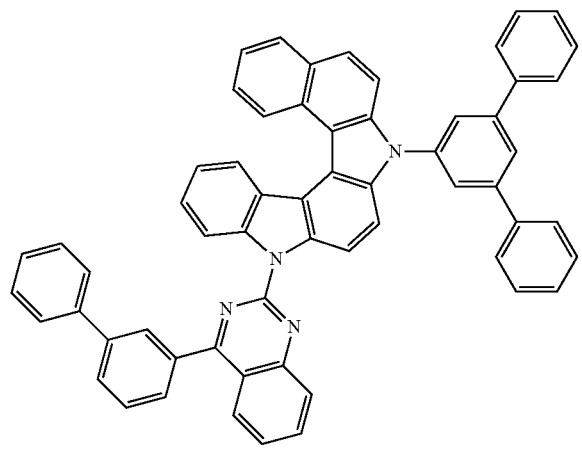
88
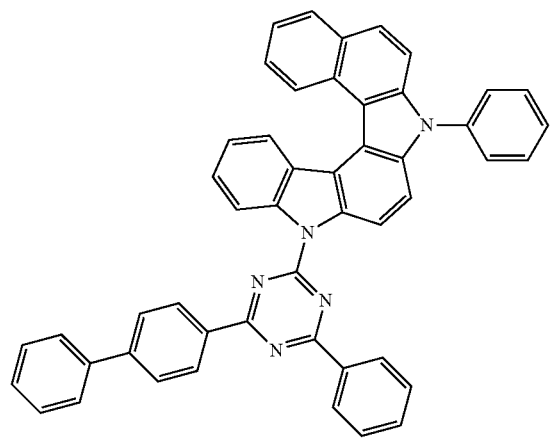
89
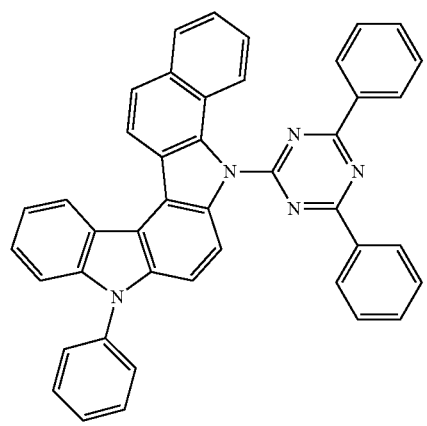
90
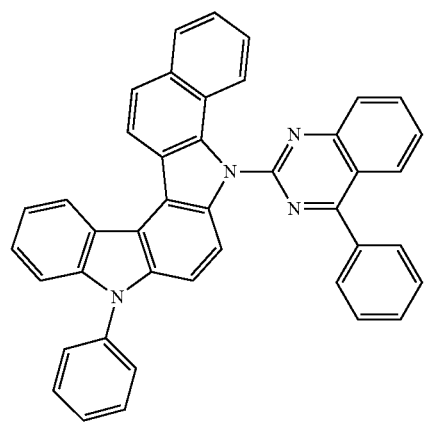
91
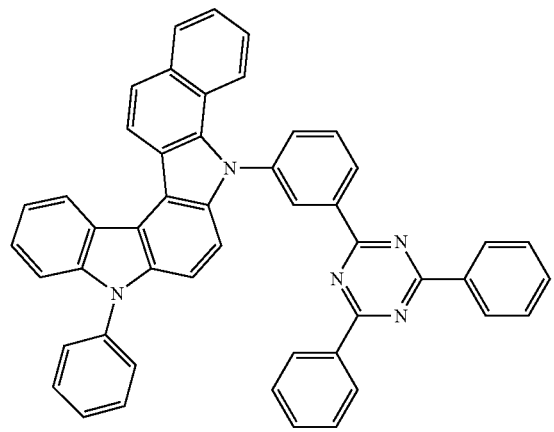
92
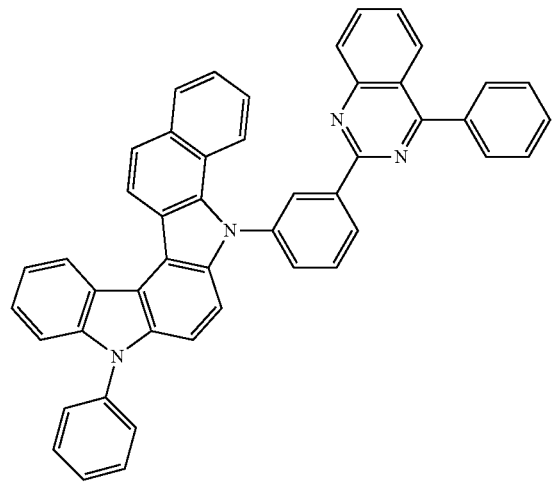

93
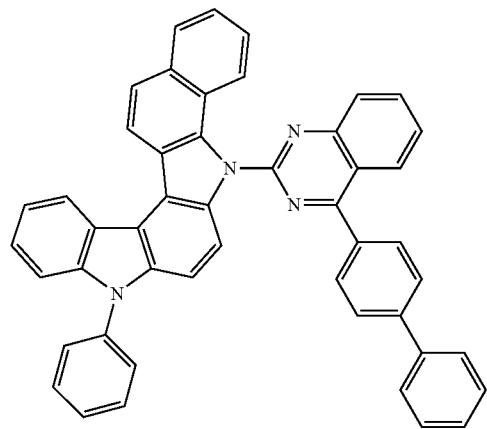
94
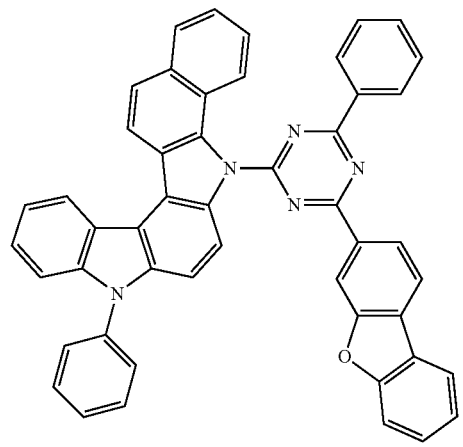
95
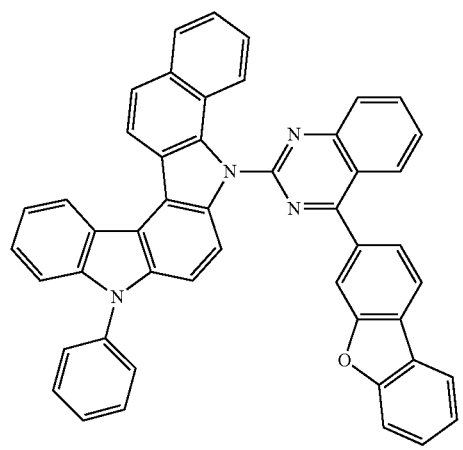
96
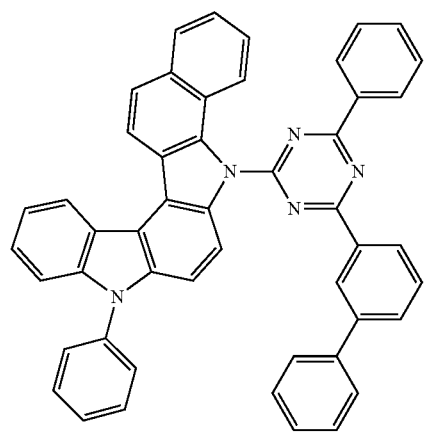
97
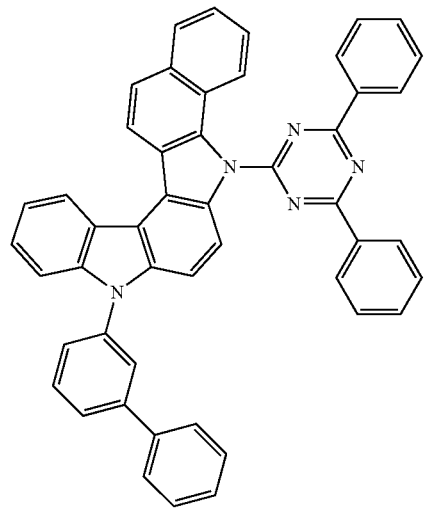
98
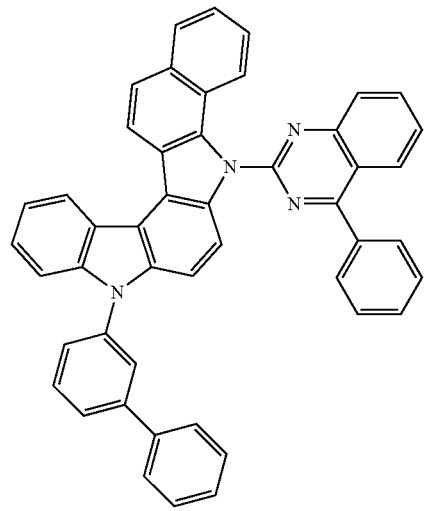

99
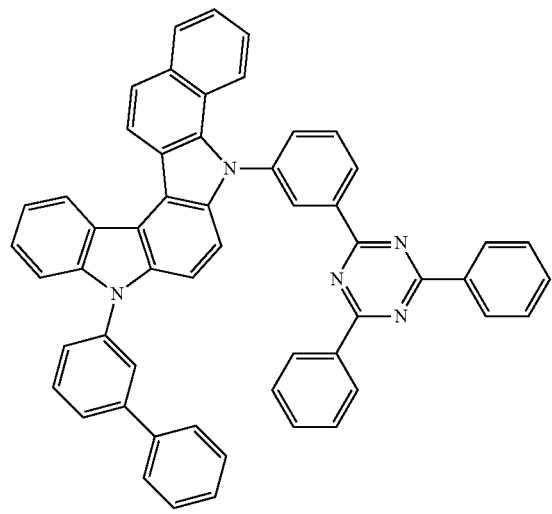
100
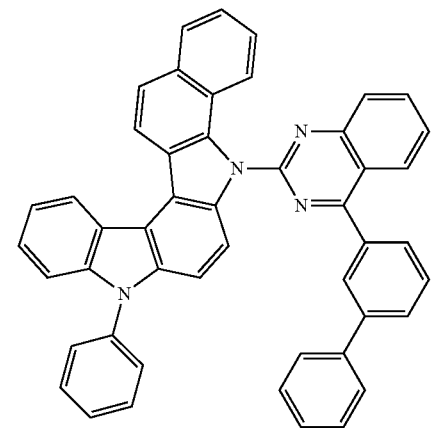
101
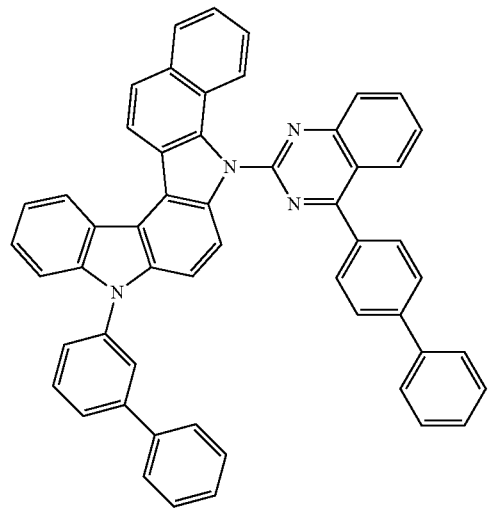
102
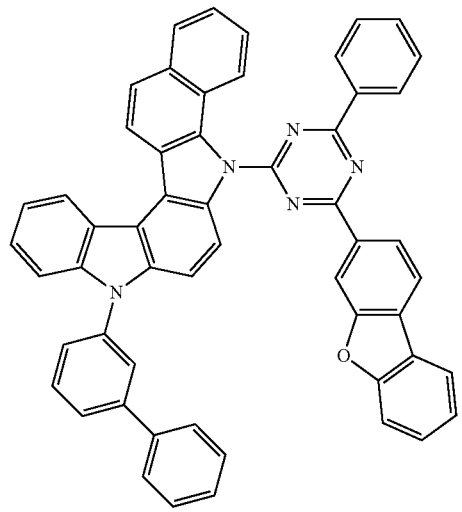
103
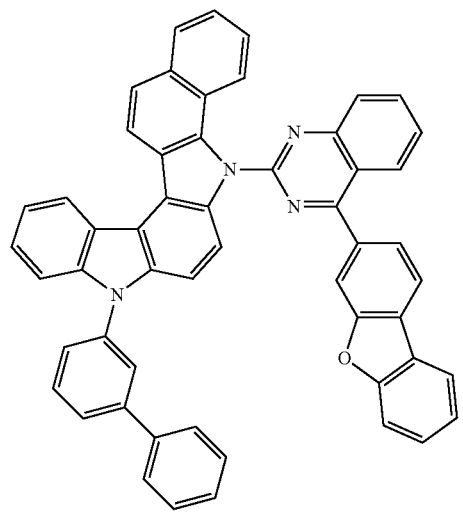
104
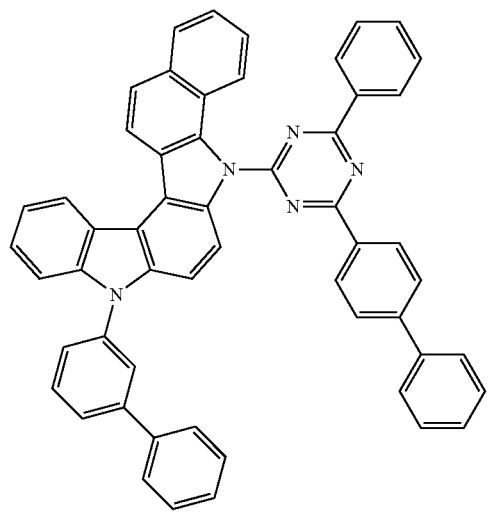

-continued
105 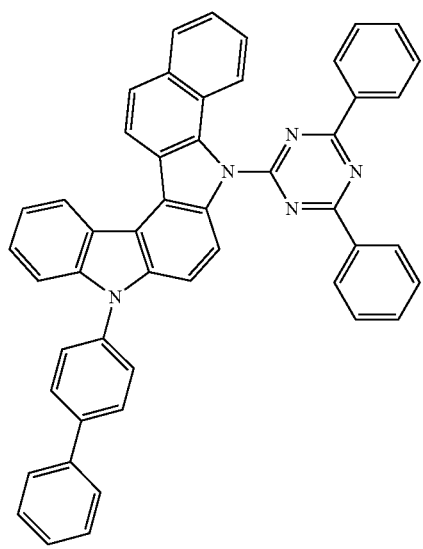
106 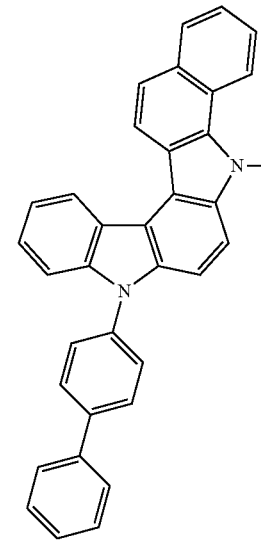
107 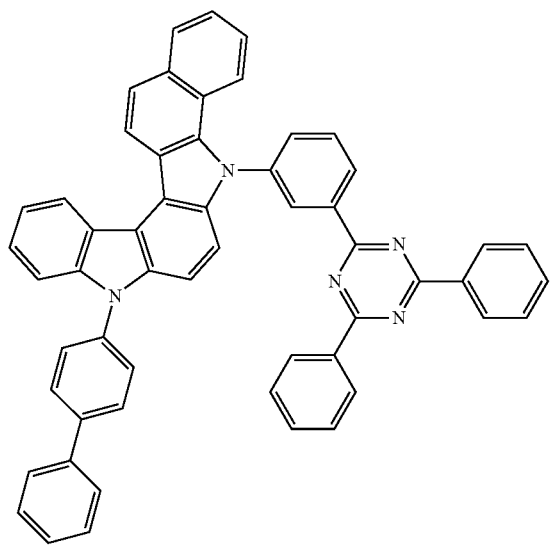
108
109 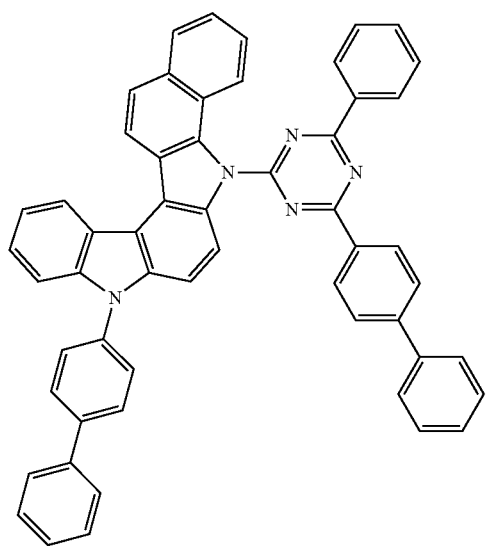
110 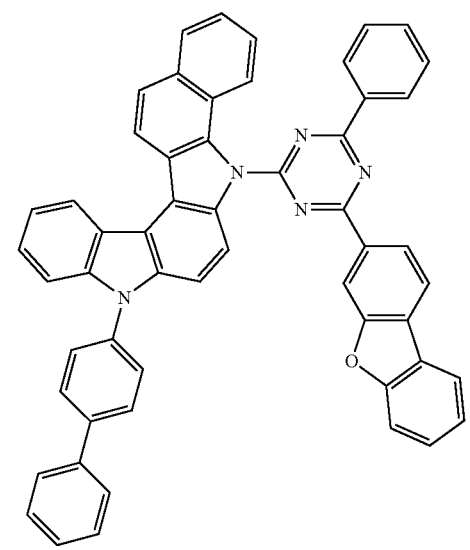

-continued
111
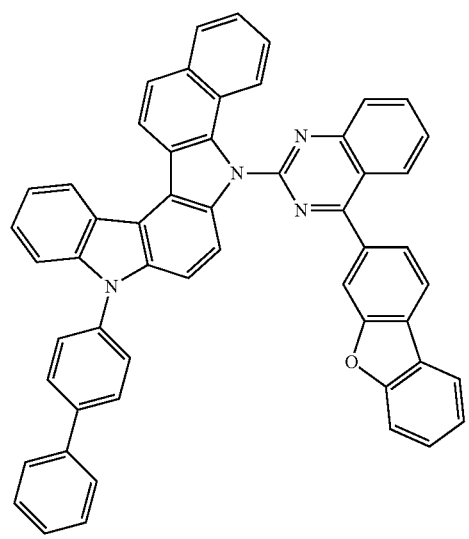
112
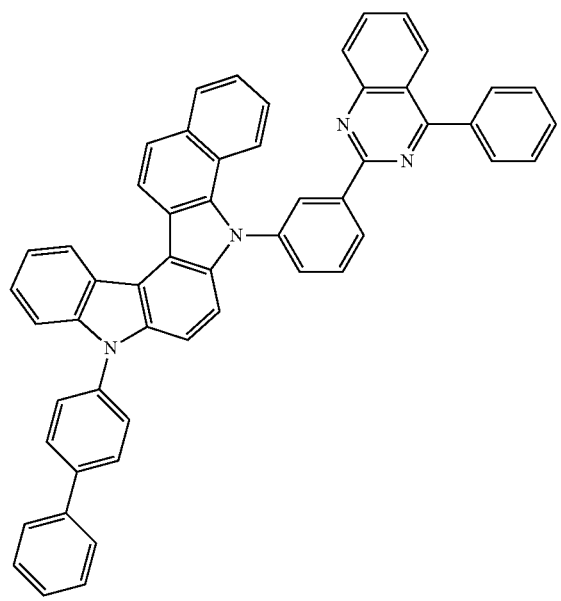
113
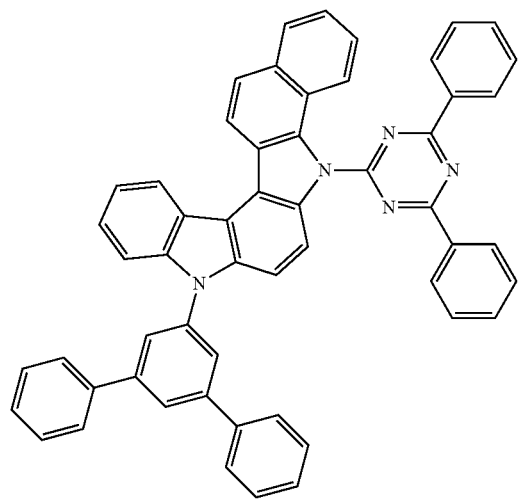
114
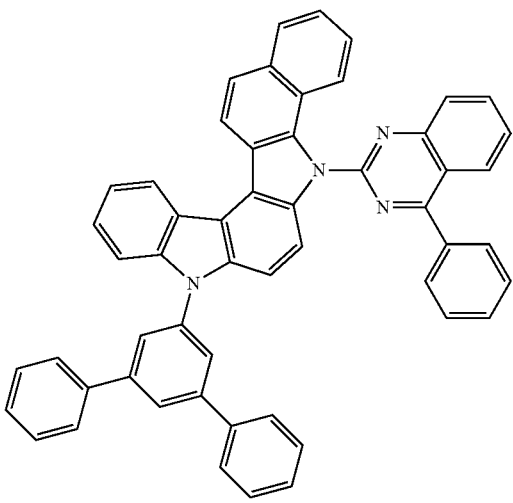

-continued
115
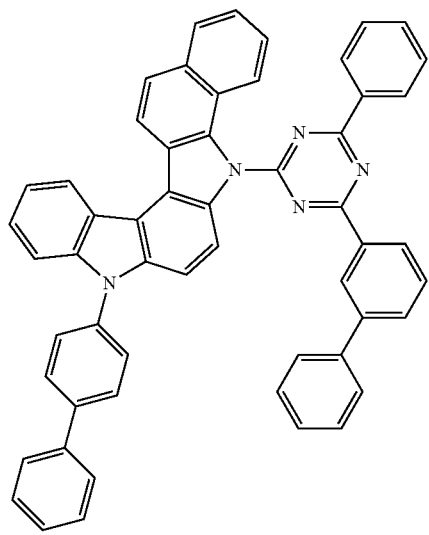
116
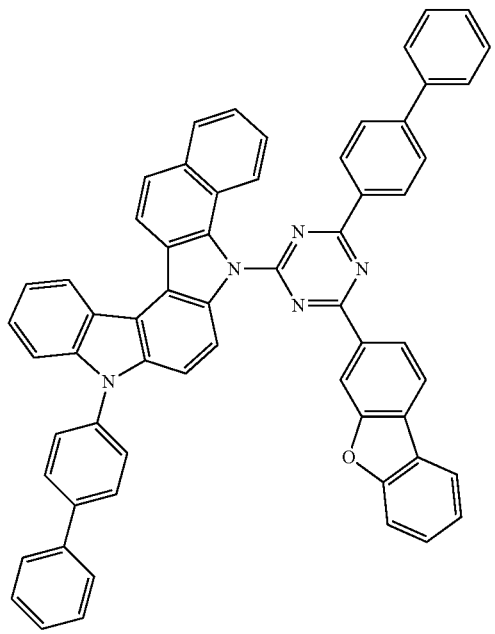
117
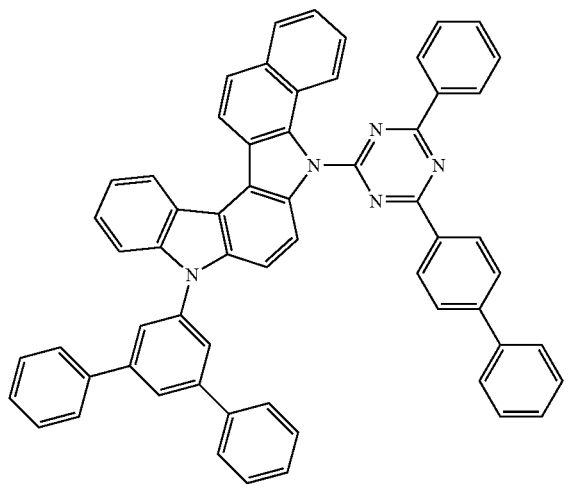
118
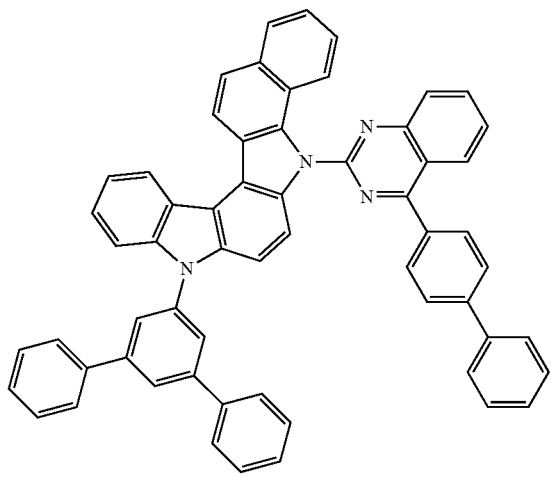
119
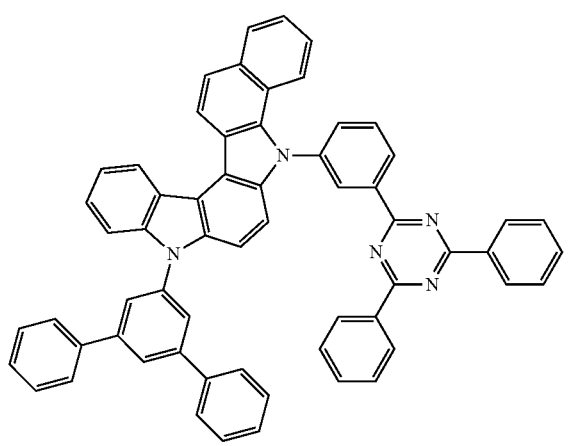
120
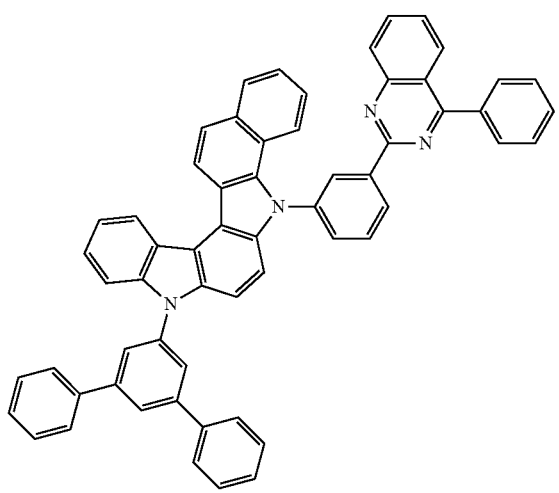

-continued
121
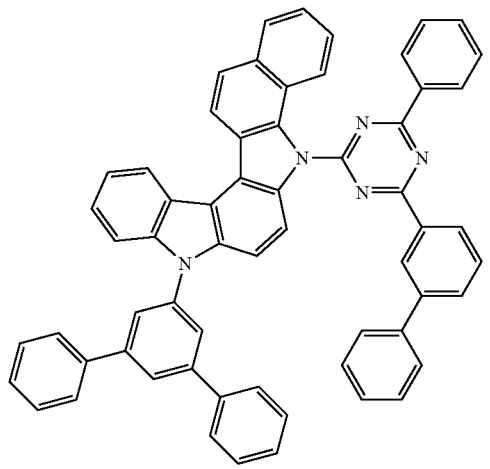
122
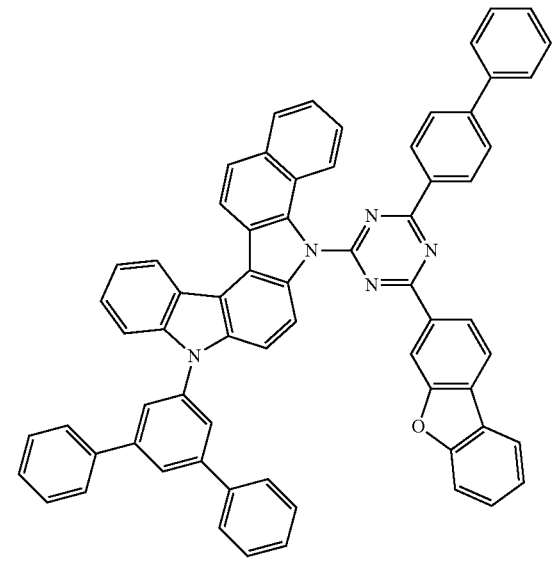
123
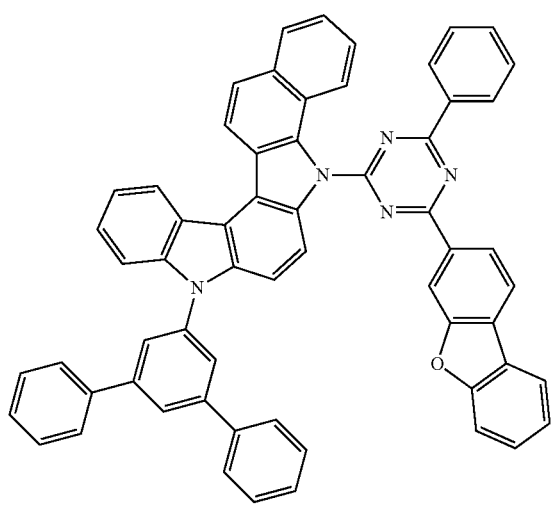
124
125
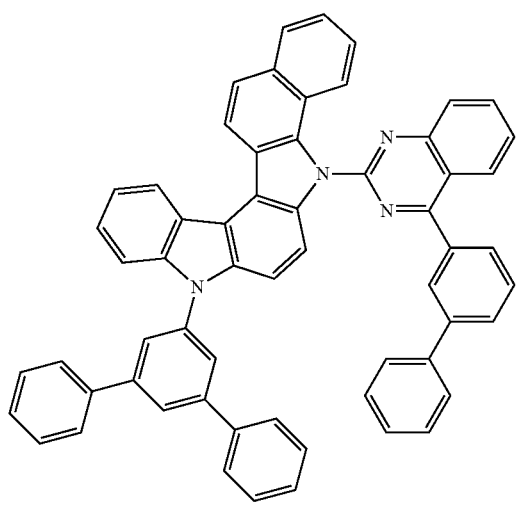
126
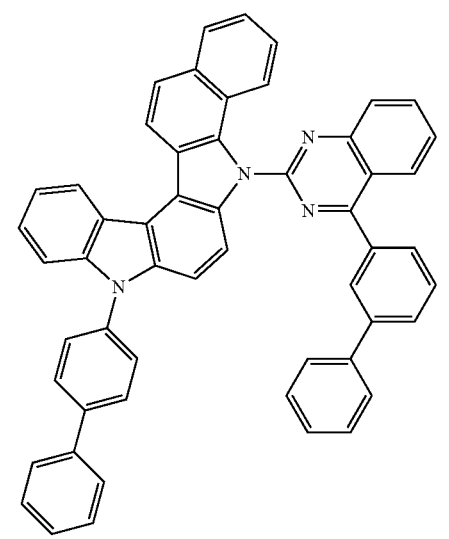

-continued
127
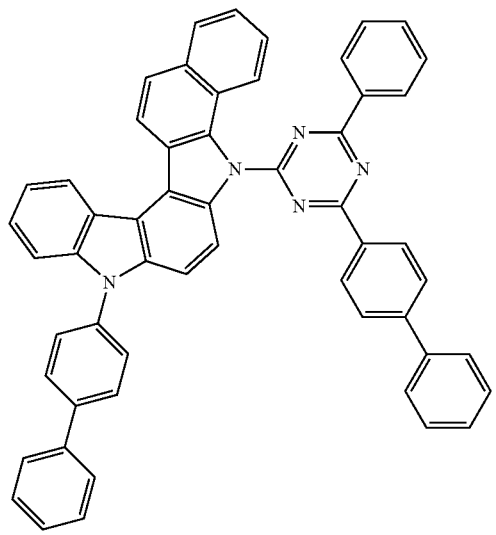
128
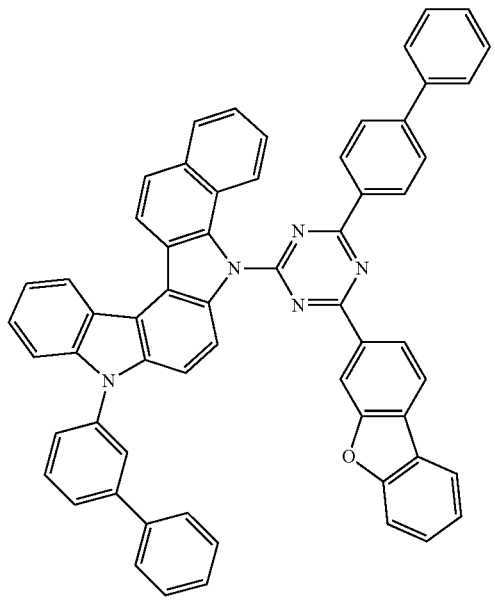
129
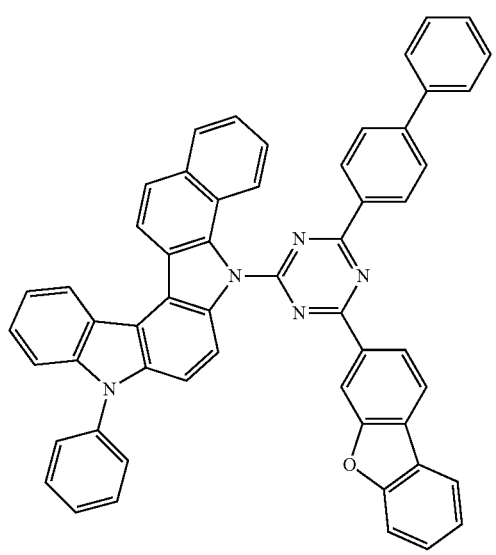
130
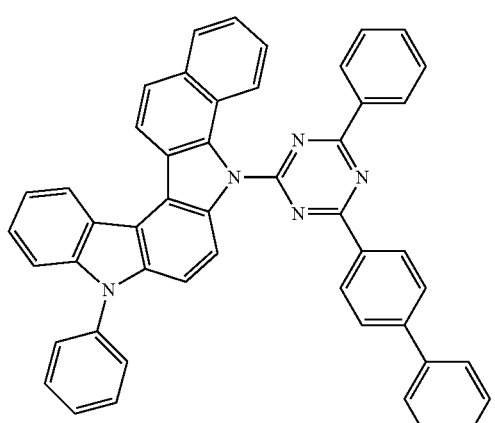

-continued
131
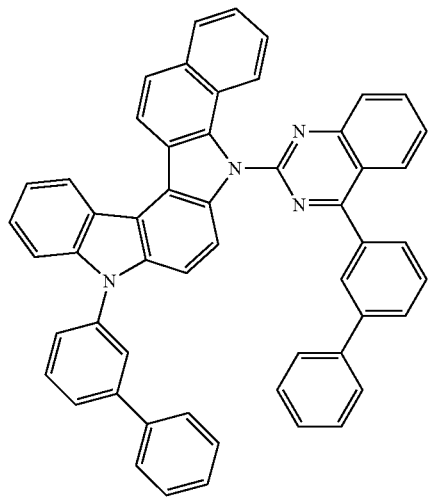
132
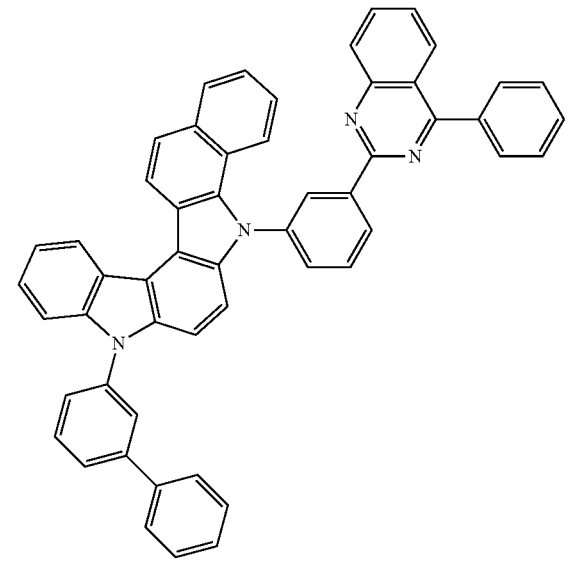
133
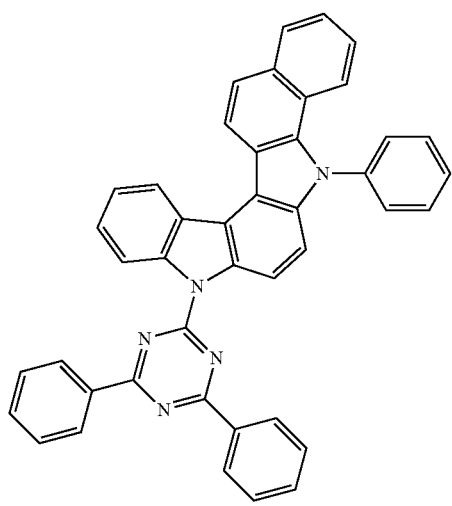
134
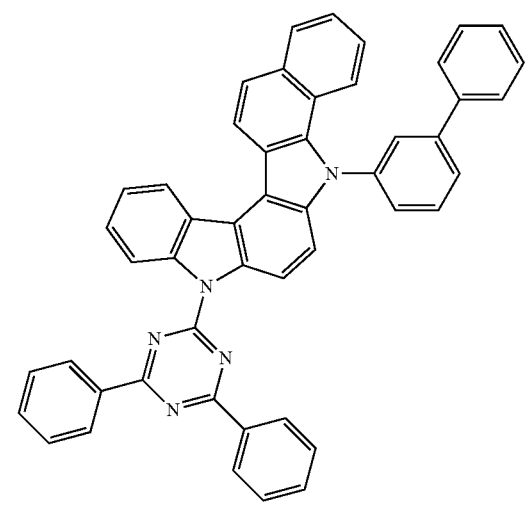
135
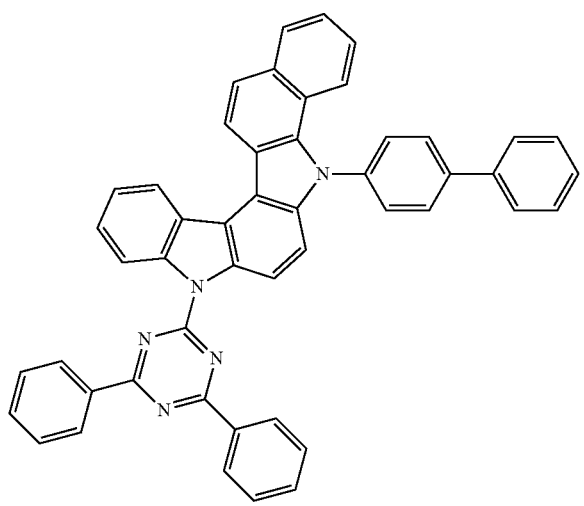
136
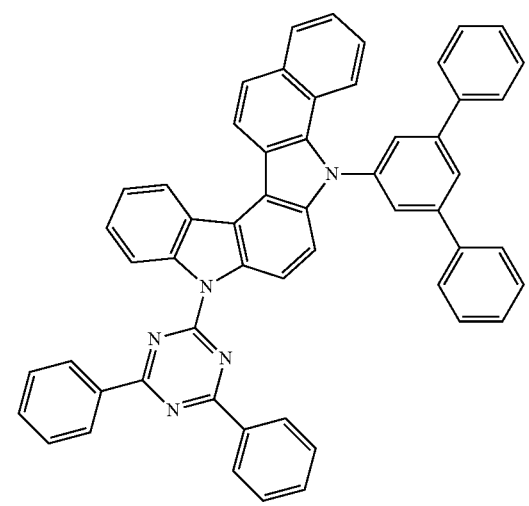

-continued
137
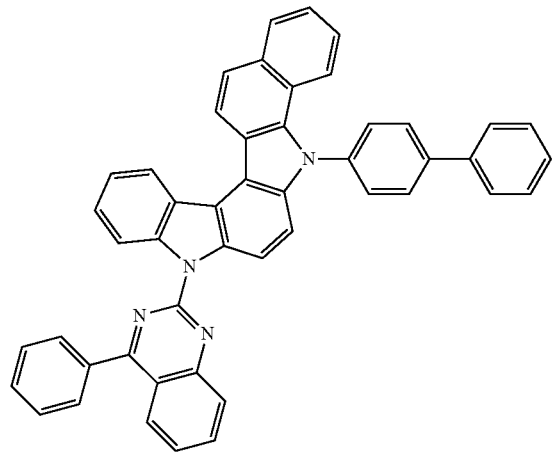
138
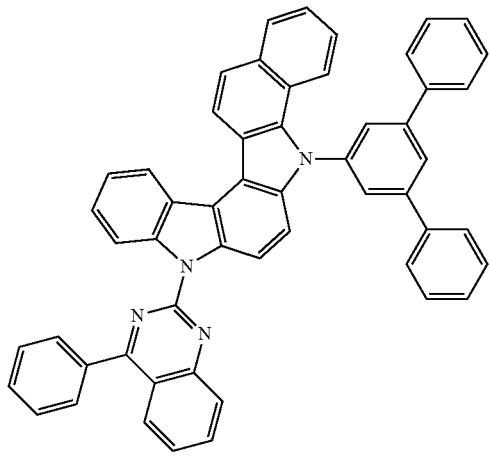
139
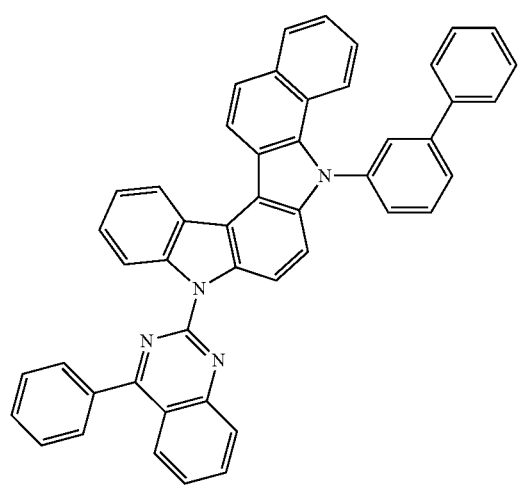
140
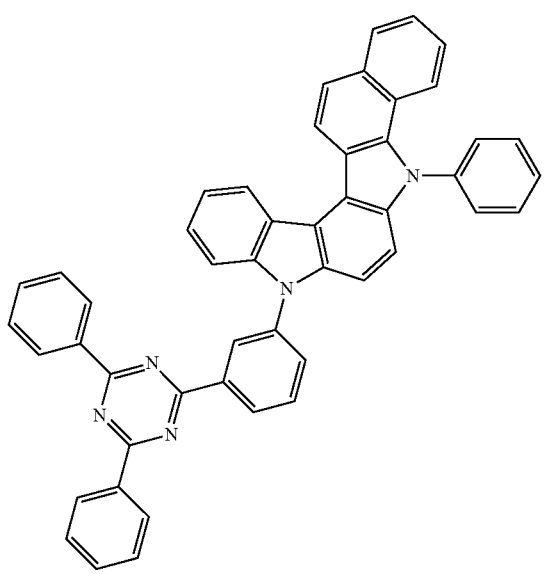
141
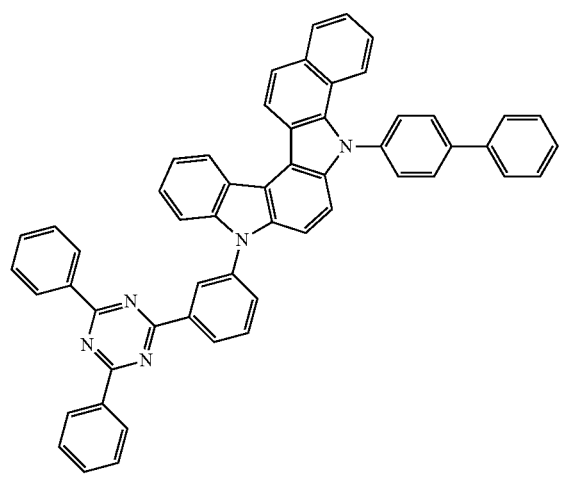
142
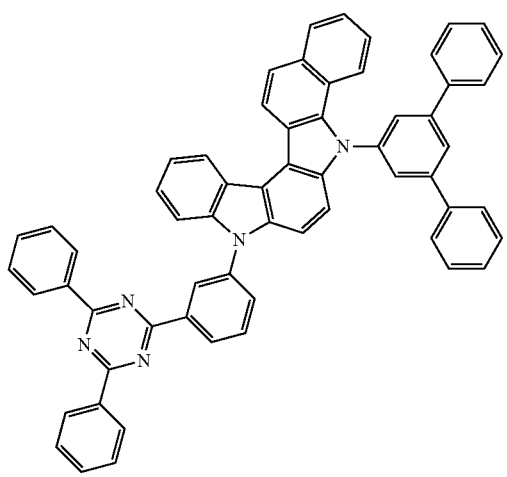

-continued
143
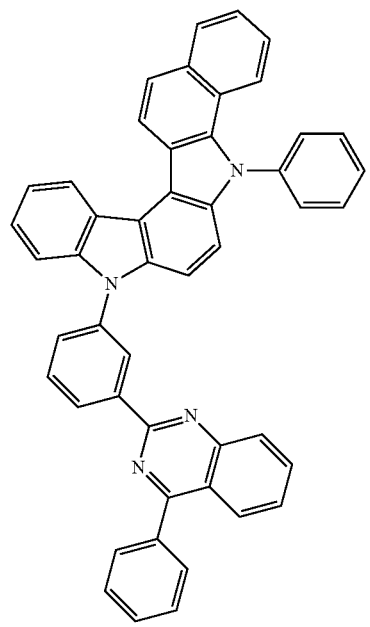
144
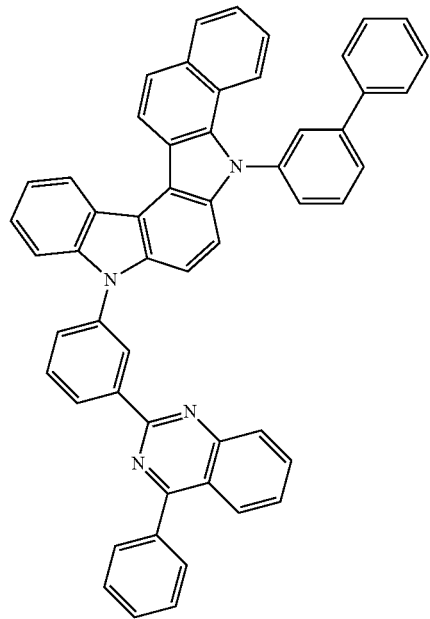
145
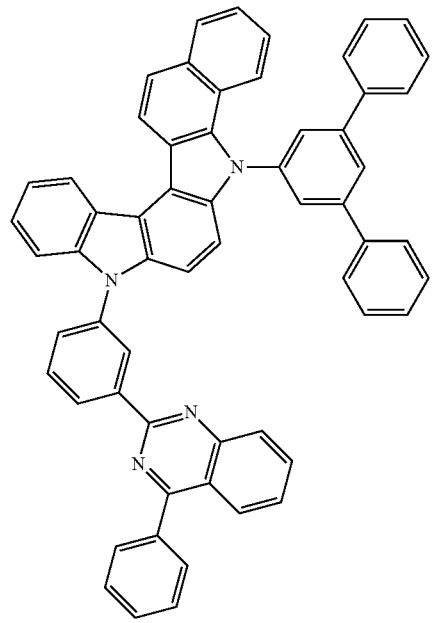
146
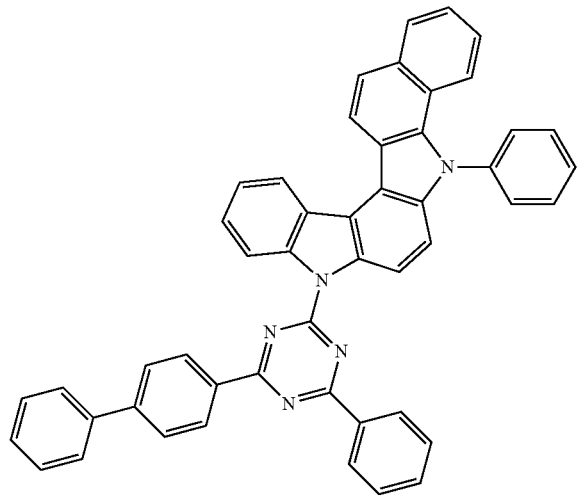

-continued
147
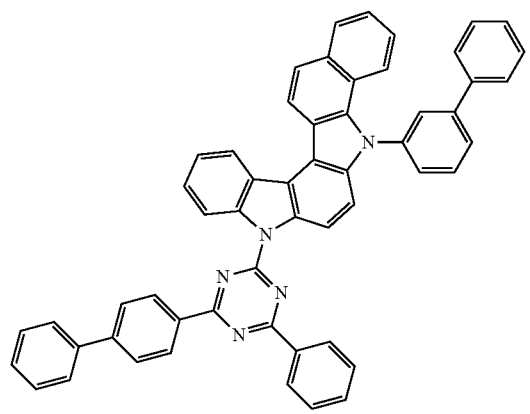
148
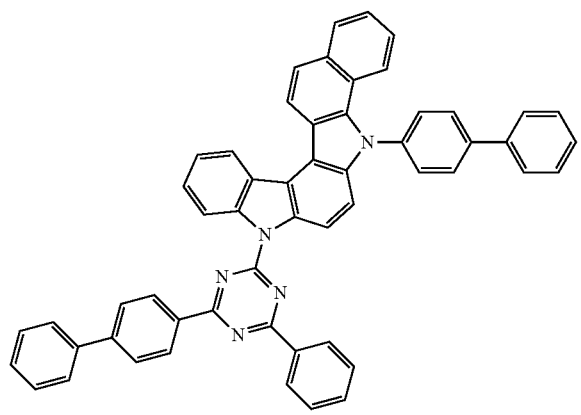
149
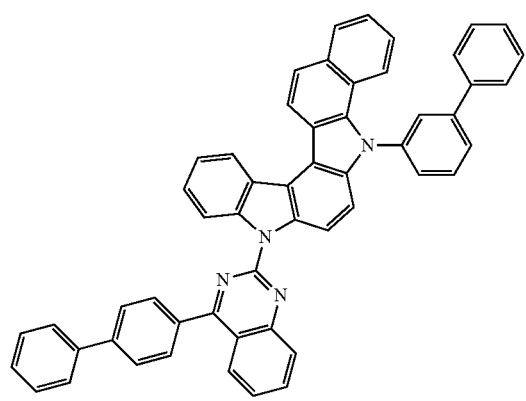
150
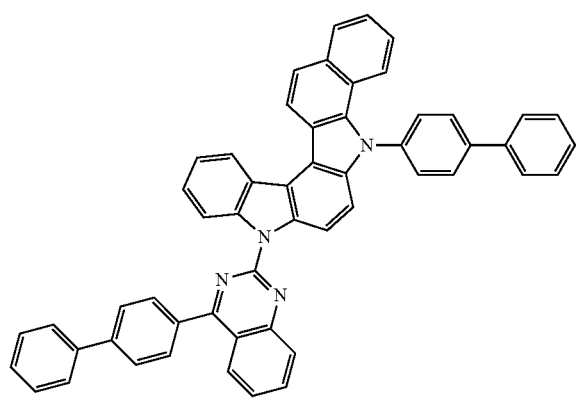
151
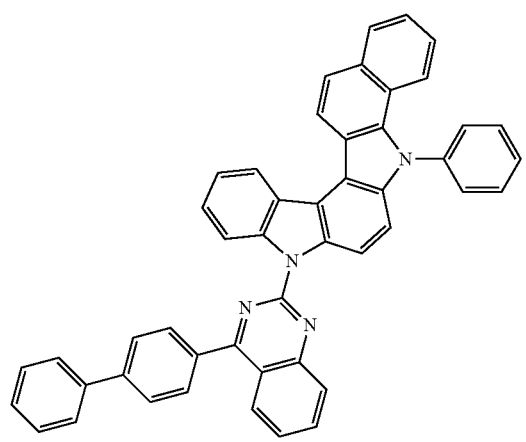
152
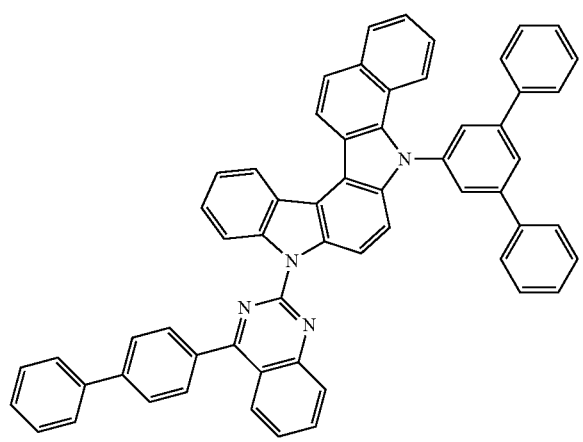

-continued
153
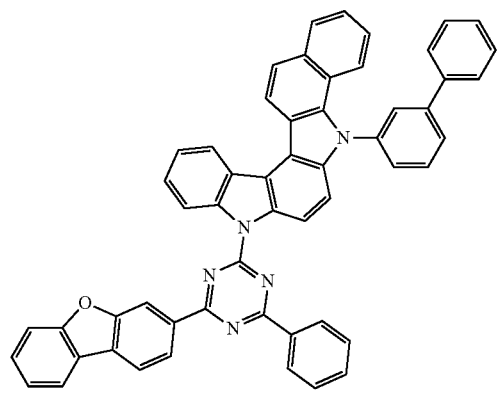
154
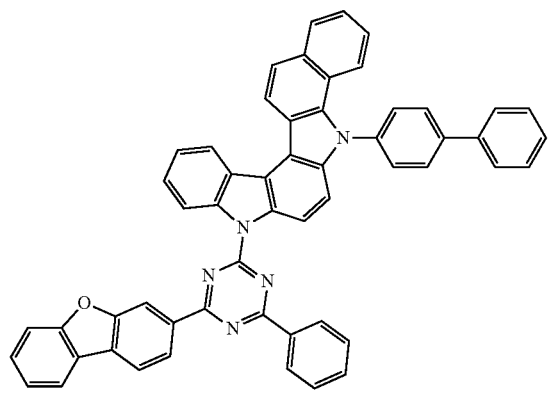
155
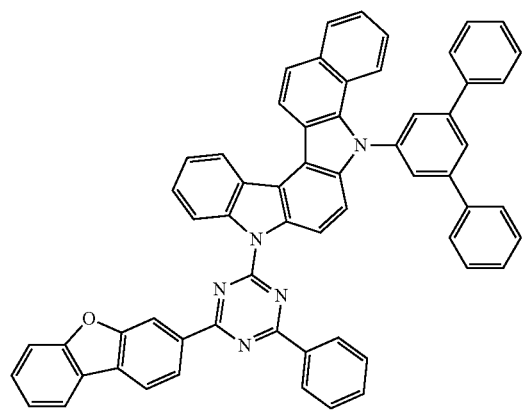
156
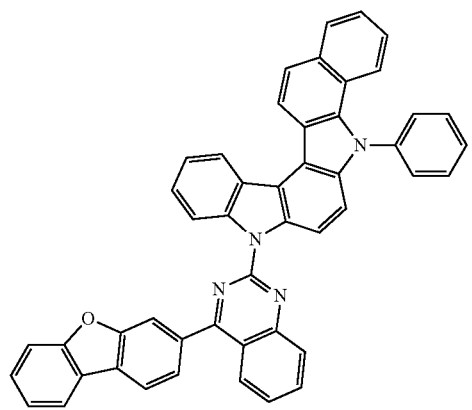
157
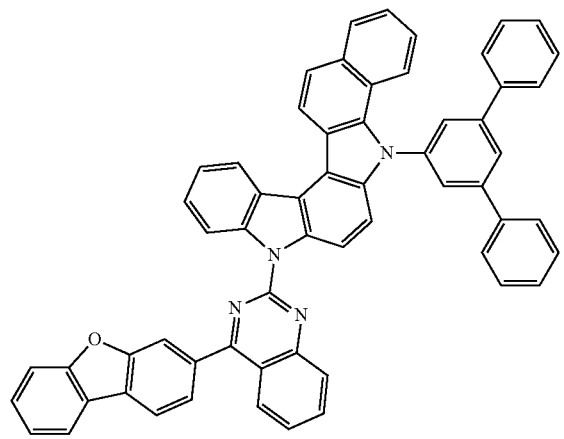
158
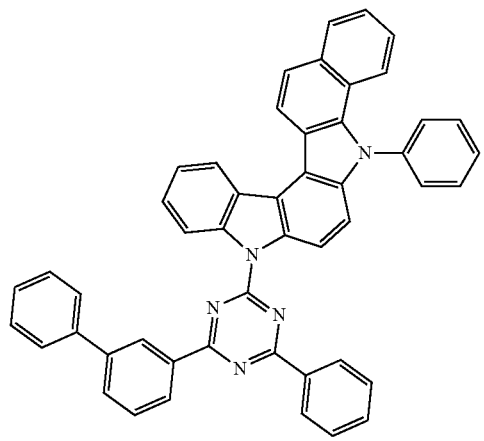

-continued
159
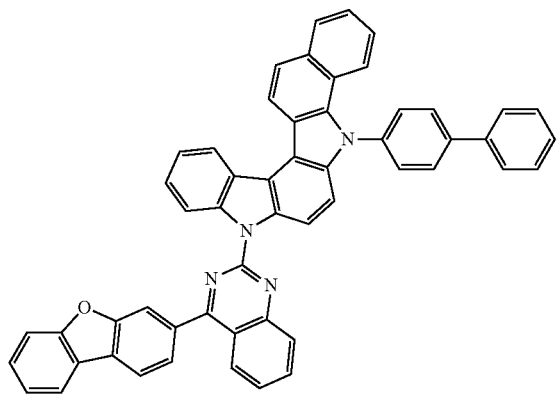
160
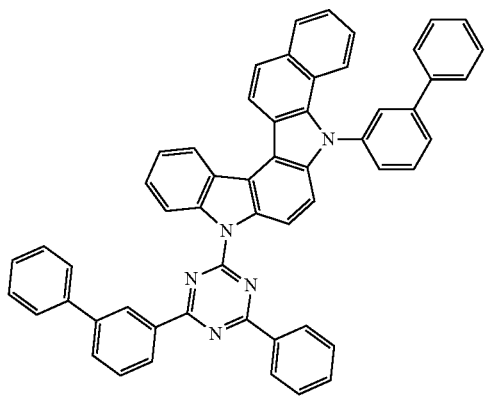
161
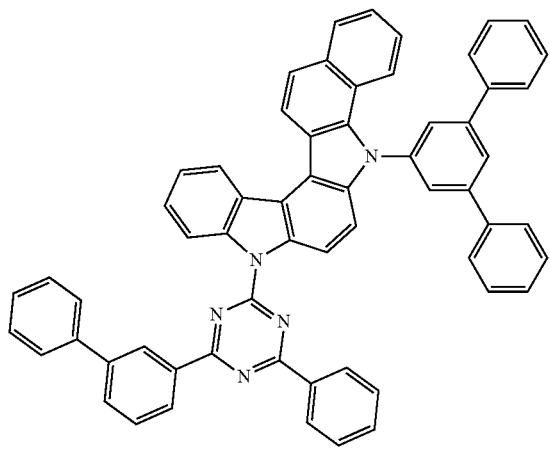
162
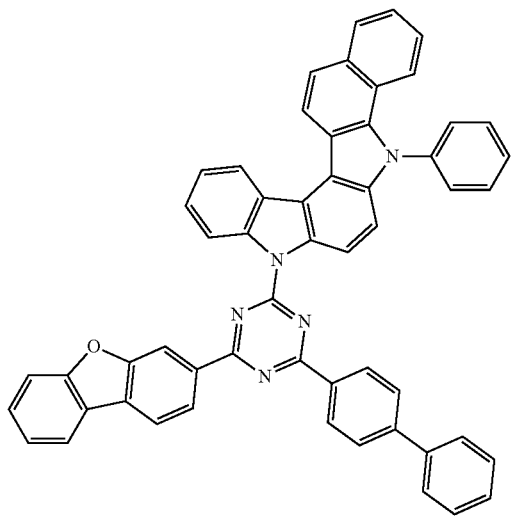
163
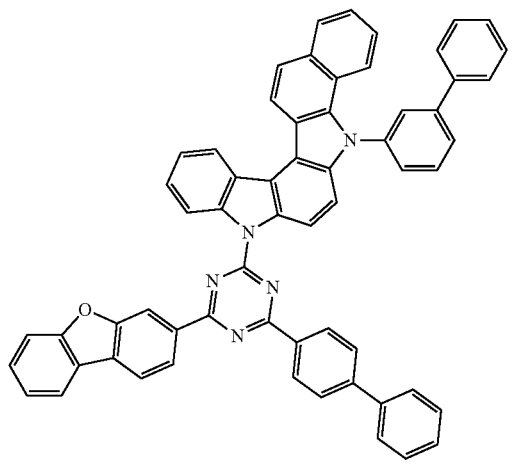
164
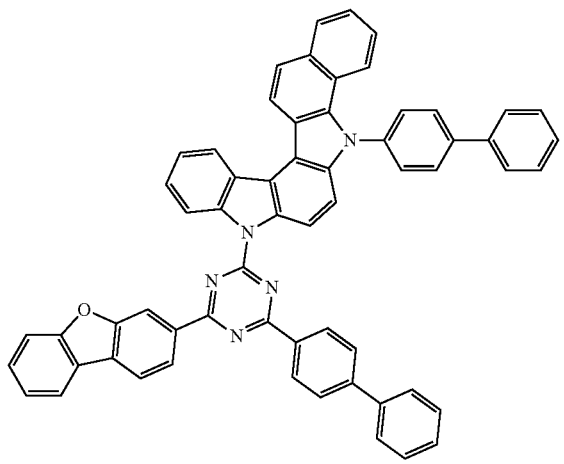

-continued
165
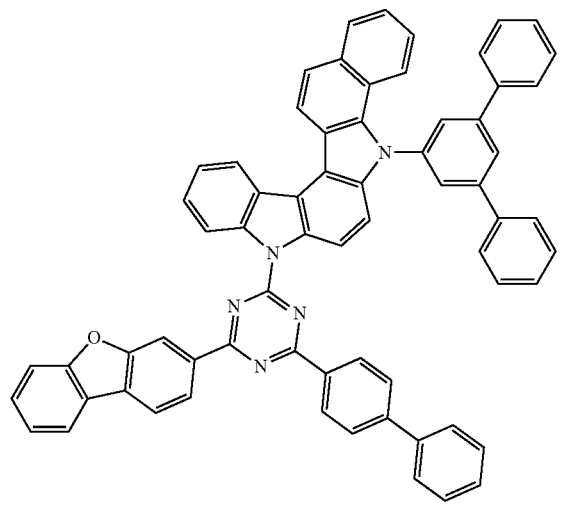
166
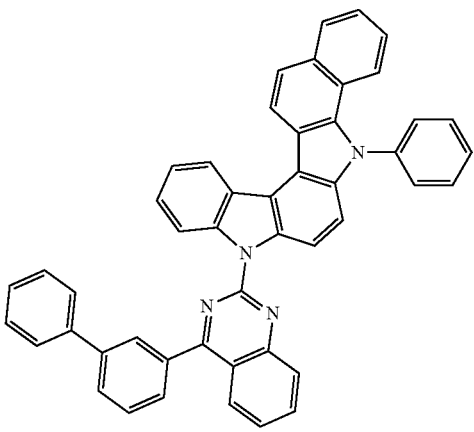
167
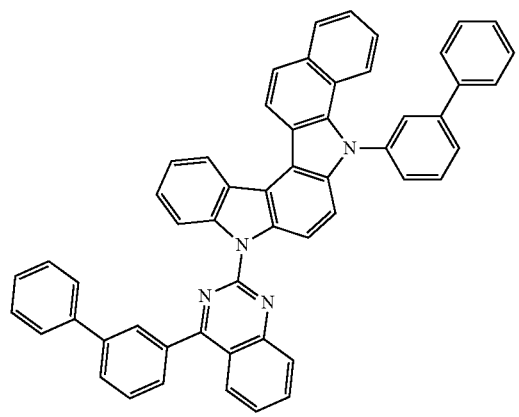
168
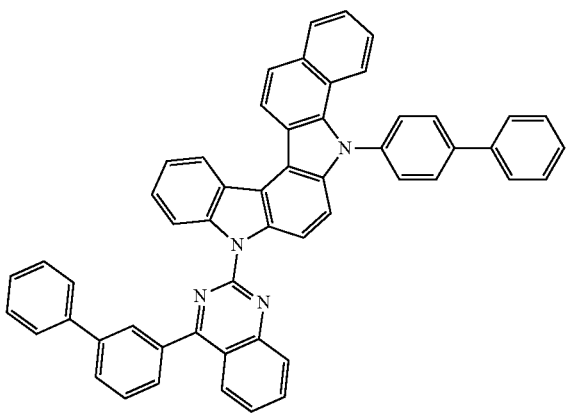
169
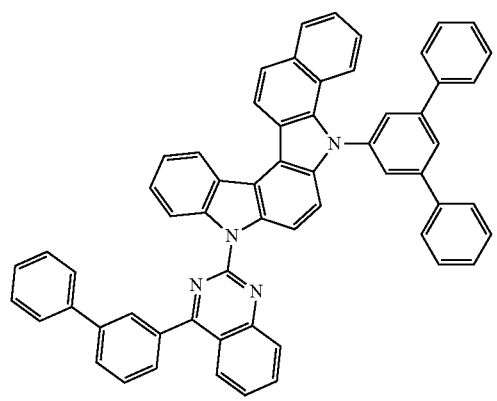
170
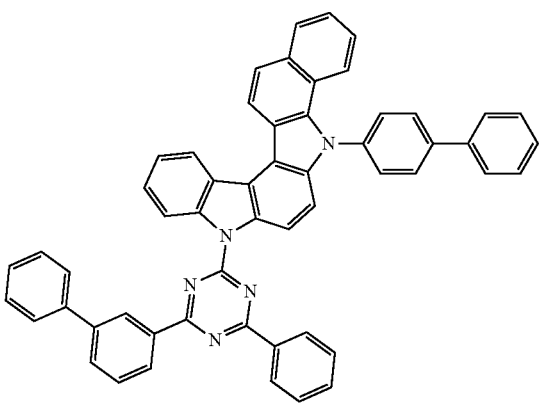

-continued
171
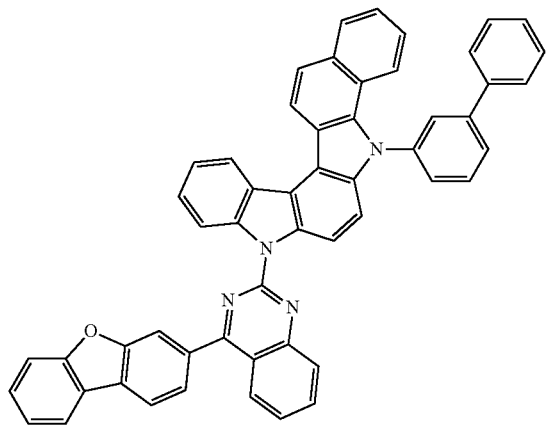
172
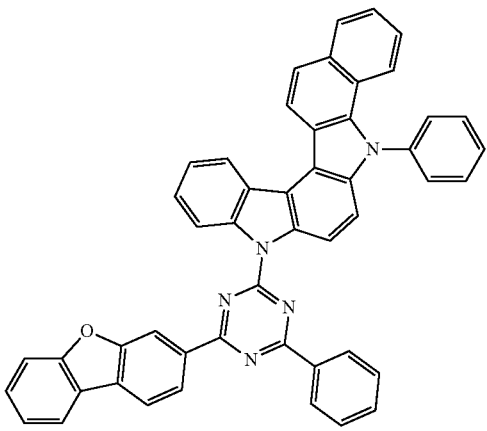
173
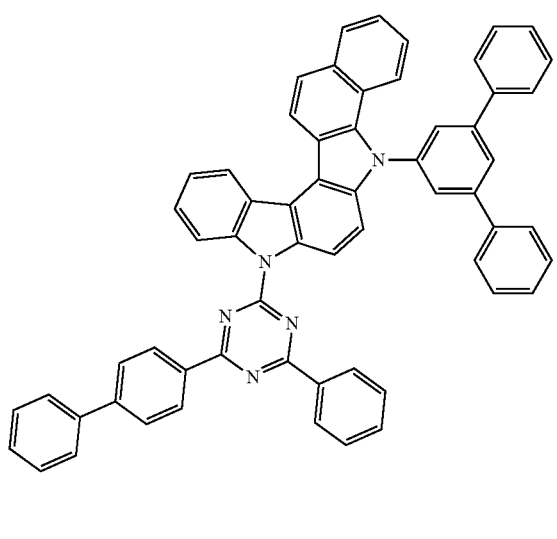
174
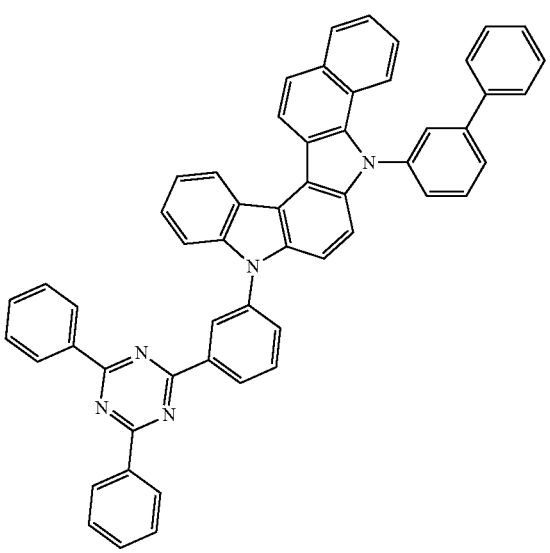
175
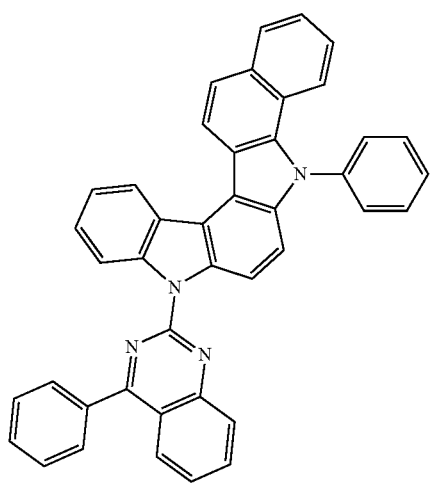
176
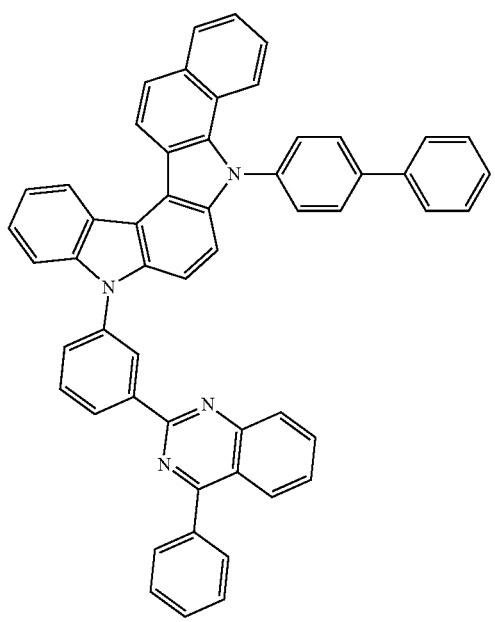

-continued
177
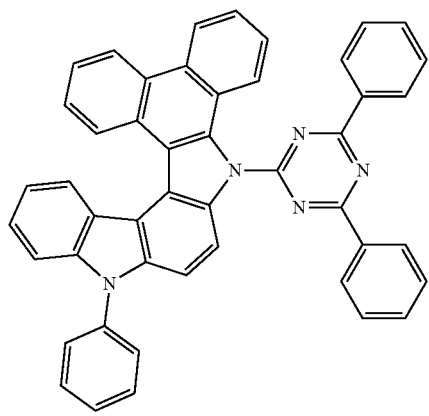
178
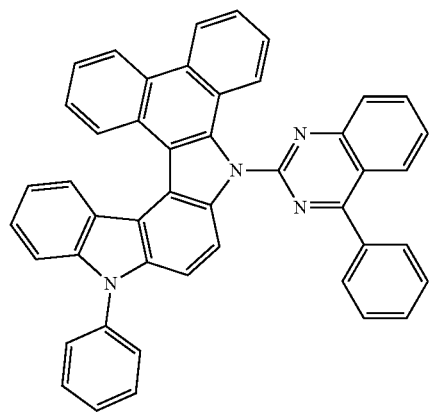
179
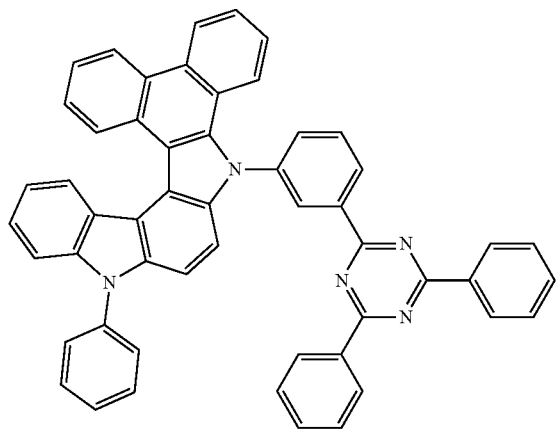
180
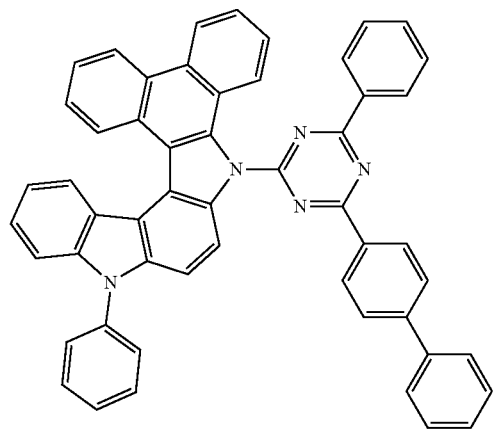
181
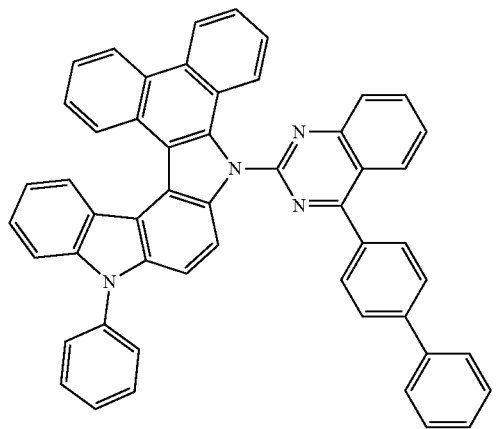
182
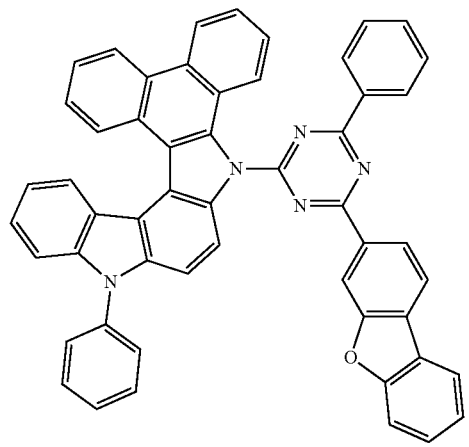

-continued
183
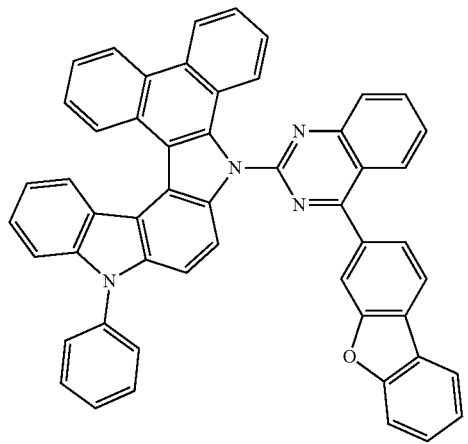
184
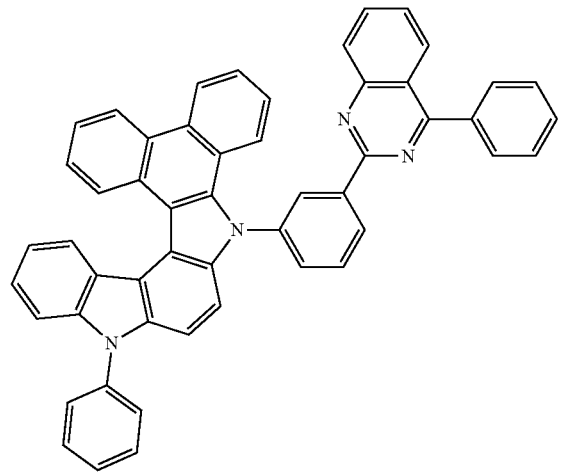
185
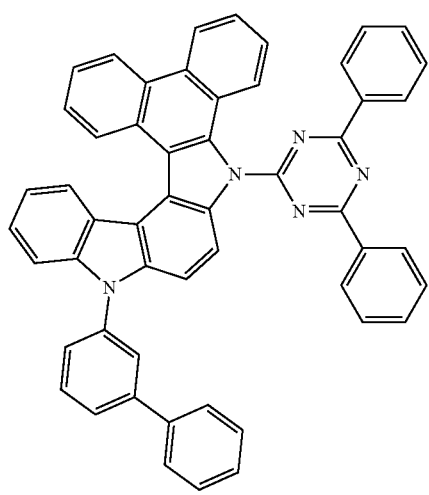
186
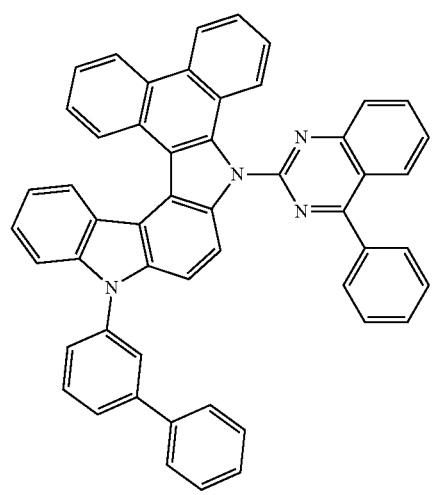
187
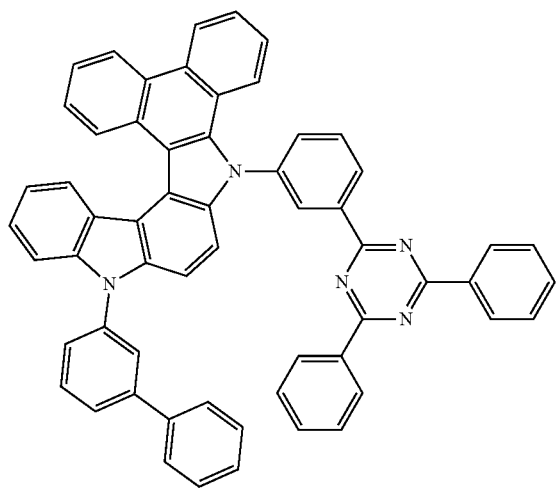
188
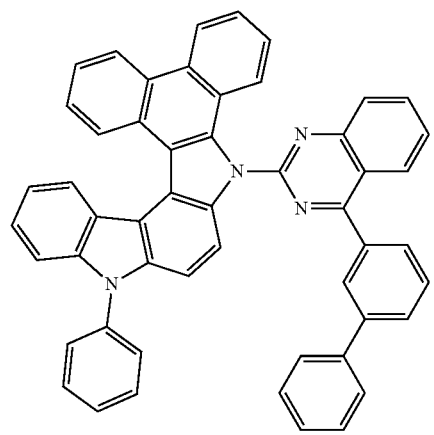

-continued
189
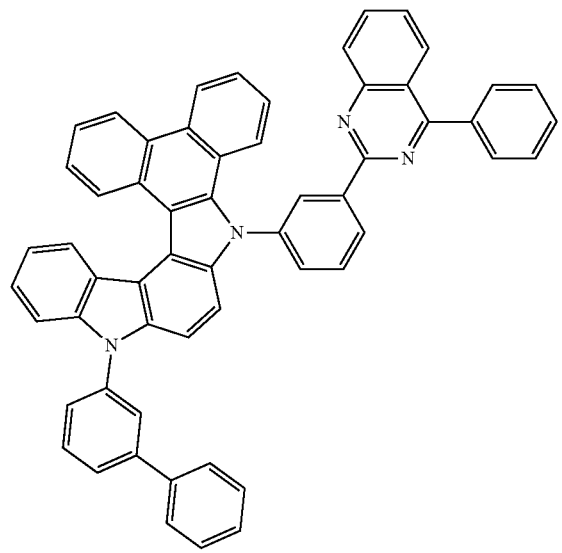
190
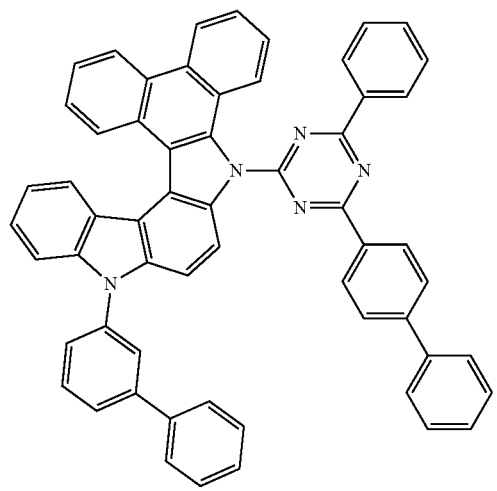
191
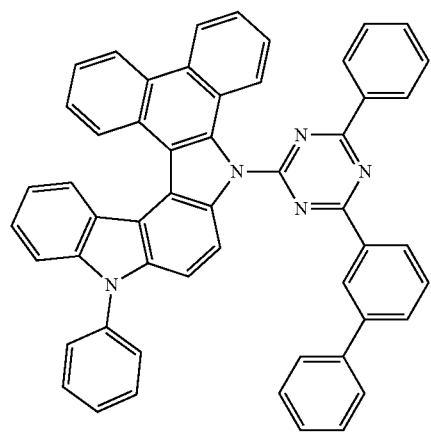
192
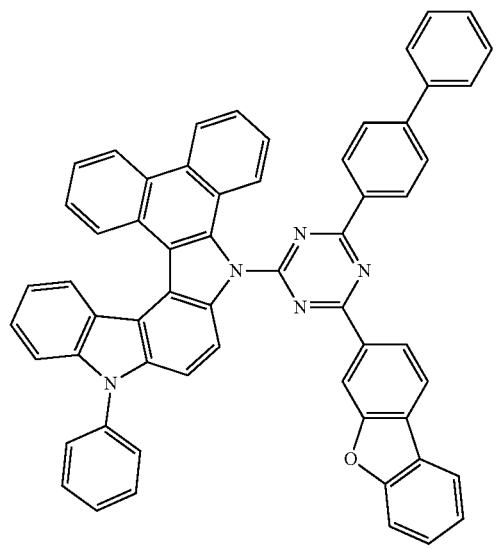

-continued
193
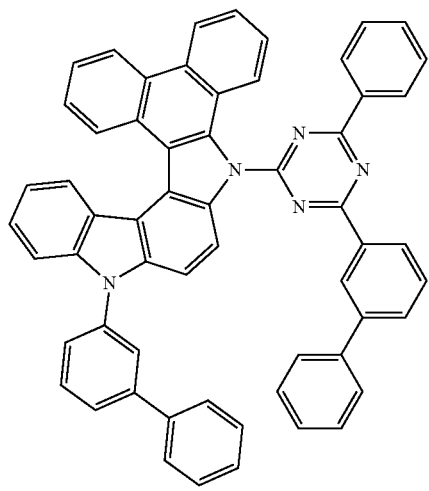
194
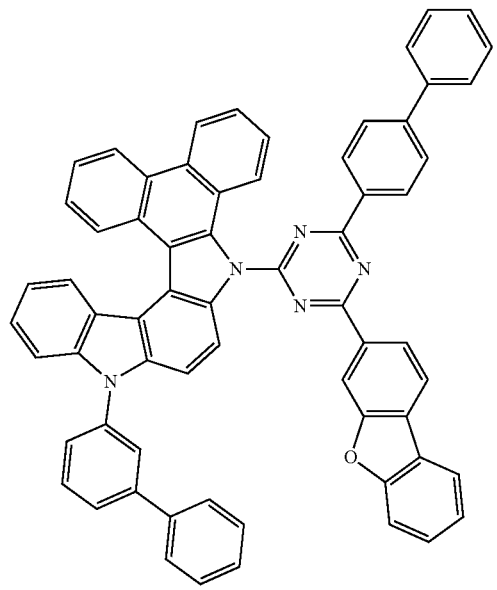
195
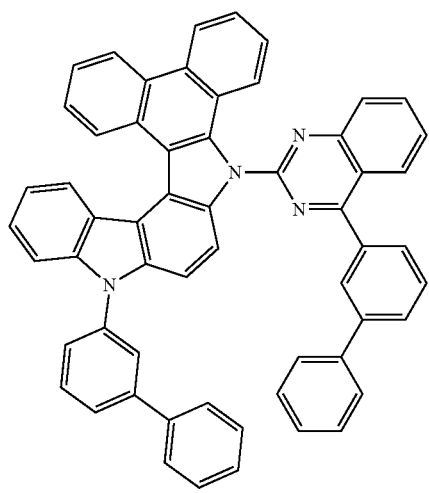
196
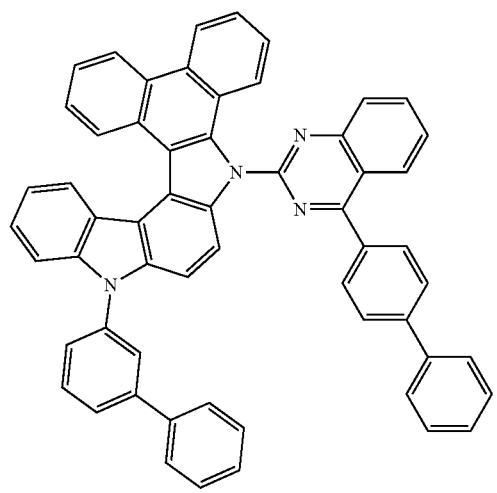
197
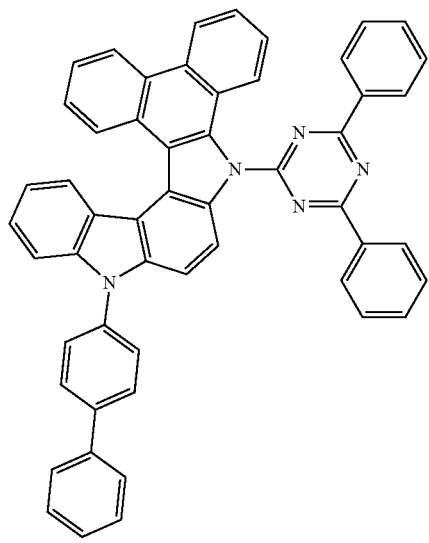
198
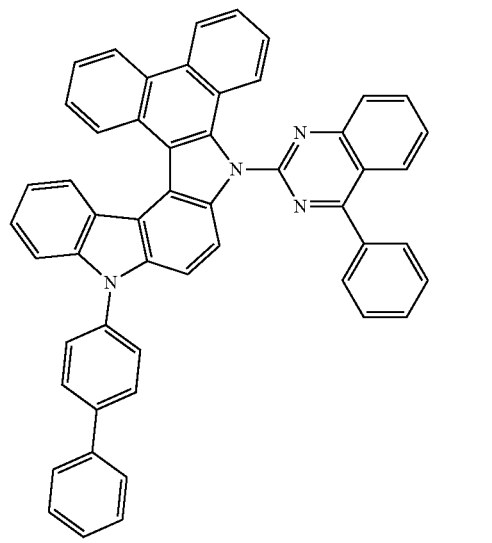

199
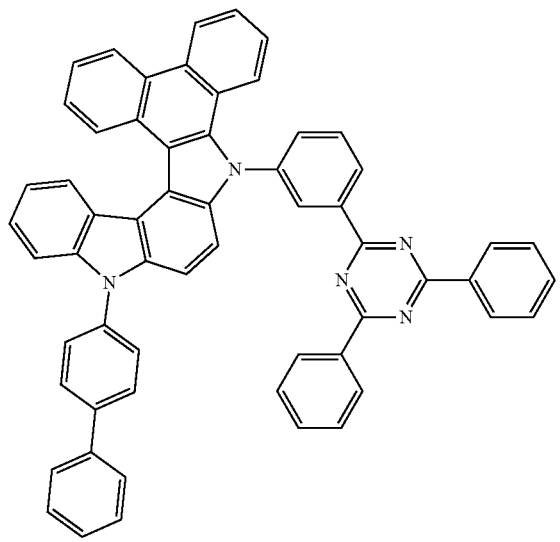
200
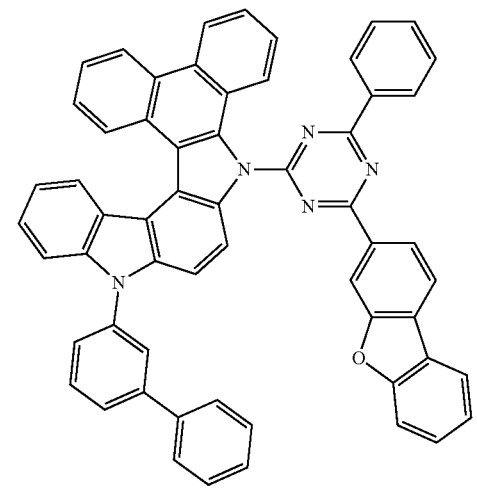
201
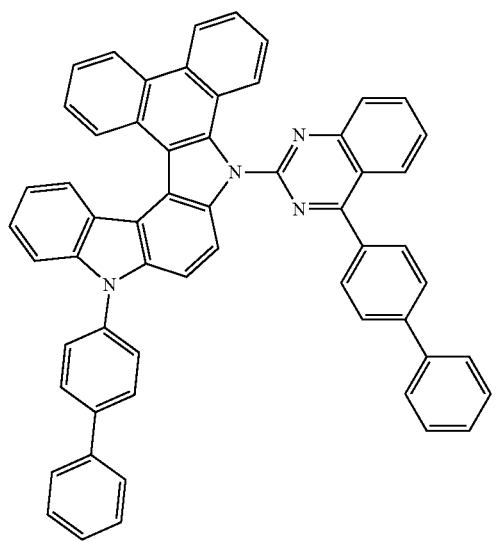
202
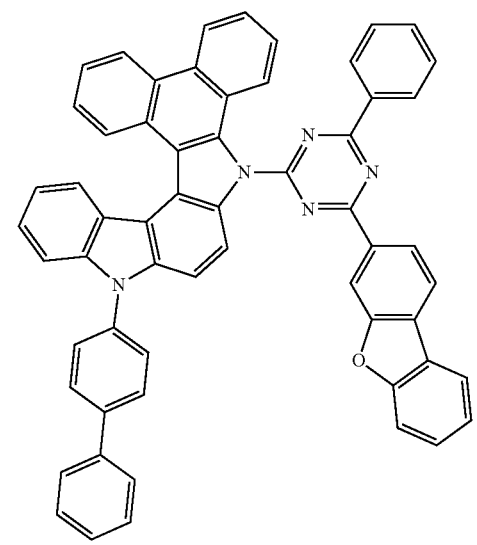
203
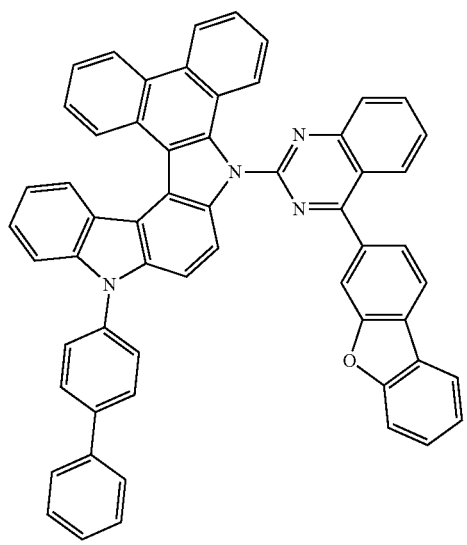
204
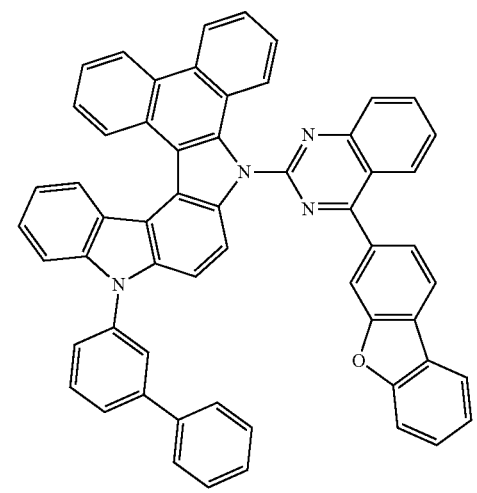

-continued
205
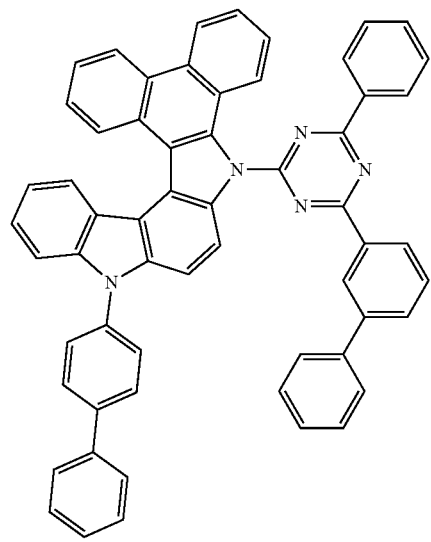
206
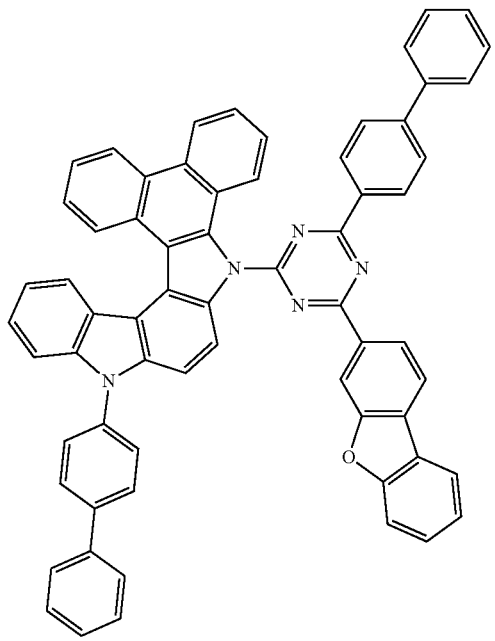
207
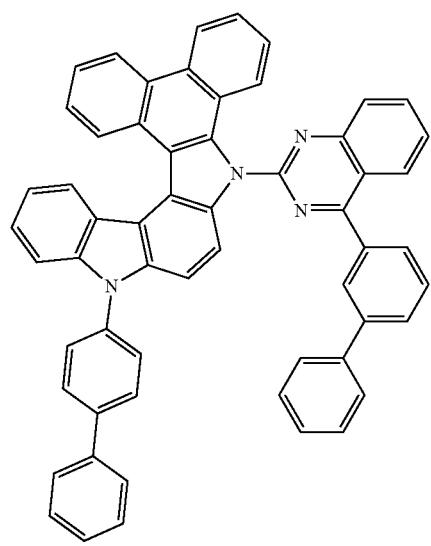
208
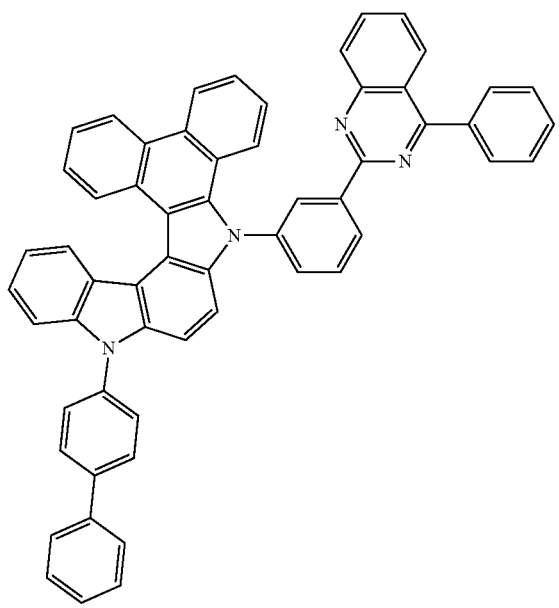

-continued
209
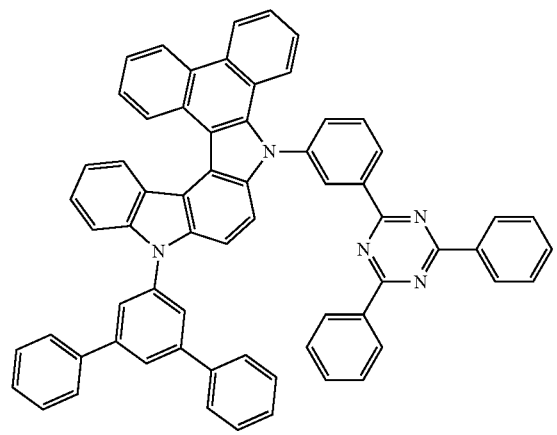
210
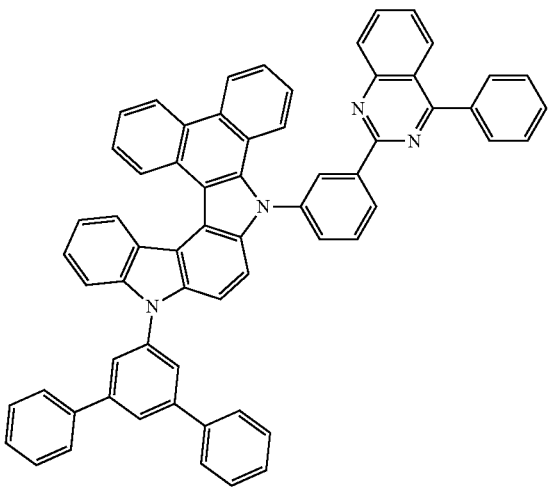
211
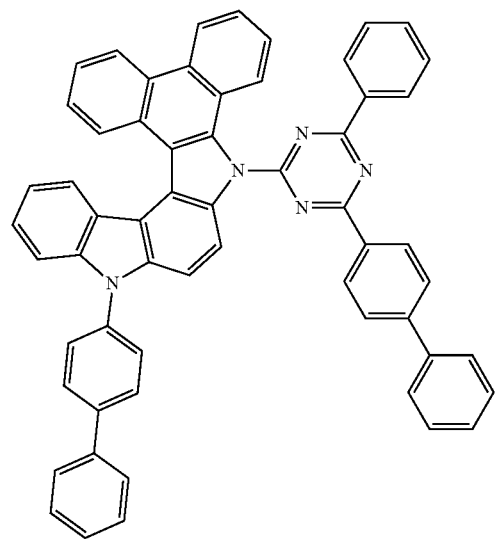
212
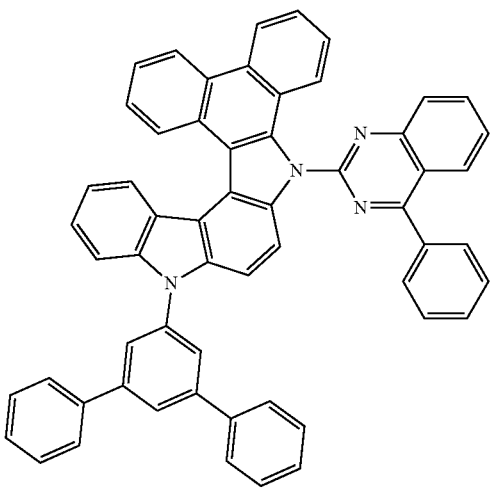
213
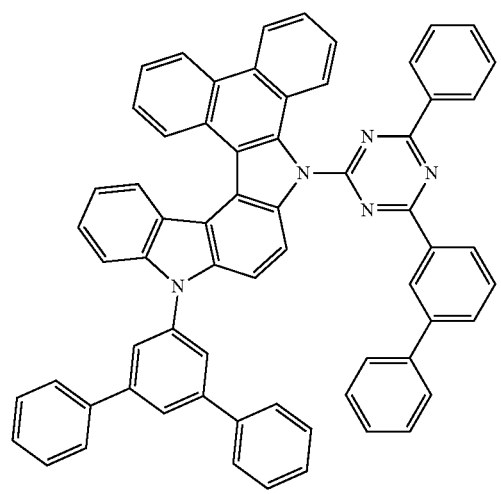
214
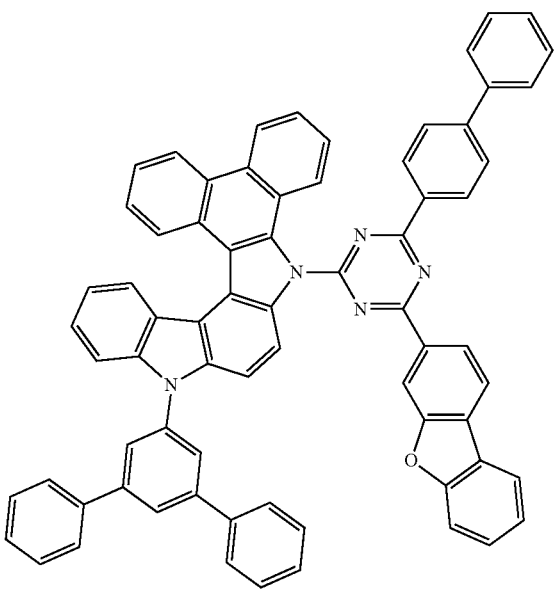

215 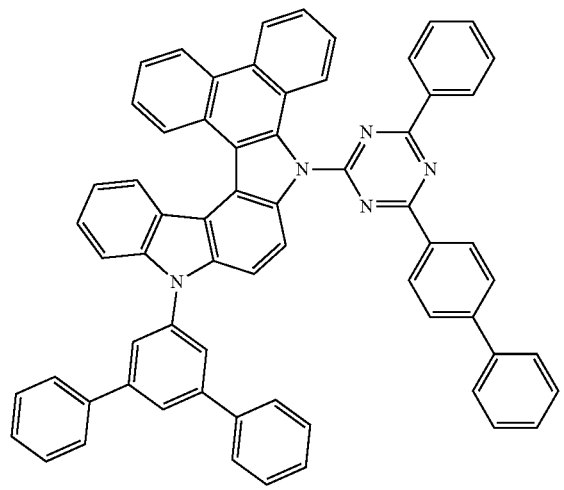
216 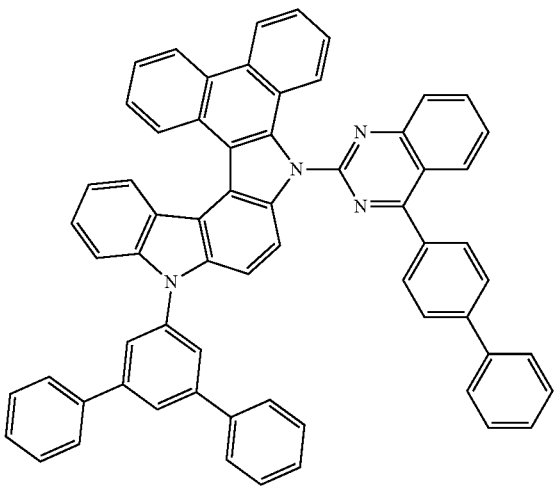
217 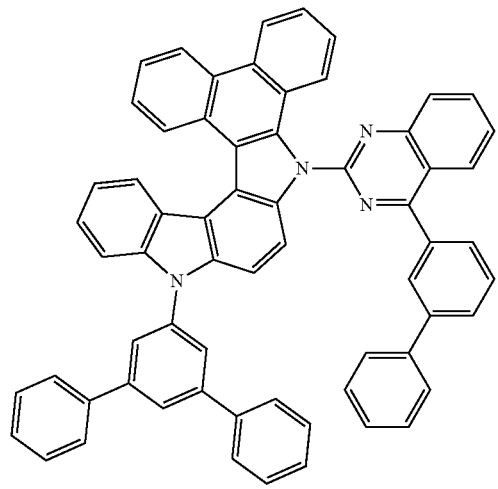
218 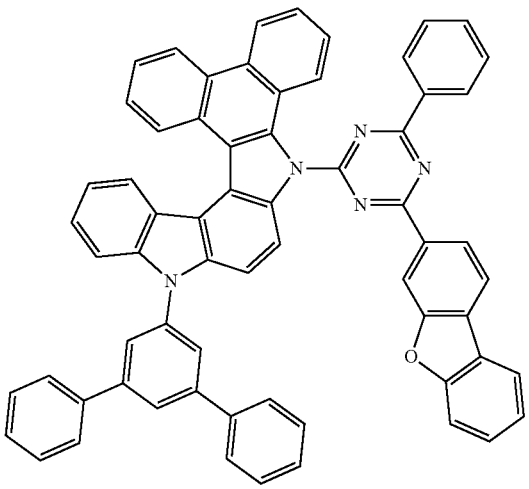
219 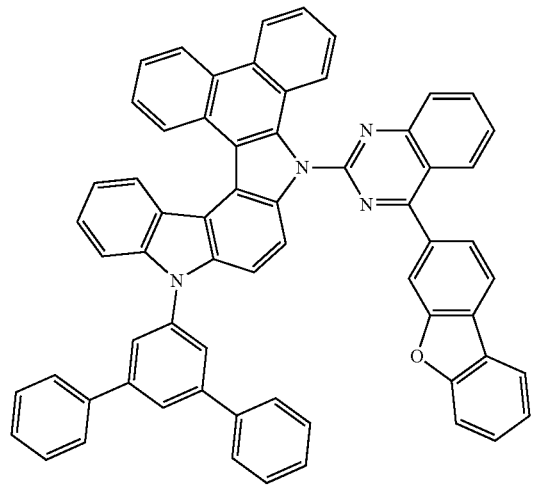
220 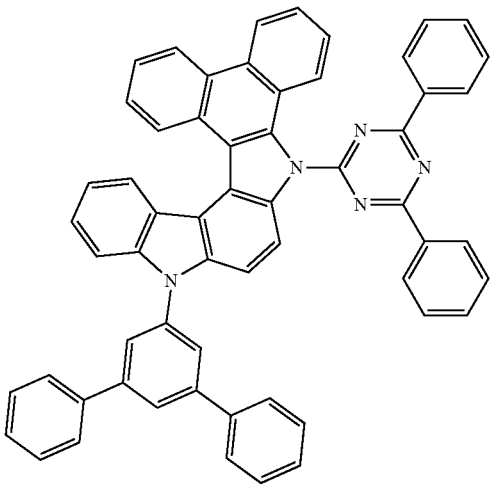

-continued
221
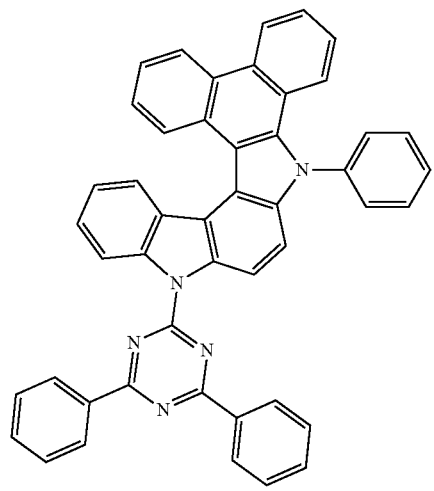
222
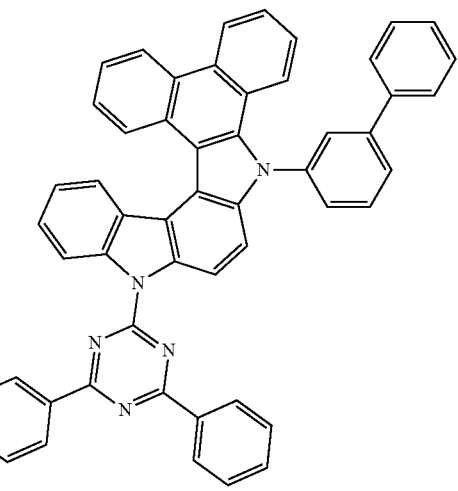
223
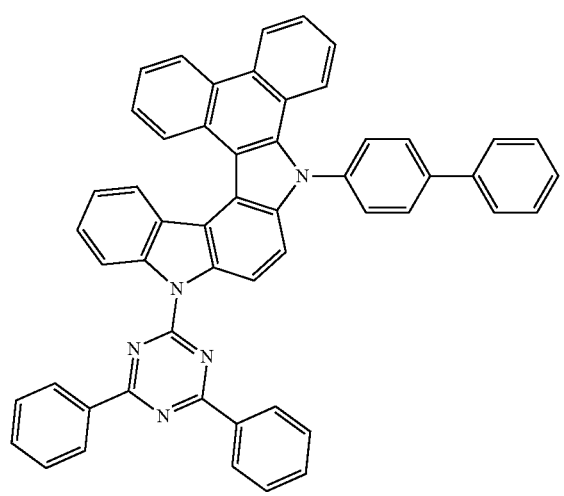
224
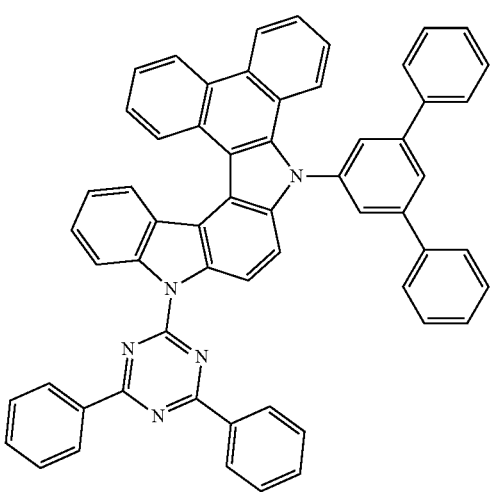
225
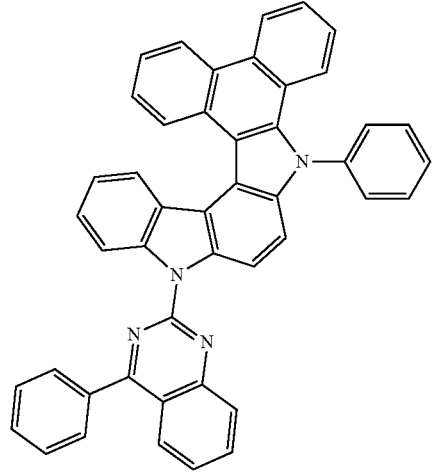
226
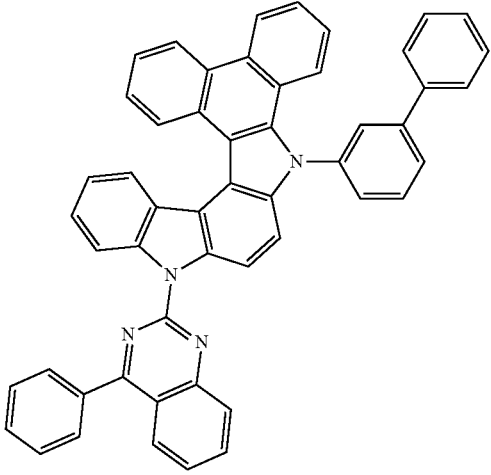

-continued
227
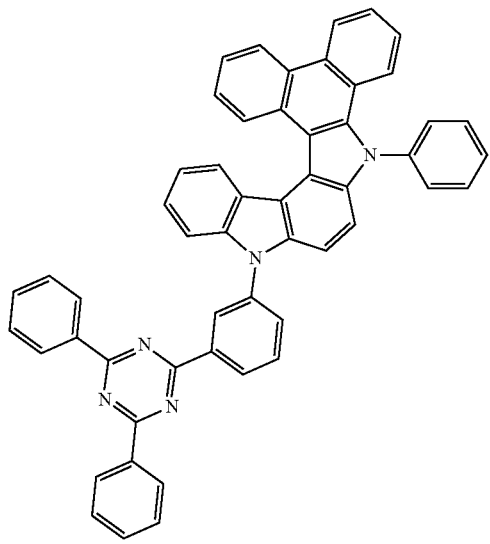
228
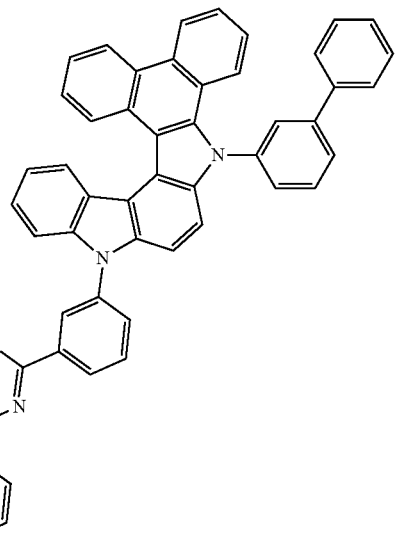
229
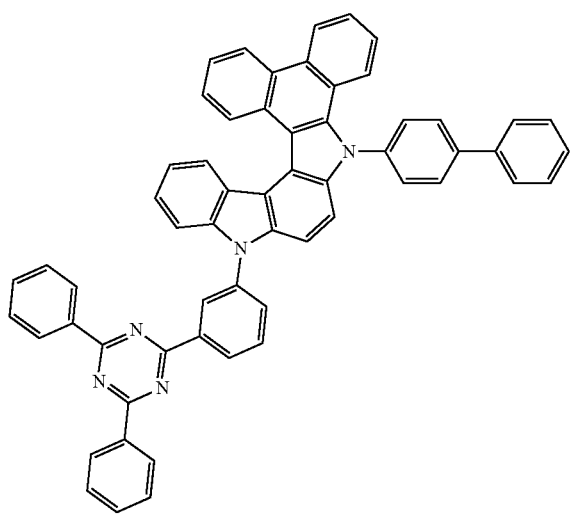
230
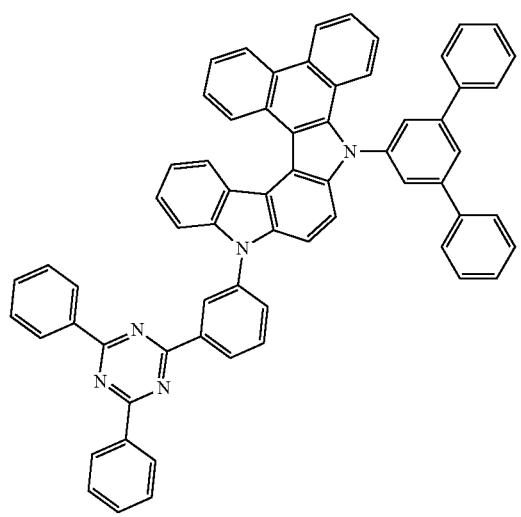
231
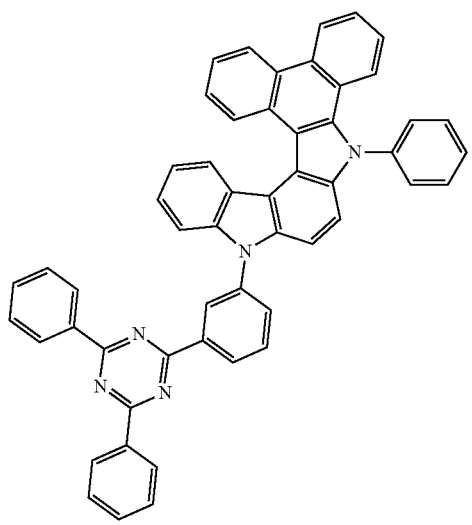
232
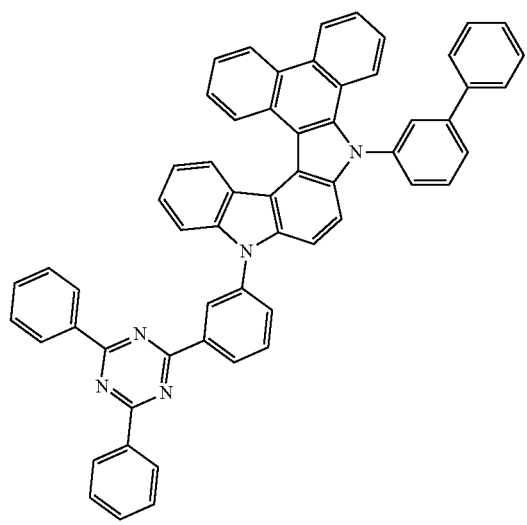

-continued
233 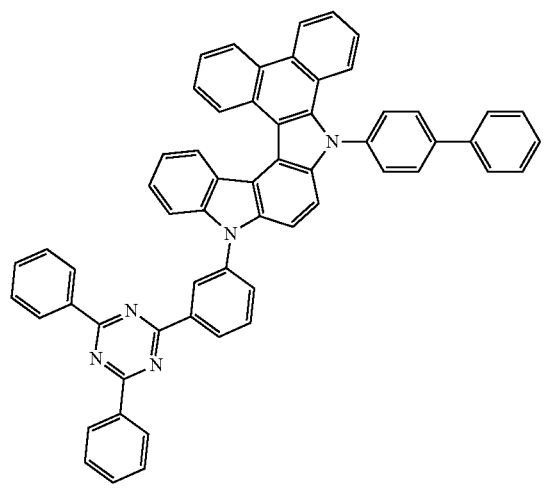
234 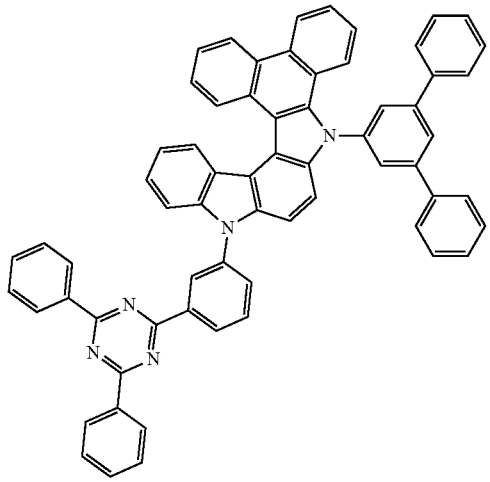
235 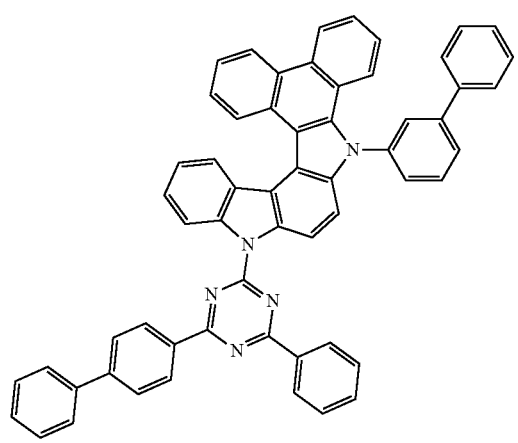
236 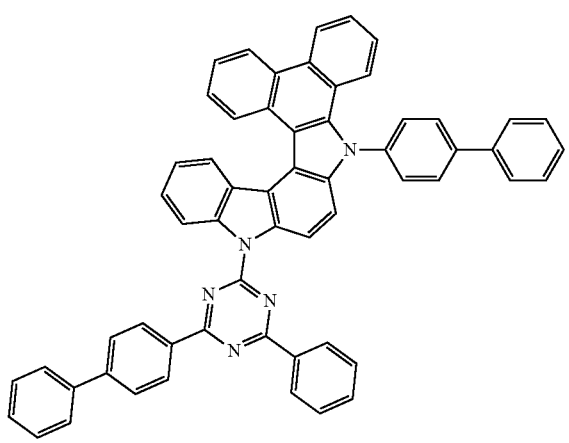
237 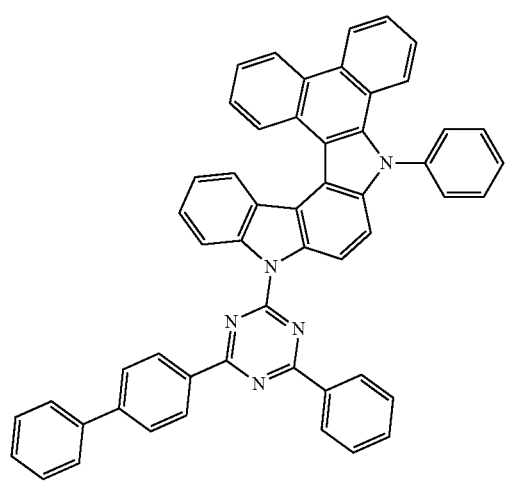
238 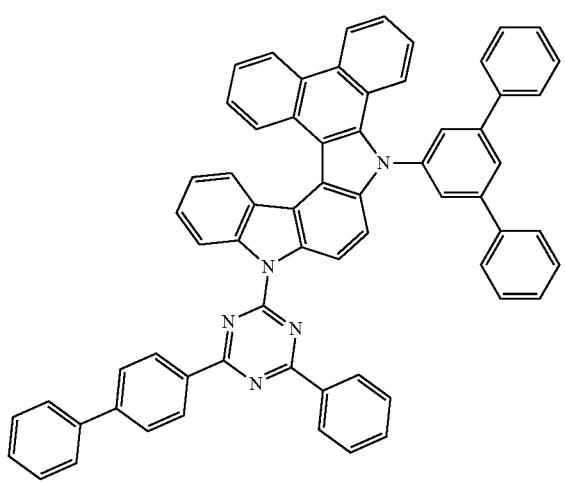

-continued
239
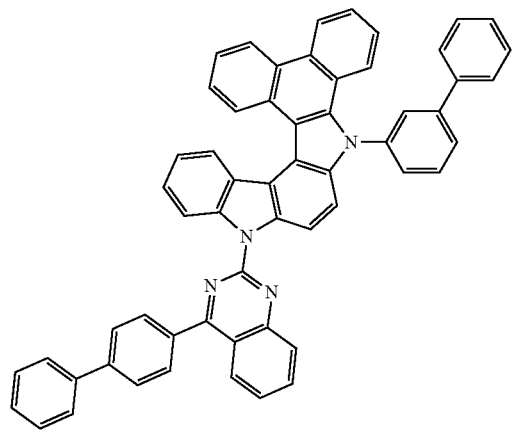
240
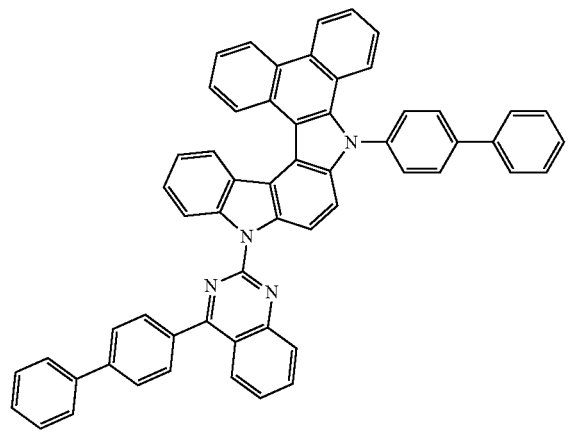
241
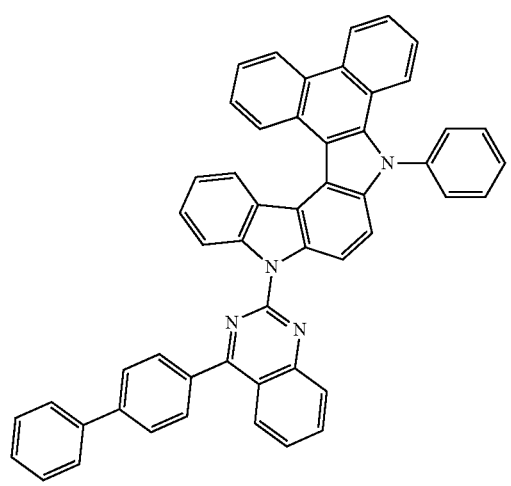
242
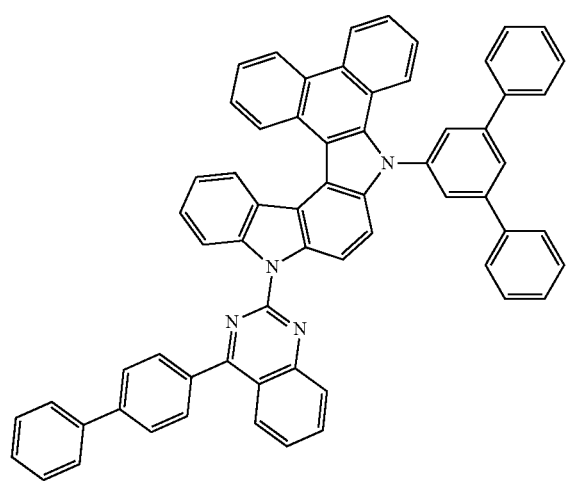
243
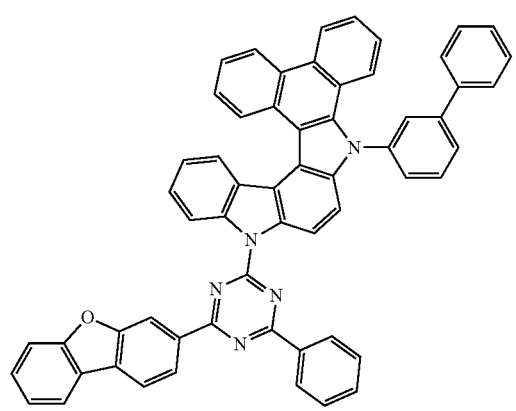
244
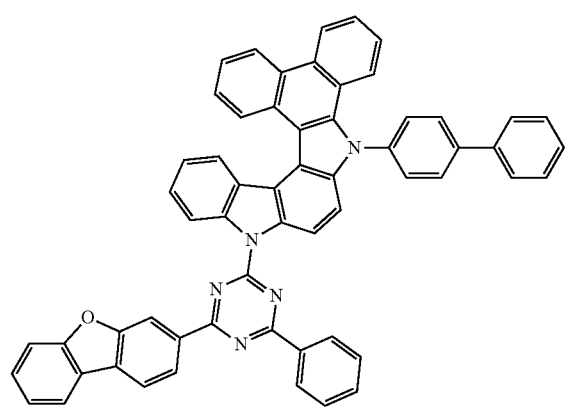

245
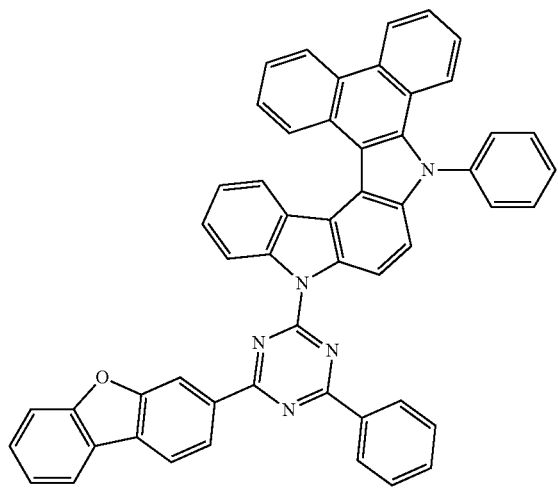
246
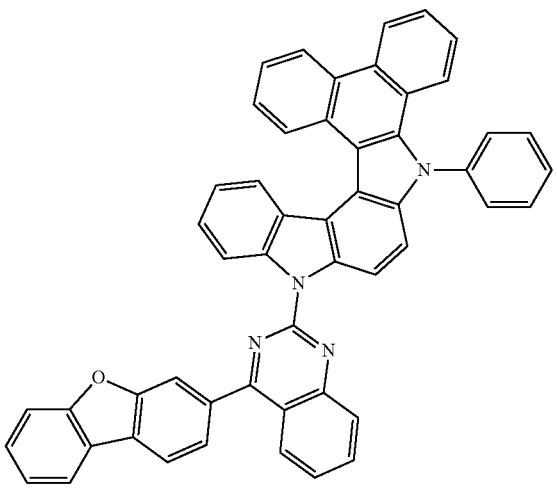
247
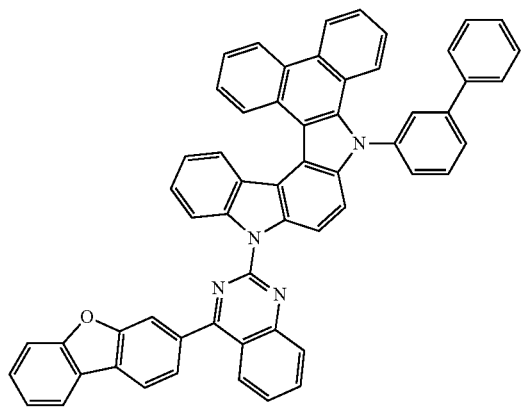
248
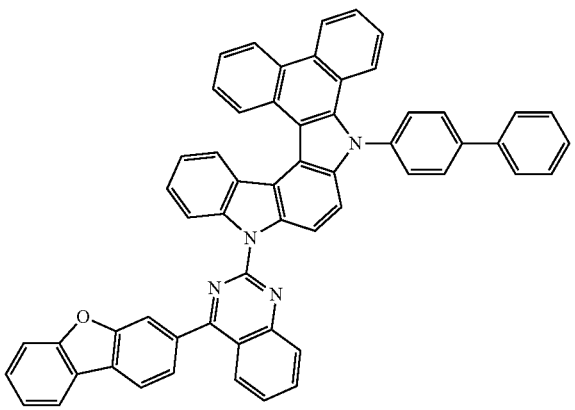
249
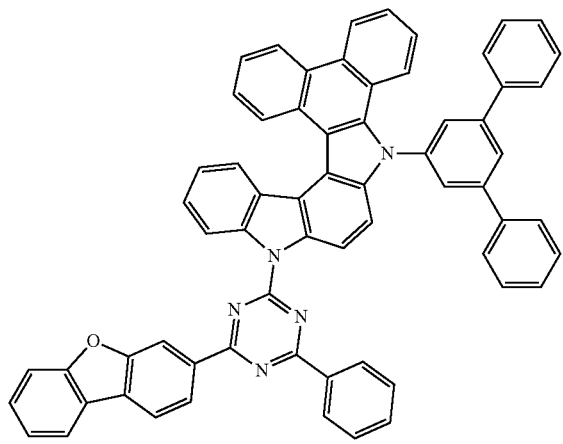
250
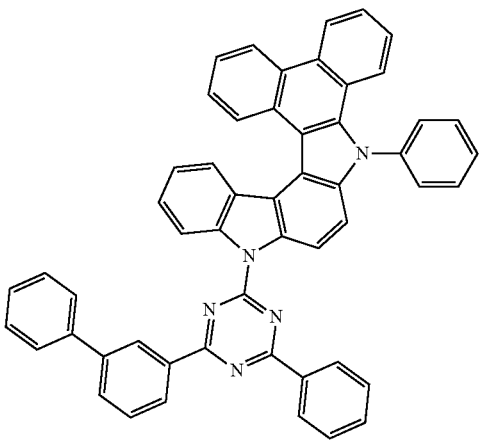

-continued
251
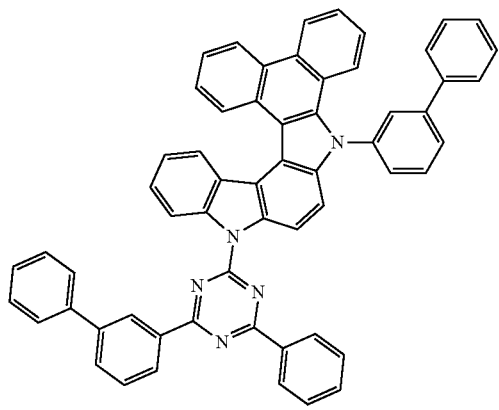
252
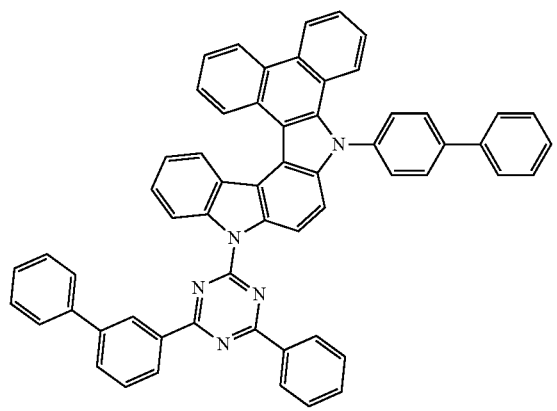
253
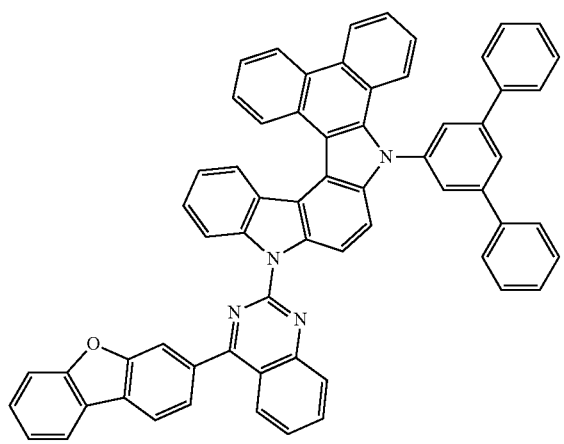
254
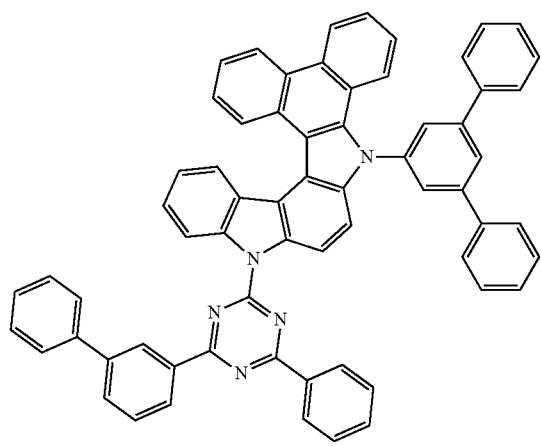
255
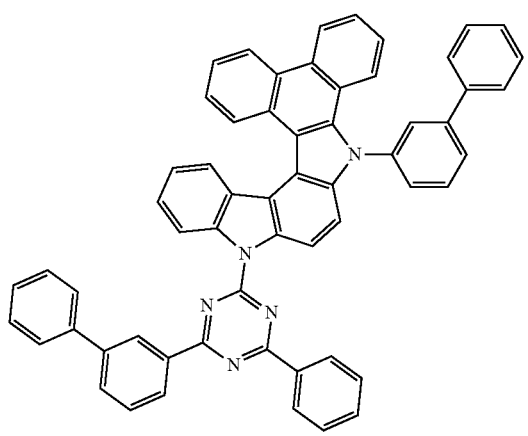
256
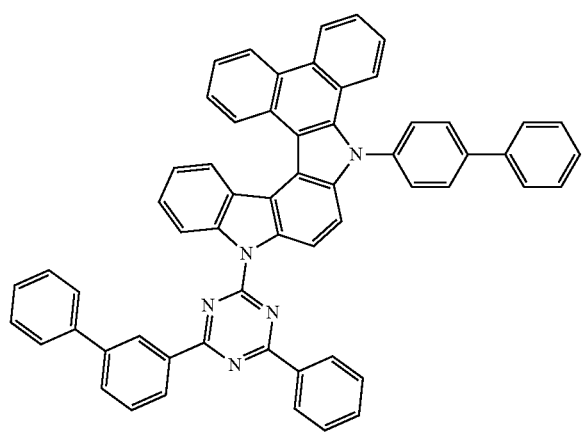

-continued
257
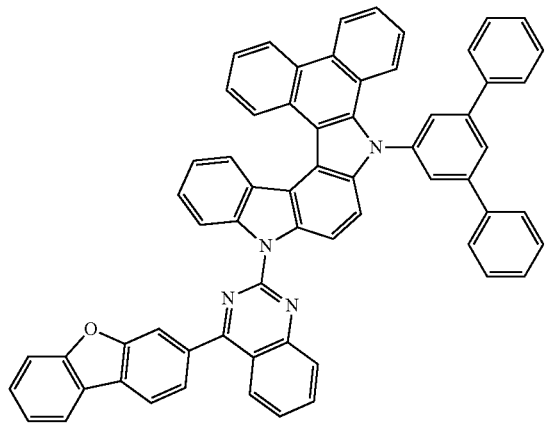
258
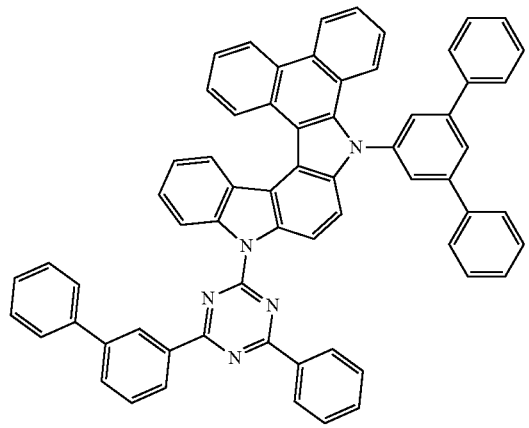
259
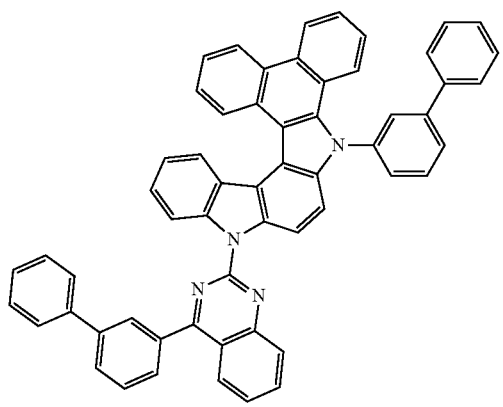
260
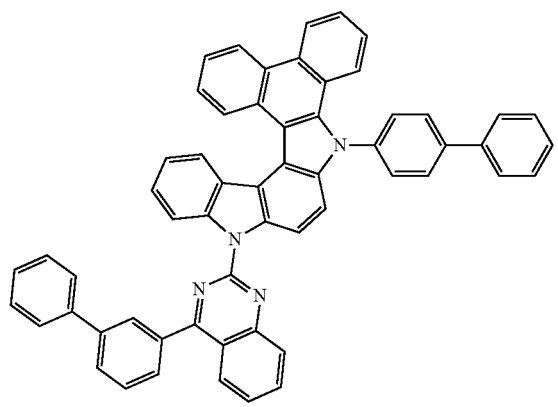
261
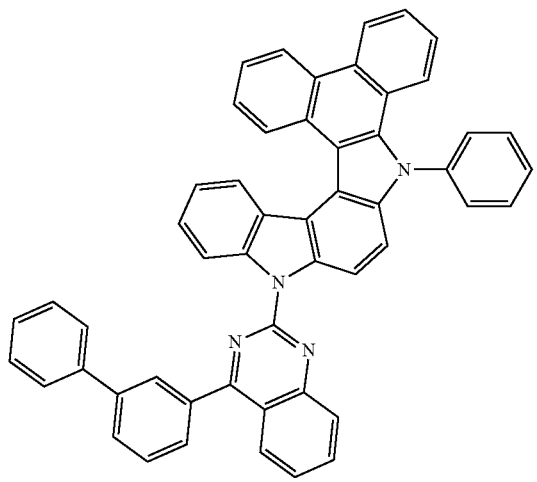
262
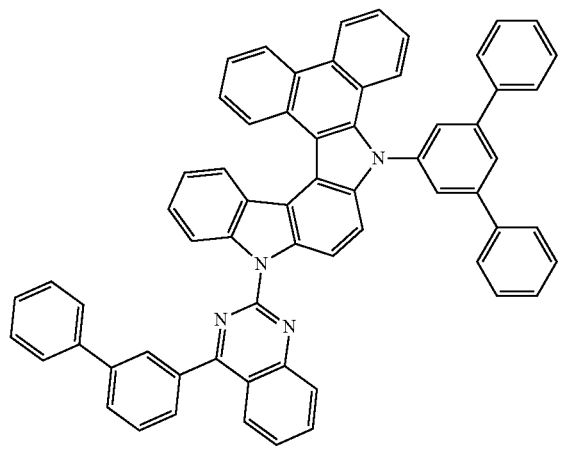

-continued
263
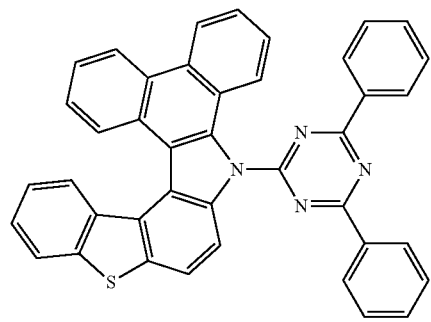
264
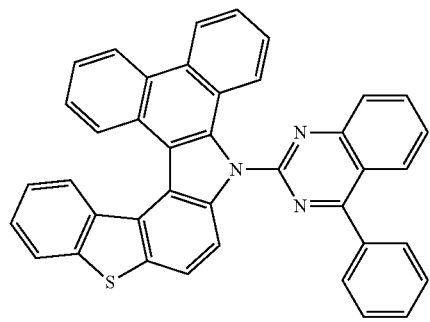
265
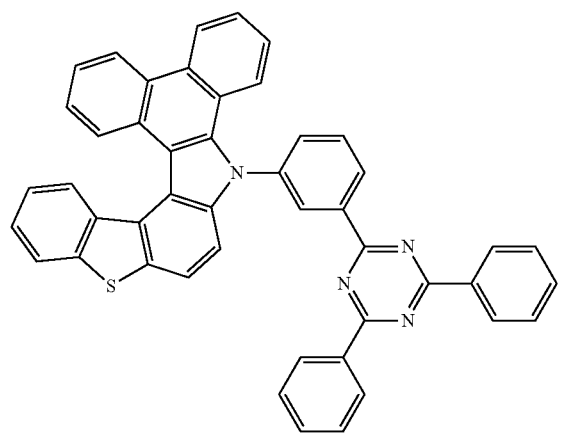
266
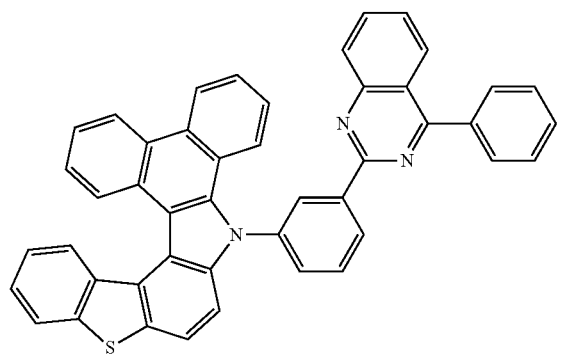
267
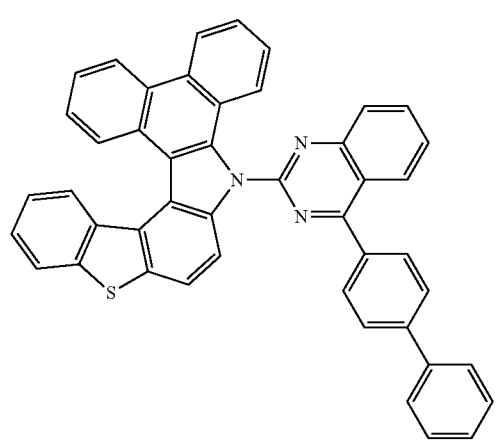
268
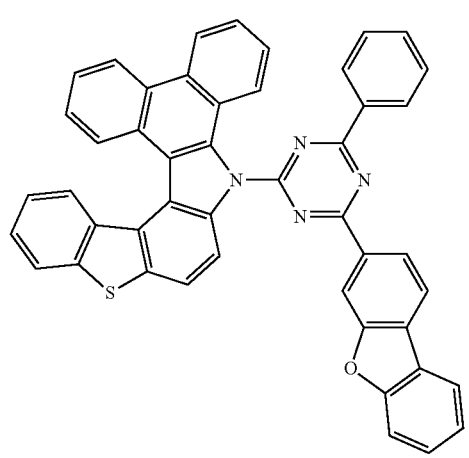

-continued
269
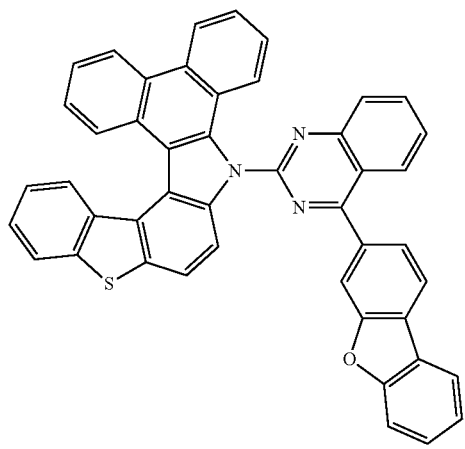
270
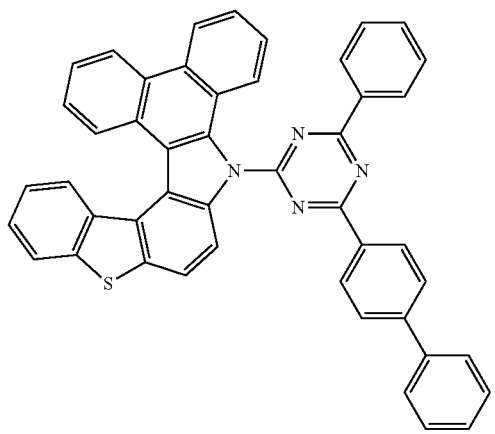
271
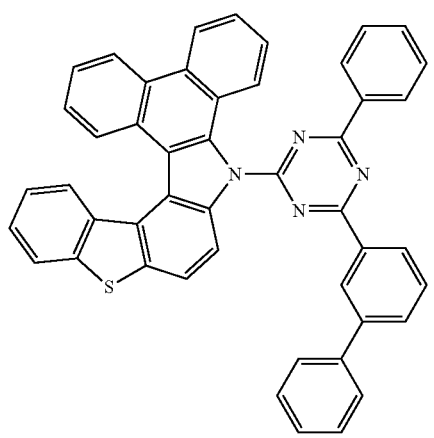
272
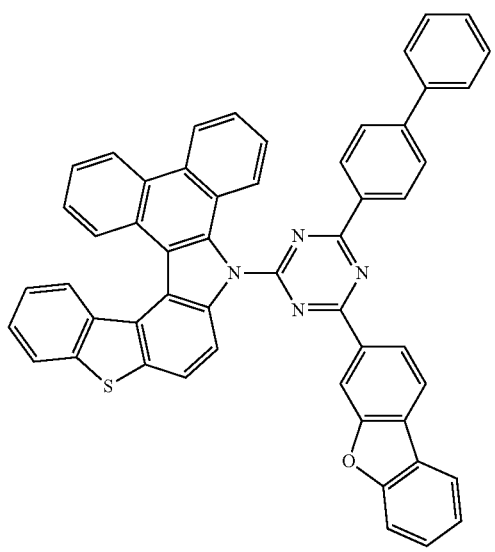
273
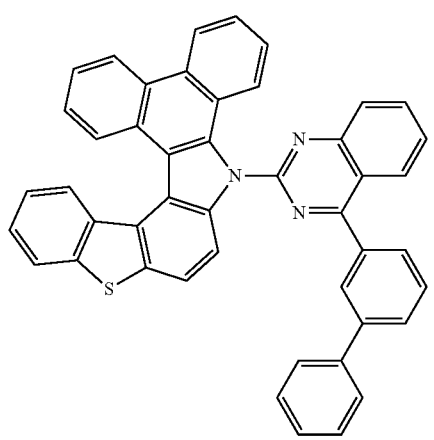
274
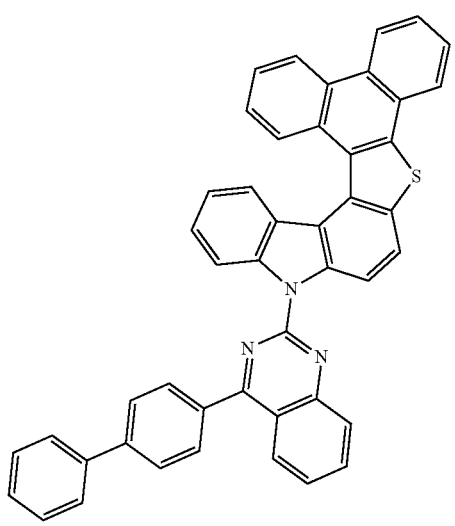

-continued
275
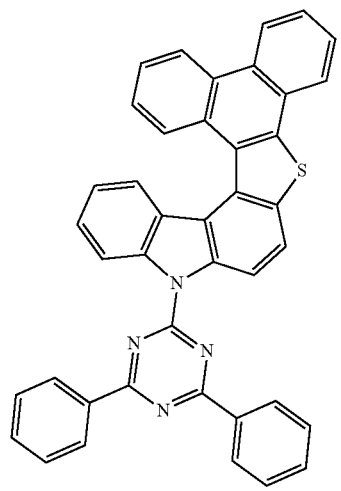
276
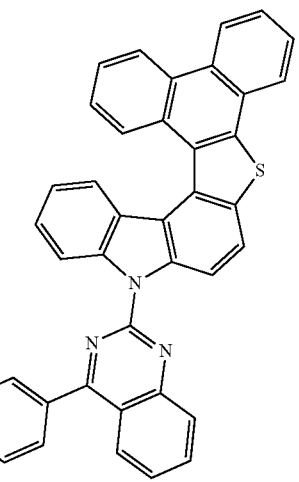
277
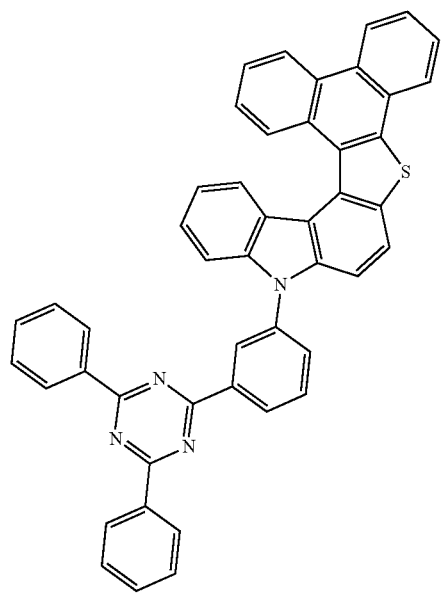
278
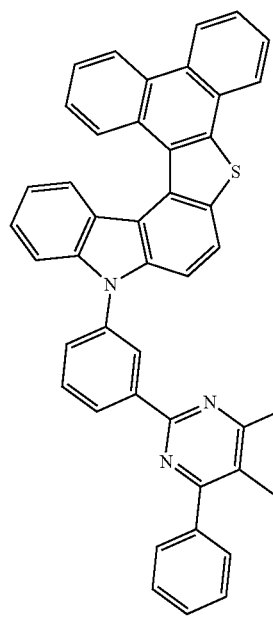
279
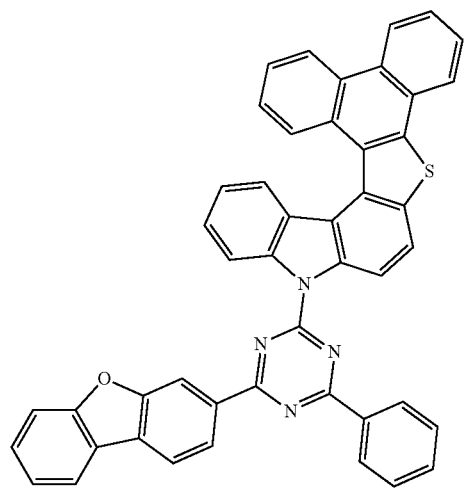
280
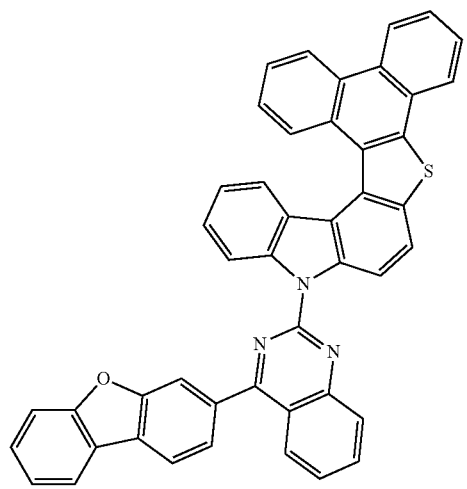

-continued
281
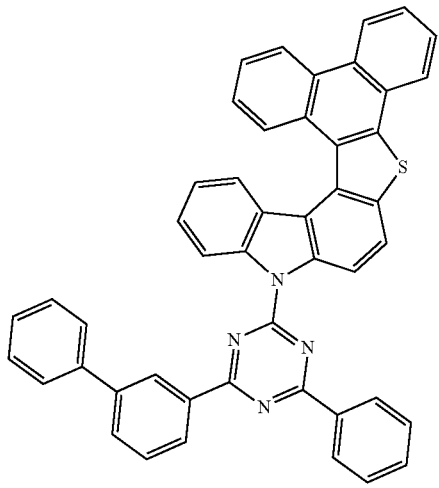
282
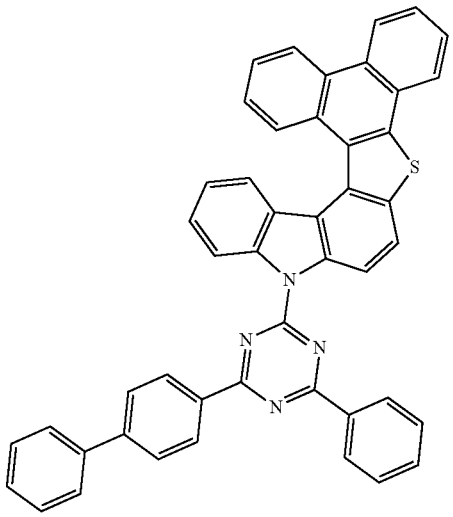
283
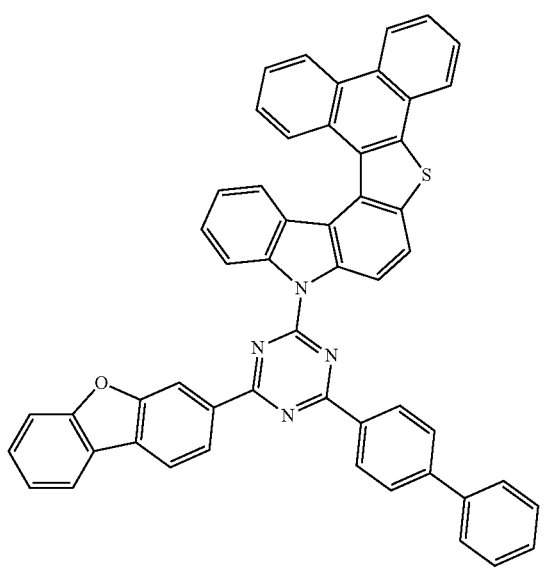
284
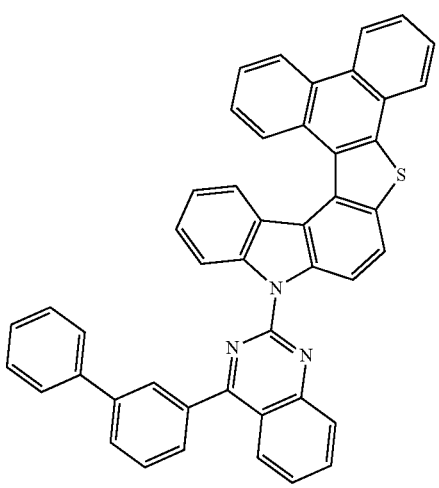
285
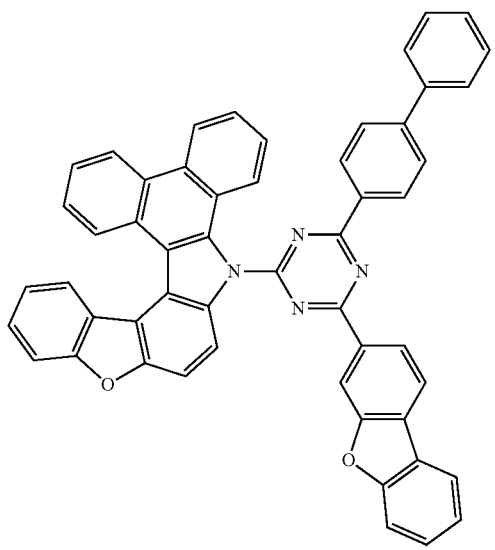
286
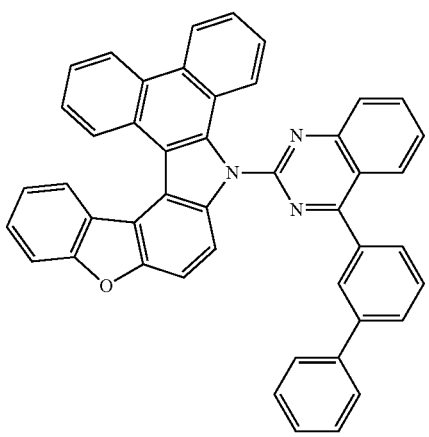

-continued
287
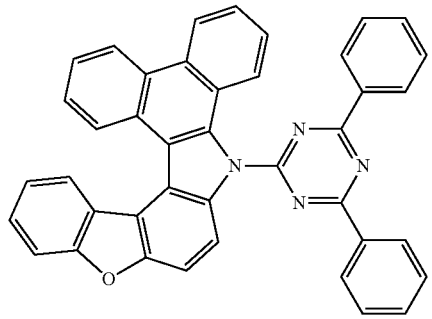
288
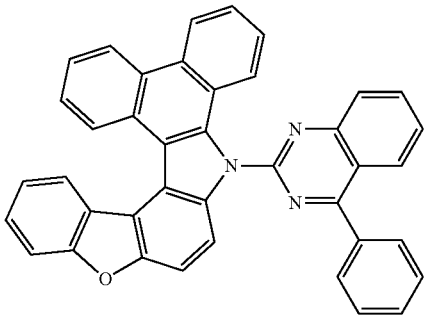
289
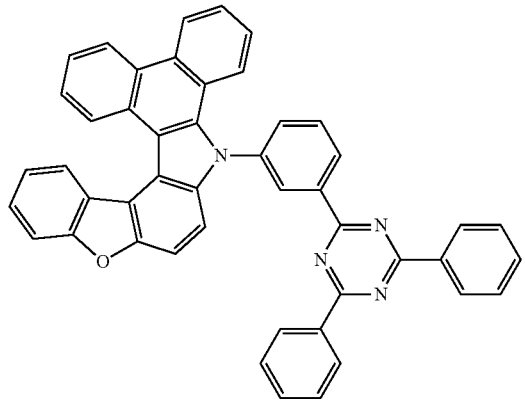
290
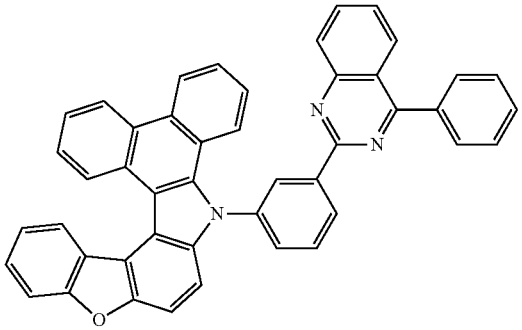
291
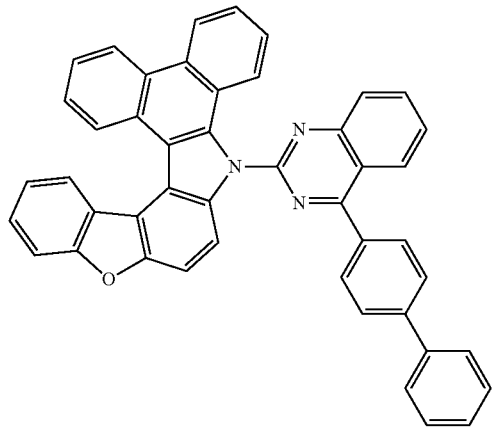
292
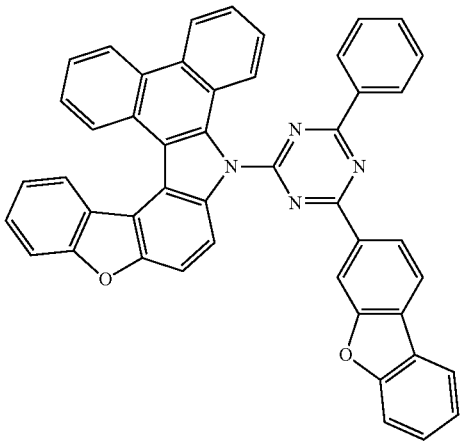
293
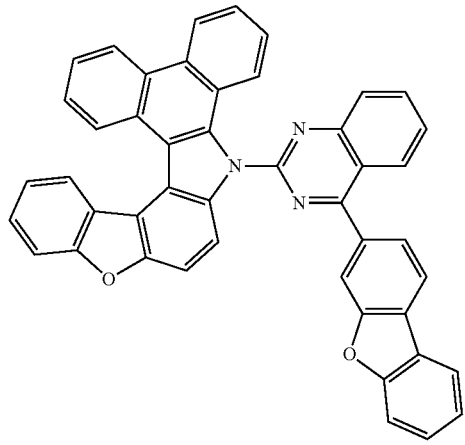
294
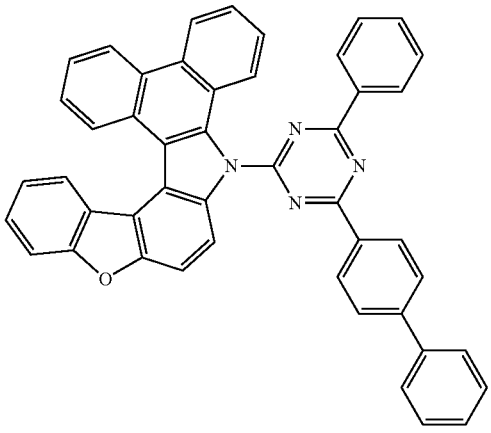

295 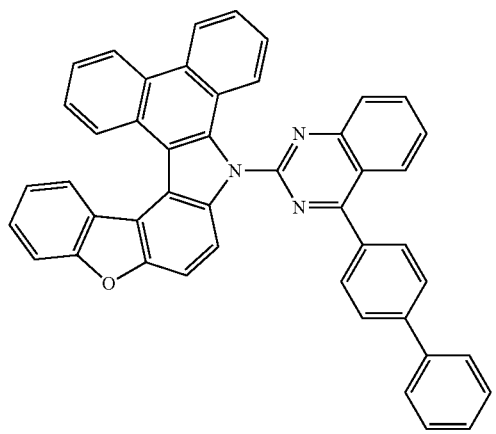
296 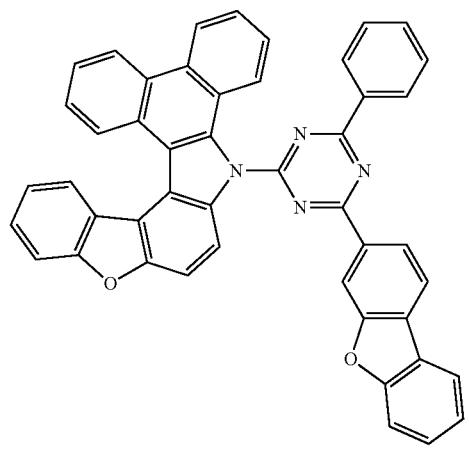
297 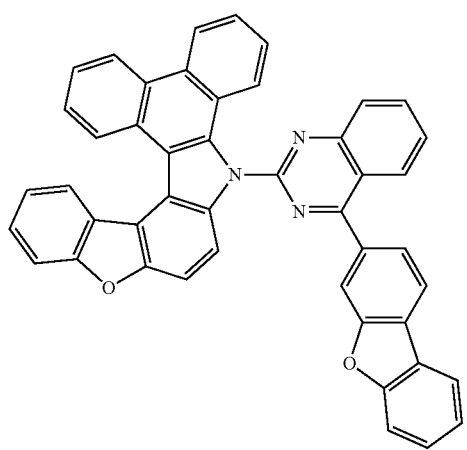
298 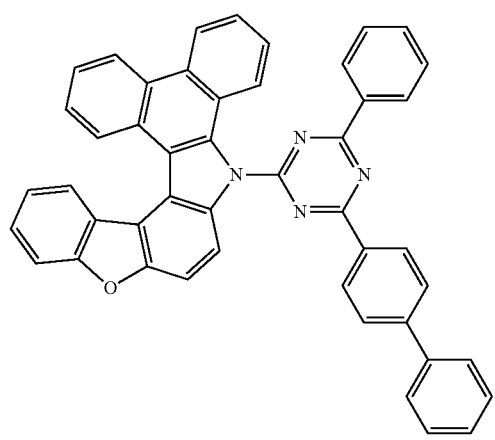
299 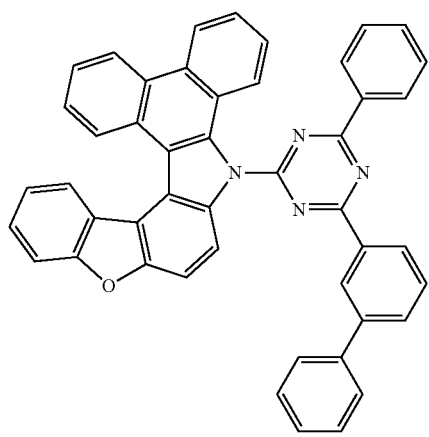
300 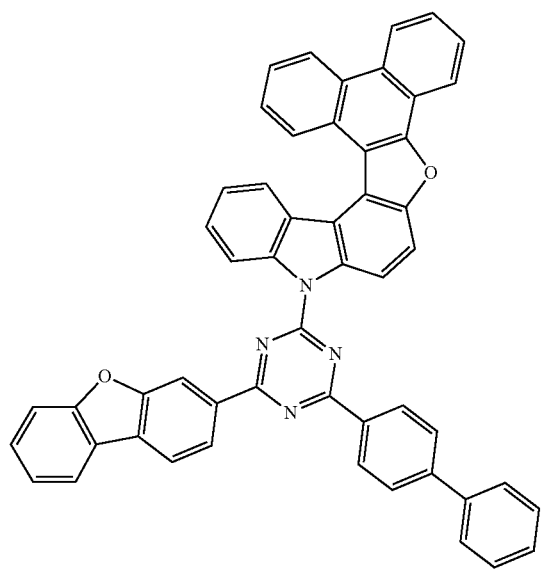

-continued
301 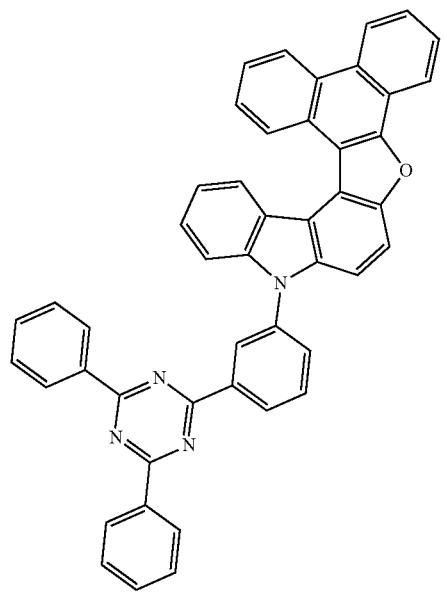
302 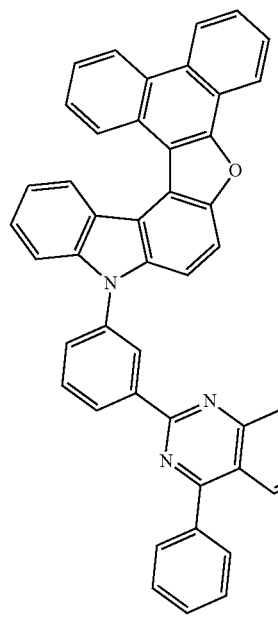
303 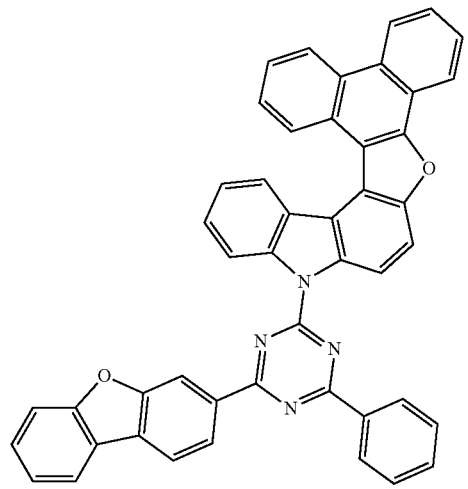
304 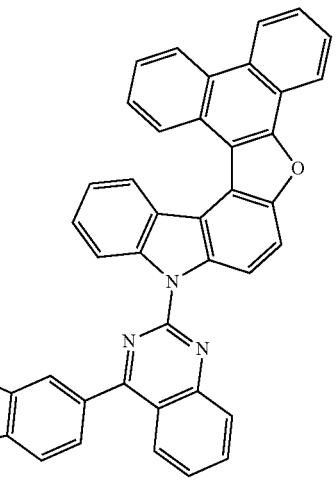
305 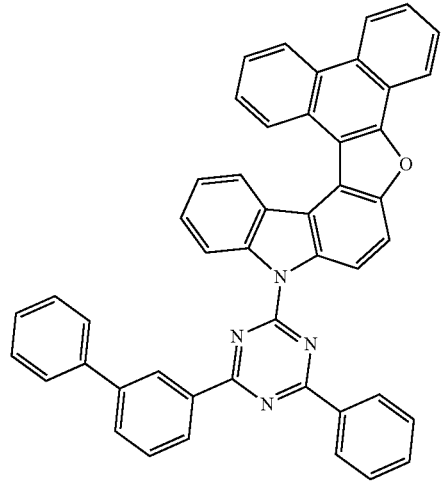
306 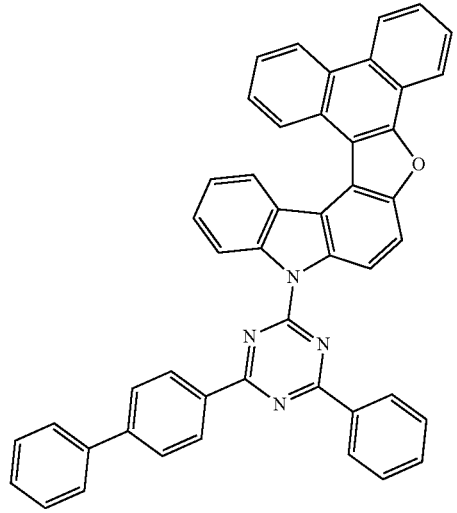

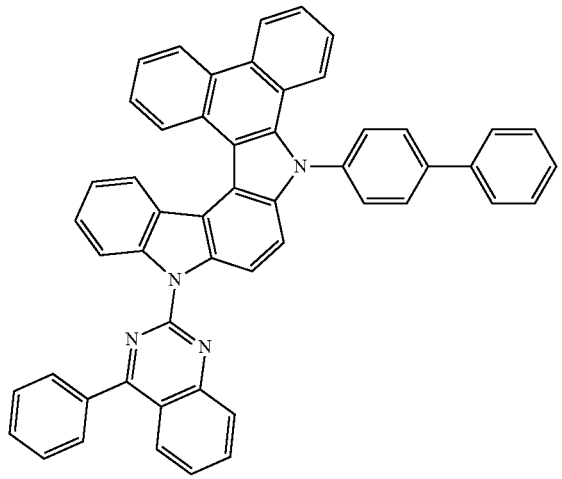

307

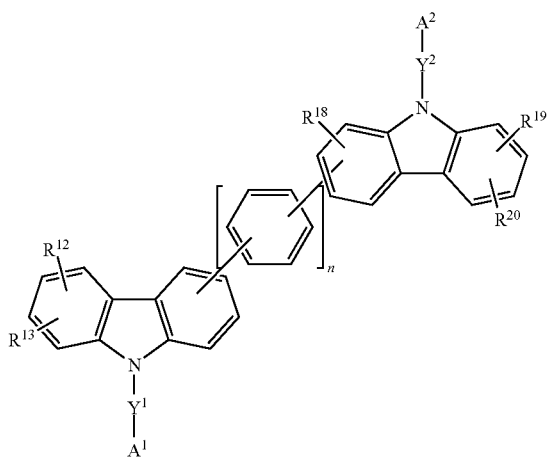

308

The second compound for an organic optoelectric device is a compound having relatively strong hole transport characteristics and is represented by Chemical Formula 2.

[Chemical Formula 2]

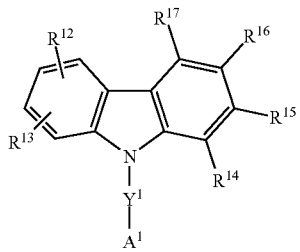

In Chemical Formula 2, $Y^1$ is a single bond, a substituted or unsubstituted C6 to C30 arylene group, or a substituted or unsubstituted C2 to C30 heteroarylene group, $A^1$ is a substituted or unsubstituted C6 to C30 aryl group, or a substituted or unsubstituted C2 to C30 heterocyclic group, $R^{12}$ to $R^{17}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and $R^{14}$ to $R^{17}$ are independently present or adjacent groups of $R^{14}$ to $R^{17}$ are linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring;

wherein "substituted" refers to replacement of at least one hydrogen by deuterium, a C1 to C20 alkyl group, a C6 to C30 aryl group, or a C2 to C30 heteroaryl group, specifically at least one hydrogen by a C1 to C10 alkyl group, a C6 to C12 aryl group, or a C2 to C20 heteroaryl group, for example at least one hydrogen by a C1 to C10 alkyl group, a phenyl group, a biphenyl group, a naphthyl group, a terphenyl group, a triphenylene group, a fluorenyl group, a pyridinyl group, a carbazolyl group, a dibenzofuranyl group, or a dibenzothiophenyl group.

When the first compound for an organic optoelectric device and similar comparative compounds are synthesized and evaluated, a similar driving voltage to those of the comparative compounds is obtained, but efficiency and a life-span are deteriorated, and accordingly, when the first compound for an organic optoelectric device and the similar comparative compounds are used alone, there may be no advantage.

In the present disclosure, the second compound for an organic optoelectric device is used in a light emitting layer in order to improve the first compound for an organic optoelectric device. When the first compound for an organic optoelectric device is used alone, efficiency may be low due to unbalanced charges toward one side. The first compound for an organic optoelectric device shows very fast hole characteristics in a hole device evaluation, since a fused amine ring having HOMO characteristics plays a large role. Therefore, in order to balance the charges, an additional compound capable of effectively moving electrons for appropriate hole adjustment and trap characteristics with a dopant needs to be used, and herein, when the second compound for an organic optoelectric device is used as the additional compound, excellent voltage, efficiency, and life-span characteristics may be obtained.

In examples of the present disclosure, Chemical Formula 2 may be represented by Chemical Formula 2A, Chemical Formula 2B, or Chemical Formula 2C.

[Chemical Formula 2A]

[Chemical Formula 2B]

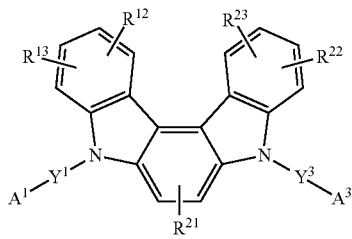

[Chemical Formula 2C]

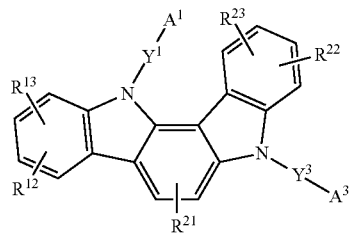

In Chemical Formula 2A, Chemical Formula 2B, and Chemical Formula 2C, $Y^1$ to $Y^3$ are independently a single bond, a substituted or unsubstituted C6 to C30 arylene group, or a substituted or unsubstituted C2 to C30 heteroarylene group, $A^1$ to $A^3$ are independently a substituted or unsubstituted C6 to C30 aryl group, or a substituted or unsubstituted C2 to C30 heterocyclic group, $R^{12}$, $R^{13}$, and $R^{18}$ to $R^{23}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and n is one of integers of 0 to 2.

$A^1$ and $A^2$ of Chemical Formula 2A may independently be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted pyridinyl group, a substituted or unsubstituted pyrimidinyl group, a substituted or unsubstituted dibenzofuranyl group, a substituted or unsubstituted dibenzothiophenyl group, a substituted or unsubstituted carbazolyl group, or a substituted or unsubstituted fluorenyl group.

In a specific example embodiment, Chemical Formula 2A may be one of structures of Group II and *—$Y^1$-$A^1$ and *—$Y^2$-$A^2$ may be one of substituents of Group III.

[Group II]

C-1

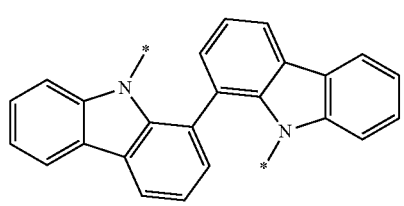

C-2

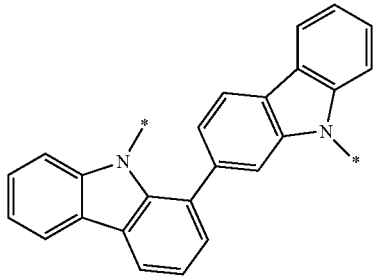

C-3

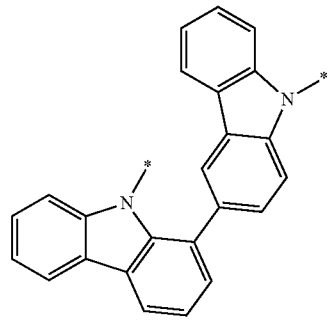

C-4

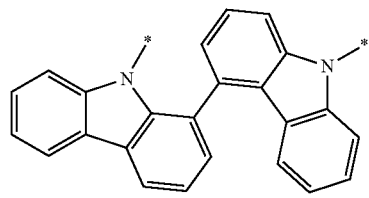

C-5

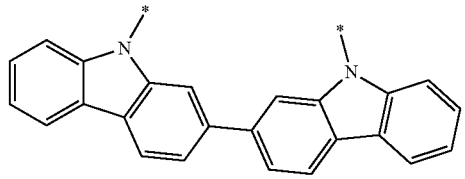

C-6

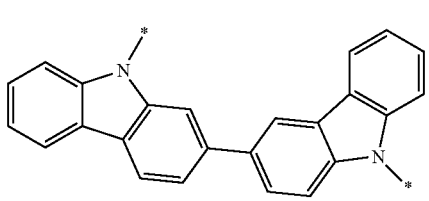

C-7

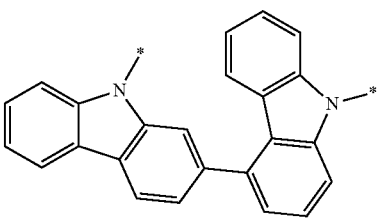

C-8
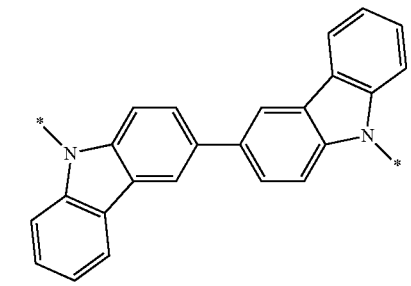
C-9
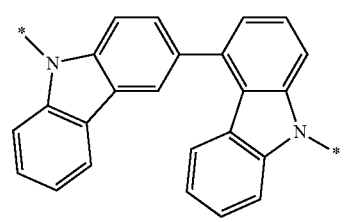
C-10
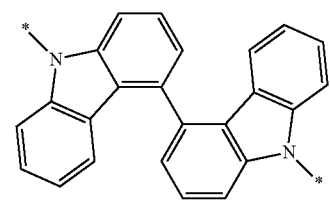
C-11
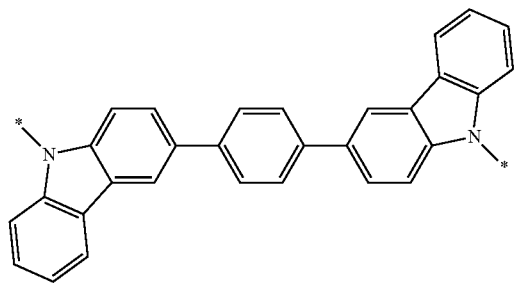
C-12
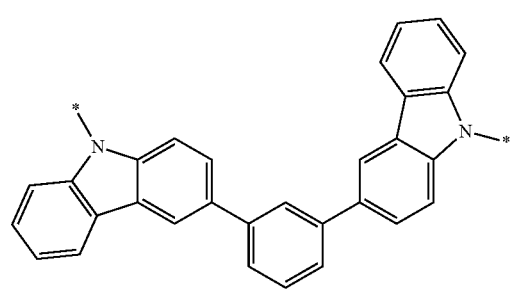
C-13
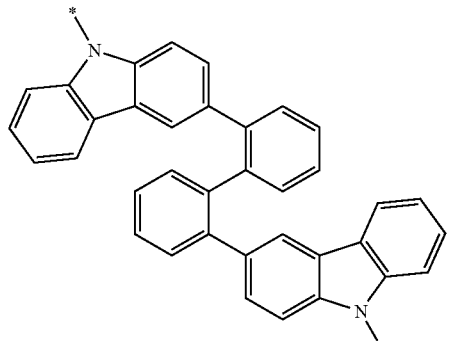
C-14
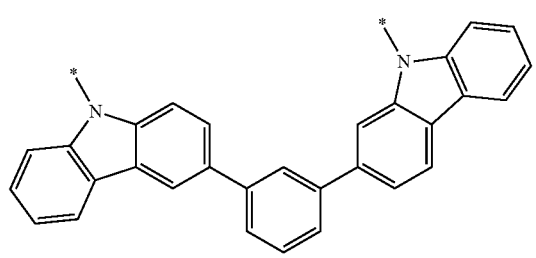
C-15
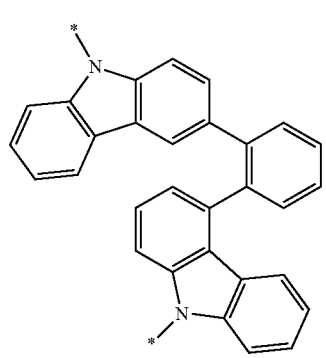
C-16
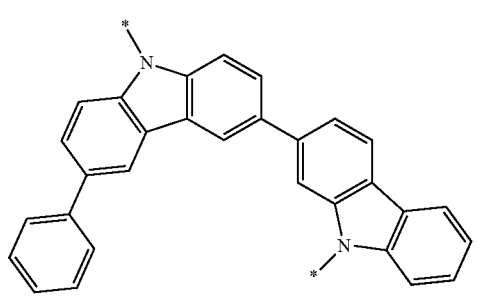
C-17
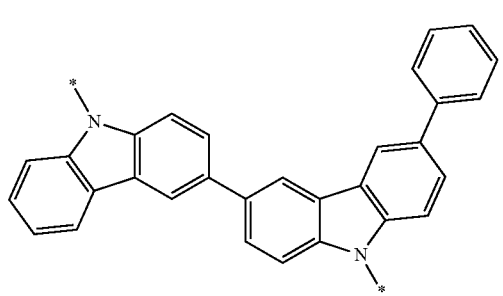

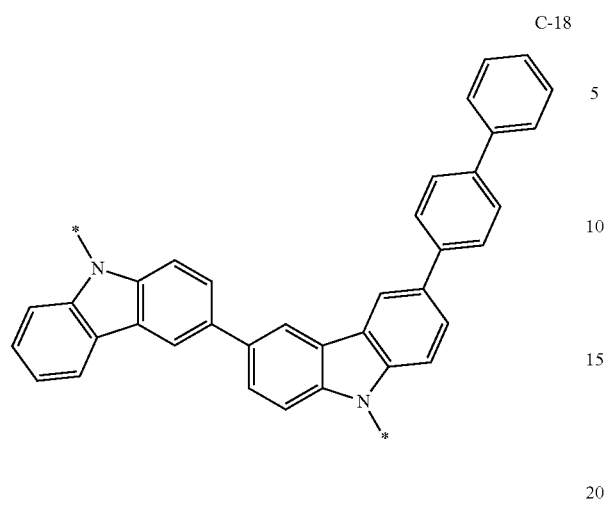
C-18
[Group III]
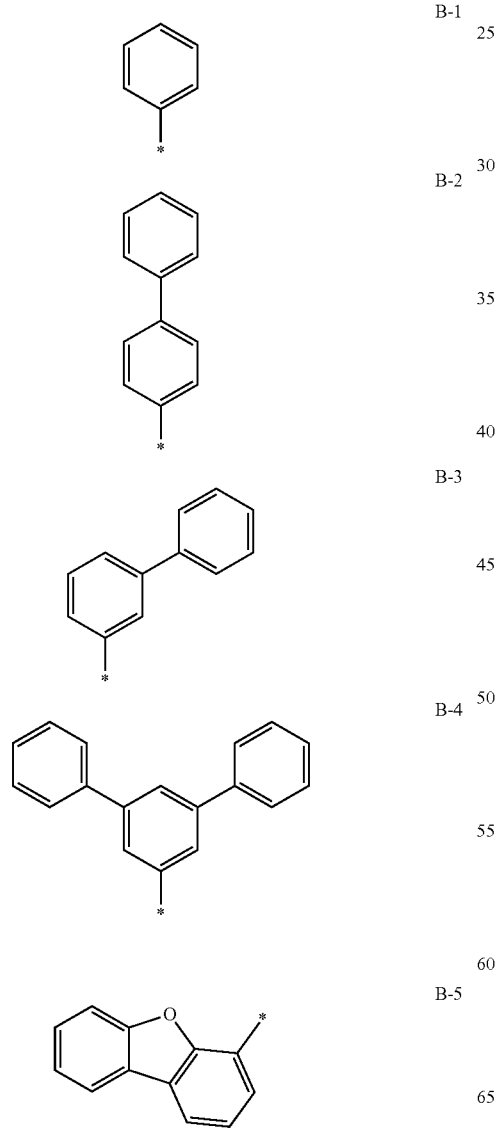
B-1
B-2
B-3
B-4
B-5
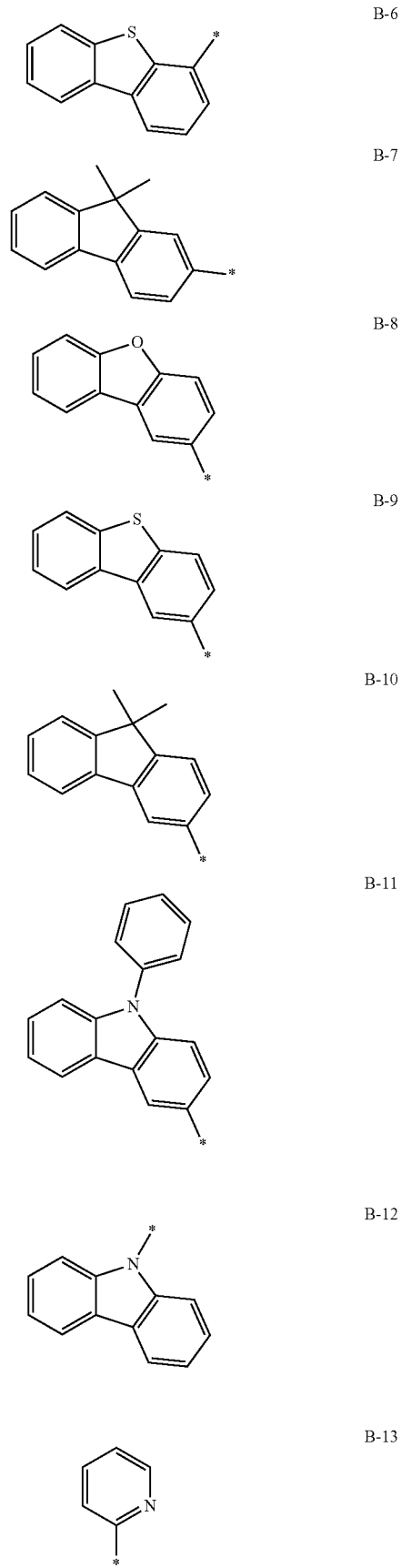
B-6
B-7
B-8
B-9
B-10
B-11
B-12
B-13

B-14 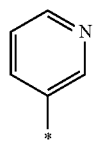
B-15 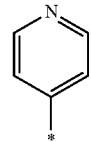
B-16 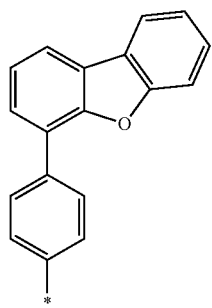
B-17 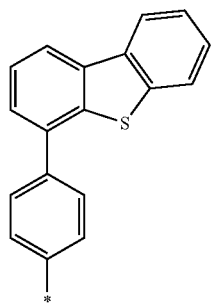
B-18 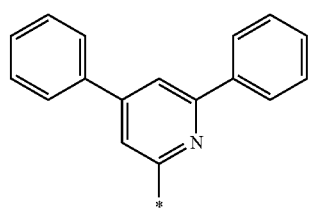
B-19 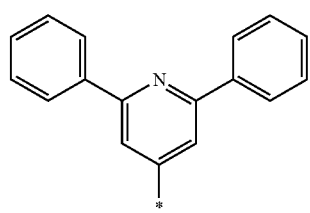
B-20 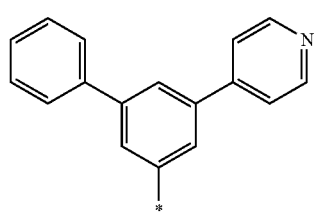
B-21 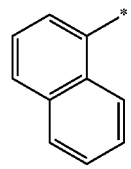
B-22 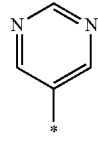
B-23 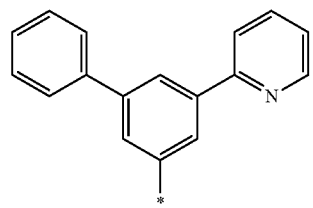
B-24 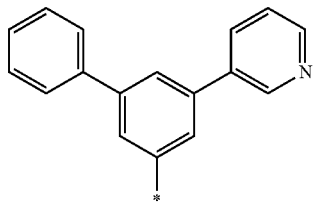
B-25 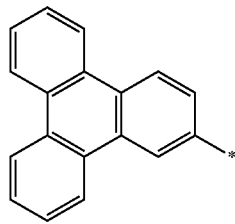
B-26

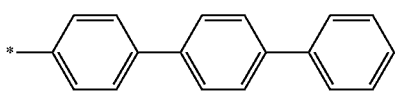

B-27

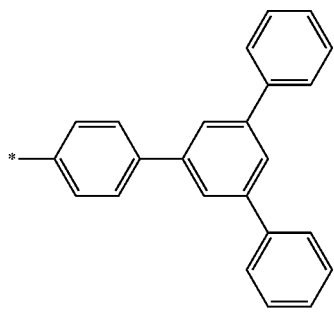

B-28

In Groups II and III, * is a linking point.

In addition, at least one of $A^1$ and $A^3$ of Chemical Formula 2B and Chemical Formula 2C may be a substituted or unsubstituted N-containing C2 to C30 heterocyclic group except a carbazolyl group and the rest may be a substituted or unsubstituted C6 to C30 aryl group.

For example, $A^1$ may be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted phenanthrenyl group, or a substituted or unsubstituted fluorenyl group and $A^3$ may be a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group, or $A^1$ may be a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group and $A^3$ may be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted phenanthrenyl group, or a substituted or unsubstituted fluorenyl group.

In a specific example embodiment, $A^1$ and $A^2$ of Chemical Formula 2A may independently be a substituted or unsubstituted phenyl group, a substituted or unsubstituted meta-biphenyl group, a substituted or unsubstituted para-biphenyl group, or a substituted or unsubstituted pyridinyl group, $A^1$ and $A^3$ of Chemical Formula 2B and Chemical Formula 2C may independently be a substituted or unsubstituted phenyl group, a substituted or unsubstituted triazinyl group, or a substituted or unsubstituted quinazolinyl group, and one of $A^1$ and $A^3$ may be a substituted or unsubstituted triazinyl group, or a substituted or unsubstituted quinazolinyl group.

In a specific example embodiment, $R^{12}$, $R^{13}$, and $R^{21}$ to $R^{23}$ of Chemical Formula 2B and Chemical Formula 2C may independently be hydrogen, deuterium, a substituted or unsubstituted C1 to C10 alkyl group, a substituted or unsubstituted C6 to C20 aryl group, or a substituted or unsubstituted C2 to C20 heterocyclic group, and more specifically hydrogen, deuterium, a substituted or unsubstituted C1 to C4 alkyl group, a substituted or unsubstituted C6 to C12 aryl group, for example hydrogen, deuterium, a substituted or unsubstituted C1 to C4 alkyl group, a substituted or unsubstituted phenyl group, a substituted or unsubstituted biphenyl group, or a substituted or unsubstituted naphthyl group.

In a specific example embodiment, $R^{12}$, $R^{13}$, and $R^{21}$ to $R^{23}$ of Chemical Formula 2B and Chemical Formula 2C may be all hydrogen.

In a specific example embodiment, $Y^1$ to $Y^3$ of Chemical Formula 2A to Chemical Formula 2C may independently be a single bond, or a substituted or unsubstituted C6 to C30 arylene group and more specifically single bond, a substituted or unsubstituted C6 to C12 arylene group, for example, a single bond, a substituted or unsubstituted phenylene group, a substituted or unsubstituted para-biphenylene group, or a substituted or unsubstituted meta-biphenylene group.

For example, Chemical Formula 2 may be represented by Chemical Formula 2A, Chemical Formula 2B, or Chemical Formula 2C.

The second compound for an organic optoelectric device may be for example compounds of Group 2, but is not limited thereto.

[Group 2]
[D-1]
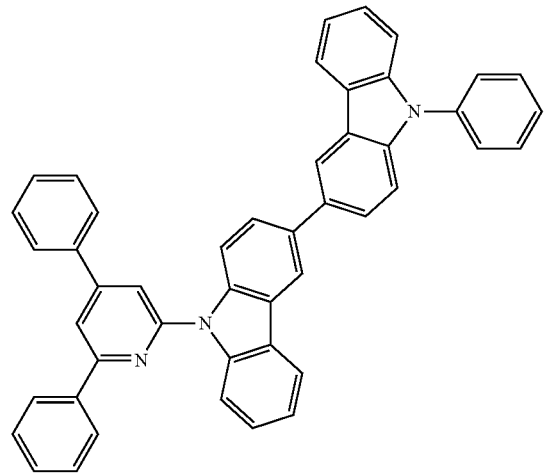
[D-2]
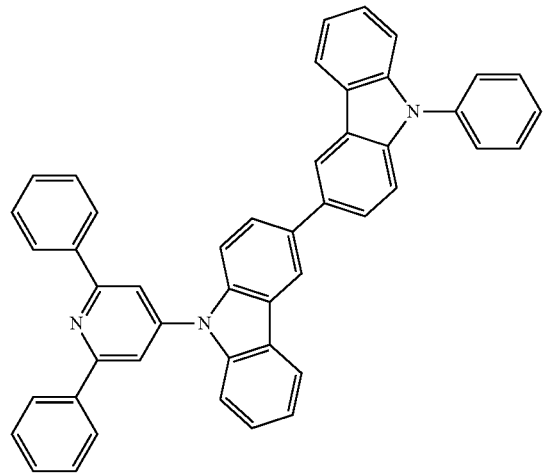
[D-3]
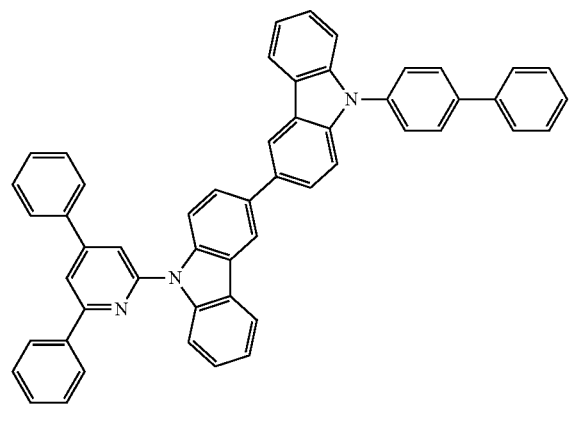
[D-4]
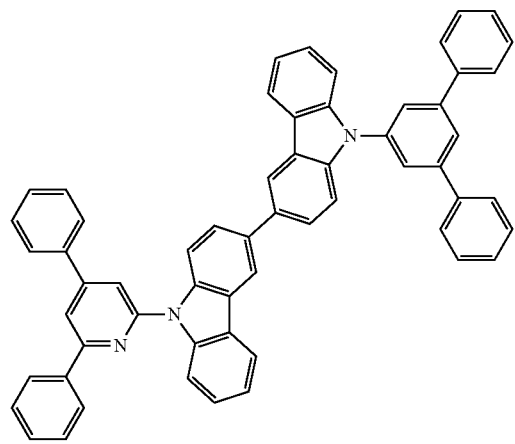
[D-5]
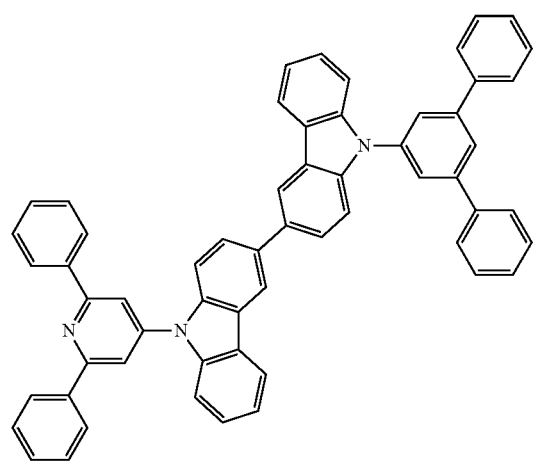
[D-6]
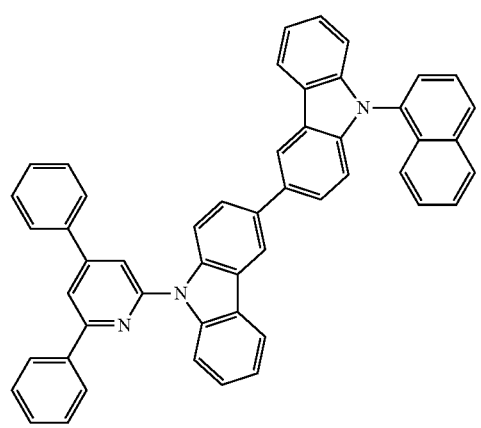

-continued
[D-7]
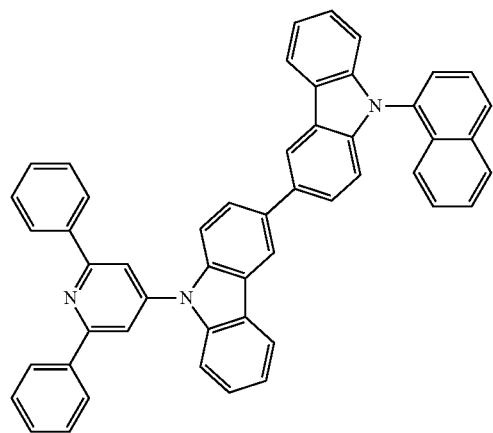
[D-8]
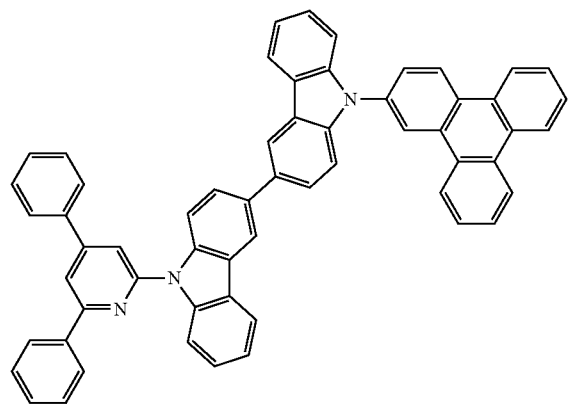
[D-9]
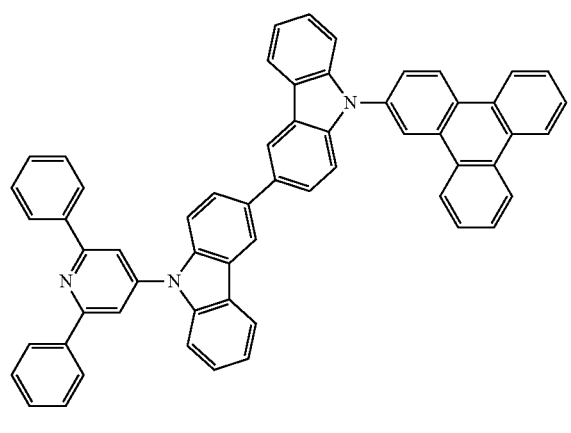
[D-10]
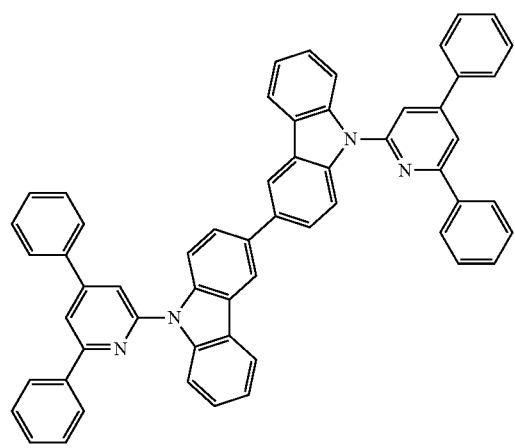
[D-11]
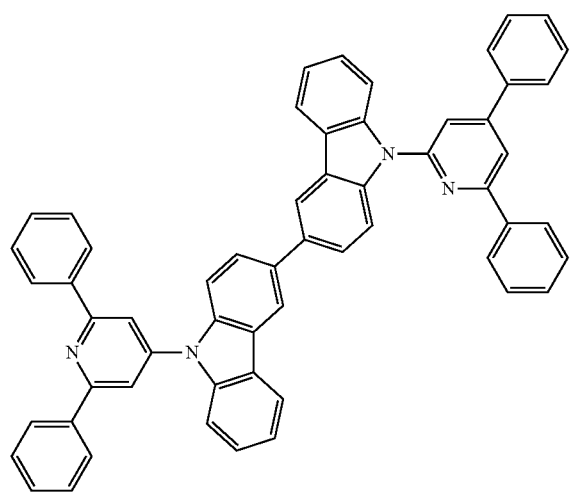
[D-12]
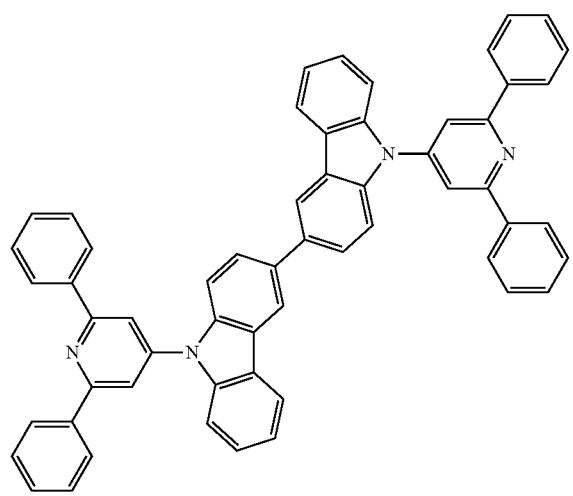

-continued
[D-13]
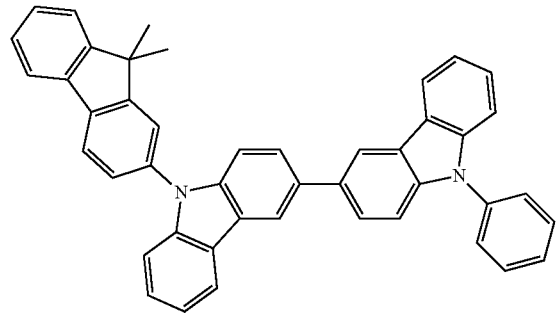
[D-14]
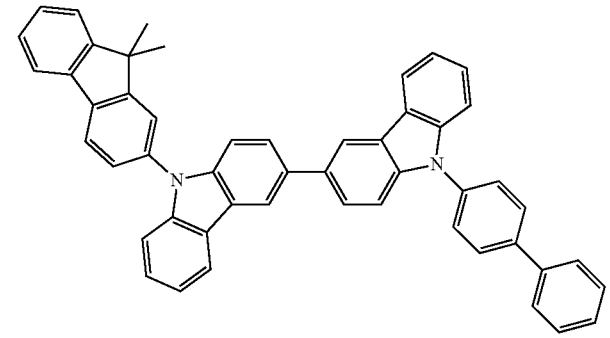
[D-15]
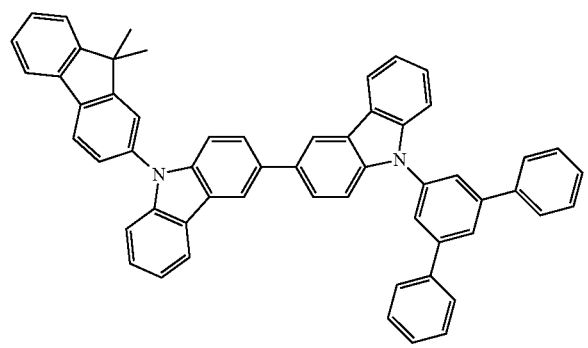
[D-16]
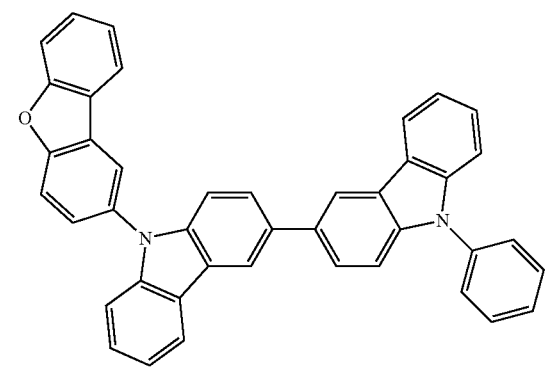
[D-17]
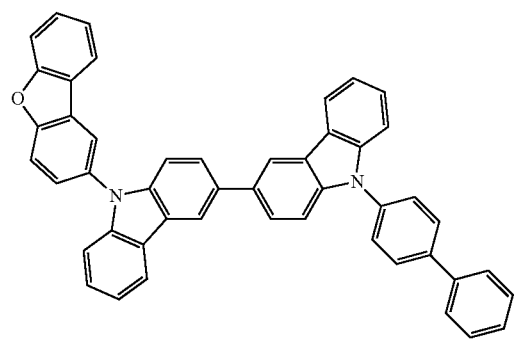
[D-18]
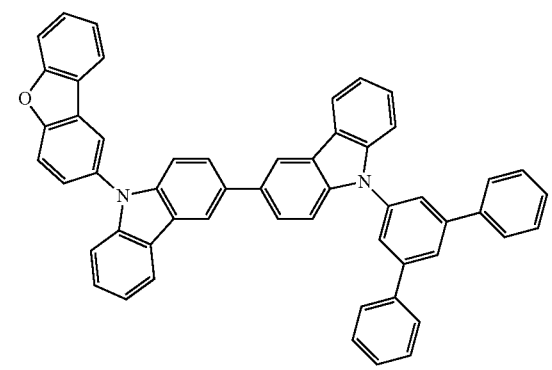
[D-19]
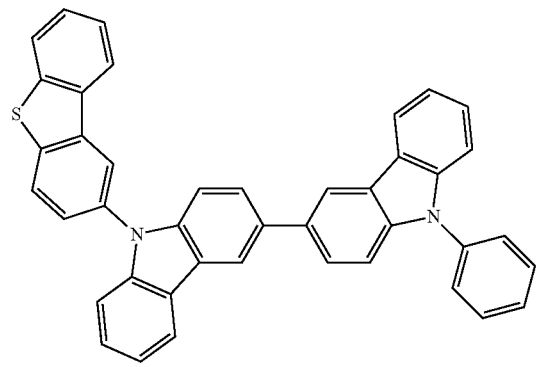
[D-20]
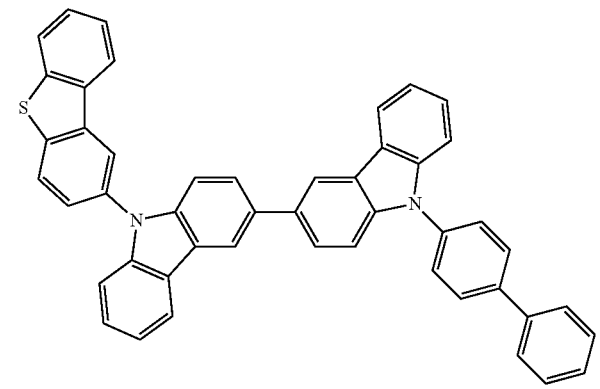

-continued
[D-21]
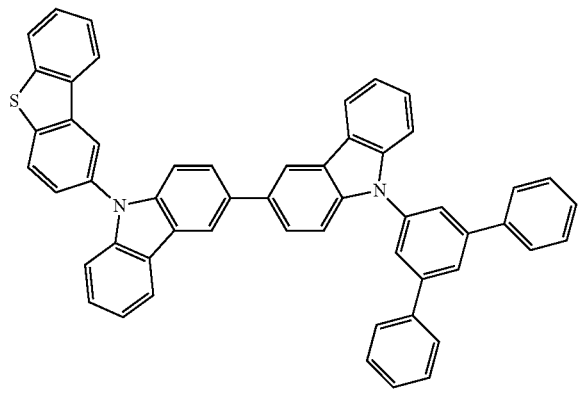
[D-22]
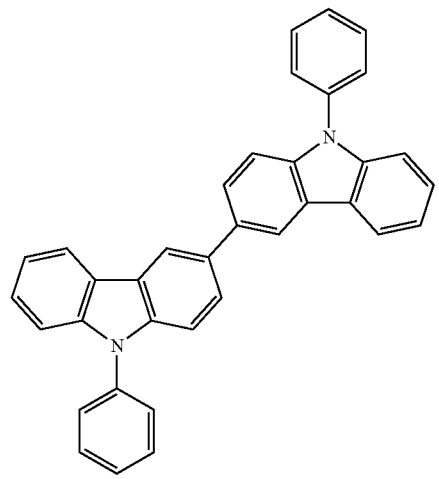
[D-23]
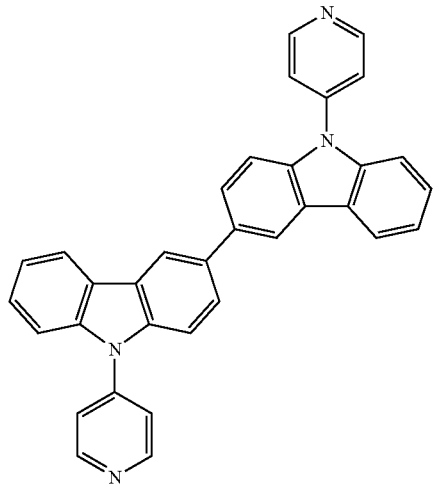
[D-24]
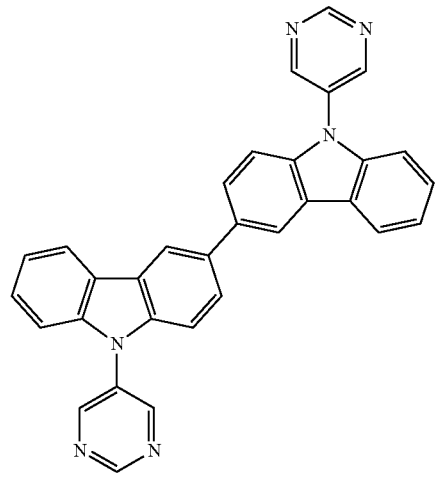
[D-25]
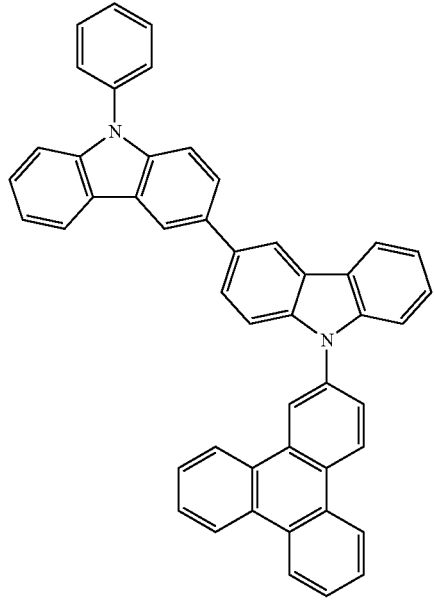
[D-26]
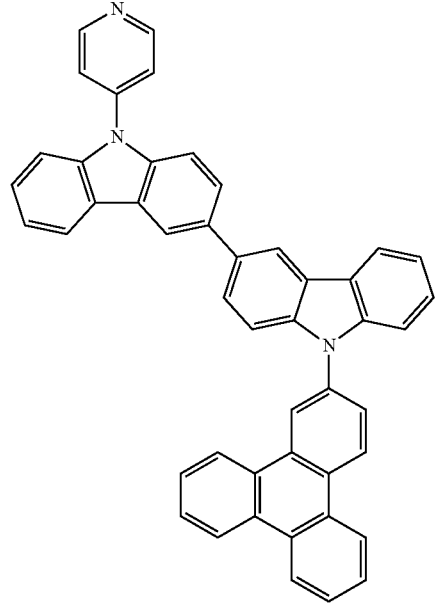

-continued
[D-27]
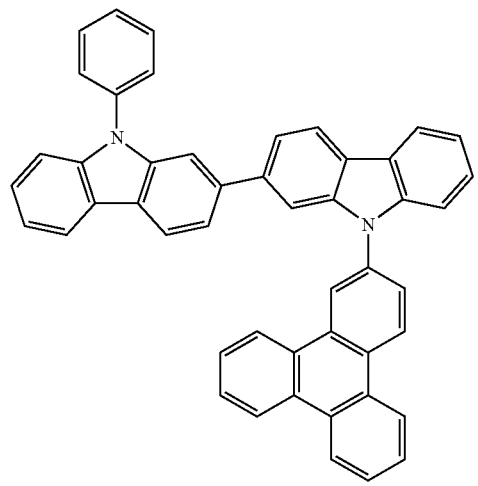
[D-28]
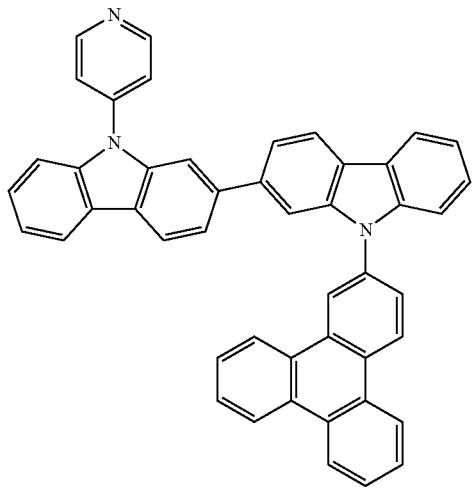
[D-29]
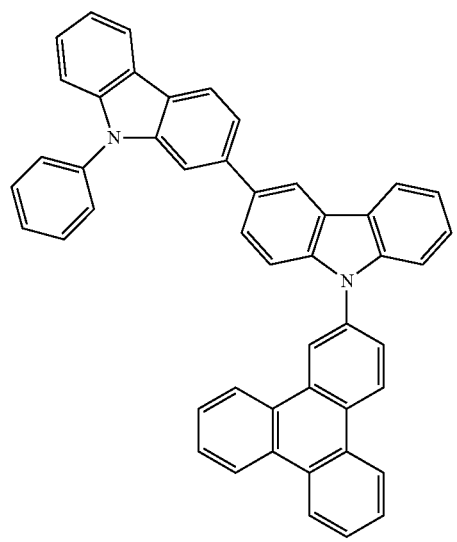
[D-30]
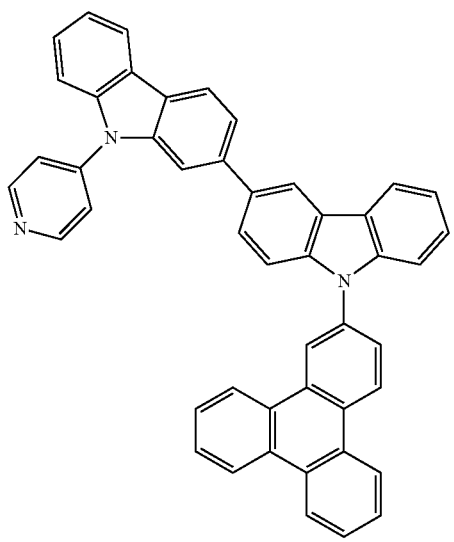

-continued
[D-31]
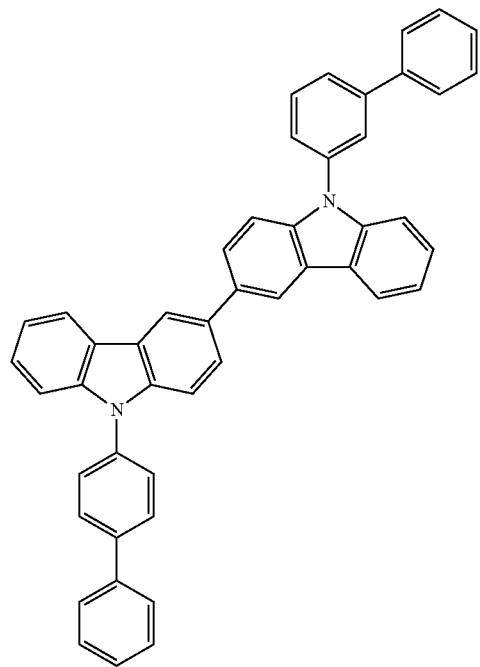
[D-32]
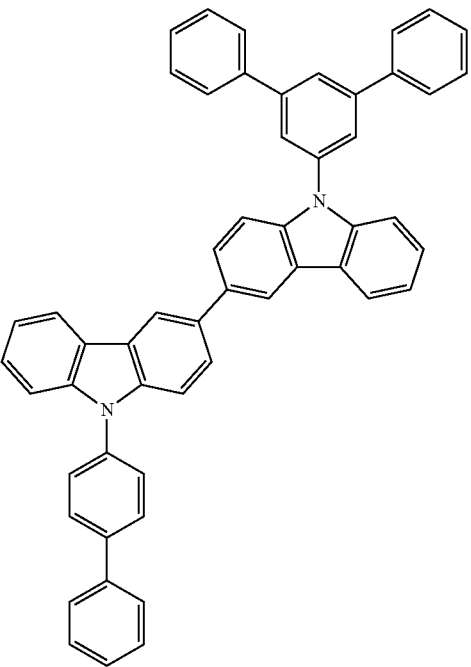
[D-33]
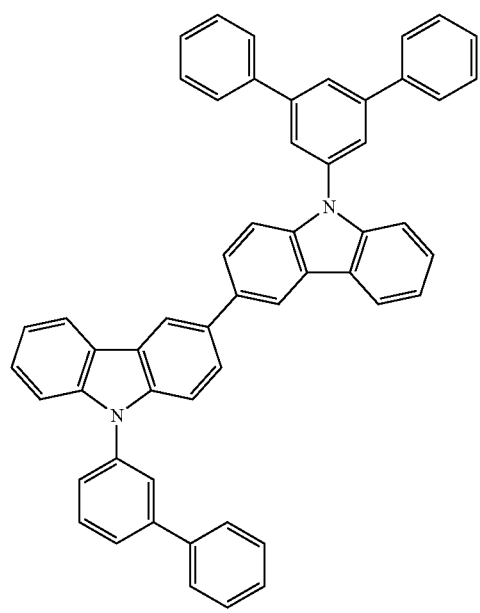
[D-34]
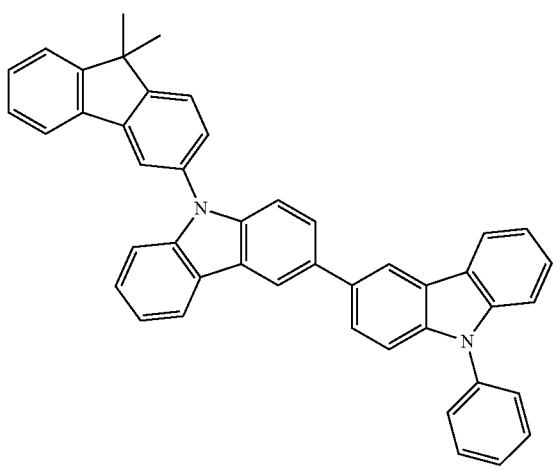

-continued
[D-35]
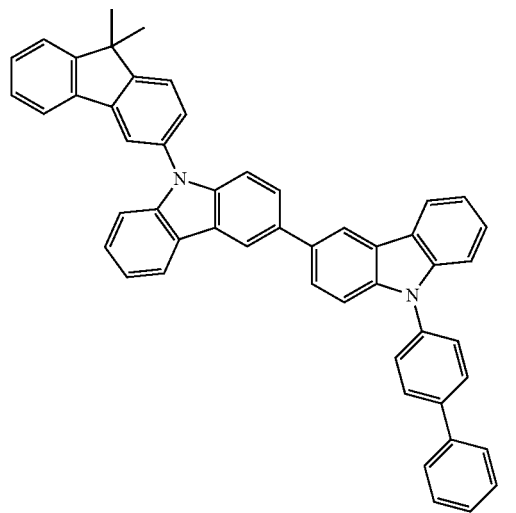
[D-36]
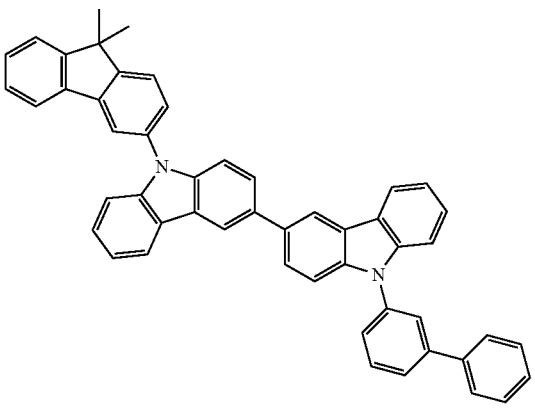
[D-37]
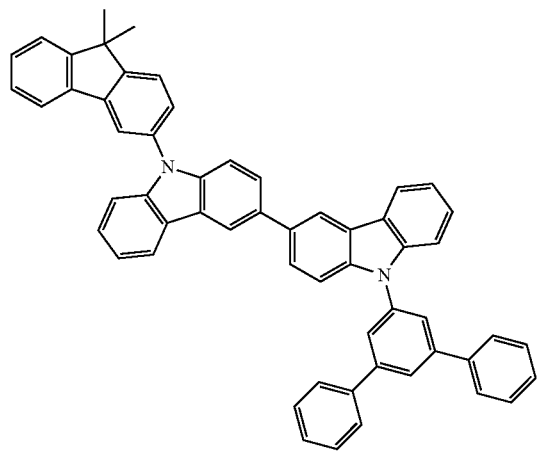
[D-38]
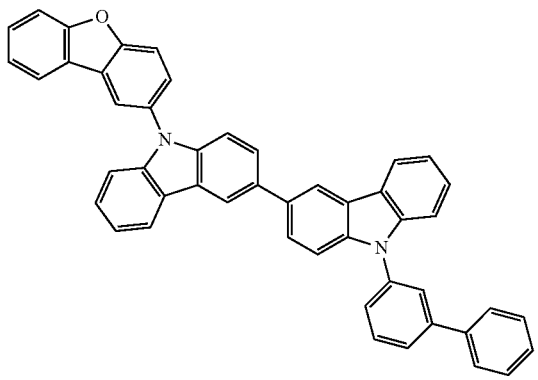
[D-39]
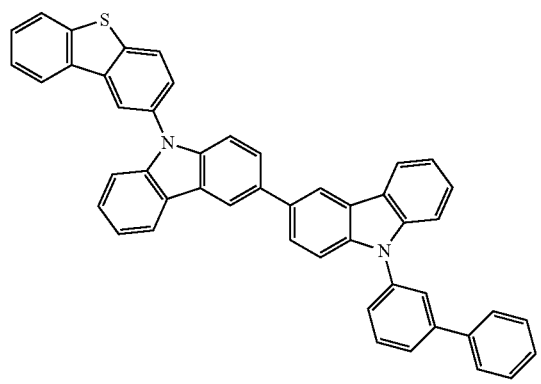
[D-40]
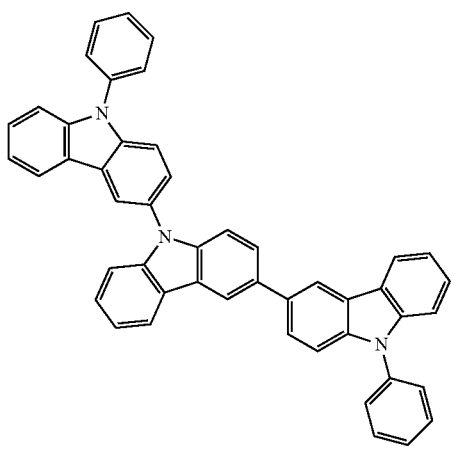

-continued
[D-41]
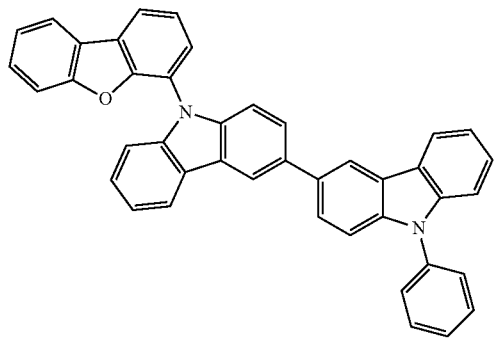
[D-42]
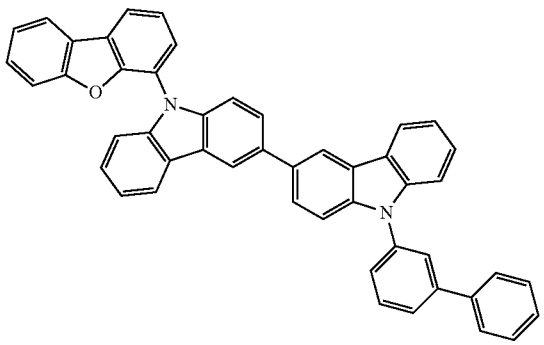
[D-43]
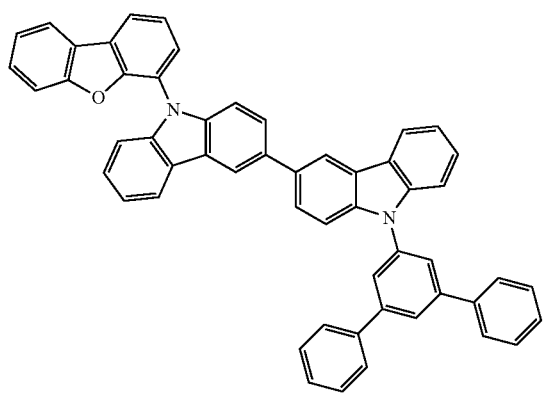
[D-44]
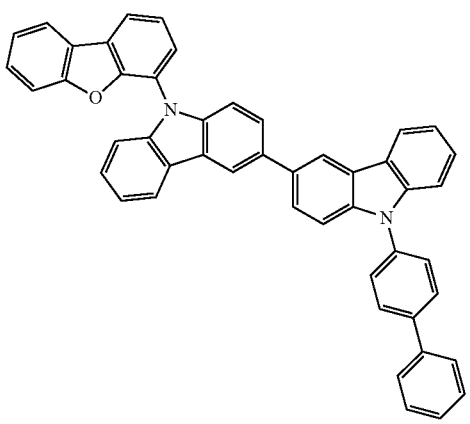
[D-45]
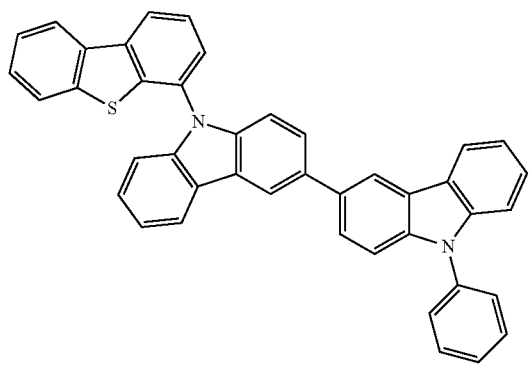
[D-46]
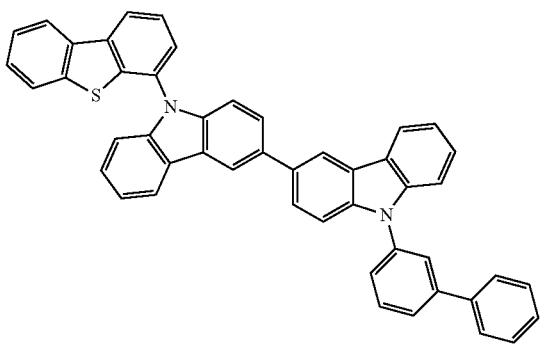
[D-47]
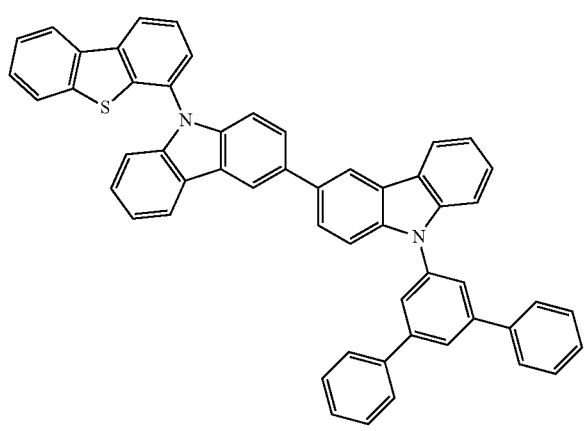
[D-48]
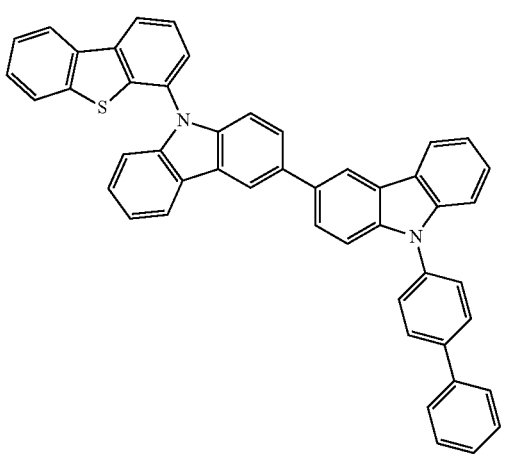

-continued
[D-49]
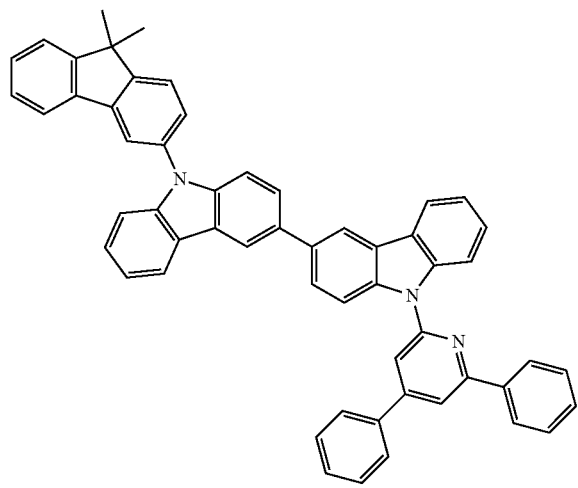
[D-50]
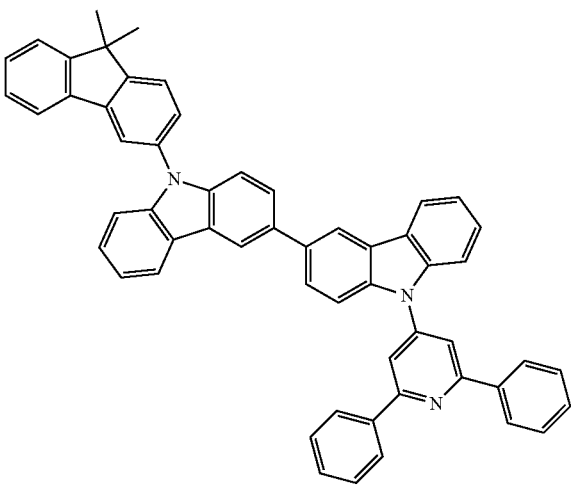
[D-51]
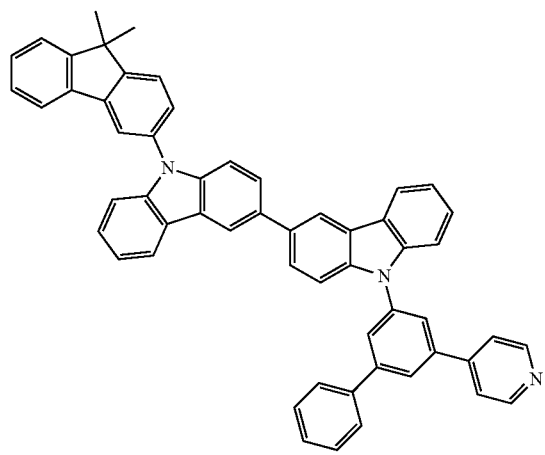
[D-52]
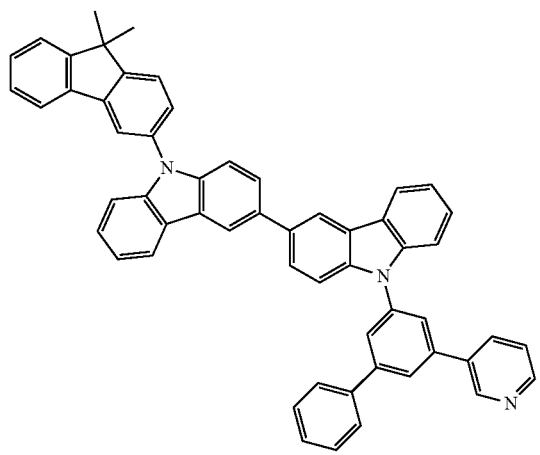
[D-53]
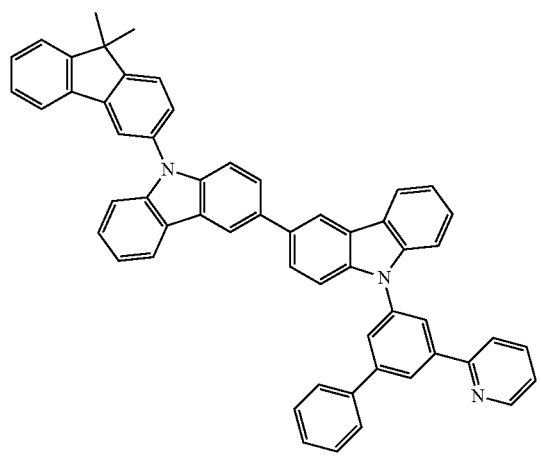
[D-54]
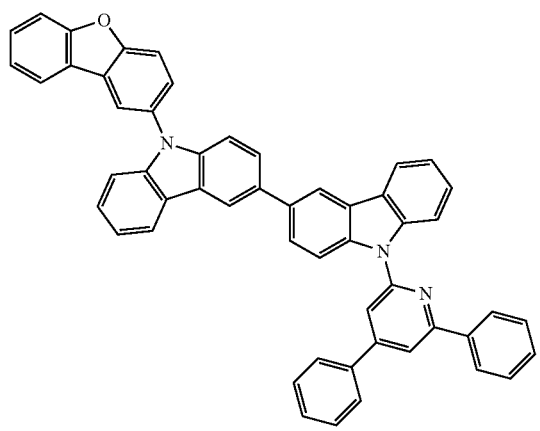

-continued
[D-55]
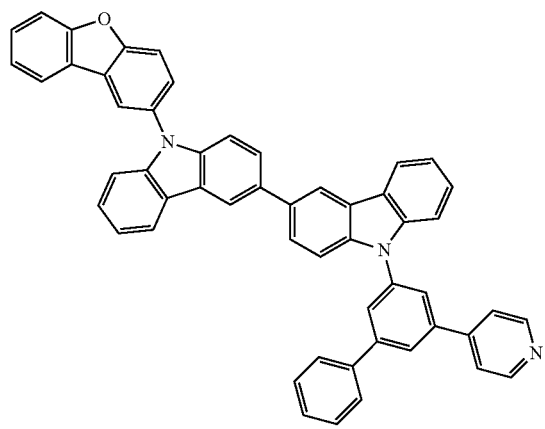
[D-56]
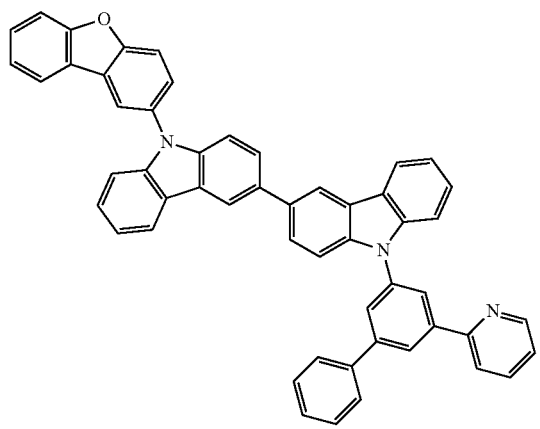
[D-57]
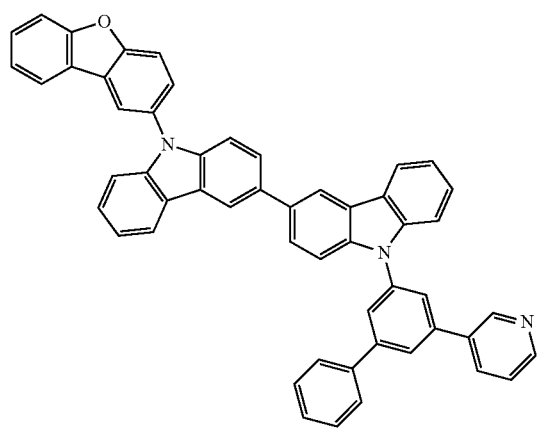
[D-58]
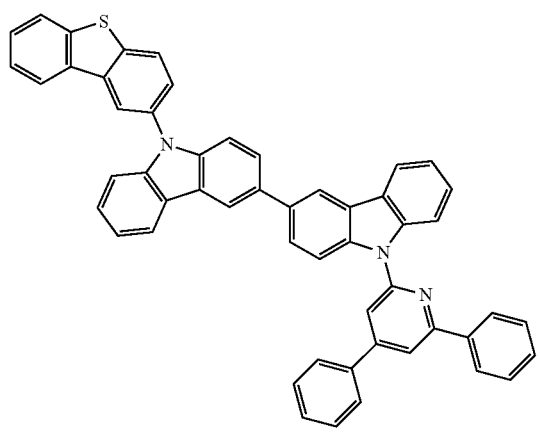
[D-59]
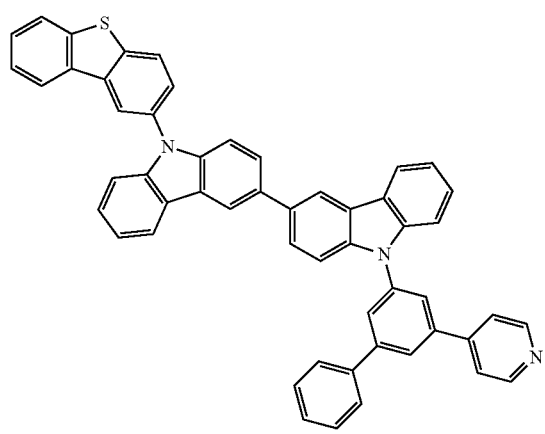
[D-60]
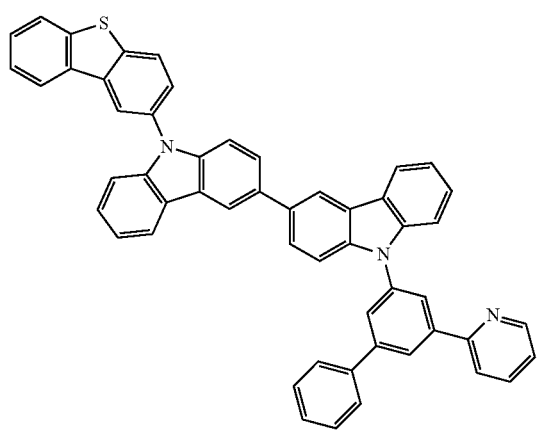

-continued
[D-61]
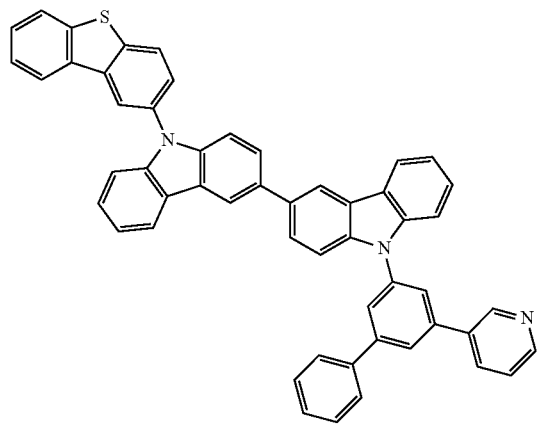
[D-62]
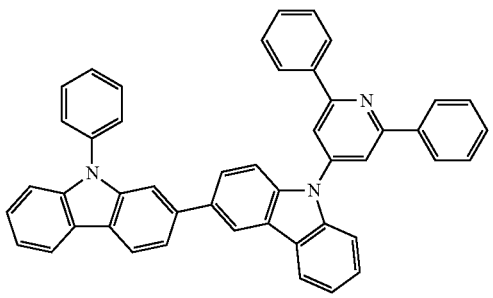
[D-63]
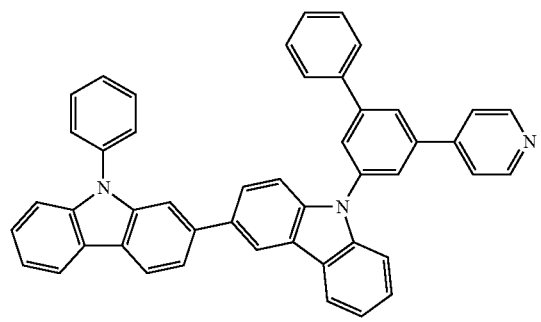
[D-64]
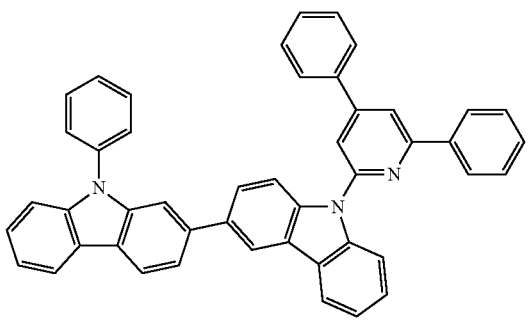
[D-65]
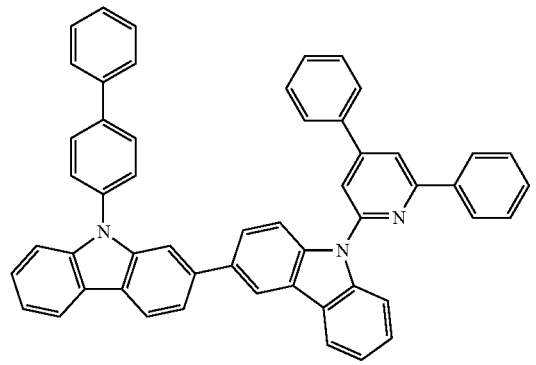
[D-66]
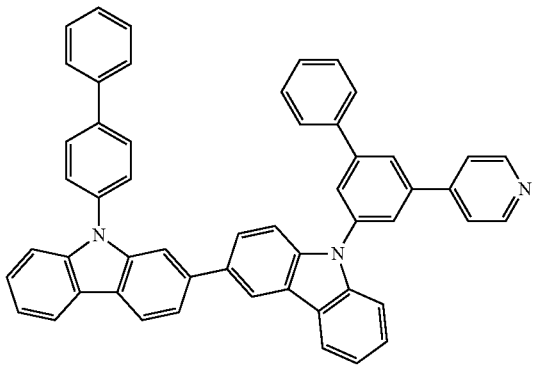
[D-67]
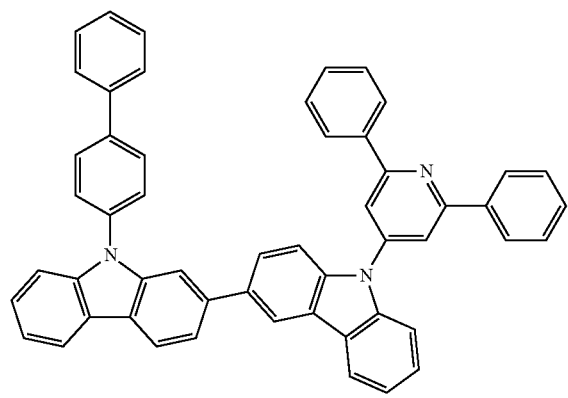
[D-68]
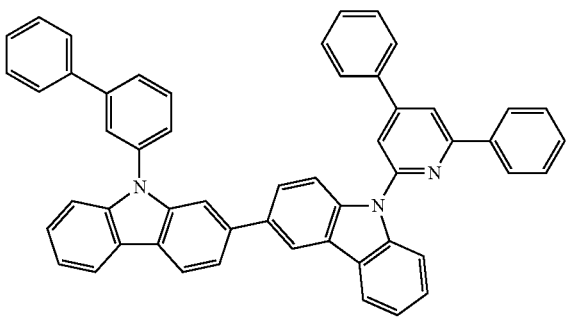

-continued
[D-69]
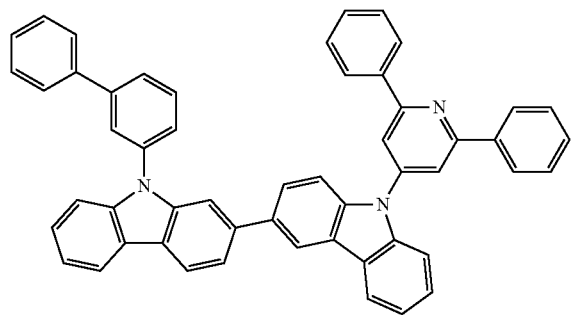
[D-70]
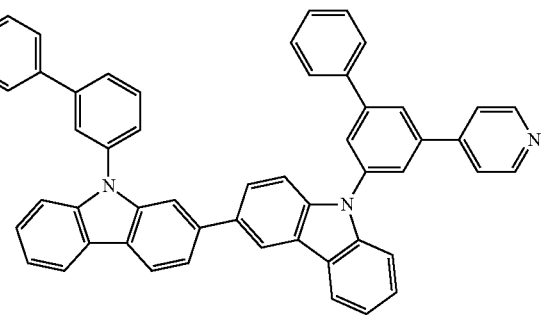
[D-71]
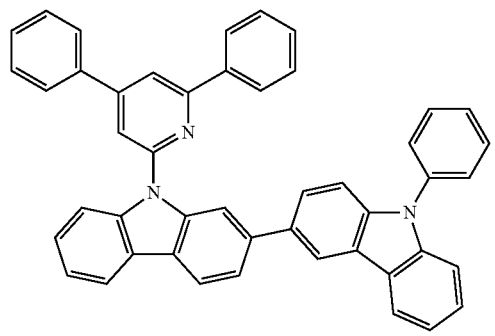
[D-72]
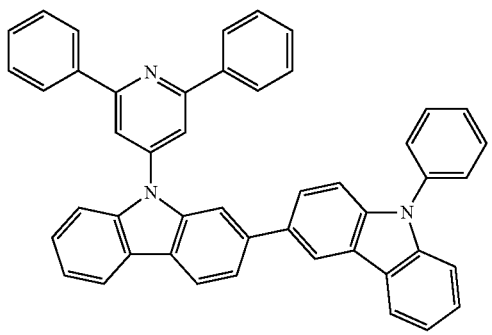
[D-73]
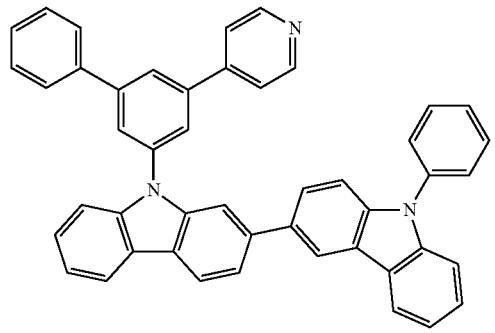
[D-74]
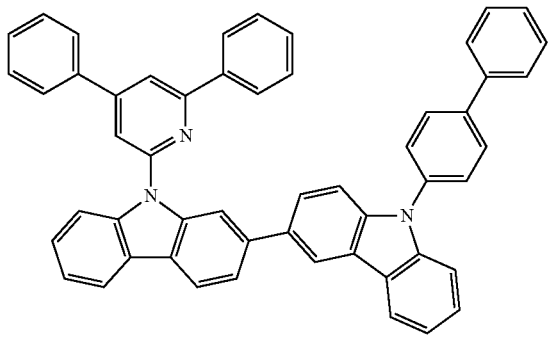
[D-75]
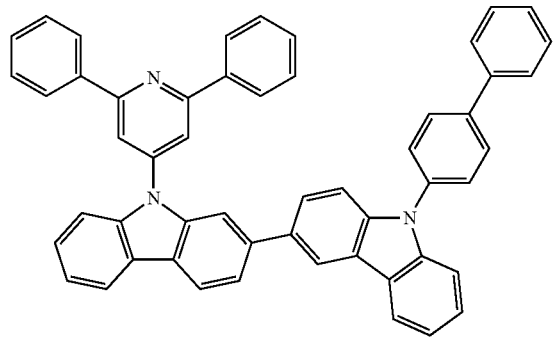
[D-76]
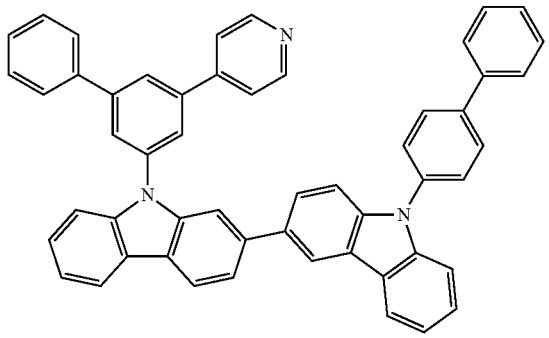

-continued
[D-77]
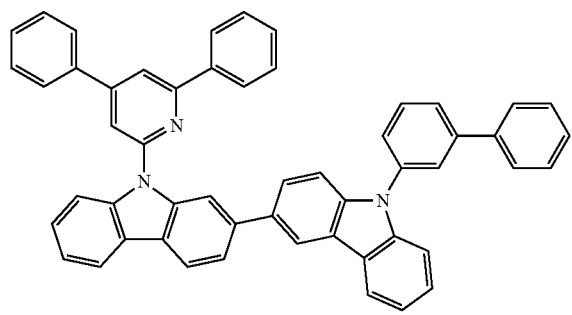
[D-78]
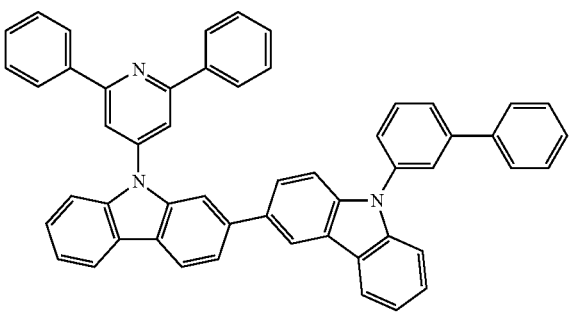
[D-79]
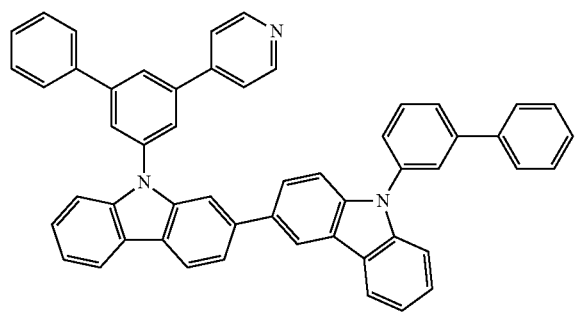
[D-80]
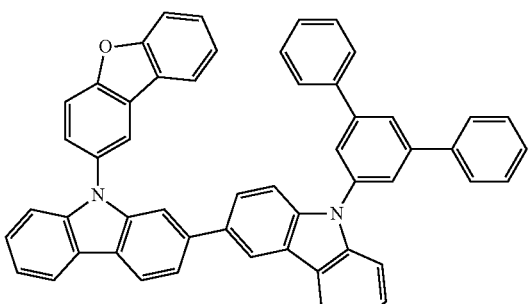
[D-81]
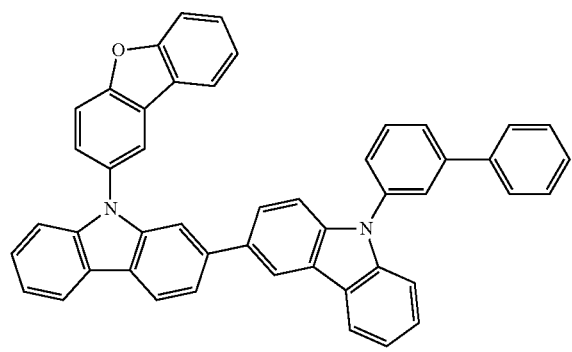
[D-82]
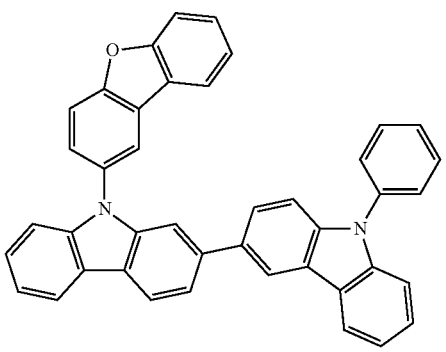
[D-83]
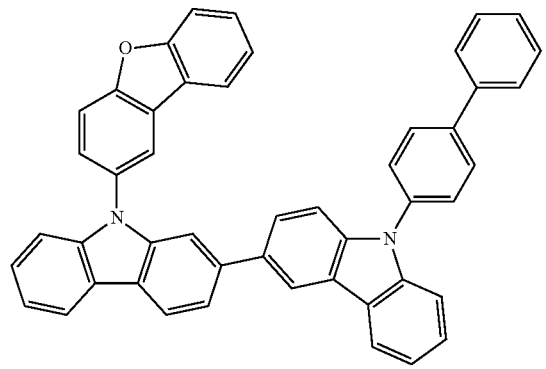
[D-84]
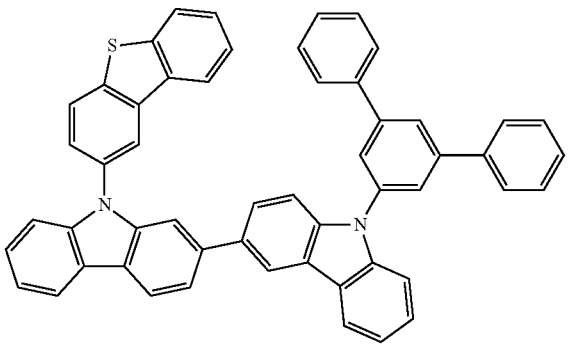

-continued
[D-85]
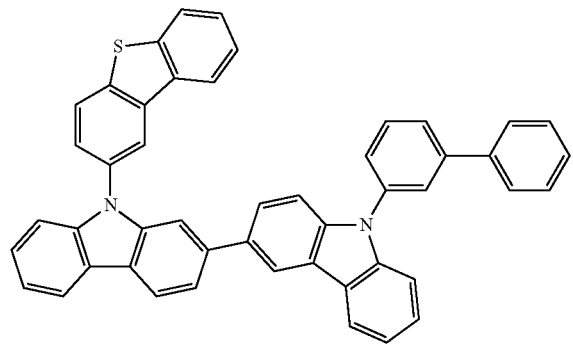
[D-86]
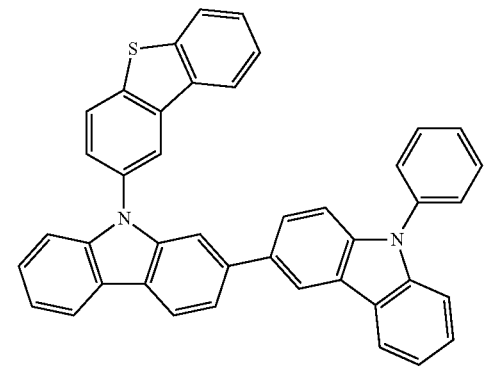
[D-87]
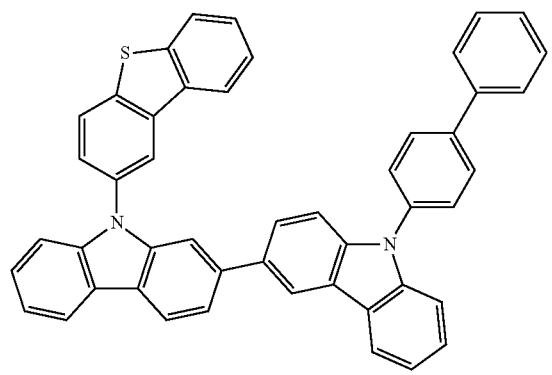
[D-88]
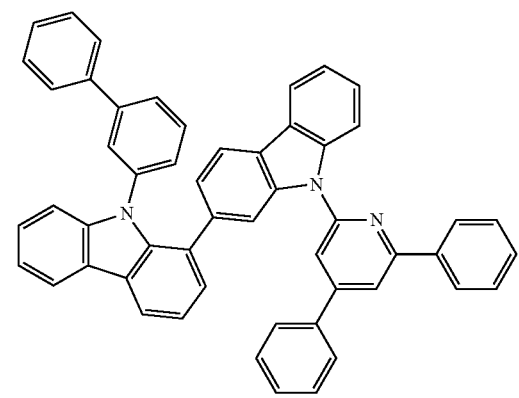
[D-89]
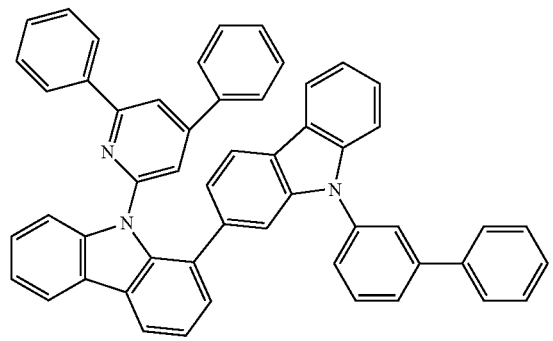
[D-90]
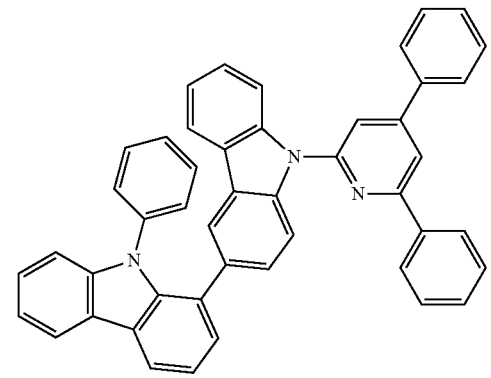
[D-91]
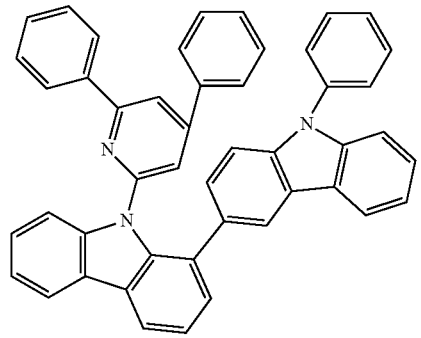
[D-92]
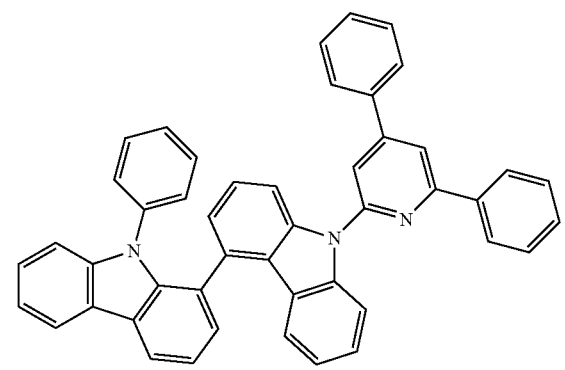

-continued
[D-93]
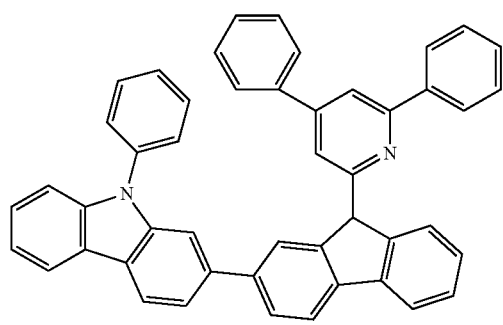
[D-94]
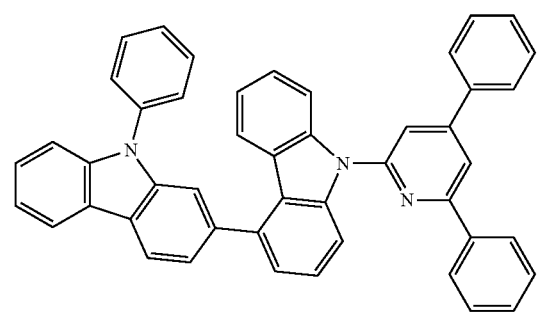
[D-95]
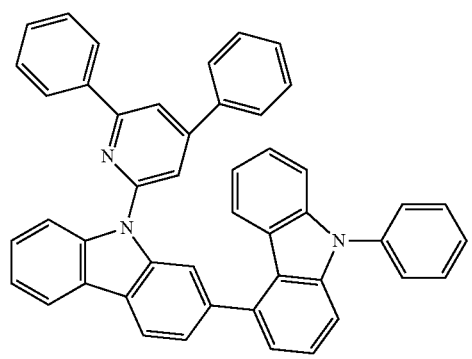
[D-96]
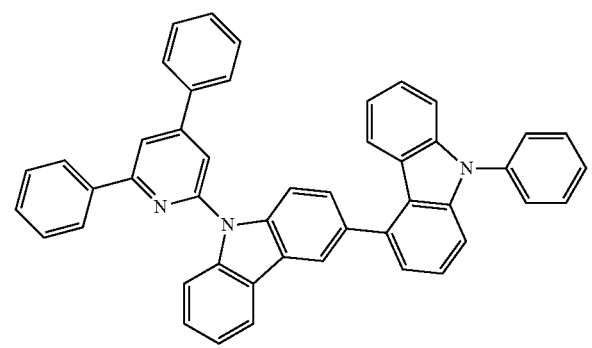
[D-97]
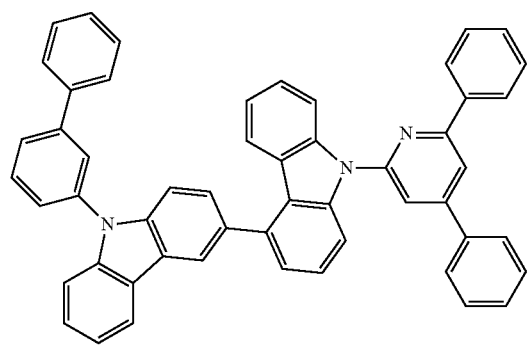
[D-98]
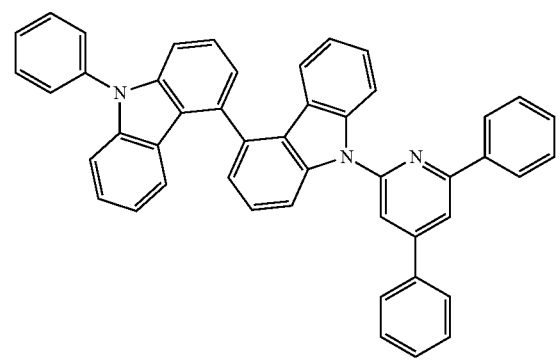

-continued
[D-99]
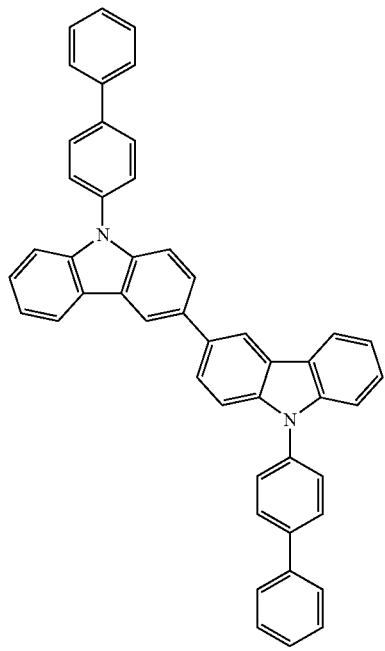
[D-100]
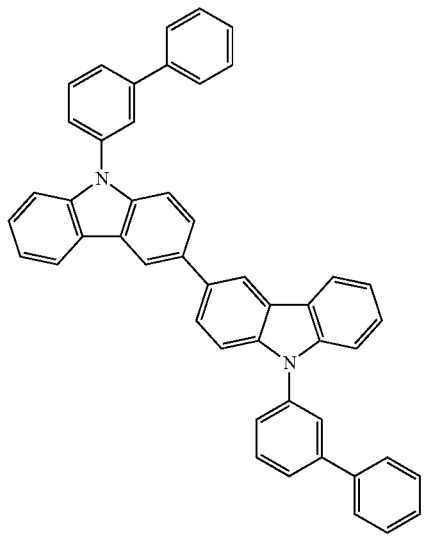
[D-101]
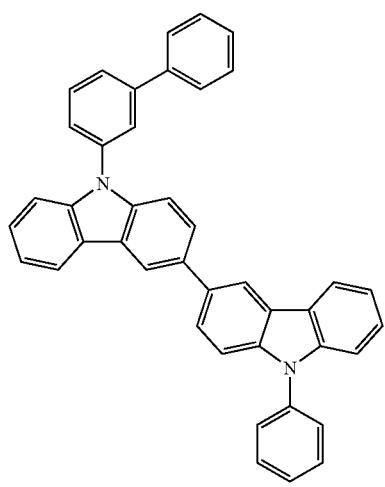
[D-102]
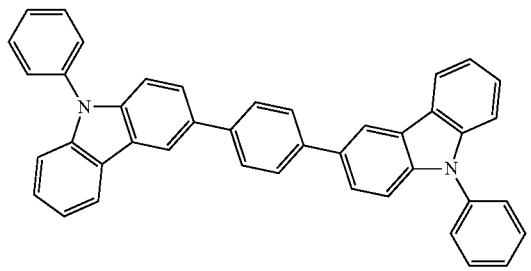
[D-103]
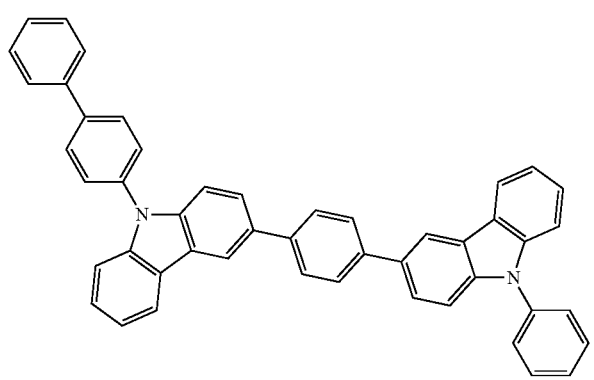

-continued
[D-104]
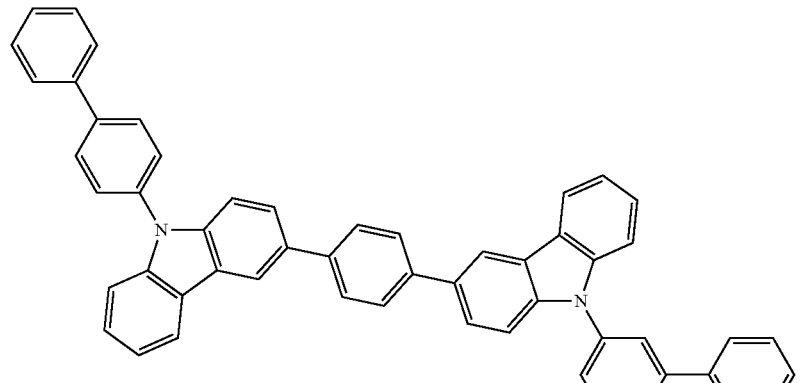
[D-105]
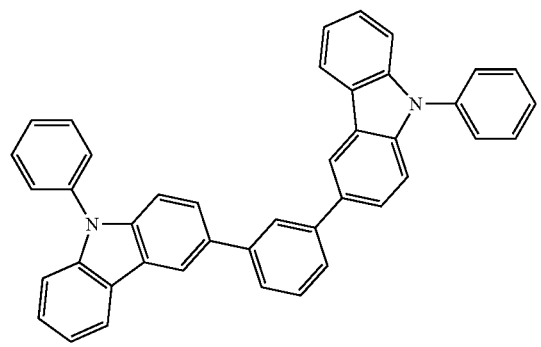
[D-106]
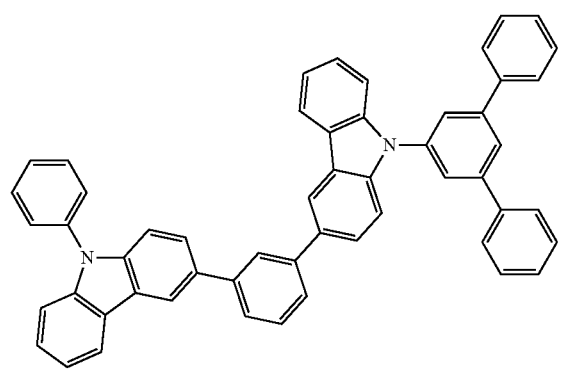
[D-107]
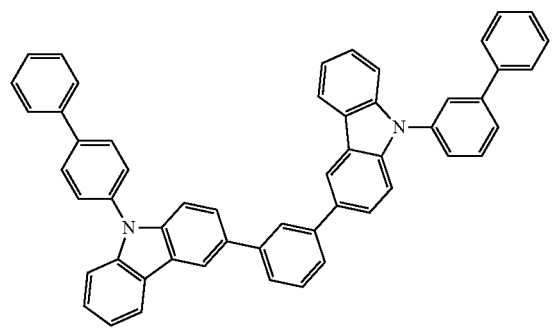
[D-108]
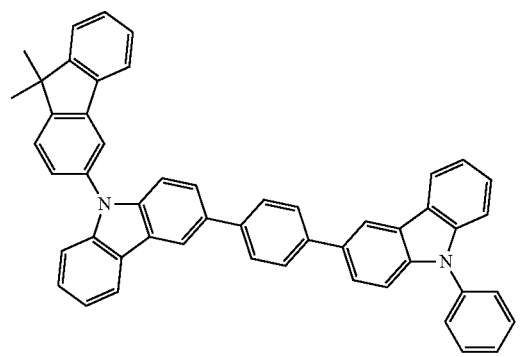
[D-109]
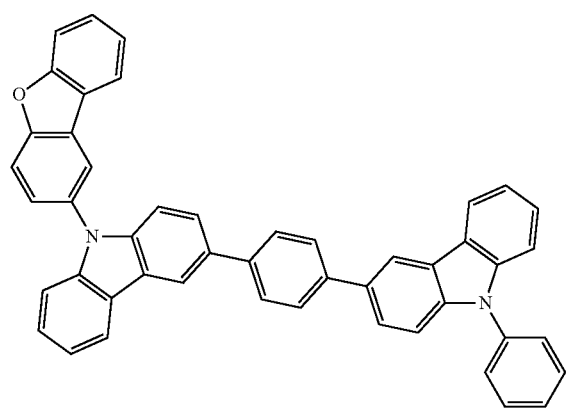
[D-110]
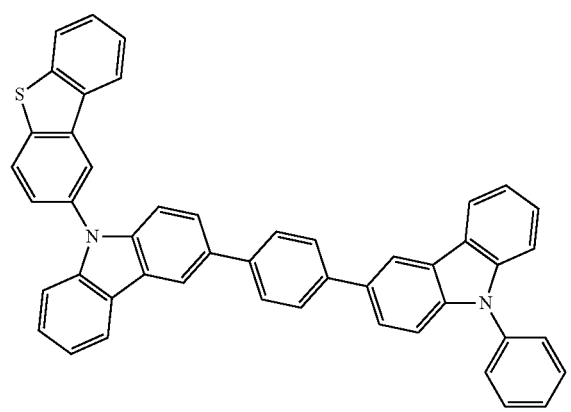

-continued
[D-111]
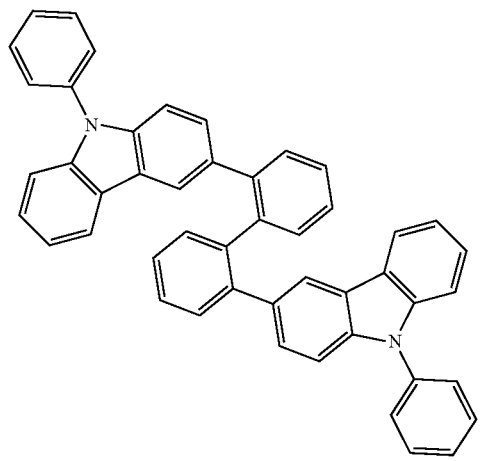
[D-112]
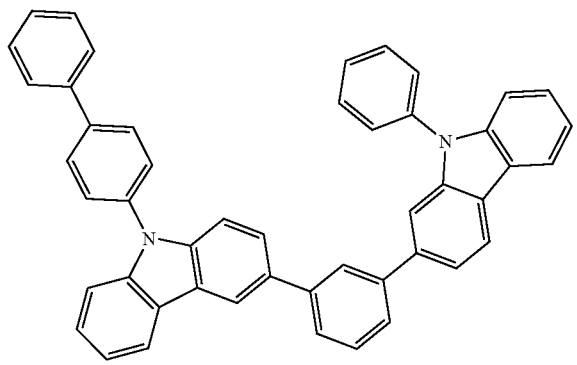
[D-113]
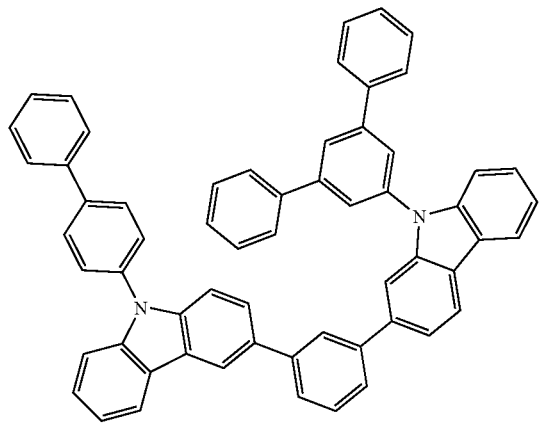
[D-114]
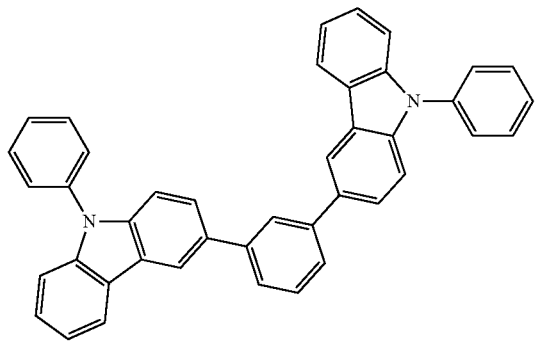
[D-115]
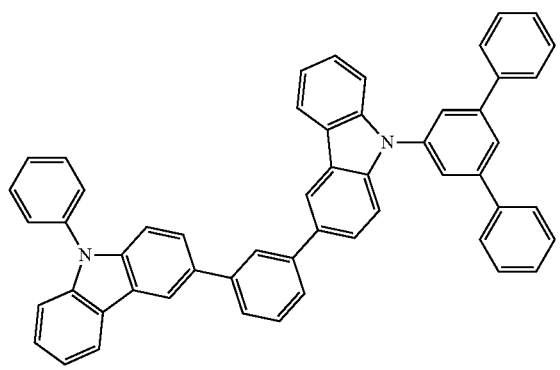
[D-116]
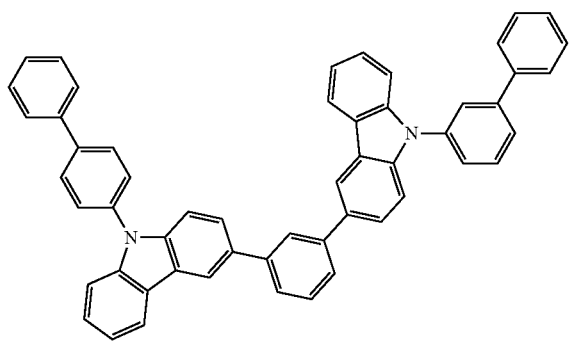

-continued
[D-117]
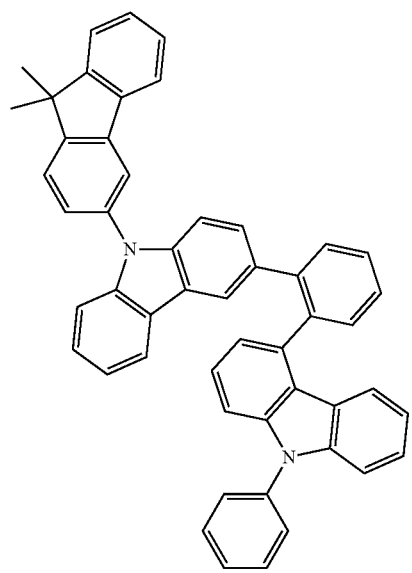
[D-118]
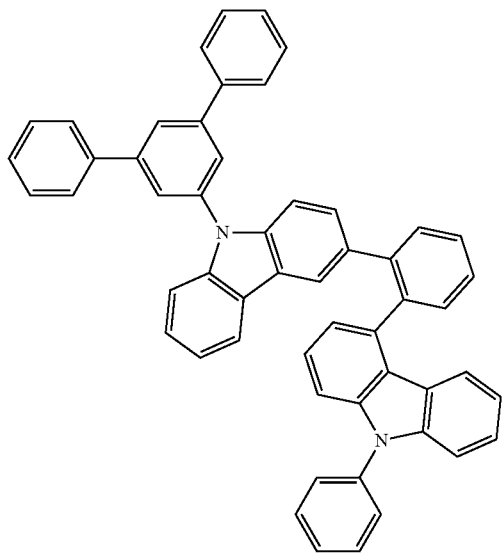
[D-119]
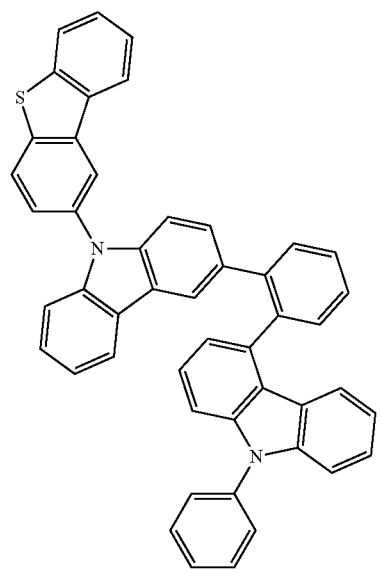
[D-120]
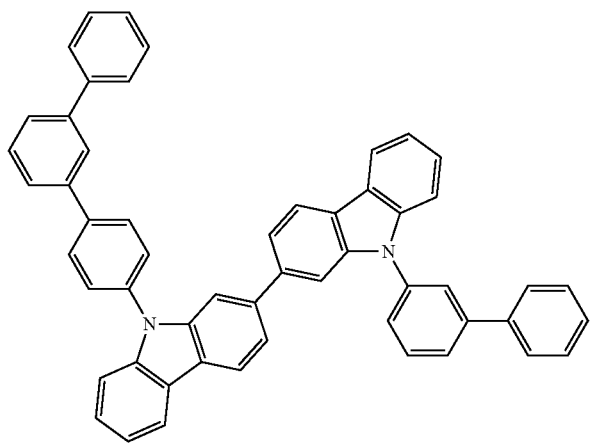
[D-121]
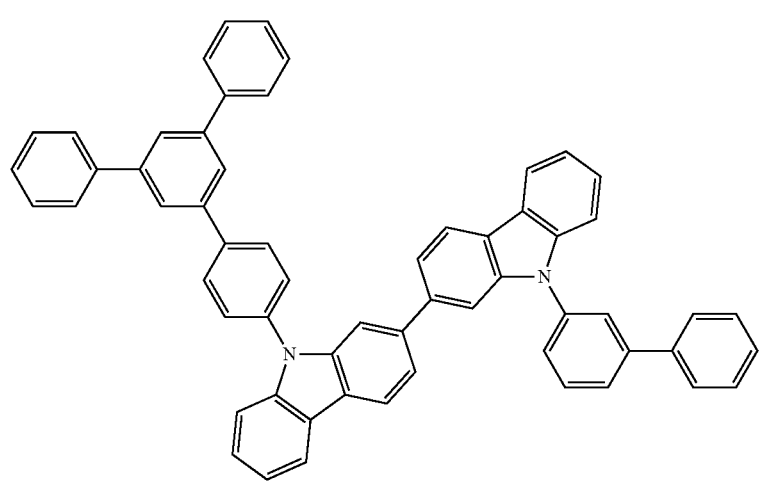

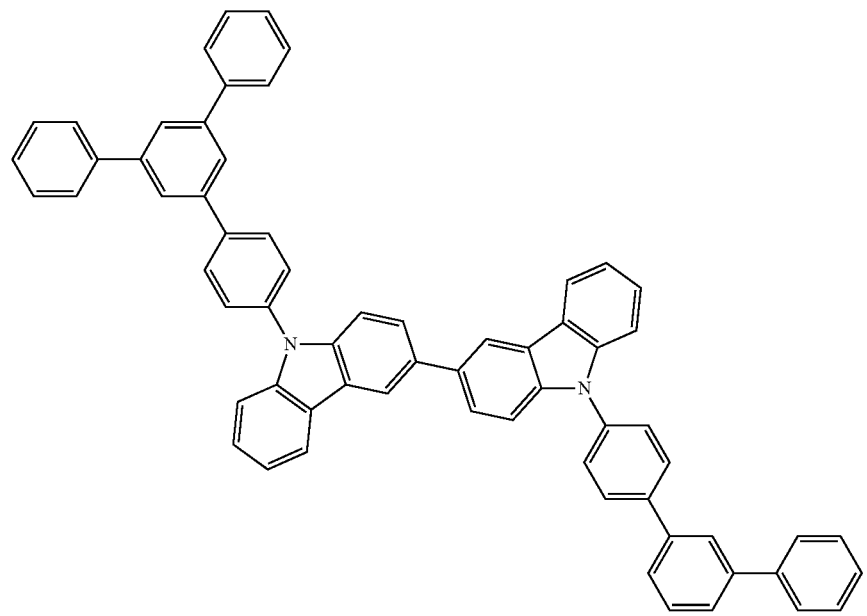
[D-122]
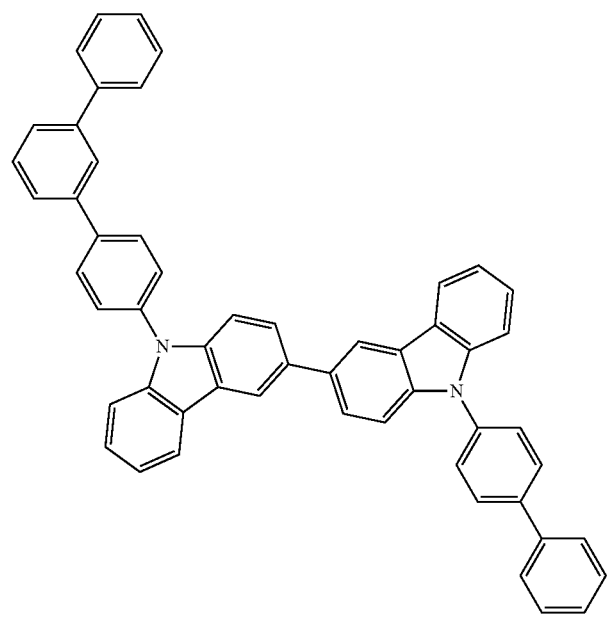
[D-123]

[D-124]
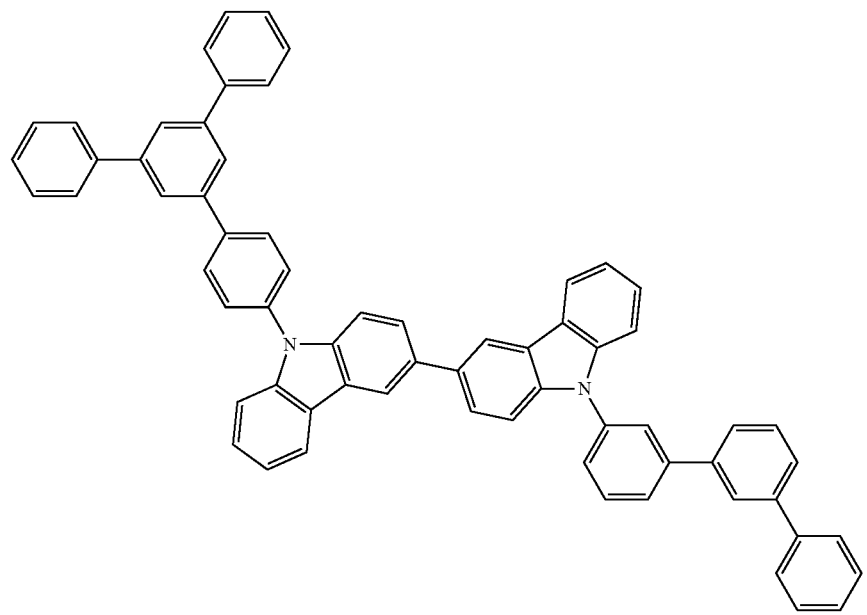
[D-125]
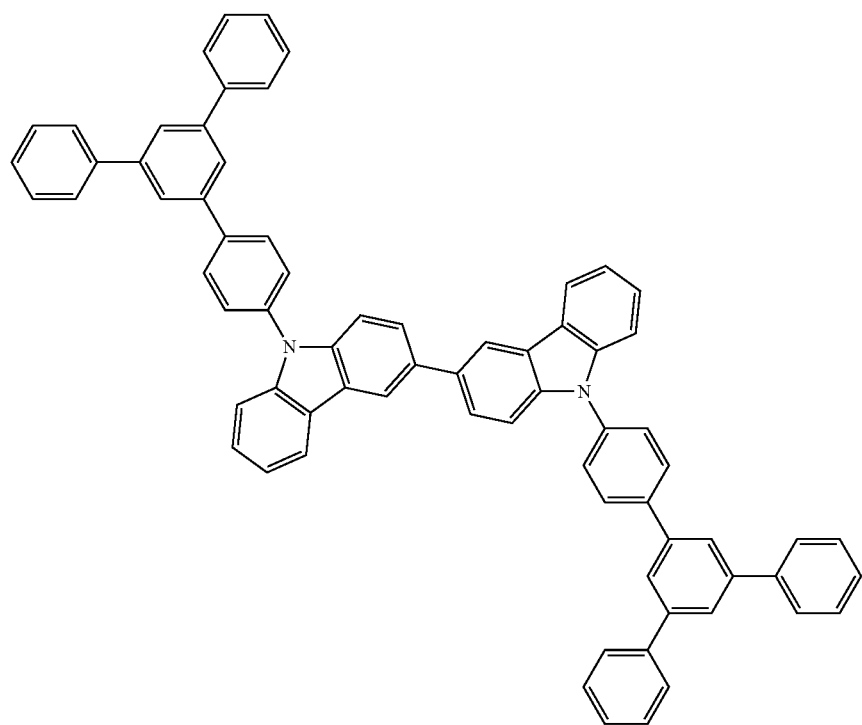

-continued
[D-126]
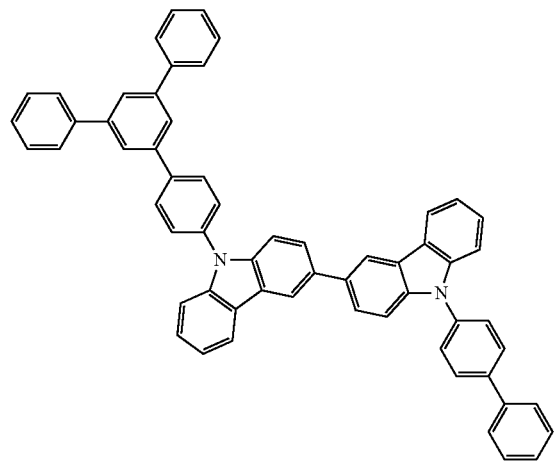
[D-127]
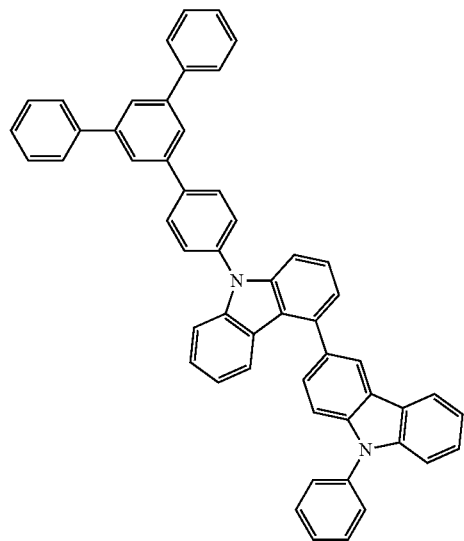
[D-128]
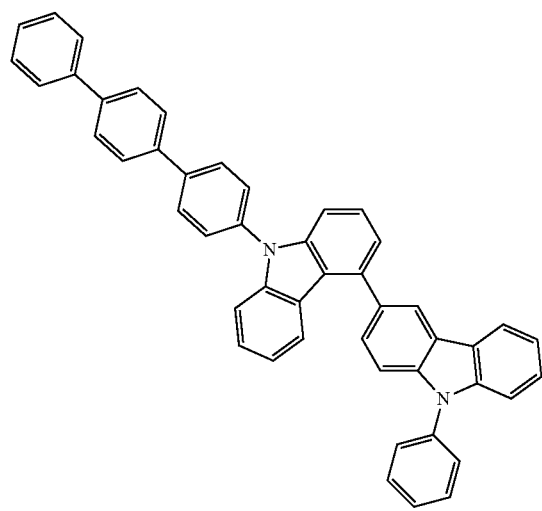
[D-129]
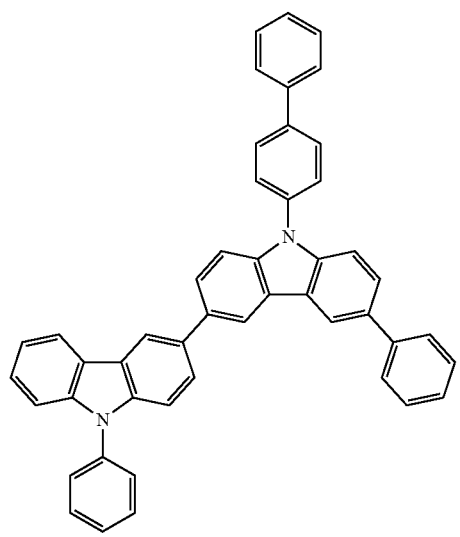
[D-130]
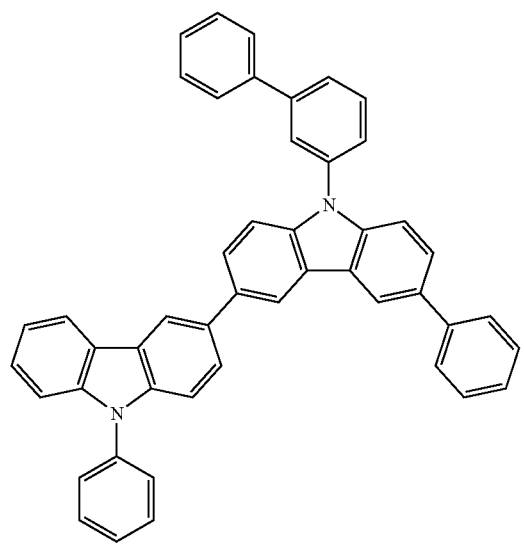
[D-131]
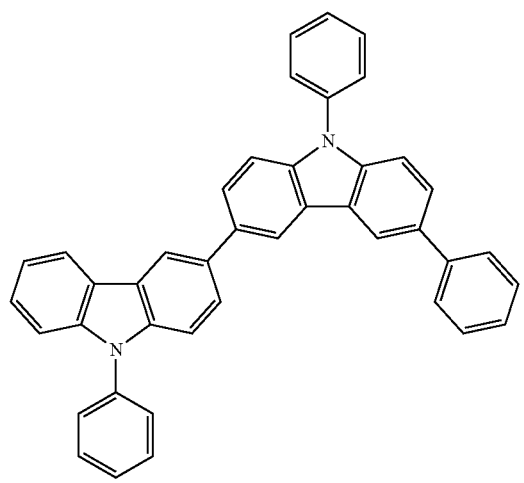

-continued
[D-132]
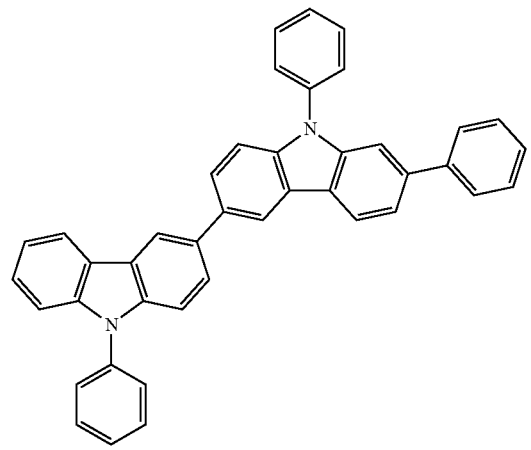
[D-133]
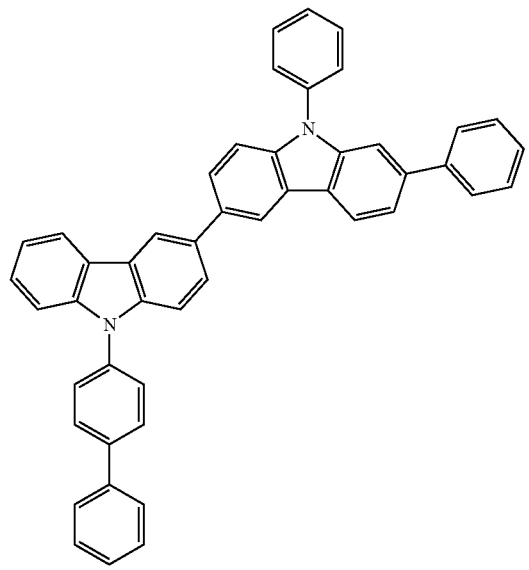
[D-134]
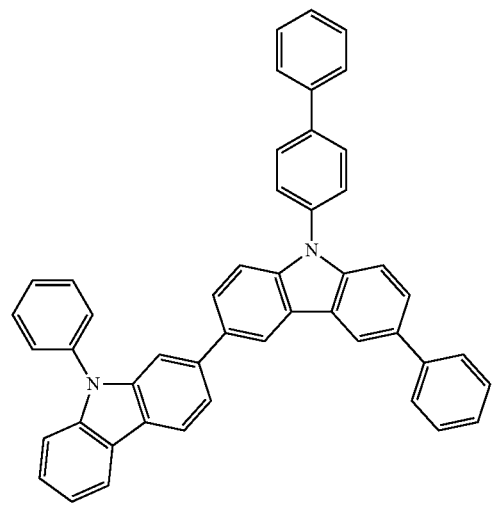
[D-135]
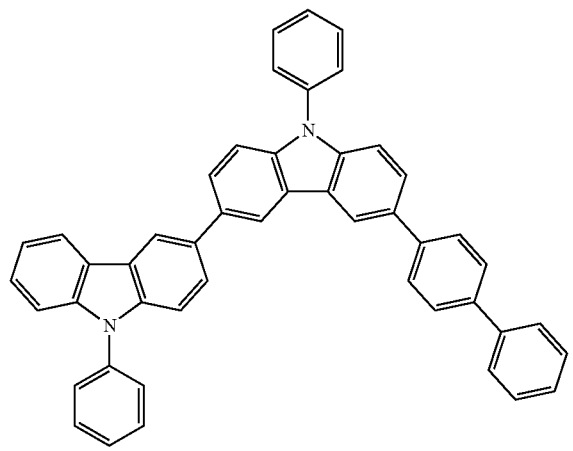

-continued
[D-136]
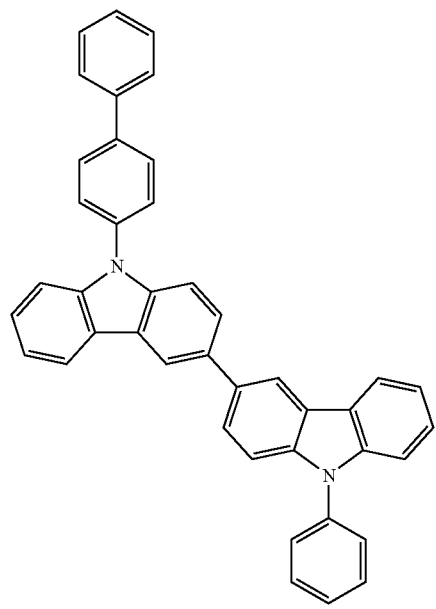
[D-137]
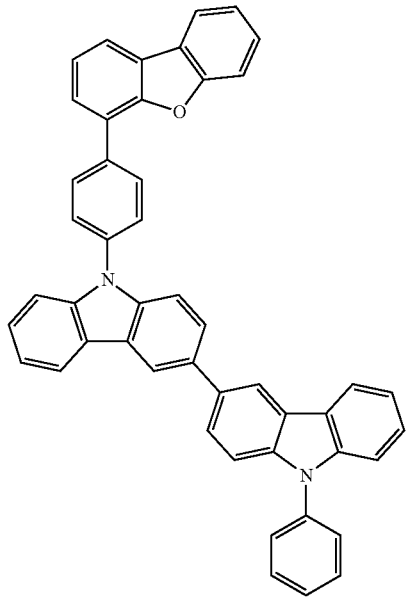
[D-138]
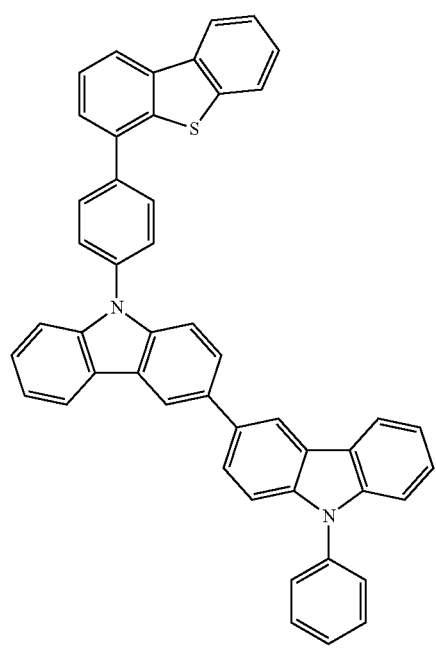
[E-1]
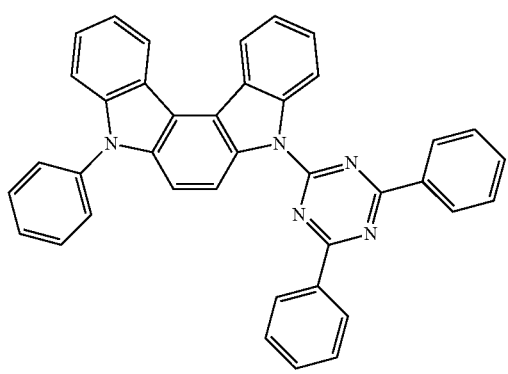

-continued
[E-2]
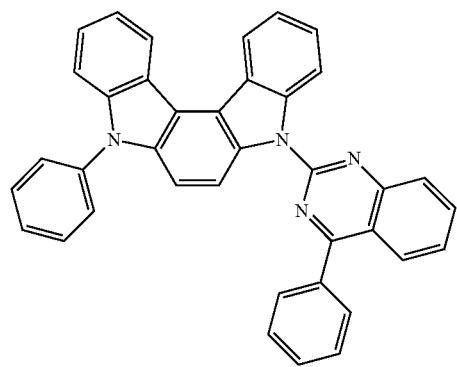
[E-3]
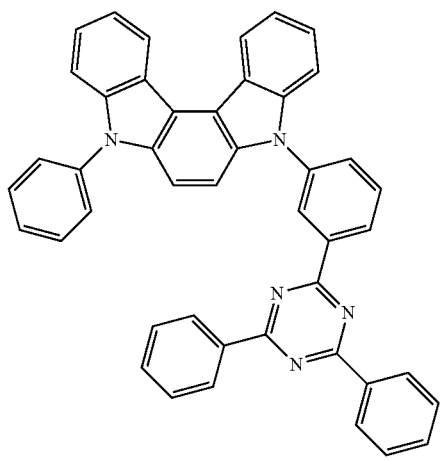
[E-4]
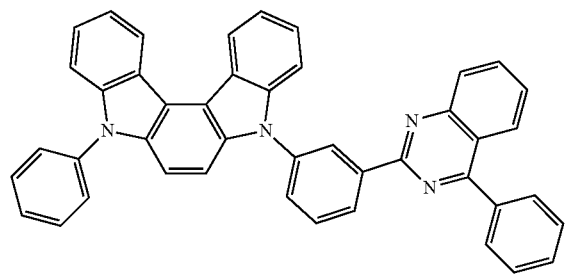
[E-5]
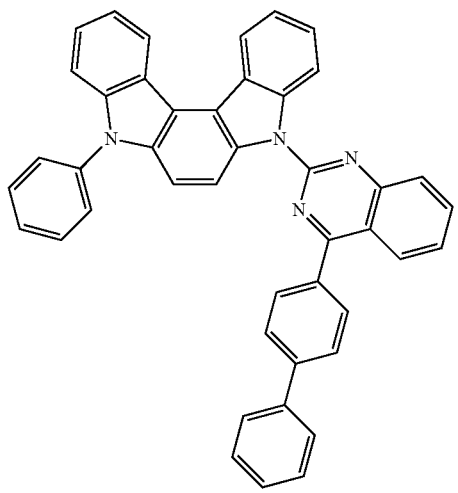
[E-6]
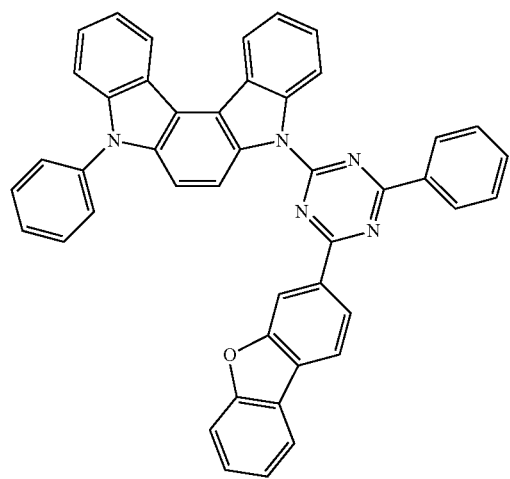
[E-7]
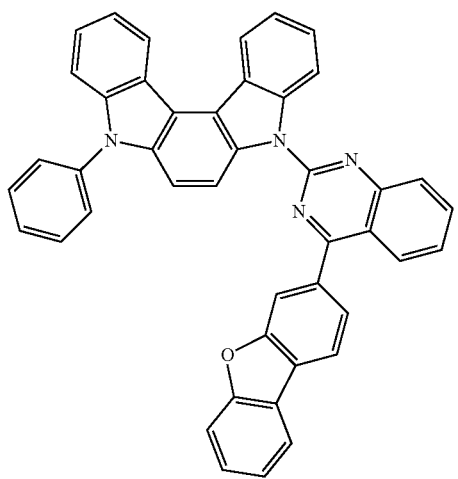

-continued
[E-8]
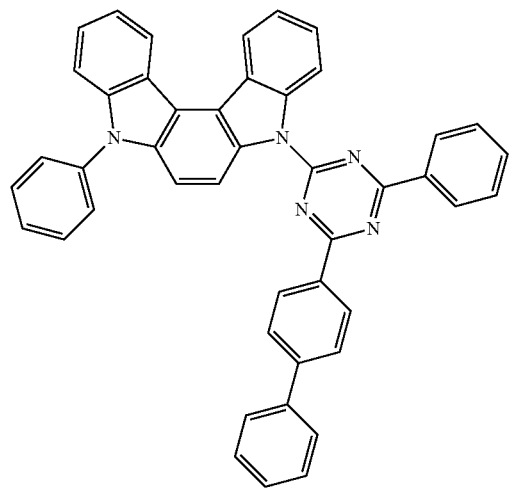
[E-9]
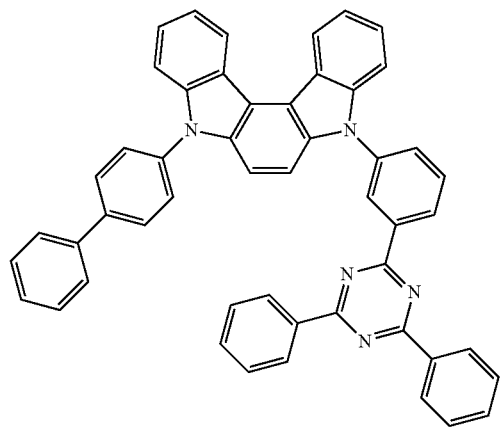
[E-10]
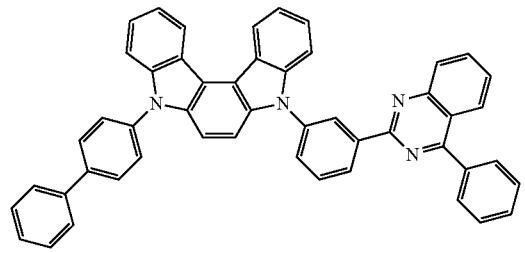
[E-11]
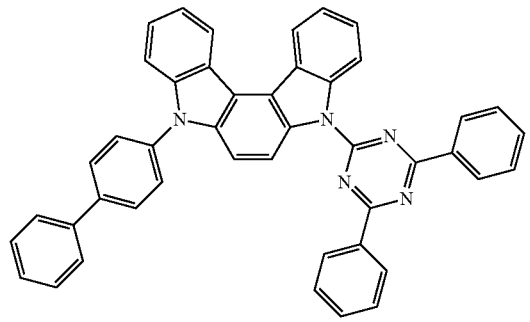
[E-12]
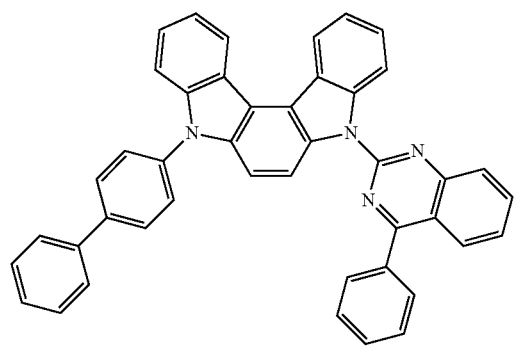
[E-13]
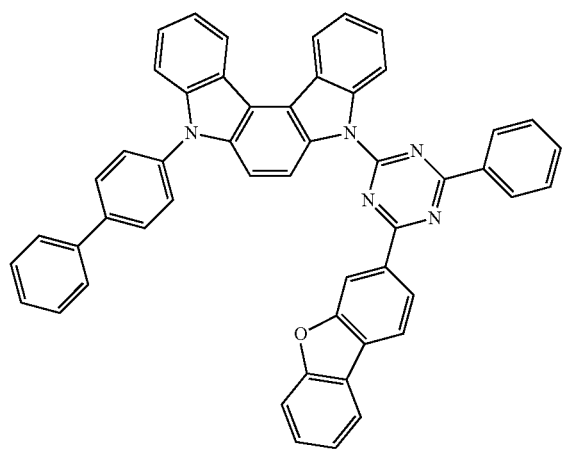

-continued
[E-14]
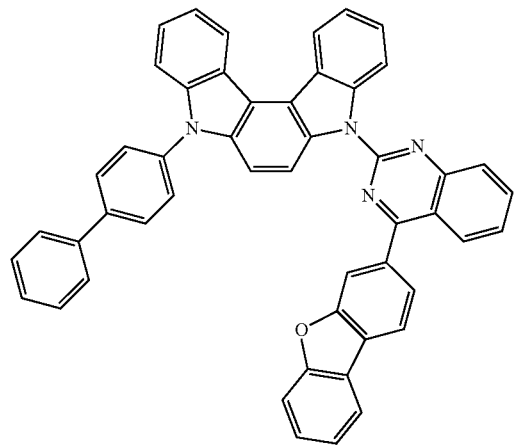
[E-15]
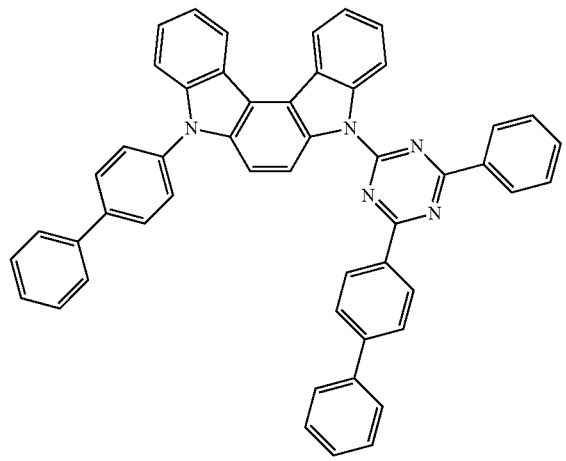
[E-16]
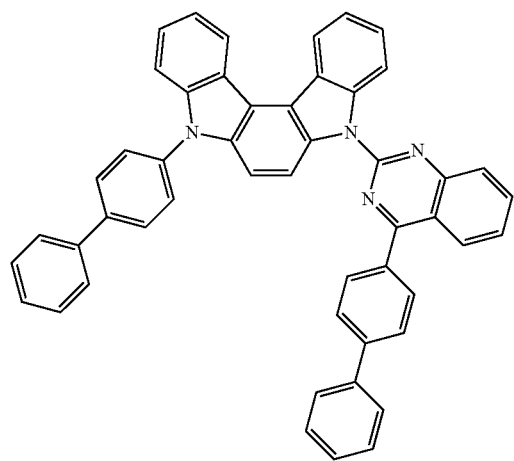
[E-17]
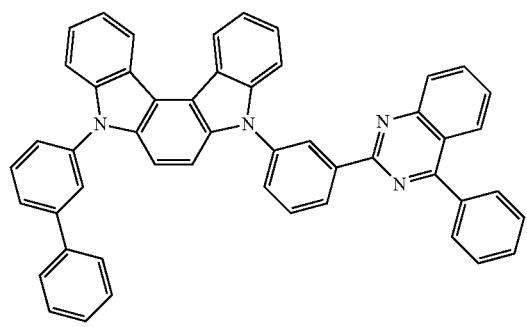
[E-18]
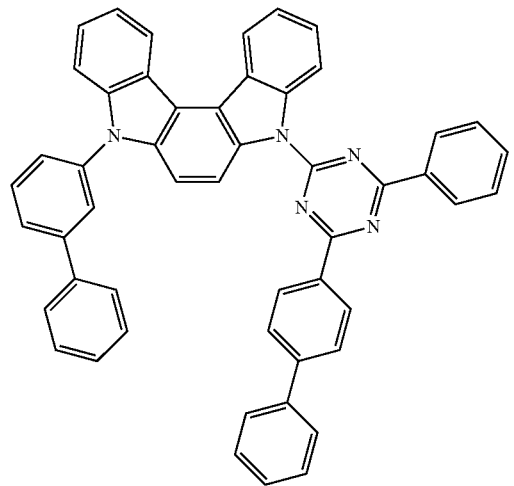
[E-19]
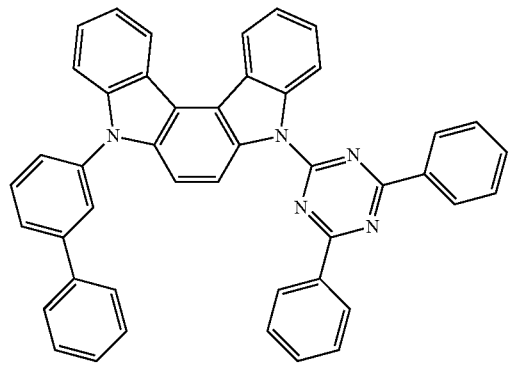

-continued
[E-20]
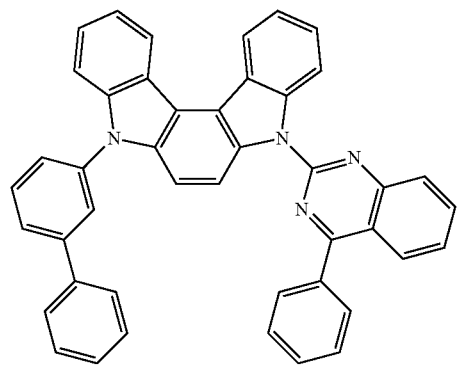
[E-21]
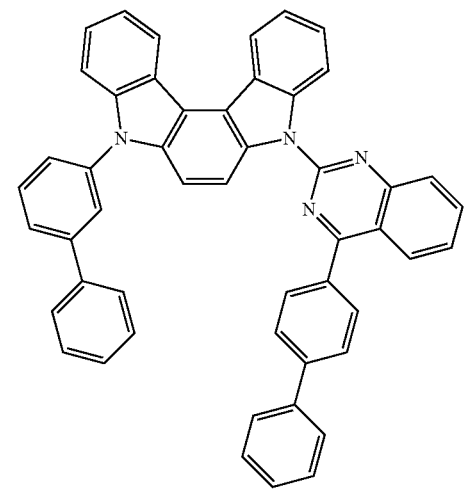
[E-22]
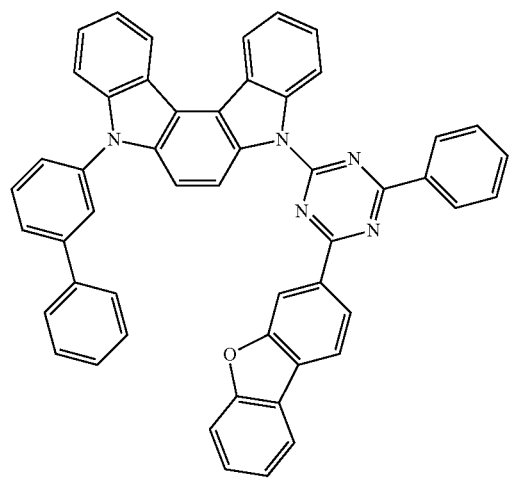
[E-23]
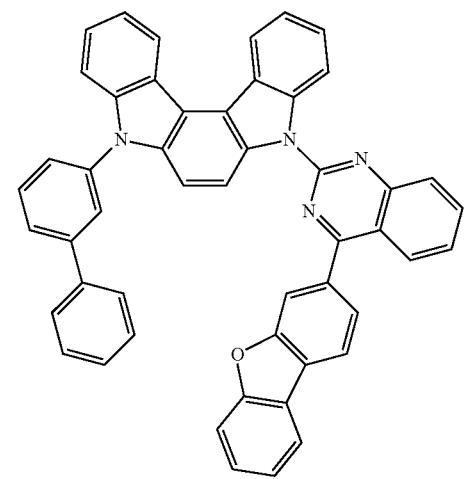
[E-24]
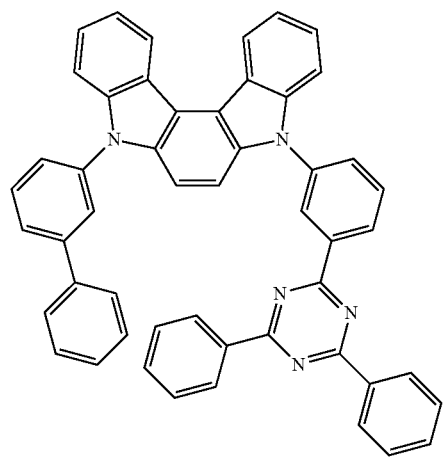
[E-25]
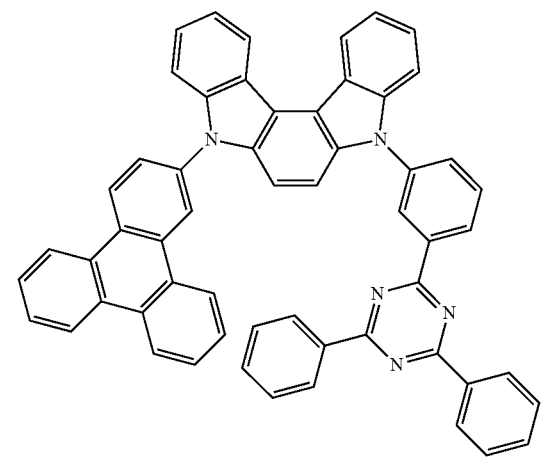

-continued
[E-26]
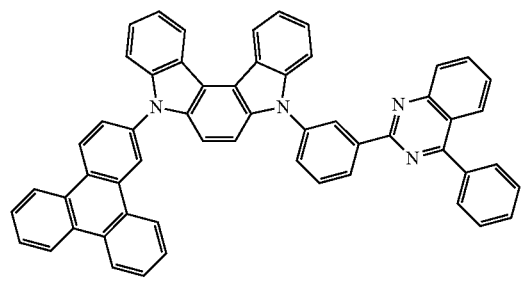
[E-27]
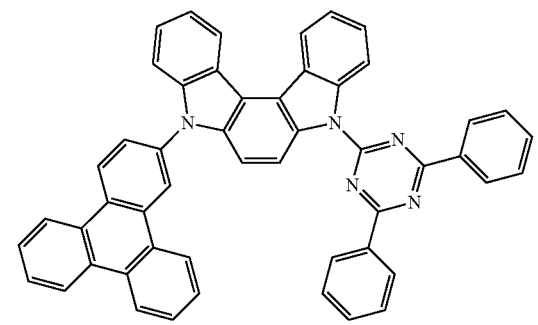
[E-28]
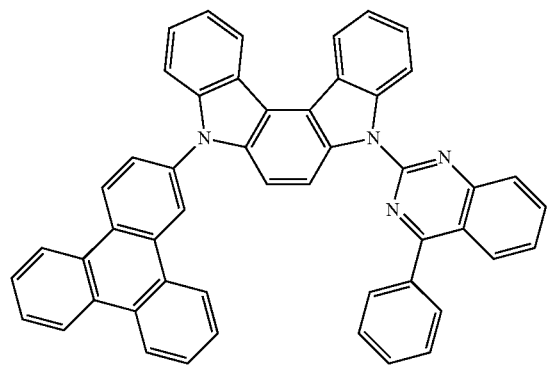
[E-29]
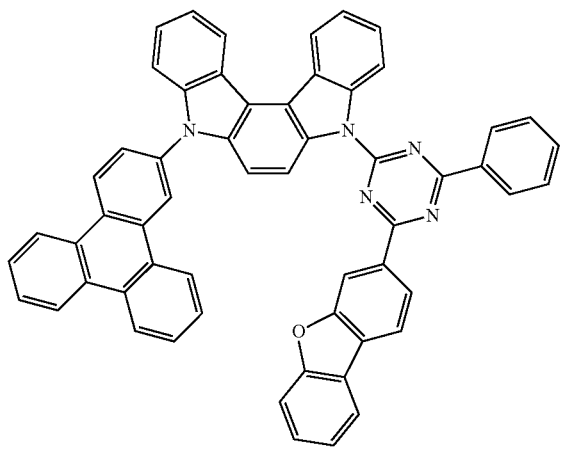
[E-30]
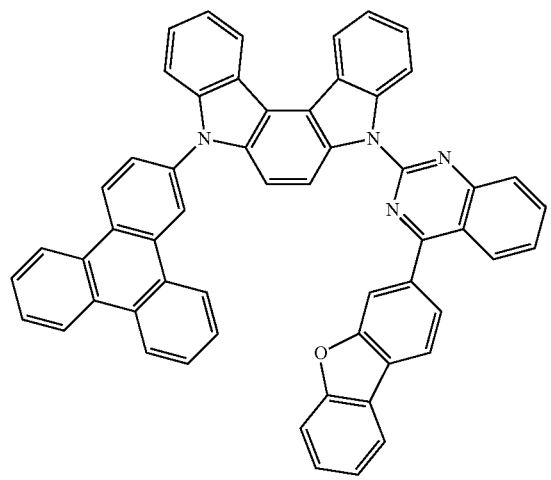
[E-31]
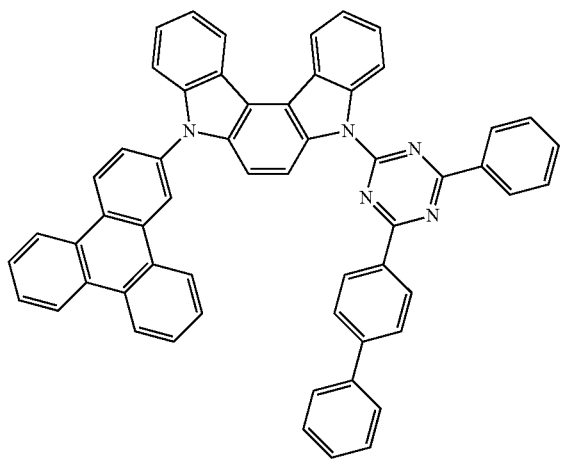

-continued
[E-32]
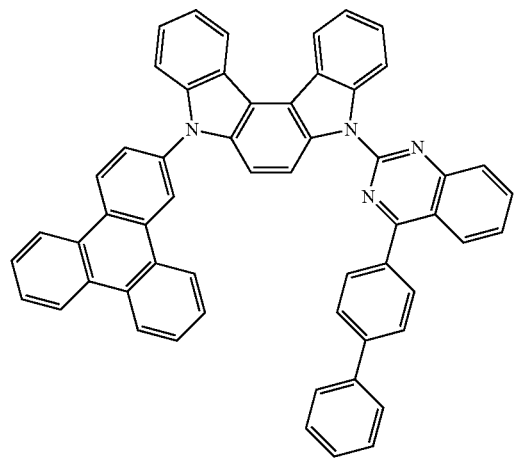
[E-33]
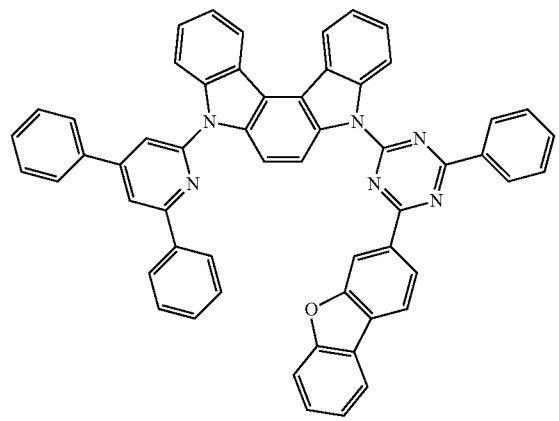
[E-34]
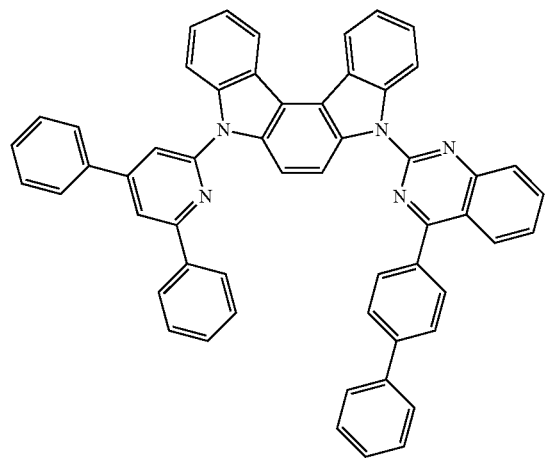
[E-35]
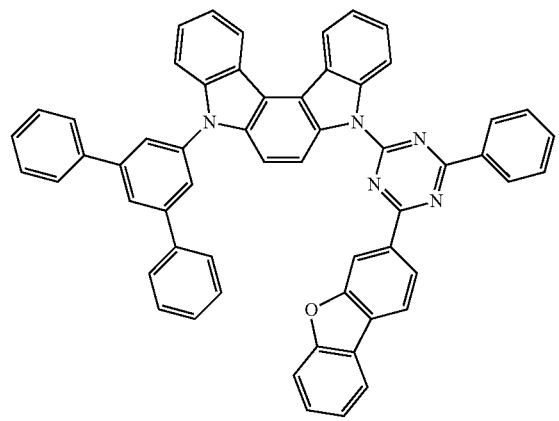
[E-36]
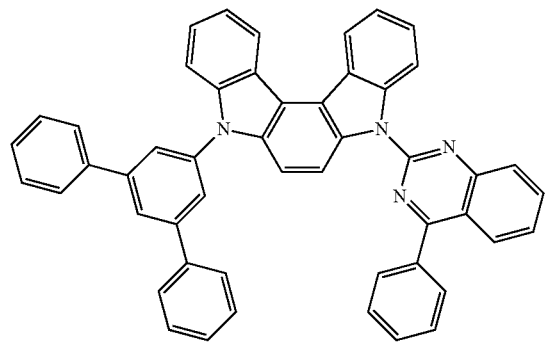
[E-37]
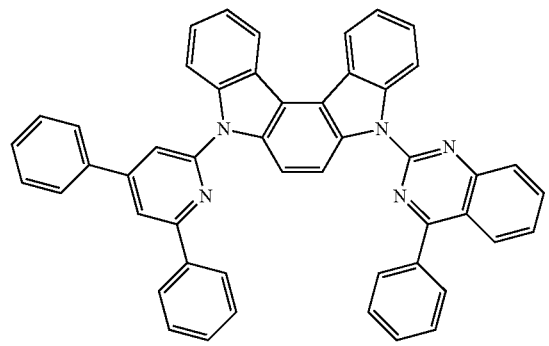

-continued
[E-38]
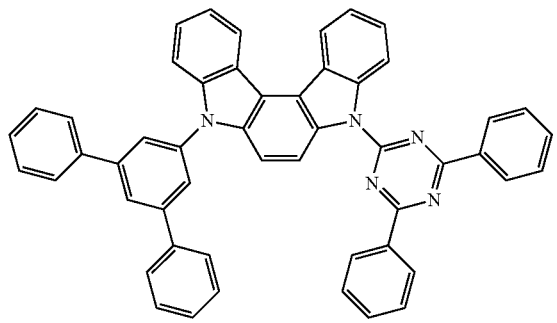
[E-39]
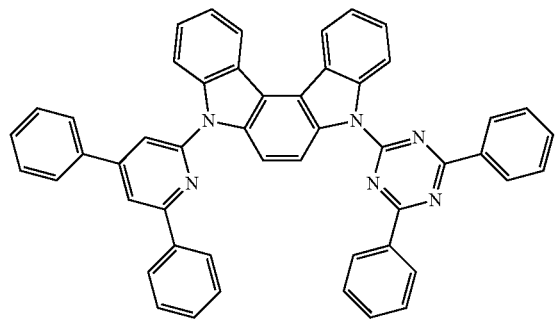
[E-40]
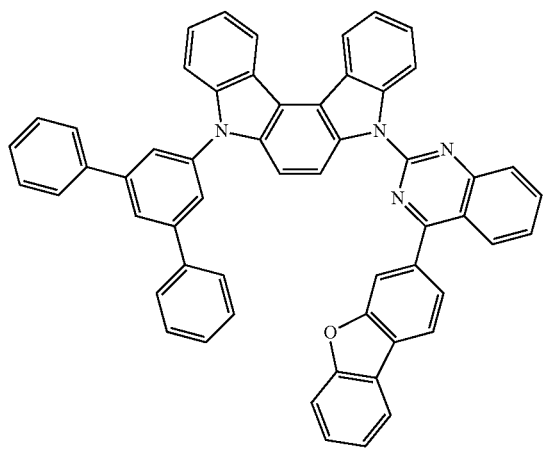
[E-41]
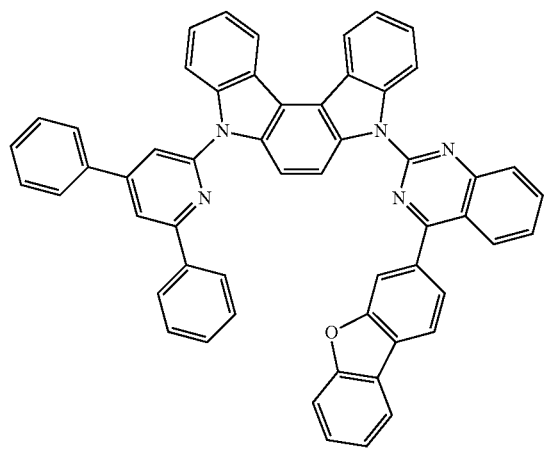
[E-42]
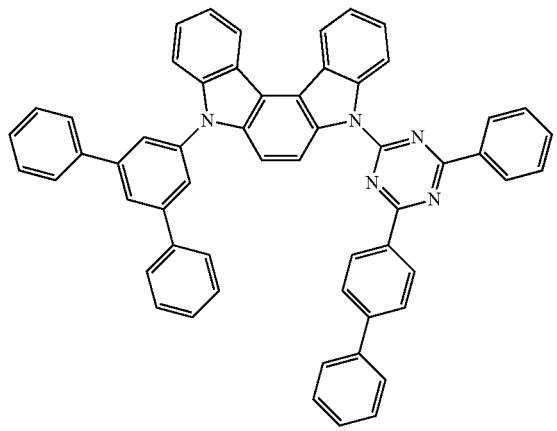
[E-43]
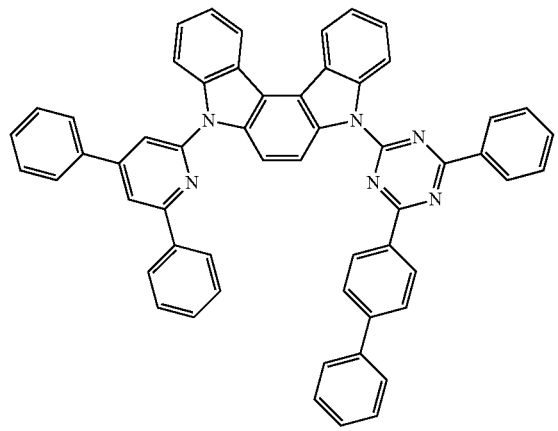
[E-44]
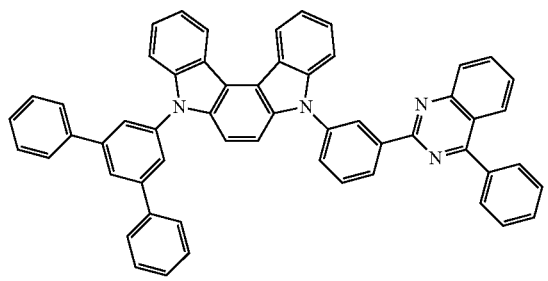
[E-45]
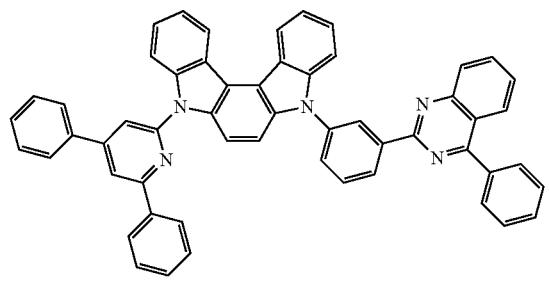

-continued
[E-46]
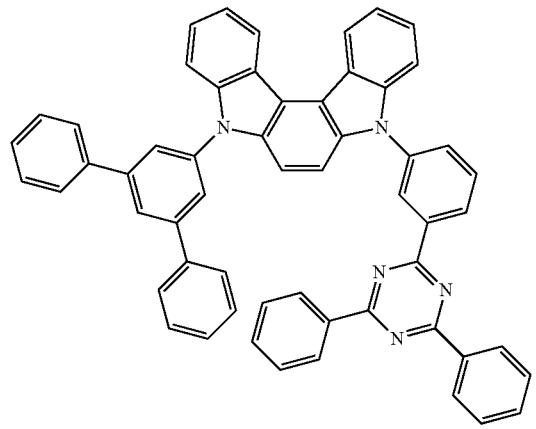
[E-47]
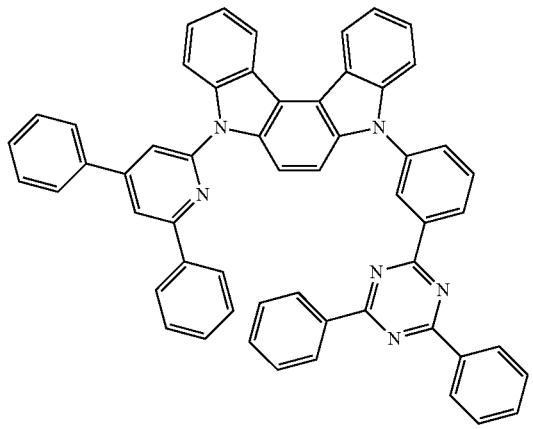
[E-48]
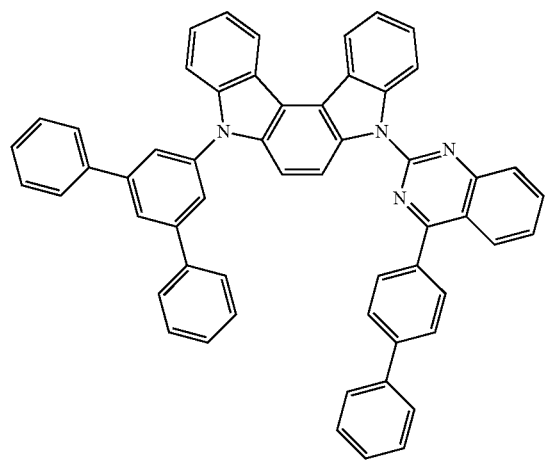
[E-49]
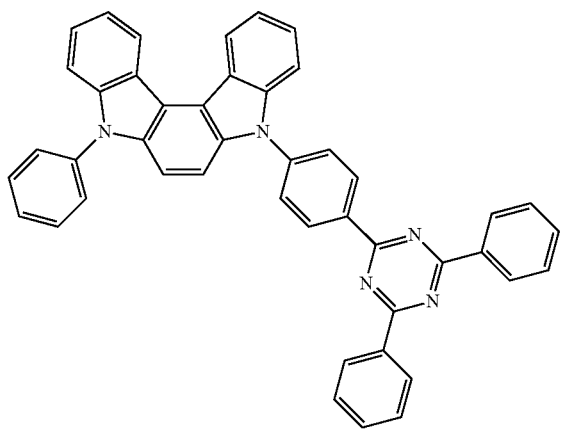
[E-50]
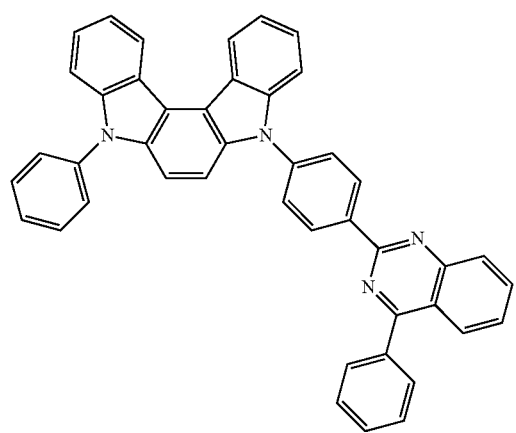
[E-51]
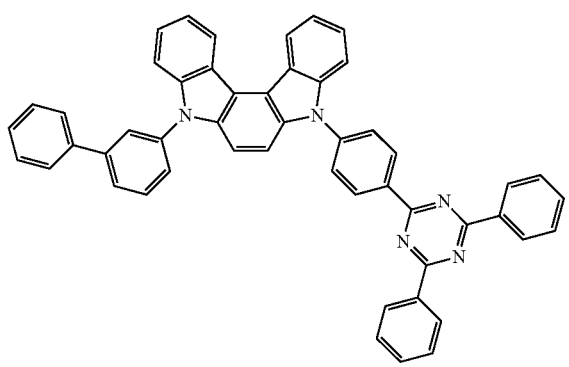

-continued
[E-52]
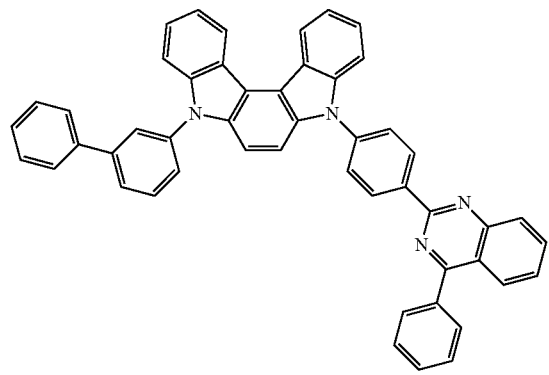
[E-53]
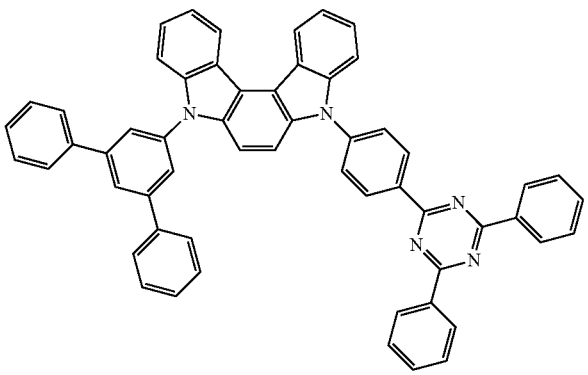
[E-54]
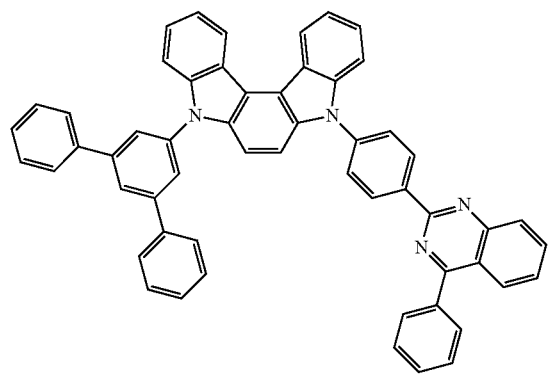
[E-55]
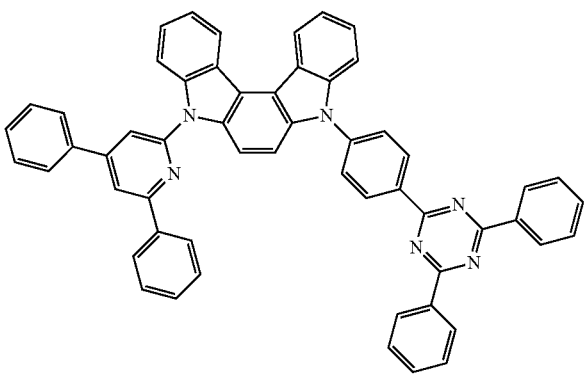
[E-56]
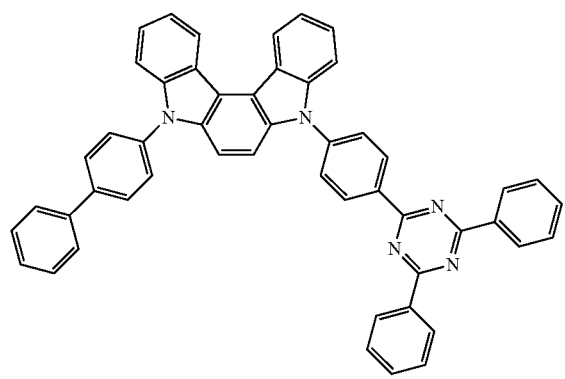
[E-57]
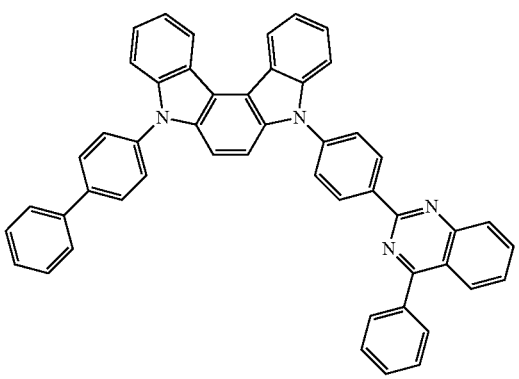
[E-58]
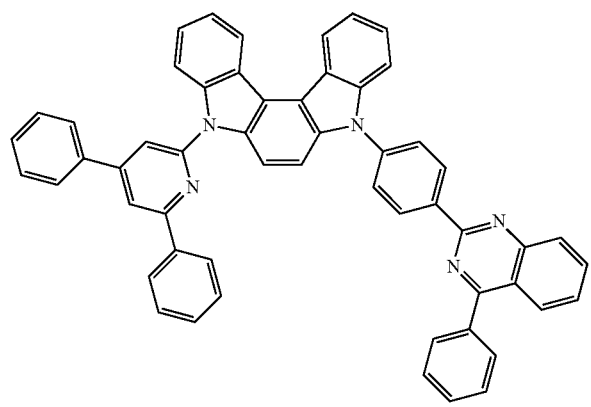
[E-59]
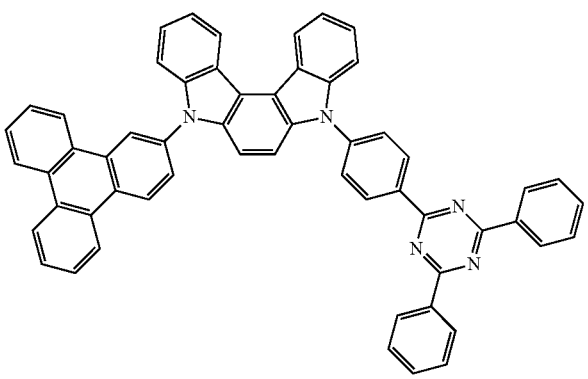

-continued
[E-60]
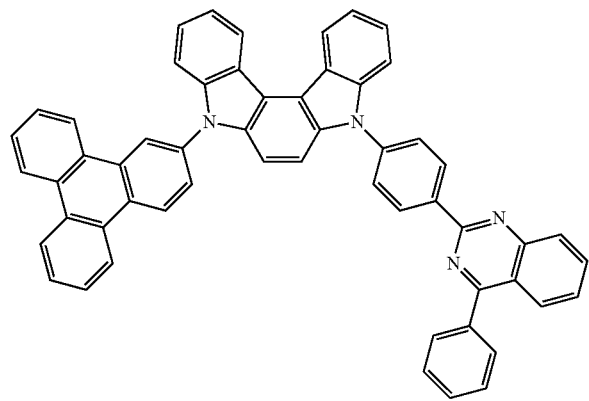
[E-61]
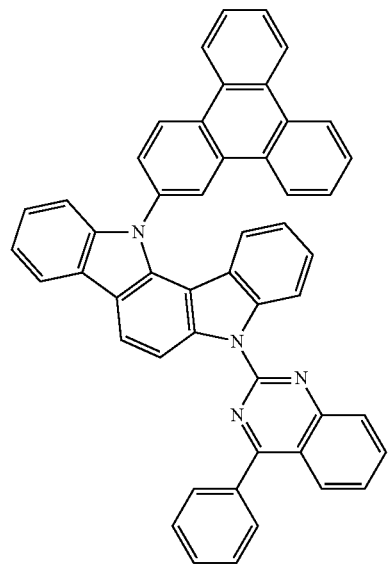
[E-62]
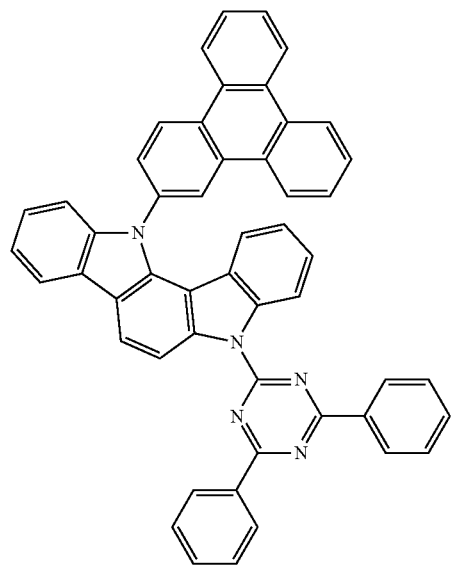
[E-63]
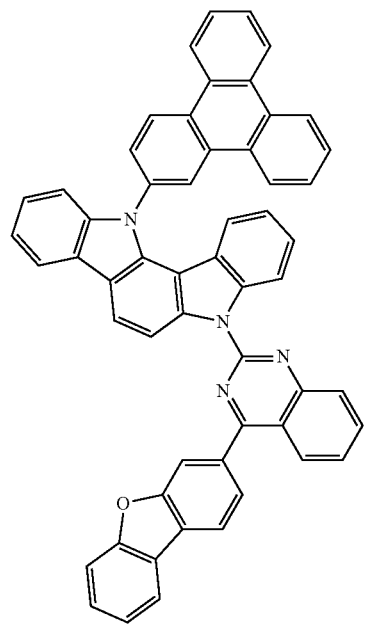

-continued
[E-64]
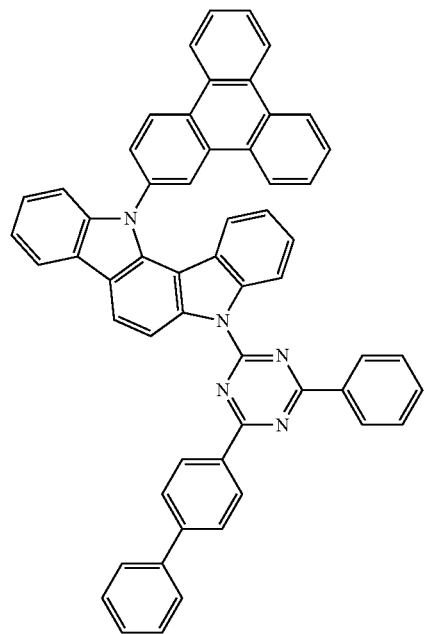
[E-65]
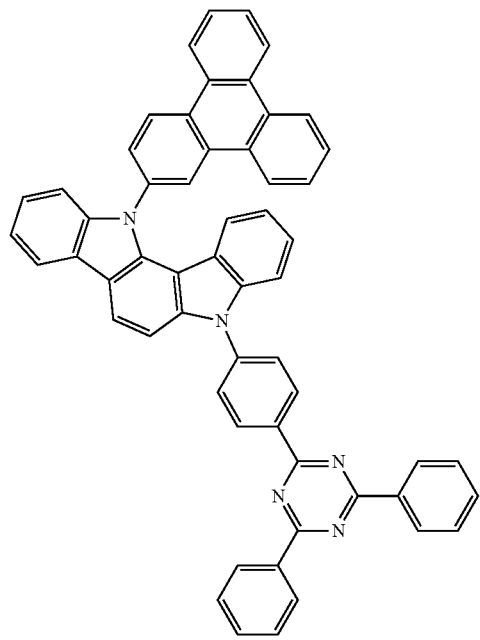
[E-66]
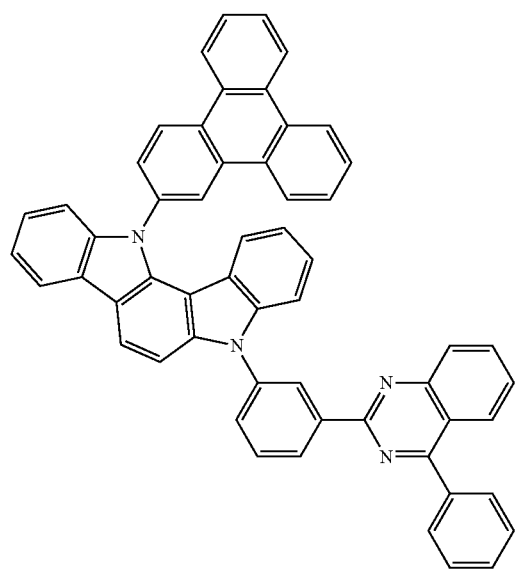
[E-67]
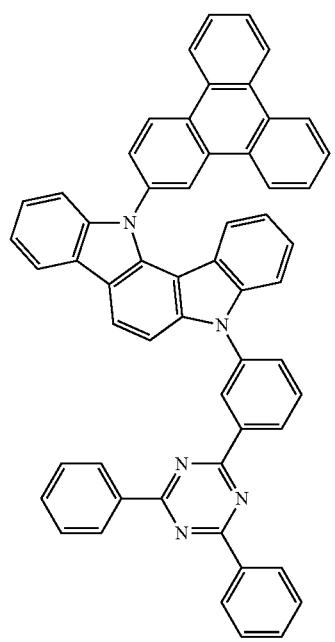

-continued
[E-68]
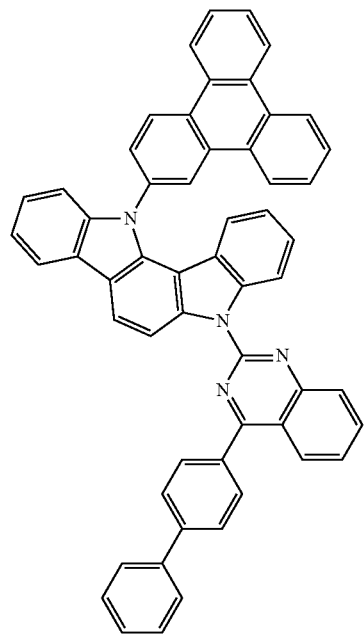
[E-69]
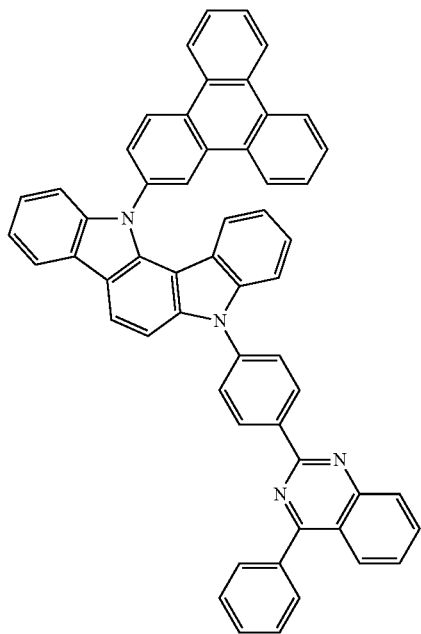
[E-70]
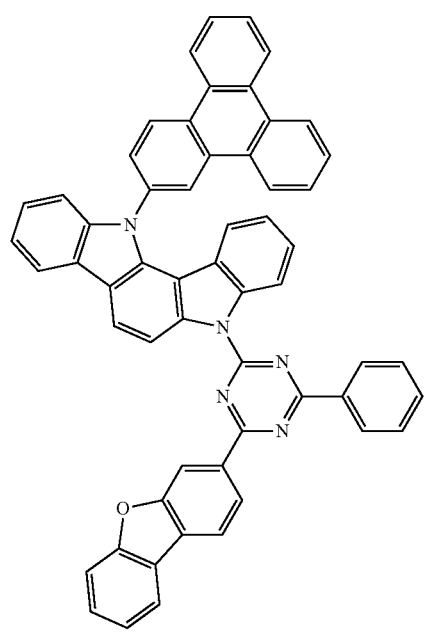
[E-71]
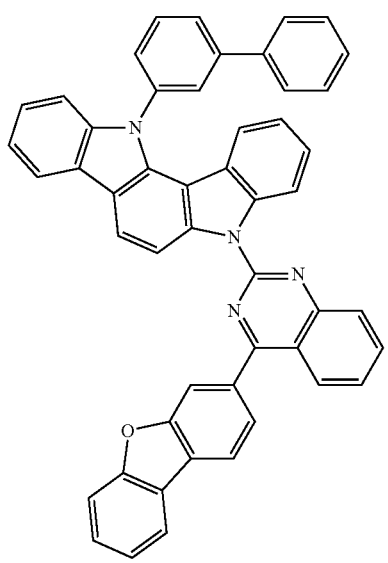

-continued
[E-72]
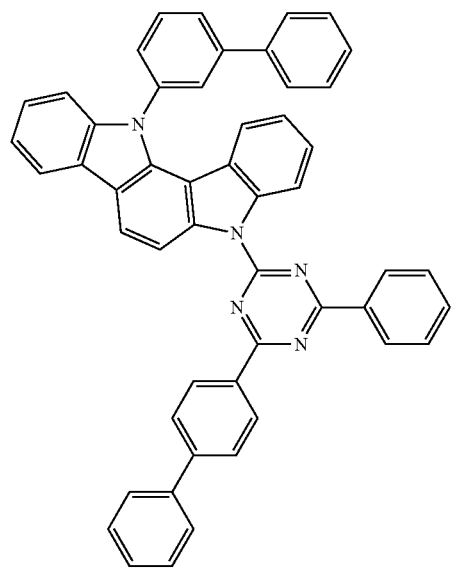
[E-73]
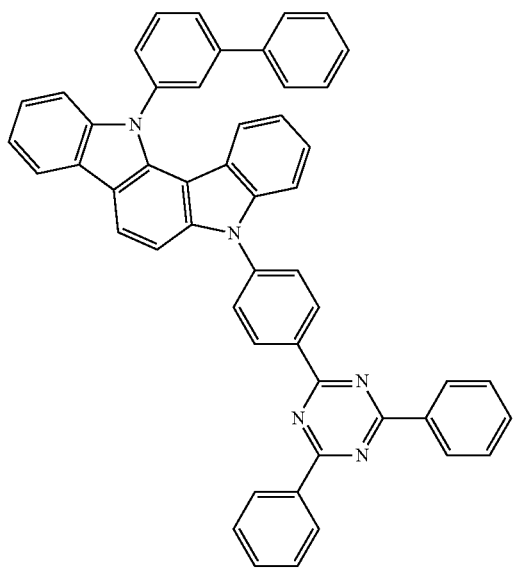
[E-74]
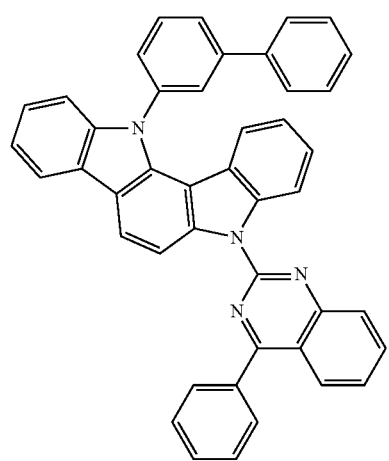
[E-75]
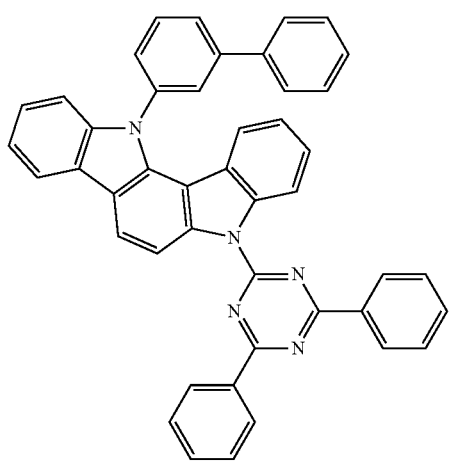
[E-76]
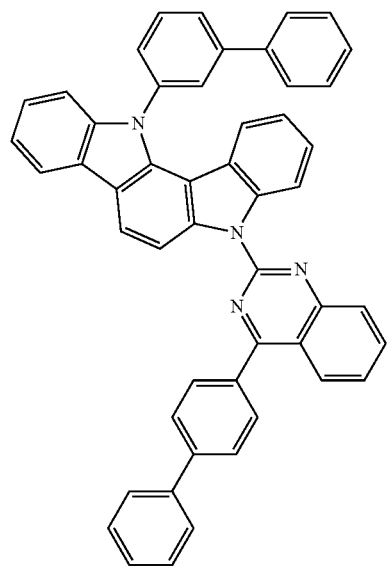
[E-77]
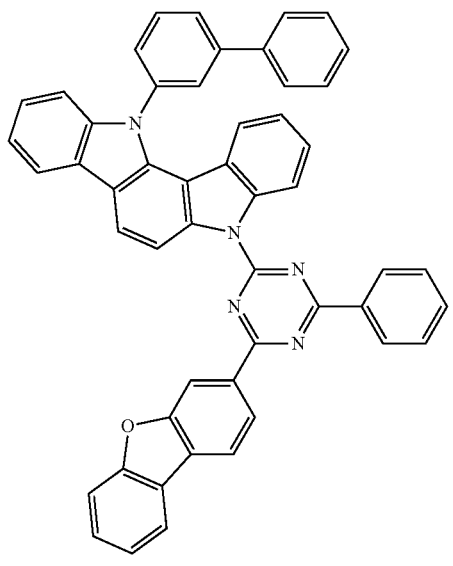

-continued
[E-78]
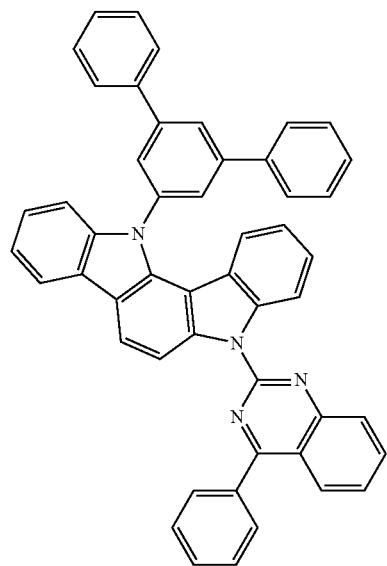
[E-79]
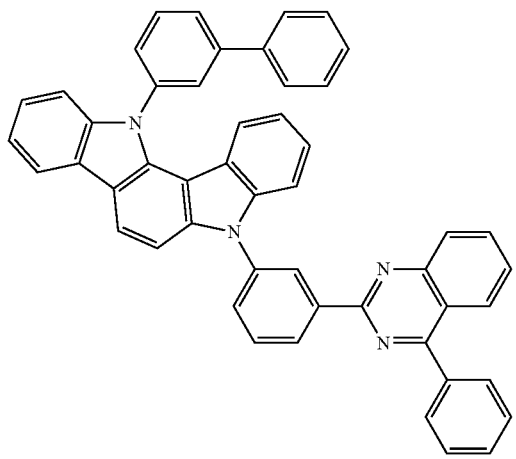
[E-80]
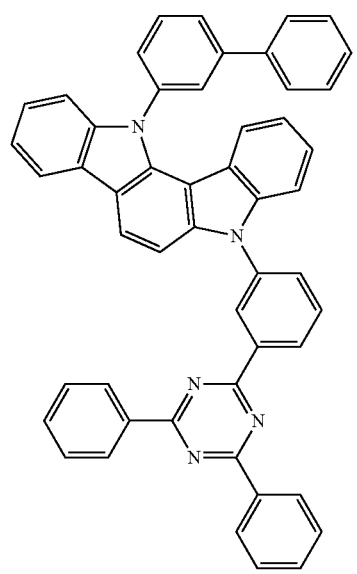
[E-81]
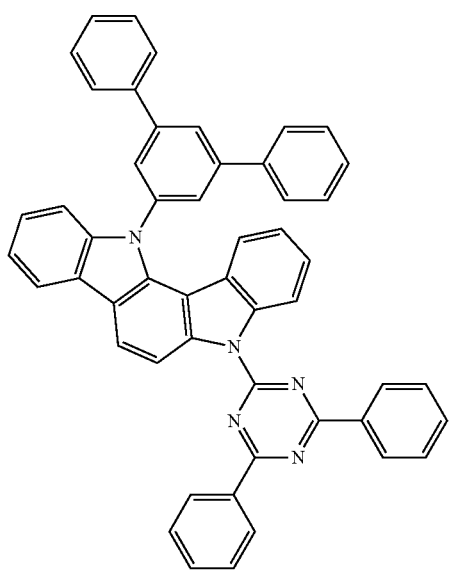

[E-82]
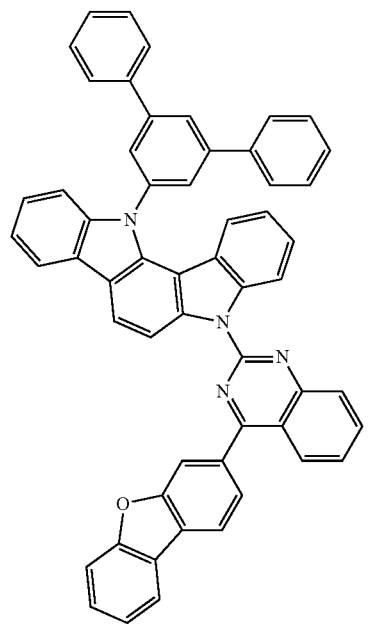
[E-83]
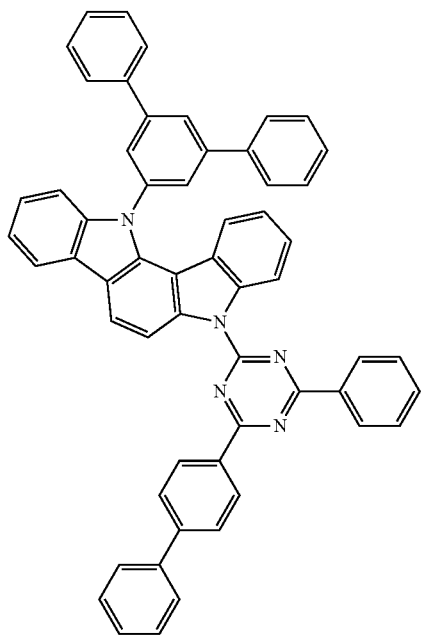
[E-84]
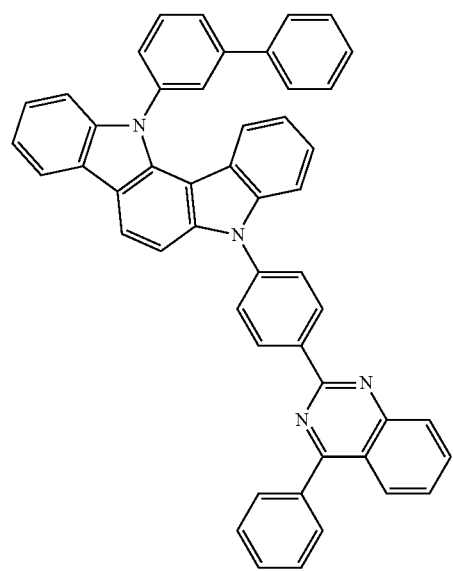
[E-85]
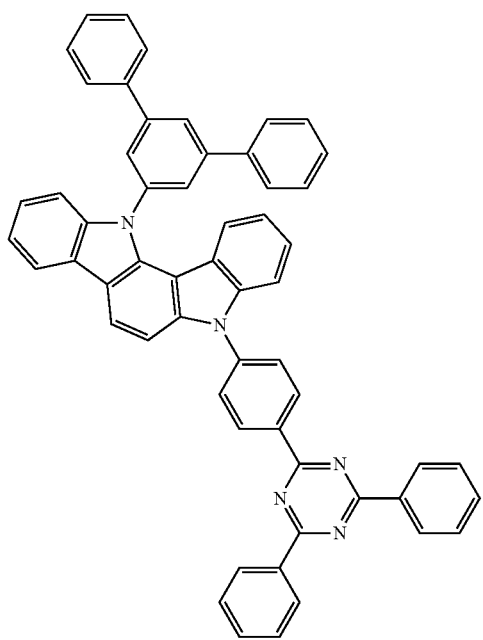

-continued
[E-86]
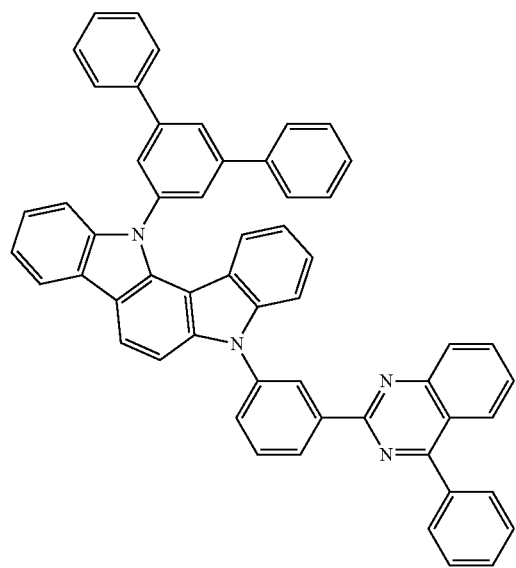
[E-87]
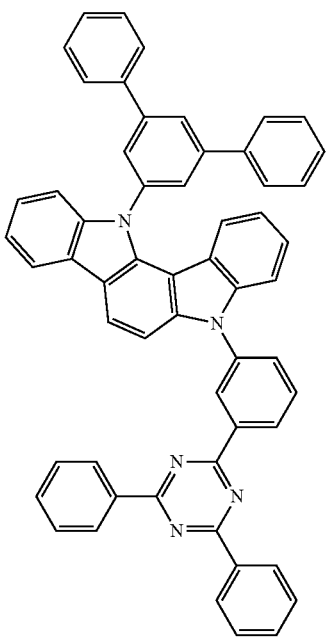
[E-88]
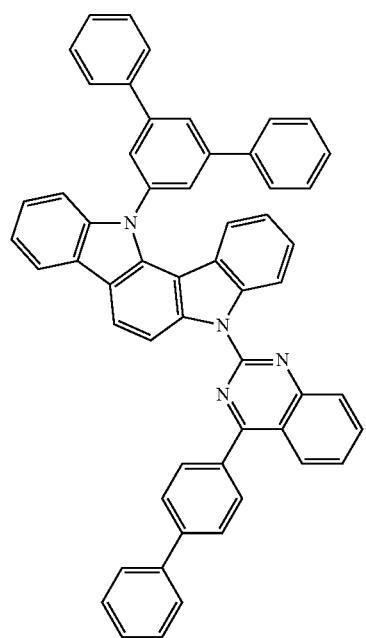
[E-89]
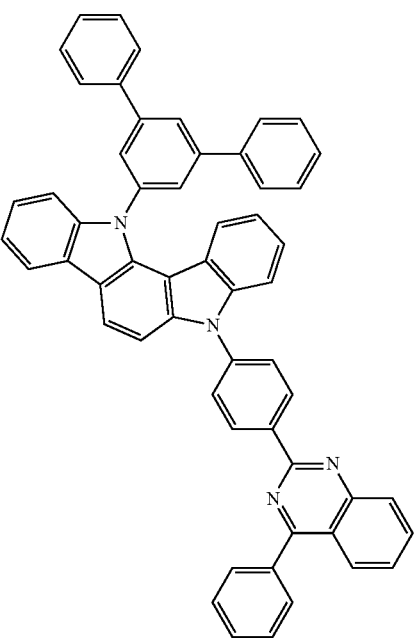

[E-90]
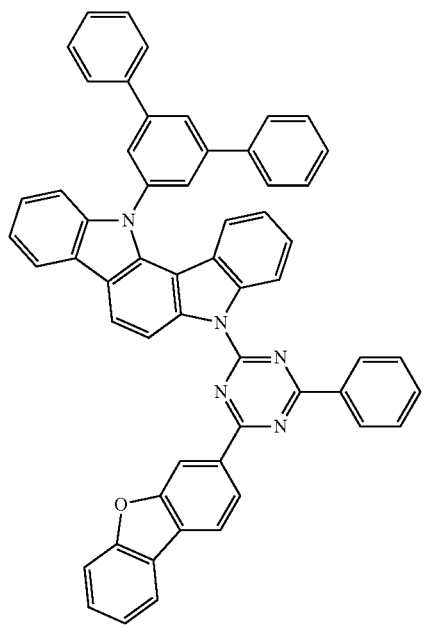
[E-91]
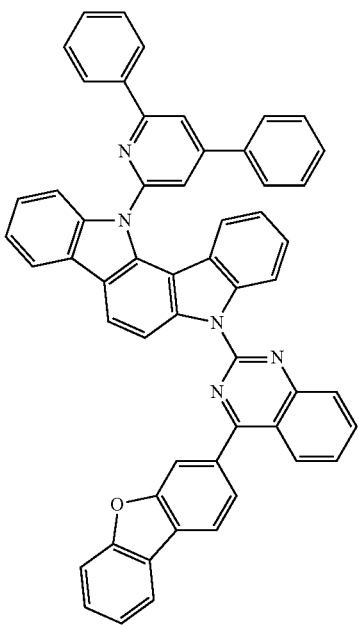
[E-92]
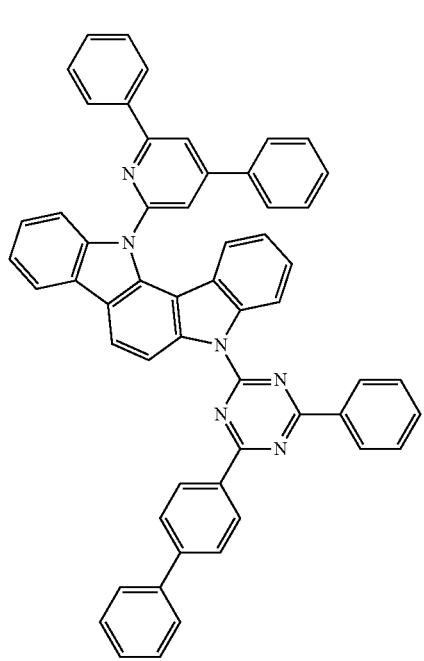
[E-93]
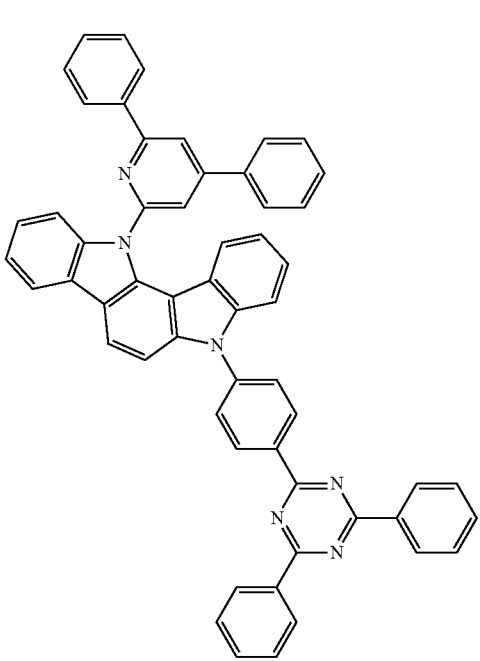

-continued
[E-94]
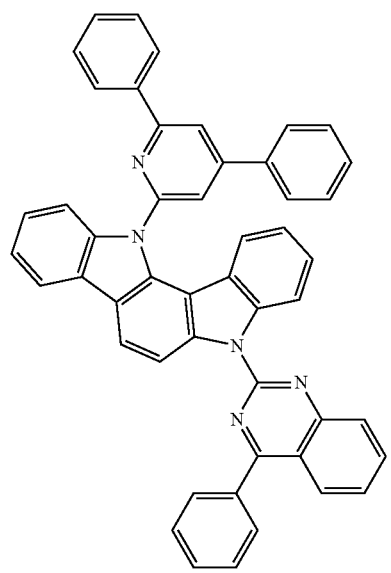
[E-95]
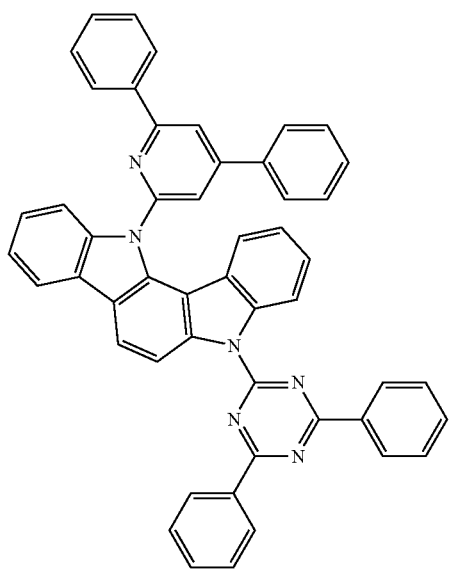
[E-96]
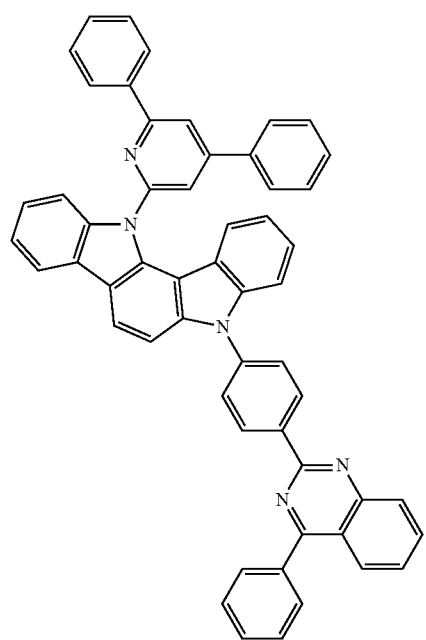
[E-97]
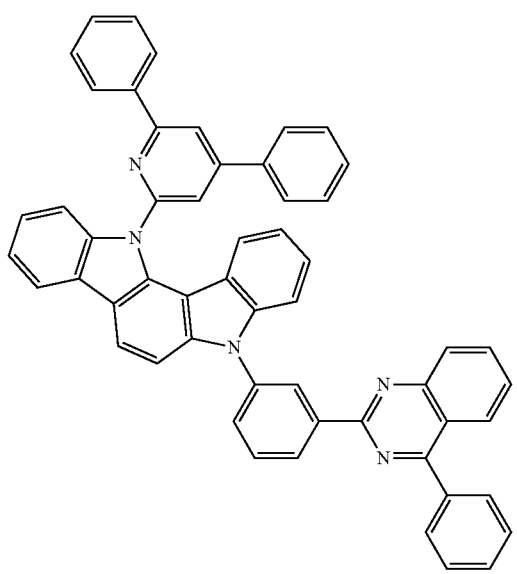

-continued
[E-98]
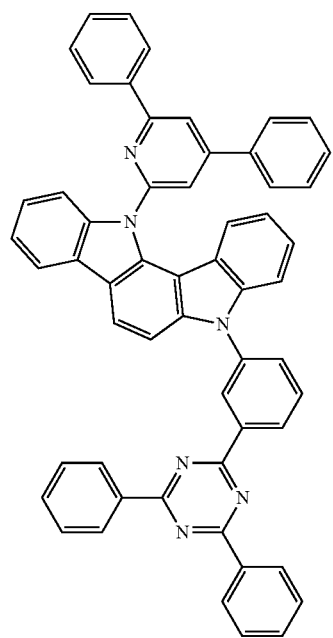
[E-99]
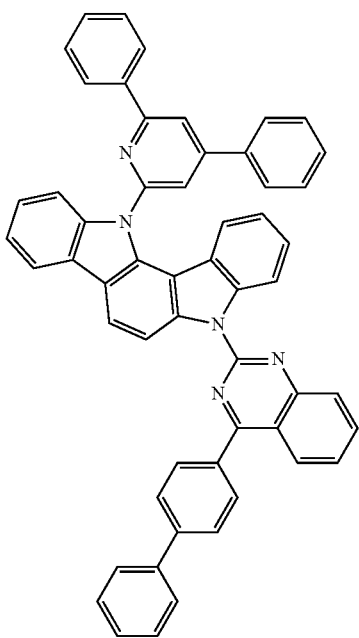
[E-100]
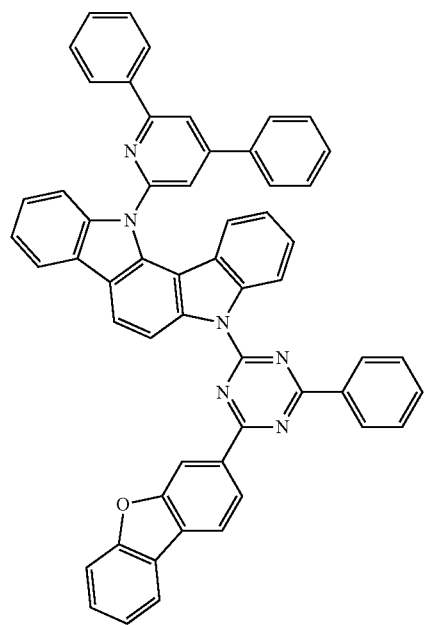
[E-101]
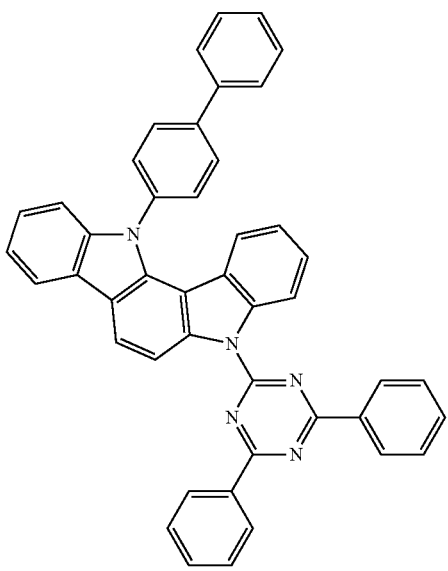

-continued
[E-102]
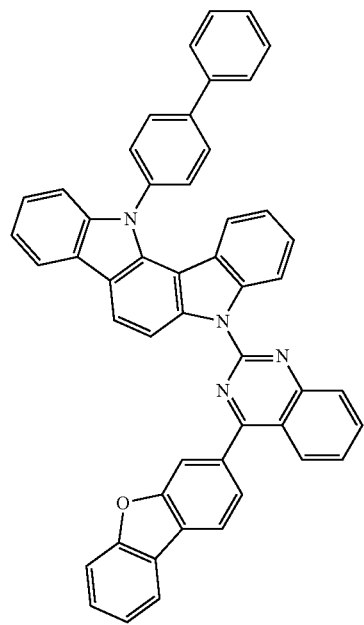
[E-103]
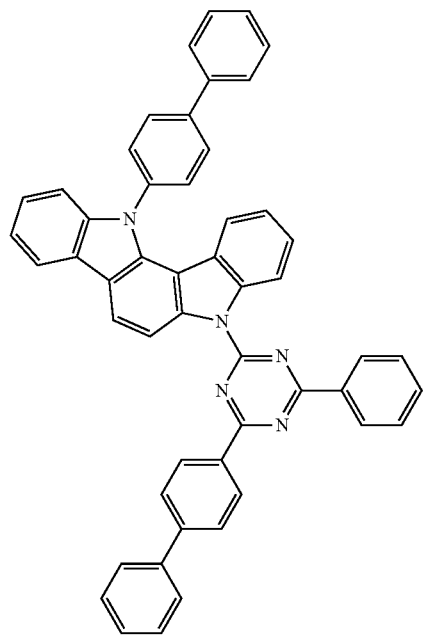
[E-104]
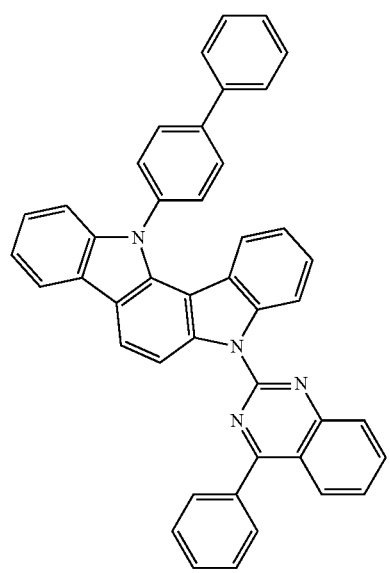
[E-105]
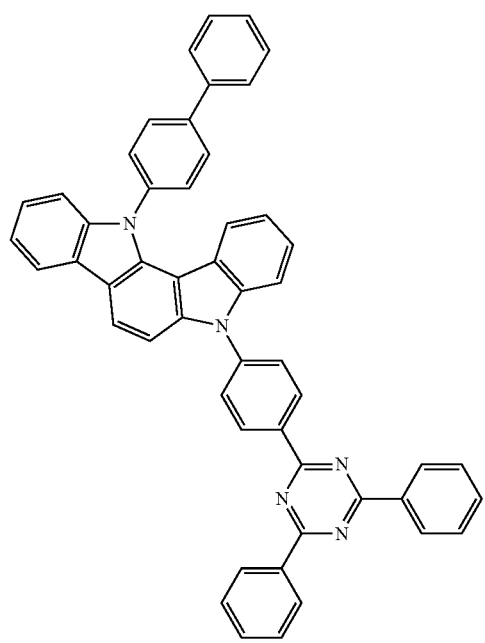

[E-106]
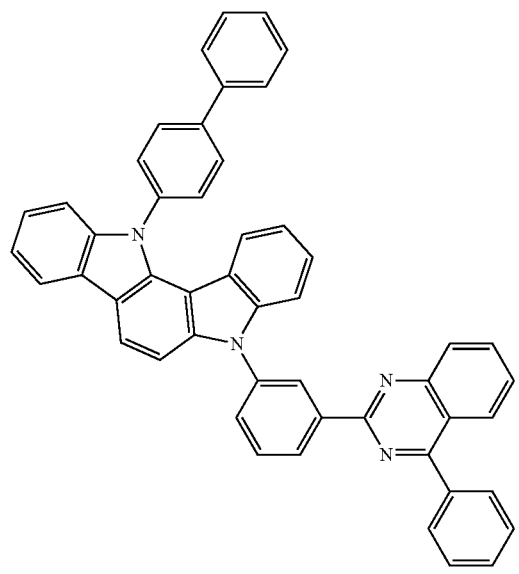
[E-107]
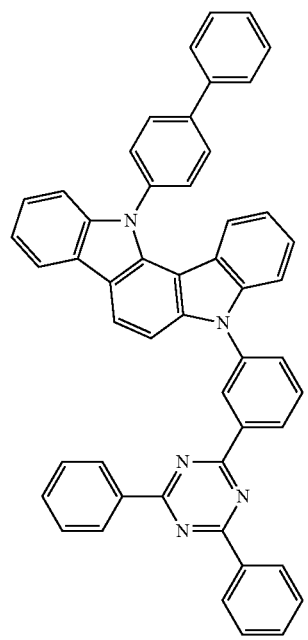
[E-108]
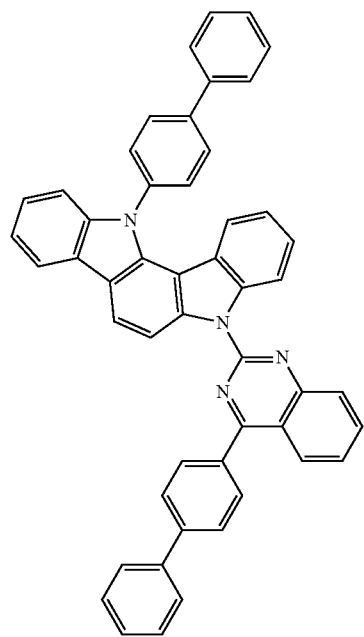
[E-109]
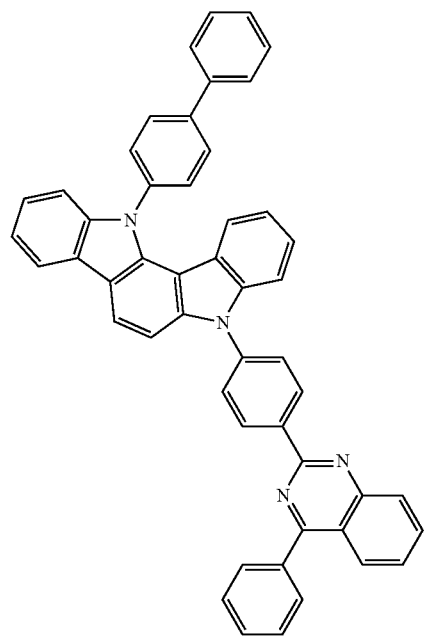

[E-110]
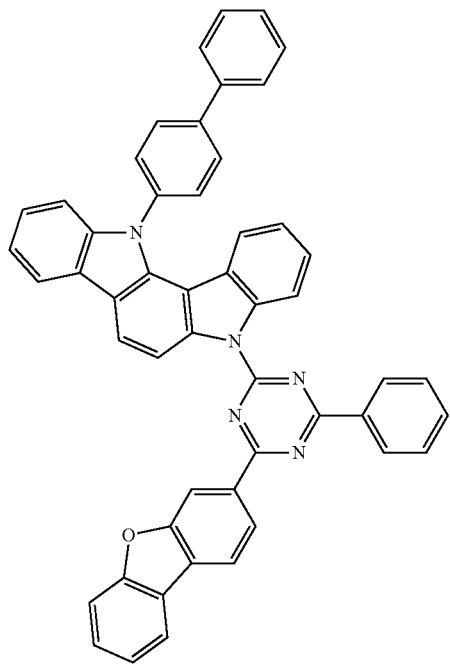
[E-111]
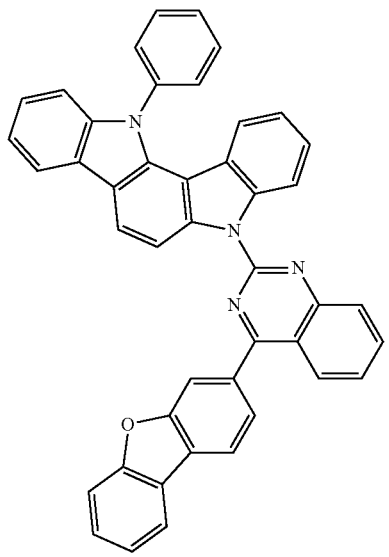
[E-112]
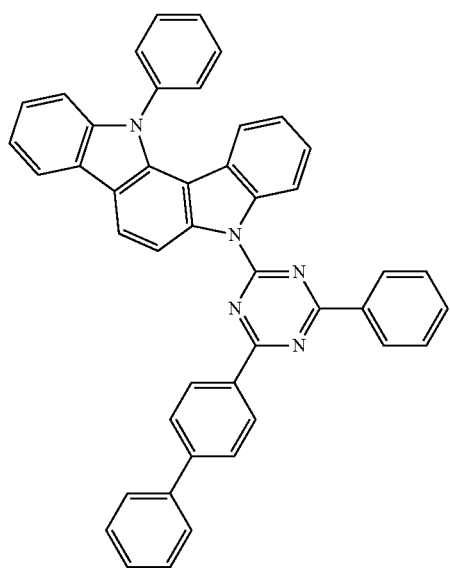
[E-113]

-continued
[E-114]
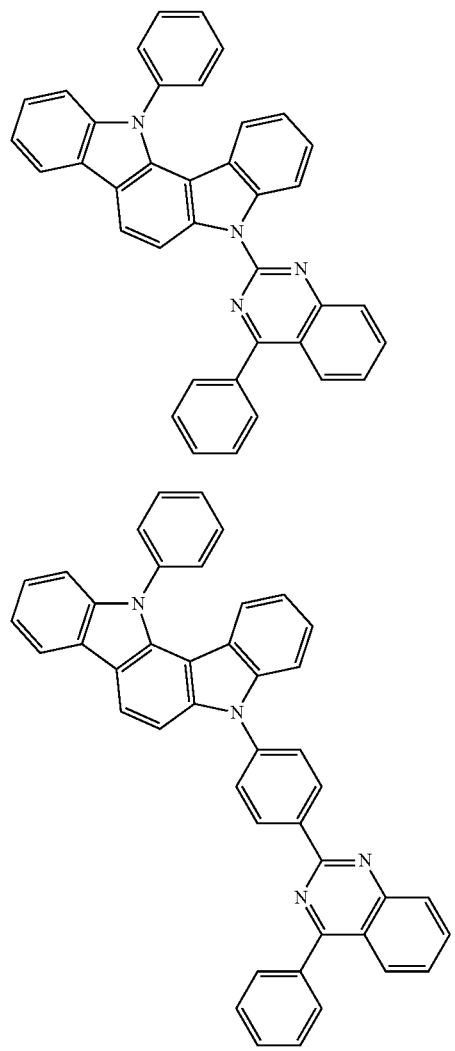
[E-115]
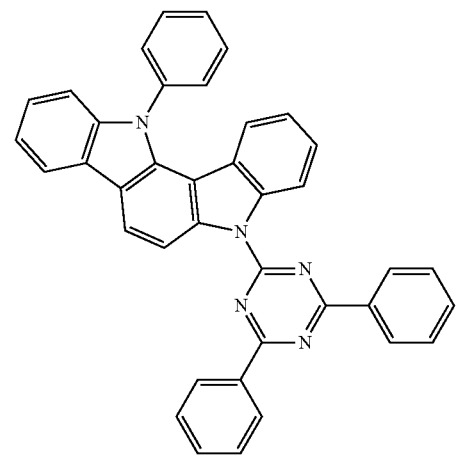
[E-116]
[E-117]
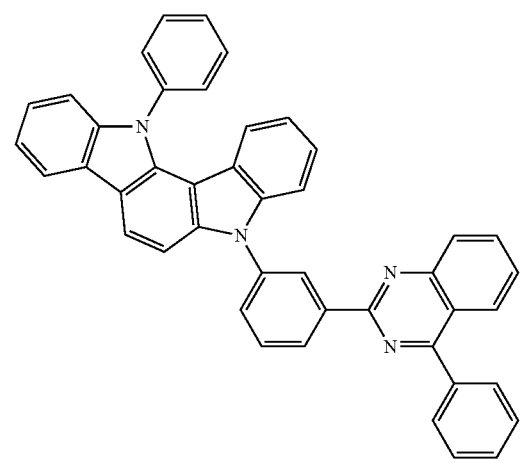
[E-118]
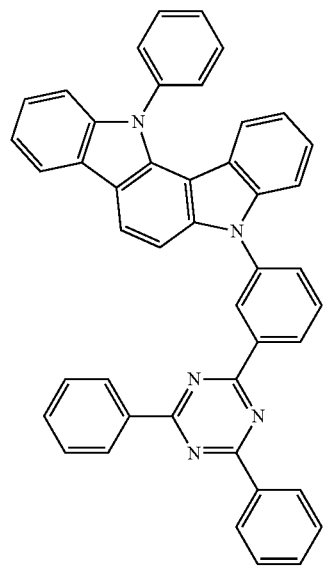
[E-119]
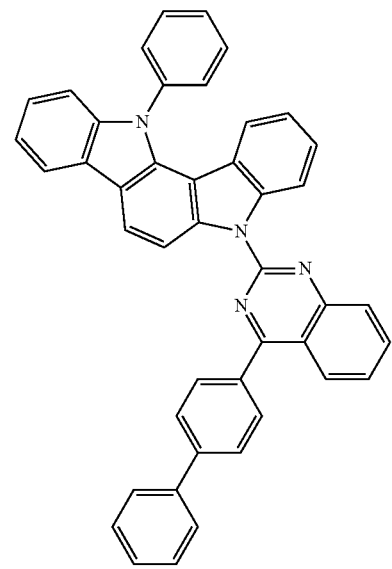

[E-120]
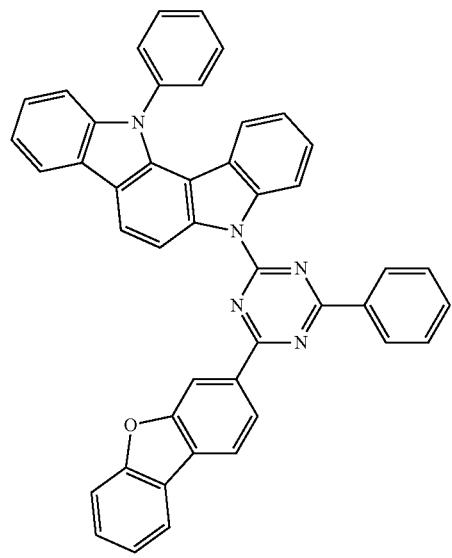
[E-121]
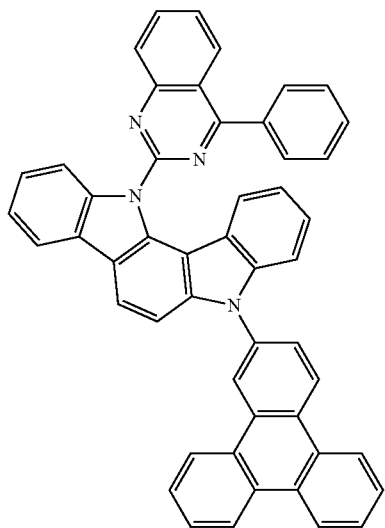
[E-122]
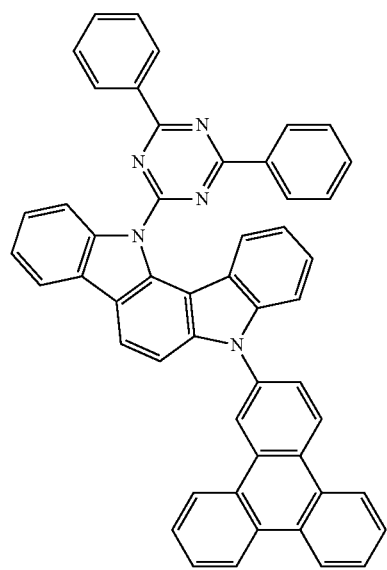
[E-123]
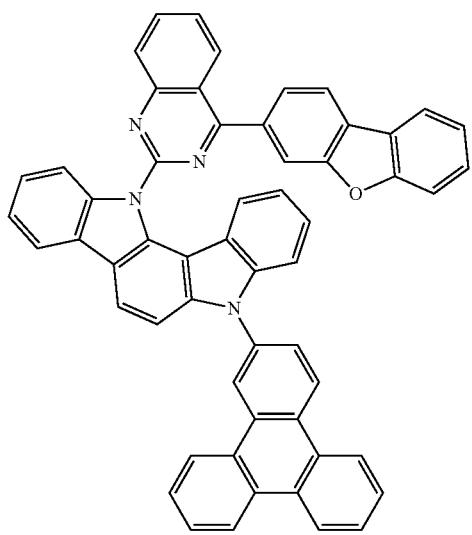

-continued
[E-124]
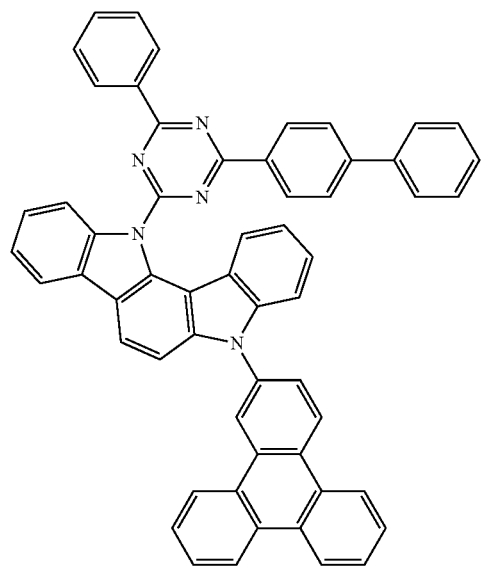
[E-125]
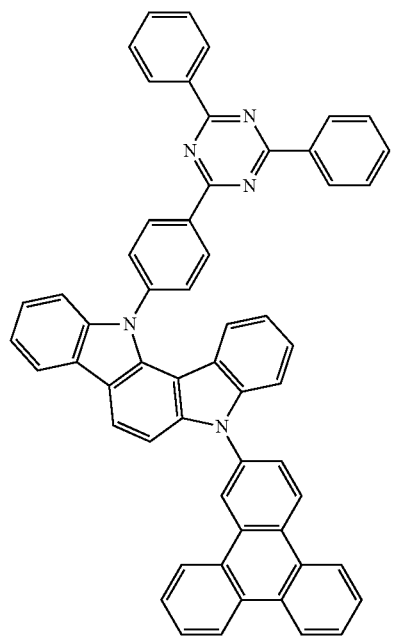
[E-126]
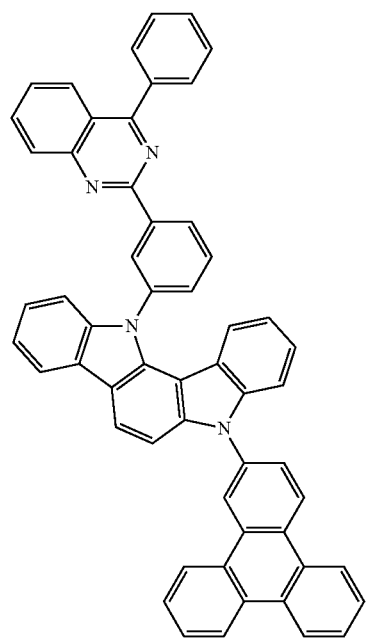
[E-127]
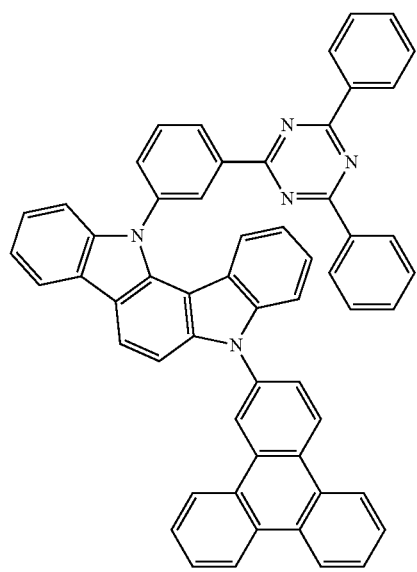

-continued
[E-128]
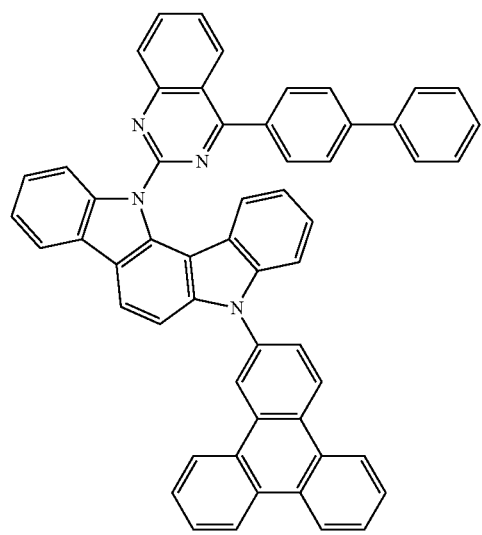
[E-129]
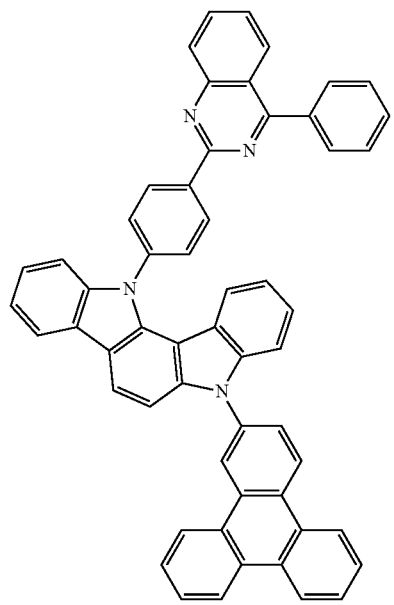
[E-130]
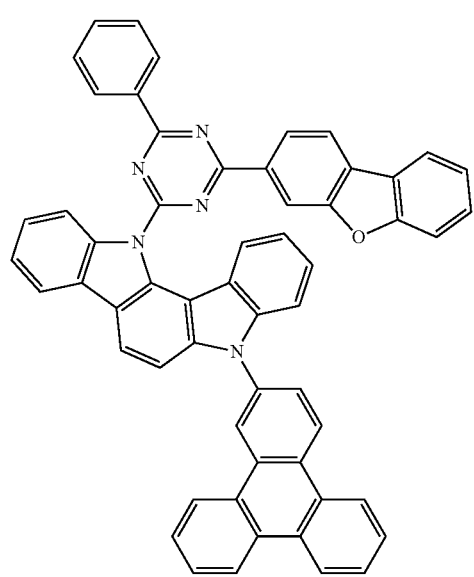
[E-131]
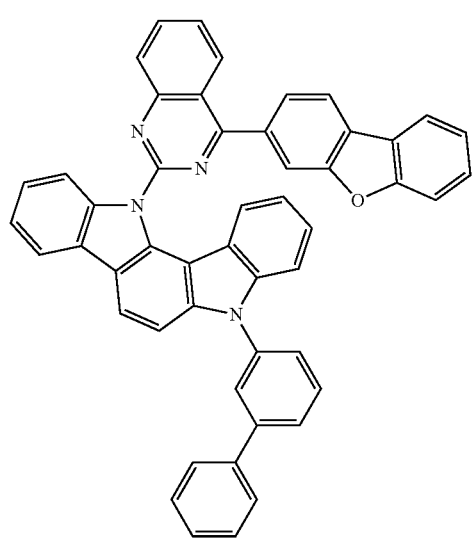

-continued
[E-132]
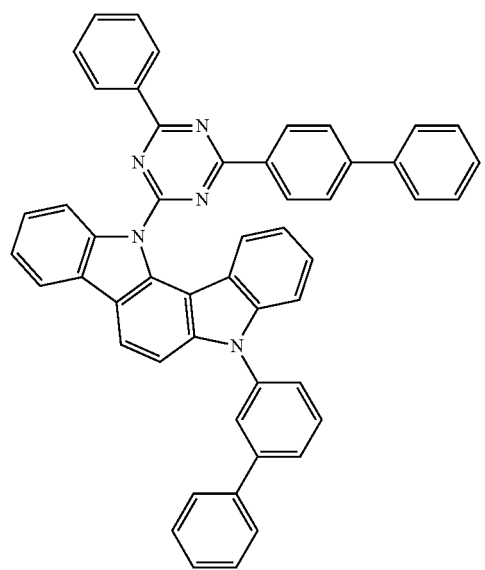
[E-133]
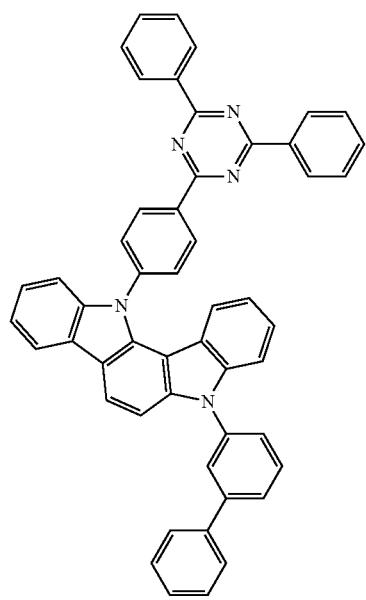
[E-134]
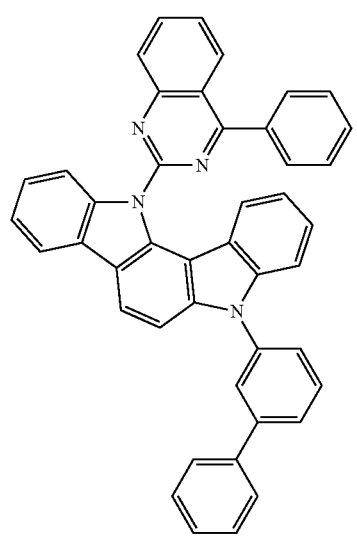
[E-135]
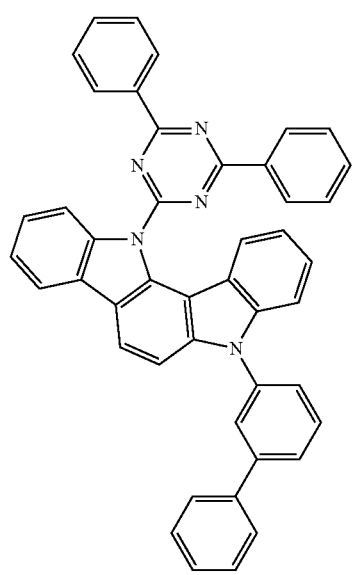

-continued
[E-136]
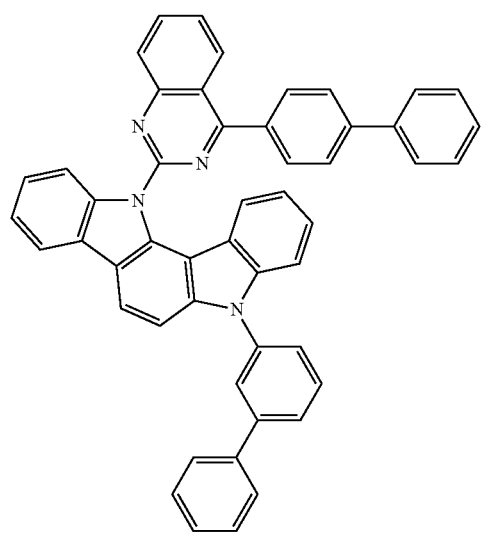
[E-137]
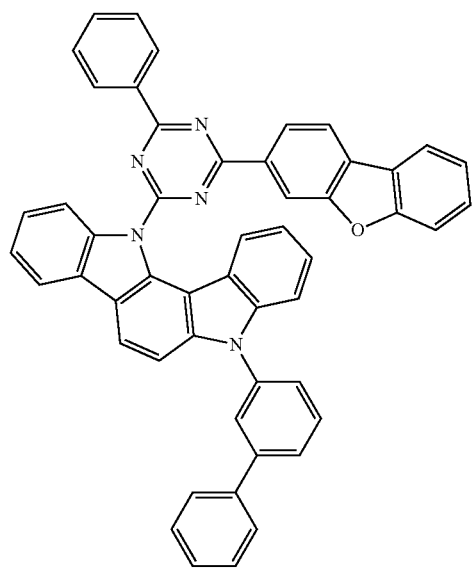
[E-138]
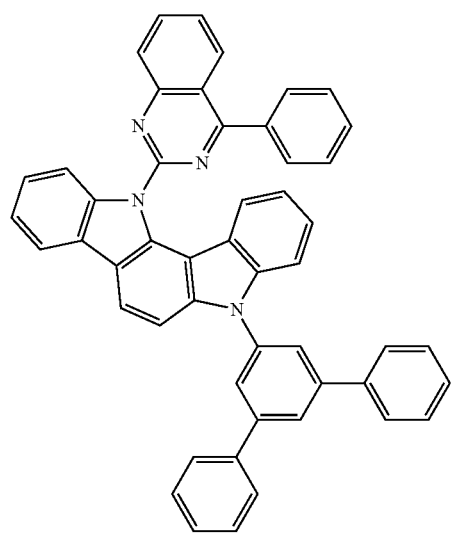
[E-139]
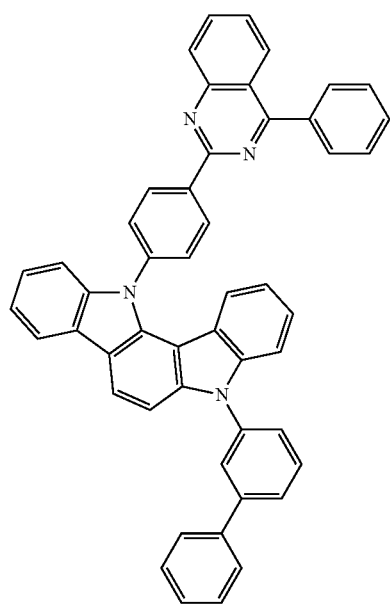

-continued
[E-140]
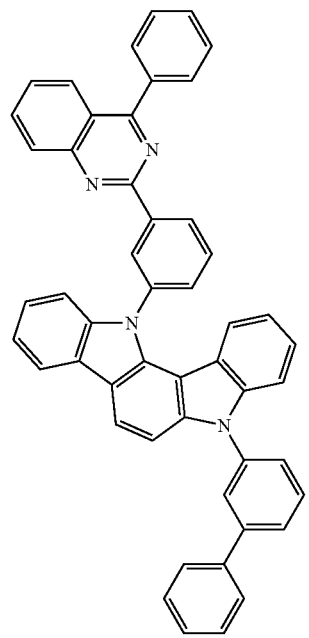
[E-141]
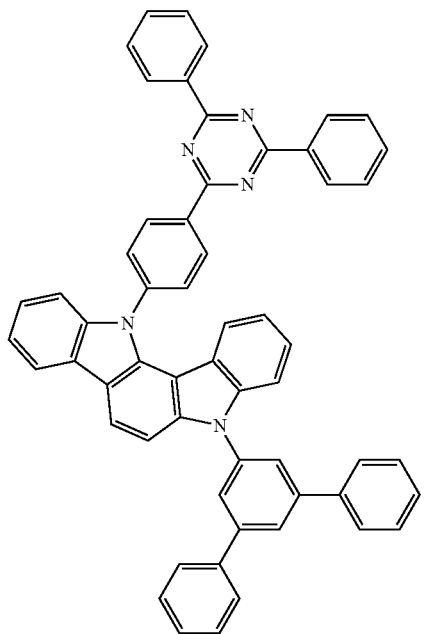
[E-142]
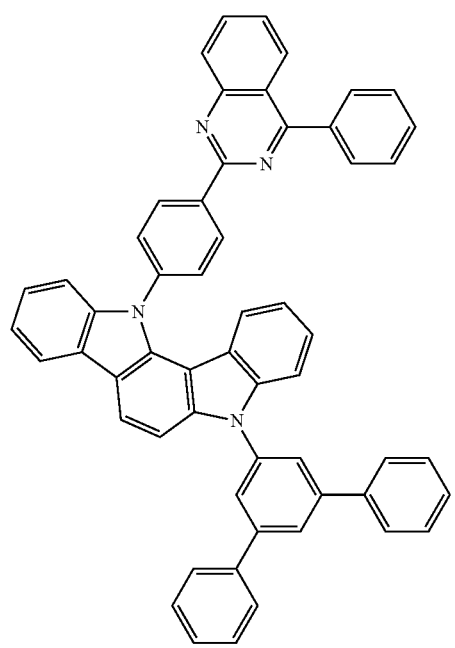
[E-143]
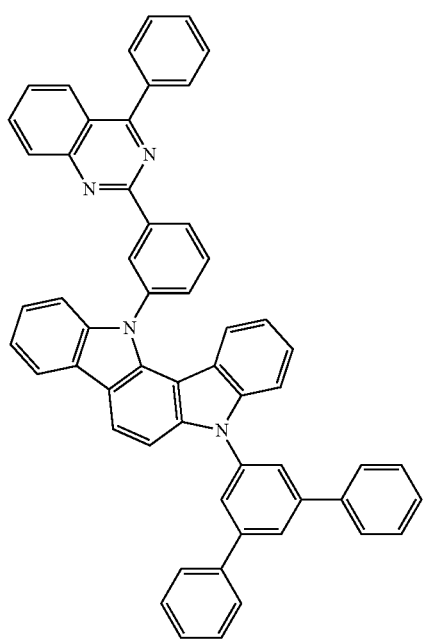

-continued
[E-144]
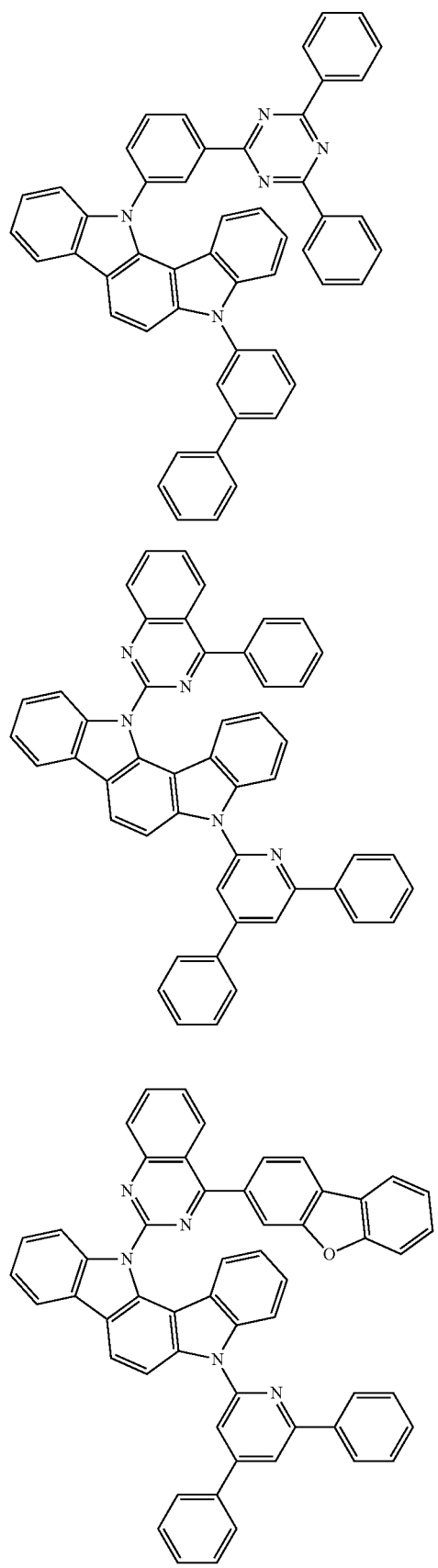
[E-145]
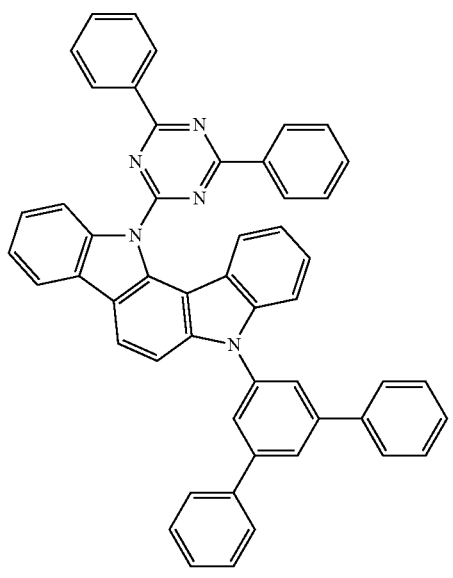
[E-146]
[E-147]
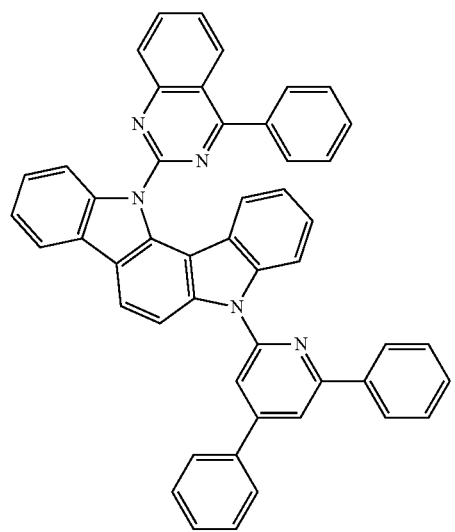
[E-148]
[E-149]
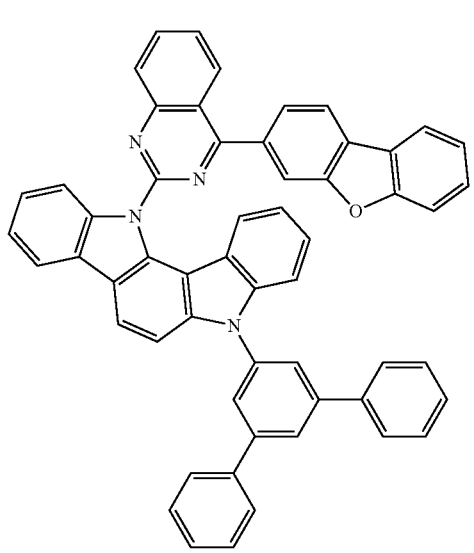

[E-150]
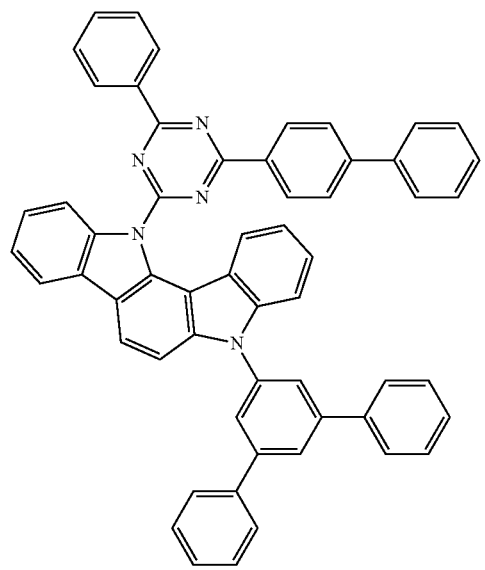
[E-151]
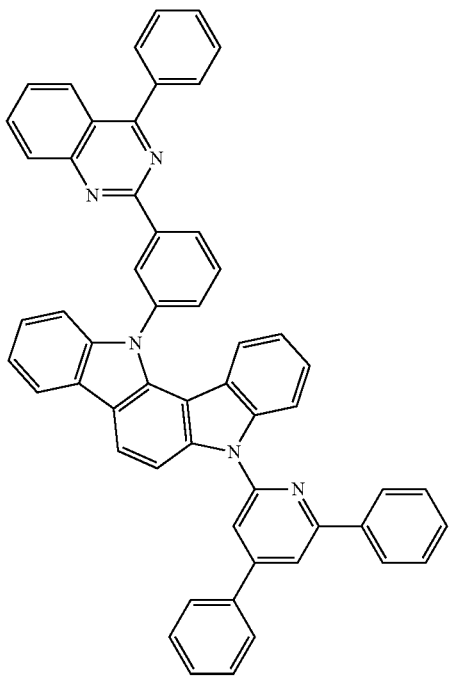
[E-152]
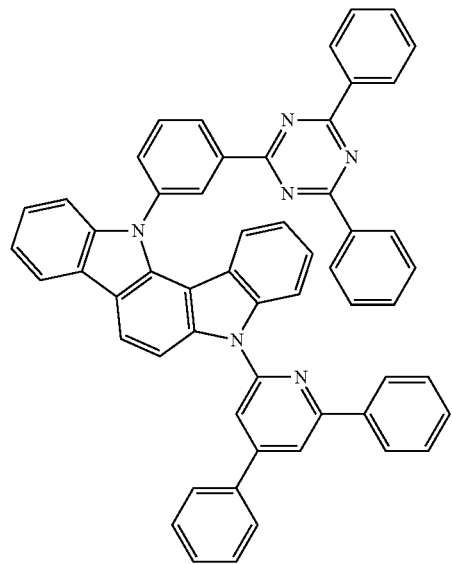
[E-153]
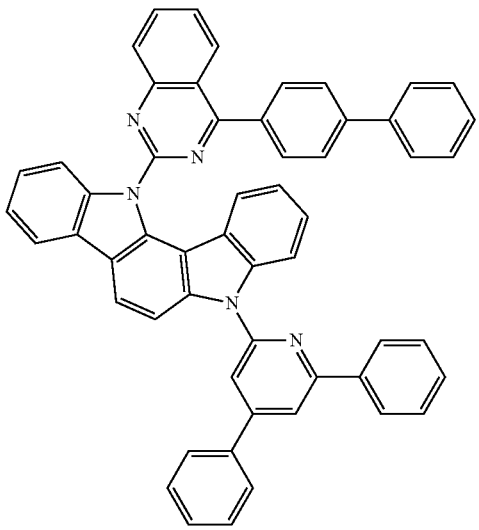

-continued
[E-154]
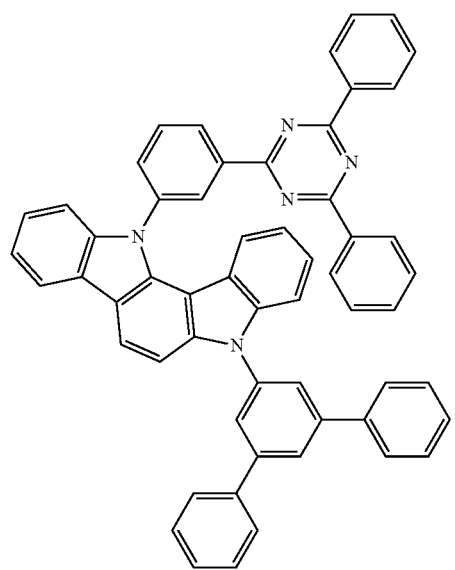
[E-155]
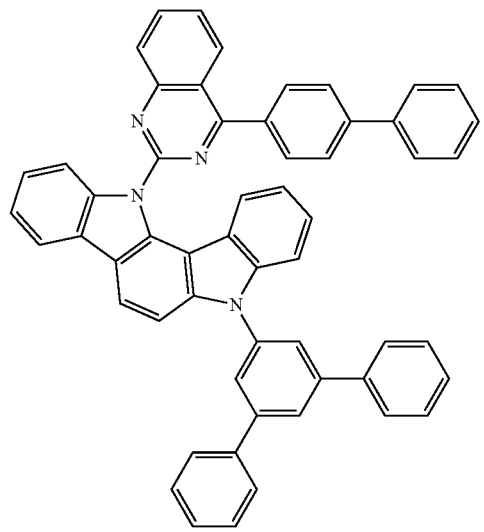
[E-156]
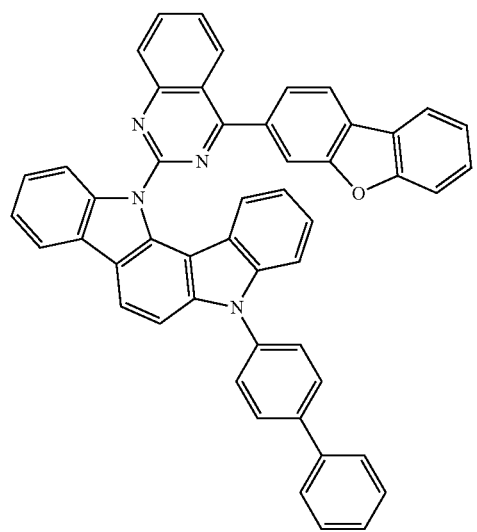
[E-157]
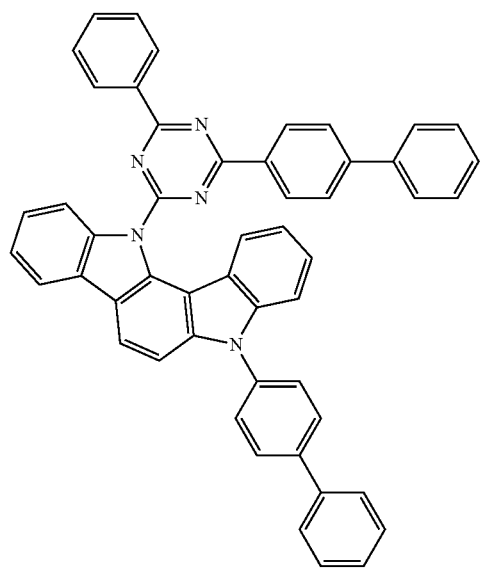

-continued
[E-158]
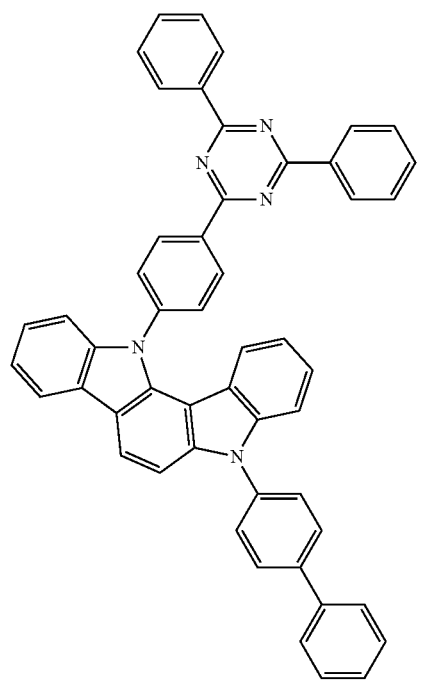
[E-159]
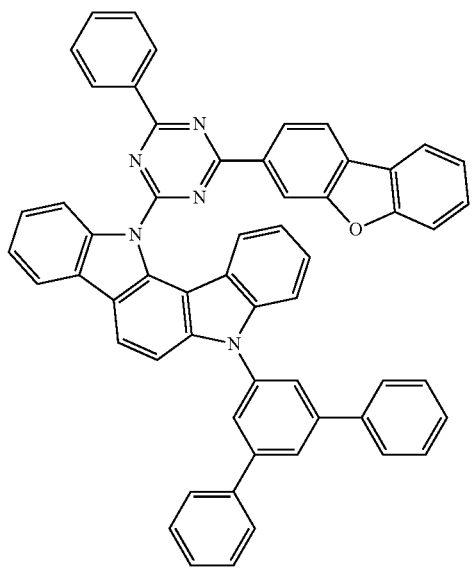
[E-160]
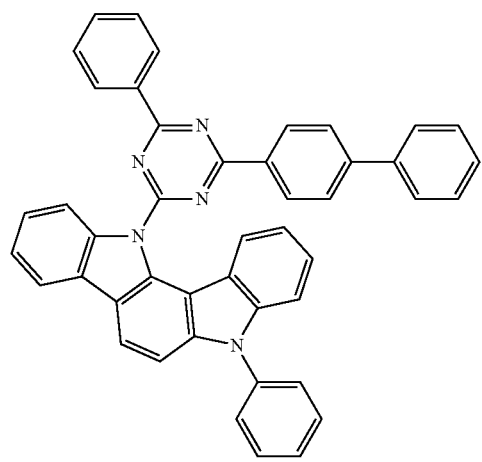
[E-161]
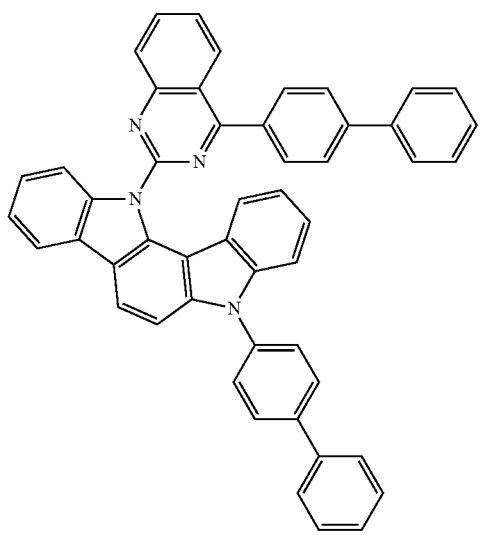

[E-162]
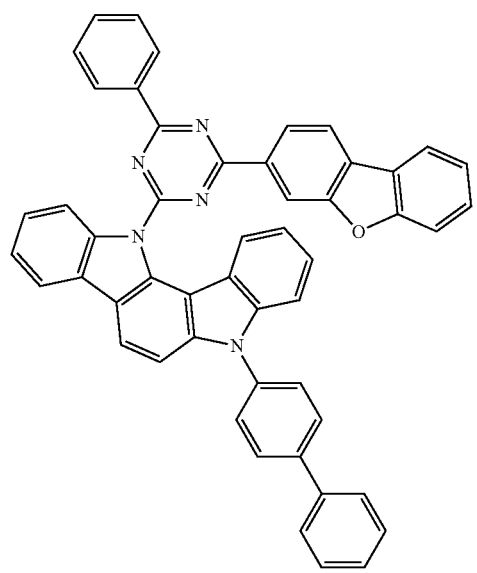
[E-163]
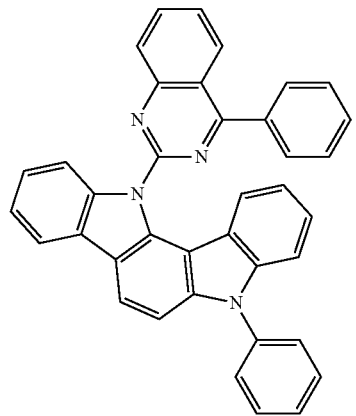
[E-164]
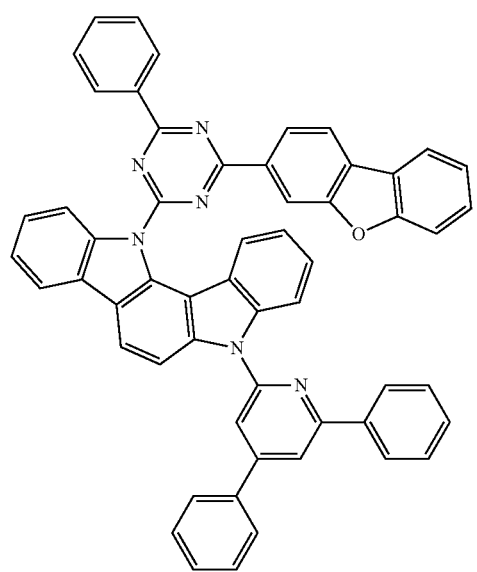
[E-165]
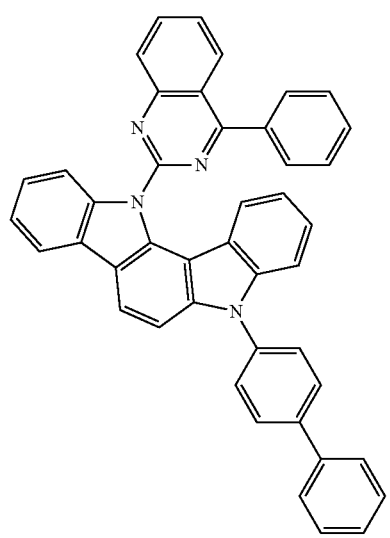

-continued
[E-166]
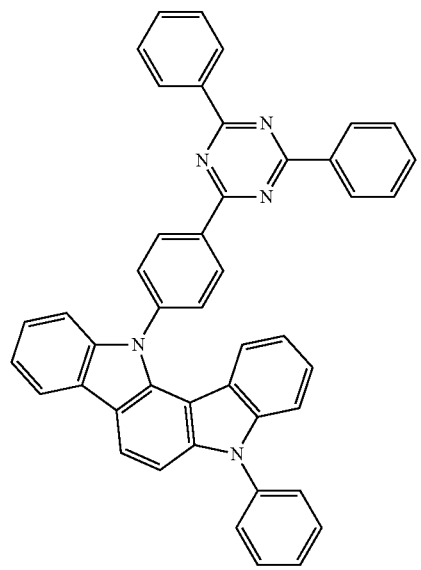
[E-167]
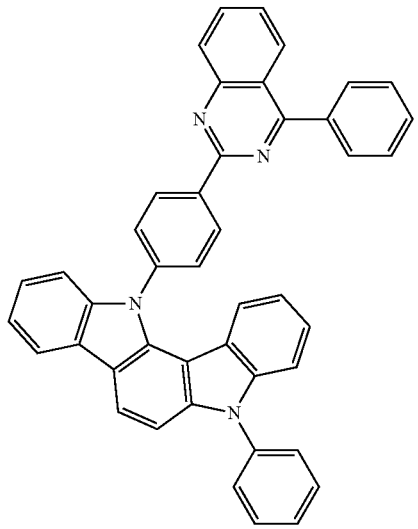
[E-168]
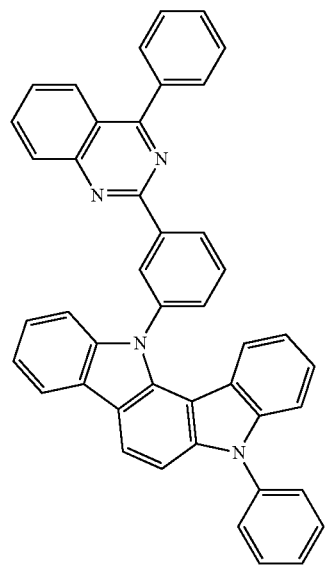
[E-169]
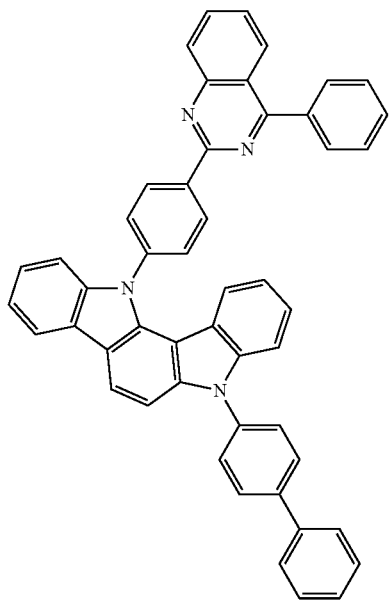

-continued
[E-170]
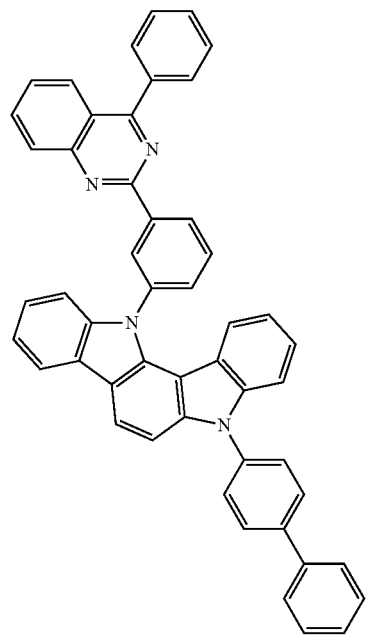
[E-171]
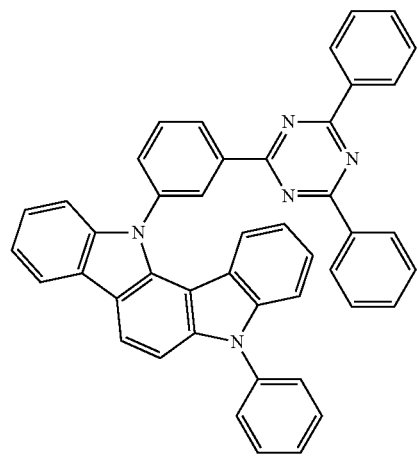
[E-172]
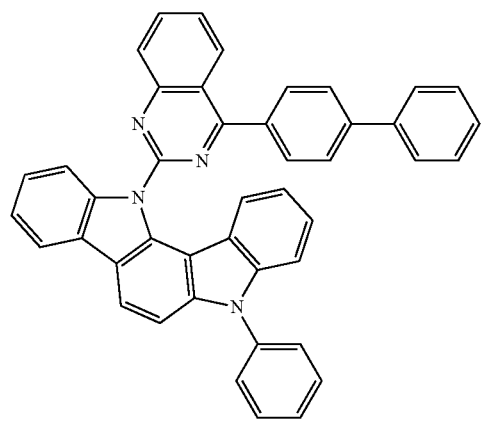
[E-173]
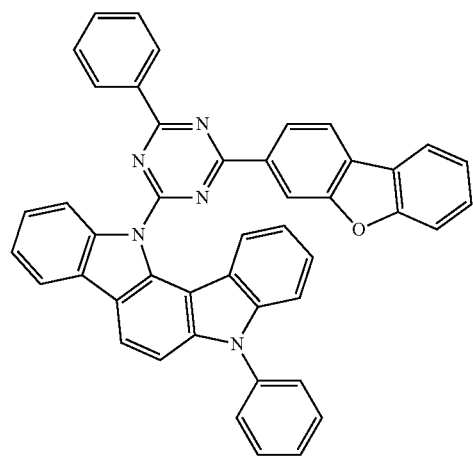
[E-174]
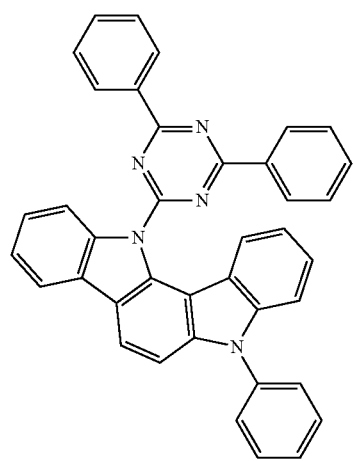
[E-175]
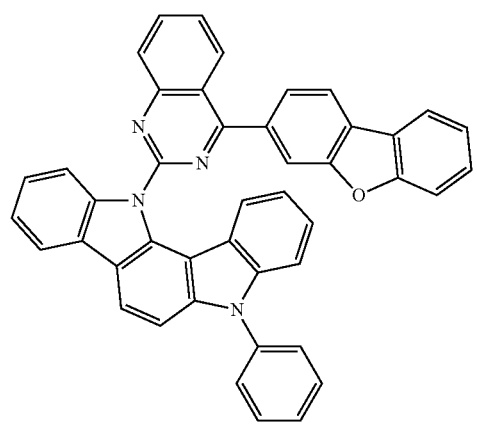

-continued
[E-176]
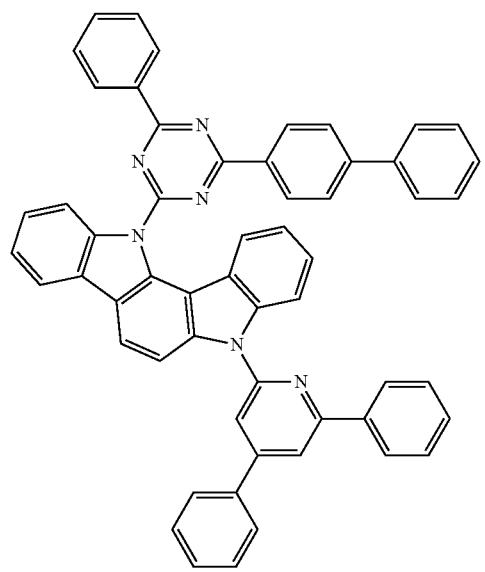
[E-177]
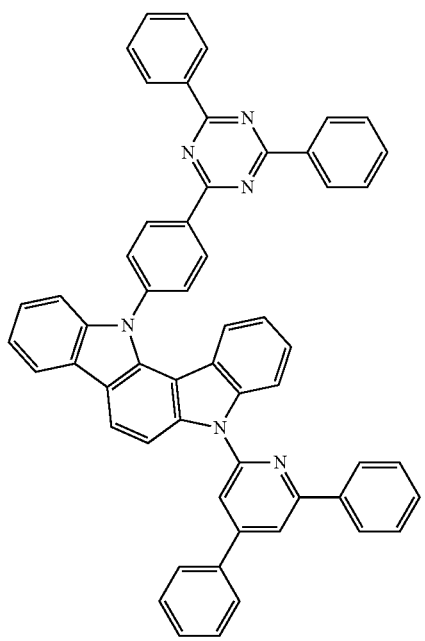
[E-178]
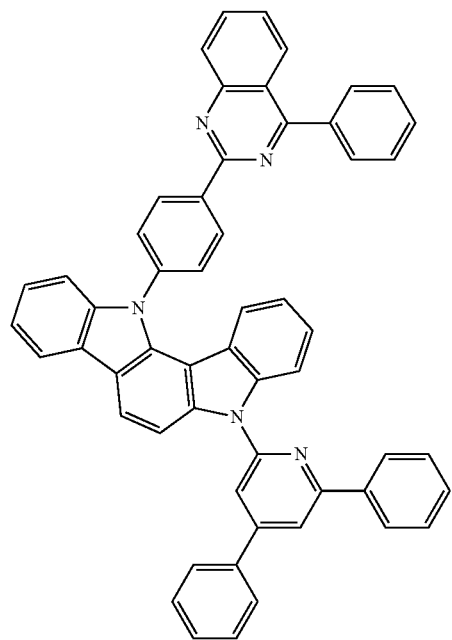
[E-179]
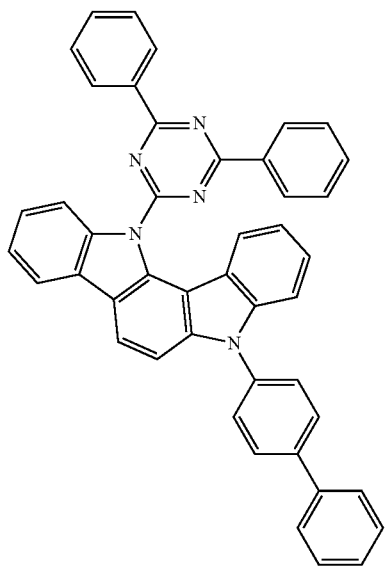

[E-180]

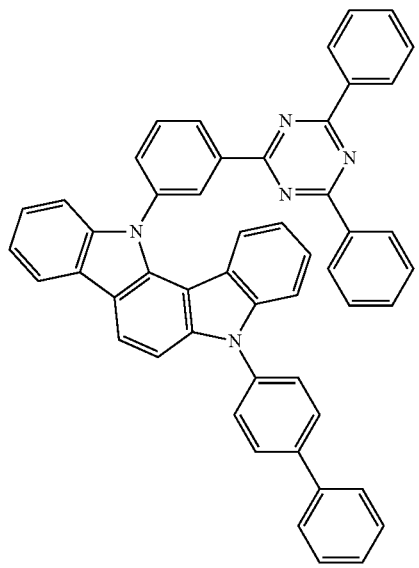

The first compound for an organic optoelectric device and second compound for an organic optoelectric device may variously be combined to prepare various compositions.

The second compound for an organic optoelectric device is used with the first compound for an organic optoelectric device in the light emitting layer and increases charge mobility and stability, and thereby luminous efficiency and life-span characteristics may be improved. For example, the first compound for an organic optoelectric device may be represented by Chemical Formula 1C-I or Chemical Formula 1C-III and the second compound for an organic optoelectric device may be represented by Chemical Formula 2A-a, Chemical Formula 2B, or Chemical Formula 2C.

[Chemical Formula 1C-I]

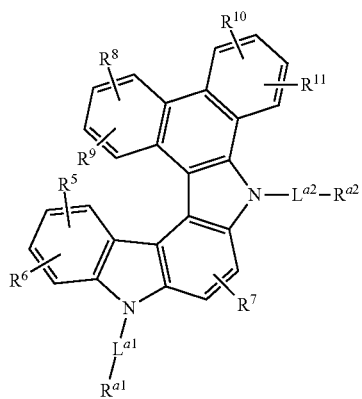

[Chemical Formula 1C-II]

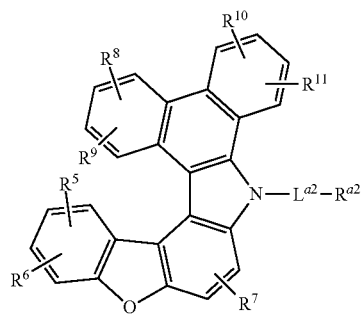

[Chemical Formula 1C-III]

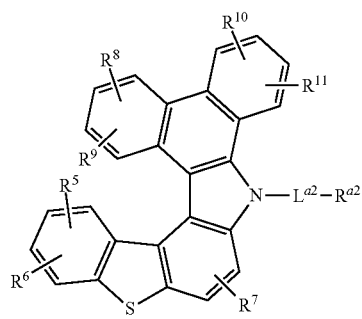

In an example embodiment, $R^{a1}$ and $R^{a2}$ of Chemical Formula 1C-I, Chemical Formula 1C-II, and Chemical Formula 1C-III may independently be a substituted or unsubstituted phenyl group, a substituted or unsubstituted biphenyl group, a substituted or unsubstituted pyrimidinyl group, a substituted or unsubstituted triazinyl group, or a substituted or unsubstituted quinazolinyl group, $R^5$ to $R^{11}$ may independently be hydrogen, deuterium, a substituted or unsubstituted C1 to C4 alkyl group, or a substituted or unsubstituted C6 to C12 aryl group, and $L^1$ and $L^2$ may independently be a single bond, or a substituted or unsubstituted C6 to C30 arylene group.

In addition, in Chemical Formula 2A-a, Chemical Formula 2B, and Chemical Formula 2C, $Y^1$ to $Y^3$ may independently be a single bond, or a substituted or unsubstituted C6 to C30 arylene group, $A^1$ and $A^2$ of Chemical Formula 2A-a may independently be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted pyridinyl group, a substituted or unsubstituted dibenzofuranyl group, a substituted or unsubstituted dibenzothiophenyl group, a substituted or unsubstituted carbazolyl group, or a substituted or unsubstituted fluorenyl group, $A^1$ and $A^3$ of Chemical Formula 2B and Chemical Formula 2C may independently be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted phenanthrenyl group, a substituted or unsubstituted fluorenyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group, and one of $A^1$ and $A^3$ of Chemical Formula 2B and Chemical Formula 2C may be a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group.

In addition, a ratio of the second compound for an organic optoelectric device and the first compound for an organic optoelectric device may be adjusted and thereby charge mobility may be controlled. When the composition of the present disclosure is used as a host, a combination ratio thereof may be different according to kinds and properties of a used dopant and the first compound for an organic optoelectric device and the second compound for an organic optoelectric device may be for example included in a weight ratio of about 1:10 to about 10:1. Specifically the first compound for an organic optoelectric device and the second compound for an organic optoelectric device may be included in a weight ratio of about 2:8 to about 8:2, about 3:7 to about 7:3, about 4:6 to about 6:4, about 4:6 to about 8:2, or about 5:5 to about 8:2, for example about 2:8 to about 8:2 or about 3:7 to about 7:3. For more specific examples, a mixing ratio of the first compound for an organic optoelectric device and the second compound for an organic optoelectric device may be about 5:5 to about 7:3, for example about 5:5, about 6:4, or about 7:3.

Within the ranges, bipolar characteristics may be realized more effectively and thus efficiency and life-span may be simultaneously improved.

The composition may further include one or more host compounds in addition to the first compound for an organic optoelectric device and the second compound for an organic optoelectric device.

The composition may further include a dopant. The dopant may be a red, green, or blue dopant, for example a phosphorescent dopant.

The dopant is mixed in a small amount to cause light emission, and may be generally a material such as a metal complex that emits light by multiple excitation into a triplet or more. The dopant may be, for example an inorganic, organic, or organic/inorganic compound, and one or more kinds thereof may be used.

The dopant may be for example a phosphorescent dopant and examples of the phosphorescent dopant may be an organometallic compound including Ir, Pt, Os, Ti, Zr, Hf, Eu, Tb, Tm, Fe, Co, Ni, Ru, Rh, Pd, or a combination thereof. The phosphorescent dopant may be for example a compound represented by Chemical Formula Z, but is not limited thereto.

$$L_2MX \qquad \text{[Chemical Formula Z]}$$

In Chemical Formula Z, M is a metal, and L and X are the same or different and are a ligand to form a complex compound with M.

The M may be for example Ir, Pt, Os, Ti, Zr, Hf, Eu, Tb, Tm, Fe, Co, Ni, Ru, Rh, Pd, or a combination thereof and the L and X may be for example a bidendate ligand.

The composition may be formed using a dry film forming method such as a chemical vapor deposition (CVD) or a solution process.

Hereinafter, an organic optoelectric device including the composition for an organic optoelectric device is described.

An organic optoelectric device according to another embodiment includes an anode and a cathode facing each other and at least one organic layer interposed between the anode and the cathode, wherein the organic layer includes the composition for an organic optoelectric device.

For example, the organic layer may include a light emitting layer and the light emitting layer may include the composition for an organic optoelectric device of the present disclosure.

Specifically, the composition for an organic optoelectric device may be included as a host, for example a red host of the light emitting layer.

In addition, the organic layer may include a light emitting layer and at least one auxiliary layer selected from a hole injection layer, a hole transport layer, an electron blocking layer, an electron transport layer, an electron injection layer, and a hole blocking layer and the auxiliary layer may include the composition for an organic optoelectric device.

The organic optoelectric device may be any device to convert electrical energy into photoenergy and vice versa without particular limitation, and may be, for example an organic photoelectric device, an organic light emitting diode, an organic solar cell, and an organic photo conductor drum.

Herein, an organic light emitting diode as one example of an organic optoelectric device is described referring to drawings.

Figure 2:
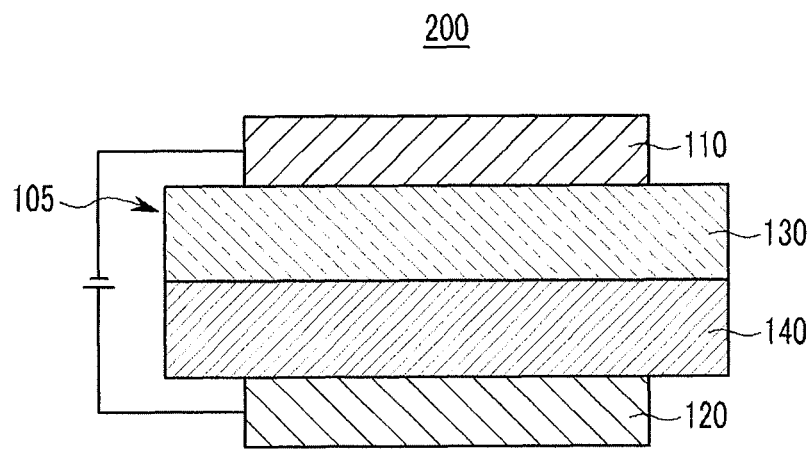

FIGS. 1 and 2 are cross-sectional views of an organic light emitting diode according to an embodiment.

Referring to FIG. 1, an organic optoelectric diode 100 according to an embodiment includes an anode 120 and a cathode 110 and an organic layer 105 disposed between the anode 120 and the cathode 110.

The anode 120 may be made of a conductor having a large work function to help hole injection and may be for example made of a metal, a metal oxide and/or a conductive polymer. The anode 120 may be, for example a metal nickel, platinum, vanadium, chromium, copper, zinc, gold, and the like or an alloy thereof; metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDT), polypyrrole, and polyaniline, but is not limited thereto.

The cathode 110 may be made of a conductor having a small work function to help electron injection, and may be for example made of a metal, a metal oxide and/or a conductive polymer. The cathode 110 may be for example a metal or an alloy thereof such as magnesium, calcium, sodium, potassium, titanium, indium, yttrium, lithium, gadolinium, aluminum silver, tin, lead, cesium, barium, and the like; a multi-layer structure material such as LiF/Al, $LiO_2$/Al, LiF/Ca, LiF/Al and $BaF_2$/Ca, but is not limited thereto.

The organic layer 105 includes a light emitting layer 130 including the compound for an organic optoelectric device.

FIG. 2 is a cross-sectional view showing an organic light emitting diode according to another embodiment.

Referring to FIG. 2, an organic light emitting diode 200 further include a hole auxiliary layer 140 in addition to the light emitting layer 130. The hole auxiliary layer 140 may further increase hole injection and/or hole mobility and block electrons between the anode 120 and the light emitting layer 130. The hole auxiliary layer 140 may be, for example a hole transport layer, a hole injection layer, and/or an electron blocking layer, and may include at least one layer.

The organic layer 105 of FIG. 1 or 2 may further include an electron injection layer, an electron transport layer, an electron transport auxiliary layer, a hole transport layer, a hole transport auxiliary layer, a hole injection layer, or a combination thereof even if they are not shown. The compound for an organic optoelectric device of the present disclosure may be included in these organic layers. The organic light emitting diodes 100 and 200 may be manufactured by forming an anode or a cathode on a substrate, forming an organic layer using a dry film formation method such as a vacuum deposition method (evaporation), sputtering, plasma plating, and ion plating or a wet coating method such as spin coating, dipping, and flow coating, and forming a cathode or an anode thereon.

The organic light emitting diode may be applied to an organic light emitting diode display.

Hereinafter, the embodiments are illustrated in more detail with reference to examples. These examples, however, are not in any sense to be interpreted as limiting the scope of the invention.

Hereinafter, starting materials and reactants used in Examples and Synthesis Examples were purchased from Sigma-Aldrich Co. Ltd. or TCI Inc. as far as there in no particular comment or were synthesized by known methods. (Preparation of Compound for Organic Optoelectric Device)

The compound as one specific examples of the present disclosure was synthesized through the following steps.

Synthesis of First Compound for Organic Optoelectric Device

Synthesis Example 1: Synthesis of Compound 225

Step 1: Synthesis of Intermediate 225-4

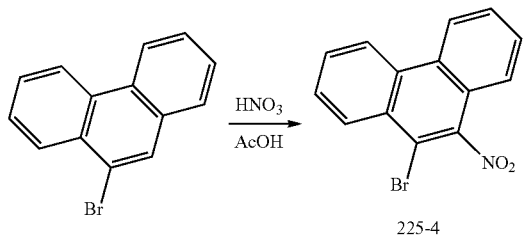

A 500 mL round-bottomed flask was equipped with a reflux condenser, and 1 equivalent of 9-bromo-phenanthrene as a starting material was dissolved in 200 mL of glacial acetic acid and 20 mL of anhydrous acetic acid. The reaction solution was heated and refluxed, and 5 equivalents of 85% nitric acid was added thereto in a dropwise fashion for 30 minutes. When the addition in a dropwise fashion was complete, the reaction solution was heated and refluxed for one hour and then, cooled down to room temperature. The reaction solution was diluted with 500 mL of methanol and 100 mL of ice water, and a solid produced therein was filtered and then, washed with water and methanol. The solid was recrystallized with toluene to obtain Intermediate 225-4 (25 g, a yield of 43%).

LC-Mass (theoretical value: 300.97 g/mol, measured value: M+1=302.01 g/mol)

Step 2: Synthesis of Intermediate 225-5

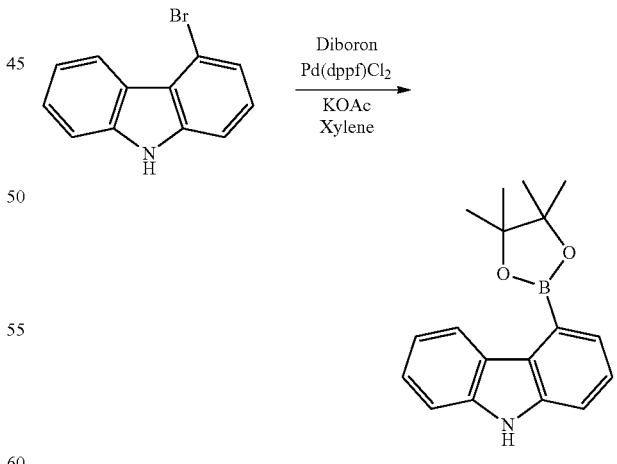

A 500 mL round-bottomed flask was equipped with a reflux condenser, 1 equivalent of 4-bromocarbazole as a starting material was put therein, and 1.2 equivalents of bispinacolatosiboron, 0.03 equivalents of dichloro diphenylphosphinoferrocene palladium, and 2 equivalents of potassium acetate were dissolved in xylene. The obtained reaction solution was heated and refluxed for 18 hours and then, cooled down. Then, the reaction solution was dissolved in 200 mL of ethyl acetate and then, filtered with silica and concentrated. The concentrated residue was purified through silica gel column to obtain Intermediate 225-5 (25 g, a yield of 75%).

LC-Mass (theoretical value: 293.16 g/mol, measured value: M+1=294. 20 g/mol)

Step 3: Synthesis of Intermediate 225-3

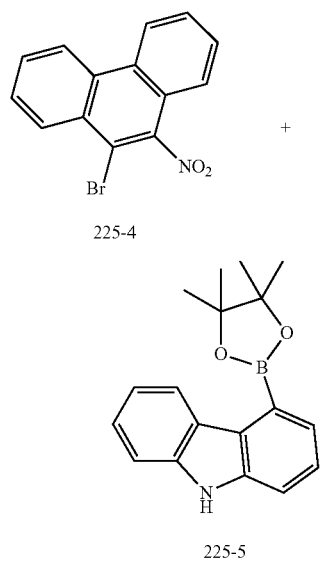

Step 4: Synthesis of Intermediate 225-2

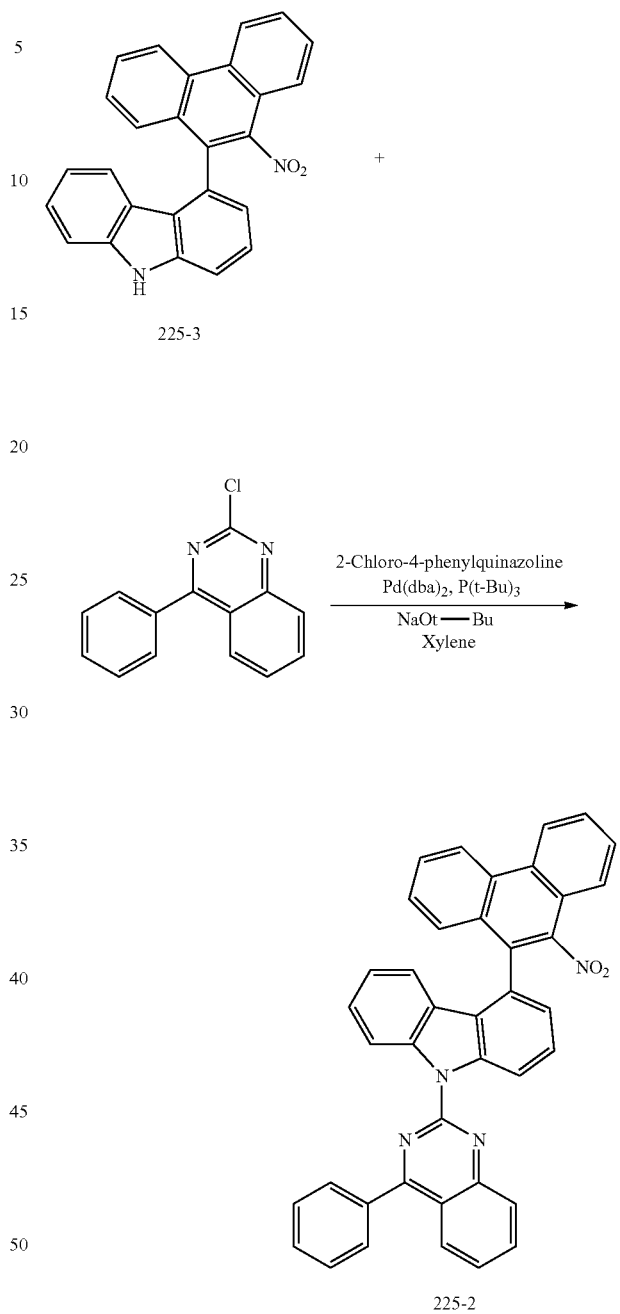

One equivalent of Intermediate 225-4 and 1.2 equivalents of Intermediate 225-5 were dissolved with a 0.25 molar concentration in a mixed solution of tetrahydrofuran and distilled water (3:1), 0.03 equivalents of tetrakis triphenyl phosphine and 2 equivalents of carbonate potassium were added thereto, and the mixture was heated and refluxed for 19 hours. The reaction solution was cooled down to separate layers, and an organic layer among them was gathered and concentrated. The concentrated residue was purified through silica gel column to obtain Intermediate 225-3 (24 g, a yield of 85%).

LC-Mass (theoretical value: 388.12 g/mol, measured value: M+1=389.22 g/mol)

One equivalent of Intermediate 225-3 was put in a 500 mL round-bottomed flask, 1.2 equivalents of 2-chloro-4-phenylquinazoline, 0.03 equivalents of bis dibenzylidene acetone palladium, 0.1 equivalents of tributylphosphine, and 2 equivalents of sodium tertiarybutoxide were heated and refluxed with a 0.25 molar concentration in xylene for 16 hours. The reaction solution was cooled down and then, diluted with 200 mL of methanol, and a solid therein was filtered. The filtered solid was recrystallized in toluene to obtain Intermediate 225-2 (21 g, a yield of 81%).

LC-Mass (theoretical value: 592.19 g/mol, measured value: M+1=593.22 g/mol)

Step 5: Synthesis of Intermediate 225-1

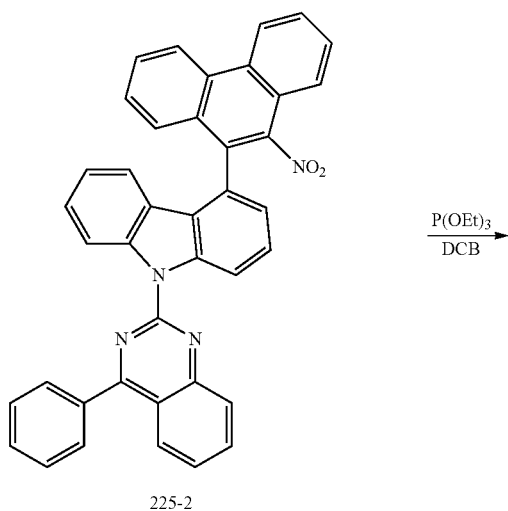

225-2

Step 6: Synthesis of Compound 225

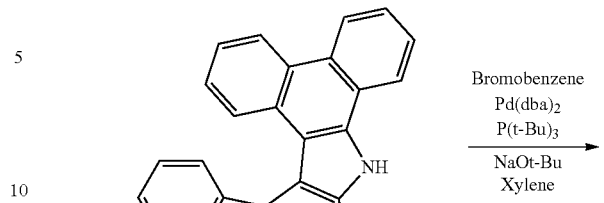

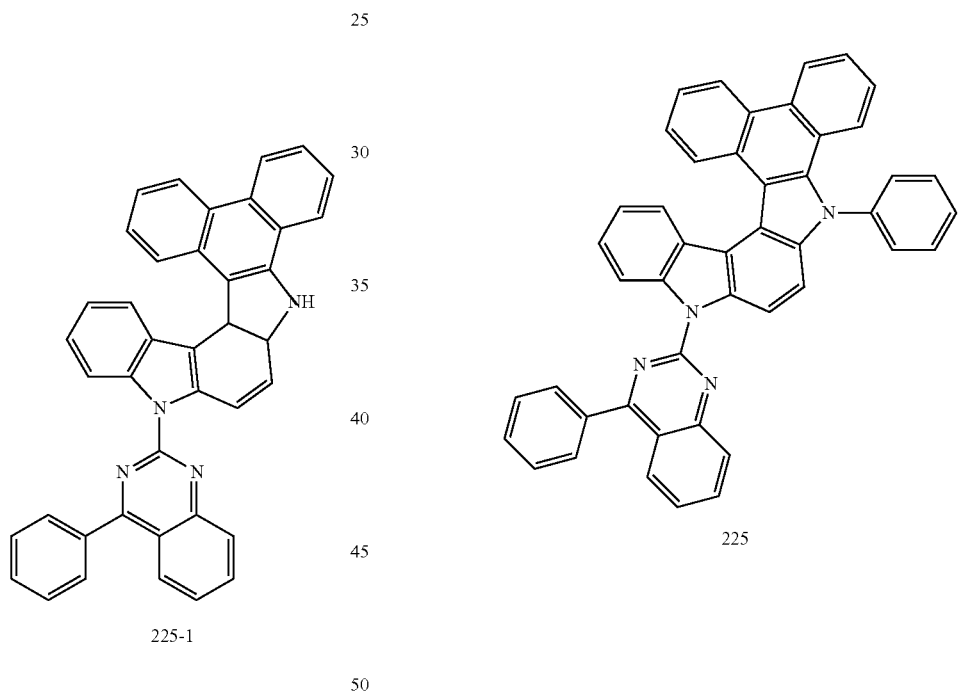

One equivalent of Intermediate 225-2 was diluted with a 0.3 molar concentration in dichlorobenzene. Five equivalents of triethylphosphite were added thereto, and the mixture was heated and refluxed for 5 days. The reaction solution was concentrated, and the concentrated residue was purified through silica gel column to obtain Intermediate 225-1 (15 g, a yield of 65%).

LC-Mass (theoretical value: 560.20 g/mol, measured value: M+1=561.21 g/mol)

One equivalent of Intermediate 225-1, 1.2 equivalents of bromo benzene, 0.03 equivalents of bis dibenzylidene acetone palladium, 0.1 equivalents of tris butylphosphine, and 2 equivalents of sodium tertiarybutoxide were diluted in xylene with a 0.25 molar concentration of the starting materials. The reaction solution was heated and refluxed for 19 hours and then, cooled down. Then, the reaction solution was diluted with 200 mL of methanol, and a solid produced therein was filtered. The solid was gathered and recrystallized with monochlorobenzene to obtain Compound 225 (15 g, a yield of 75%).

LC-Mass (theoretical value: 636.23 g/mol, measured value: M+1=636.25 g/mol)

Synthesis Example 2: Synthesis of Compound 227

Step 1: Synthesis of Compound 227-2

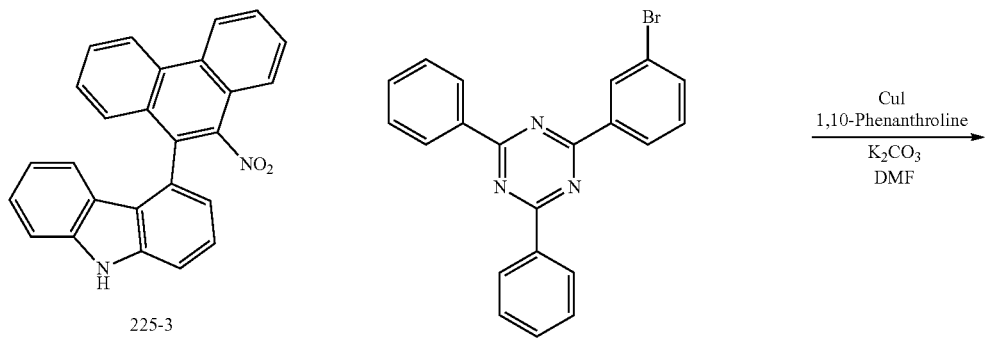

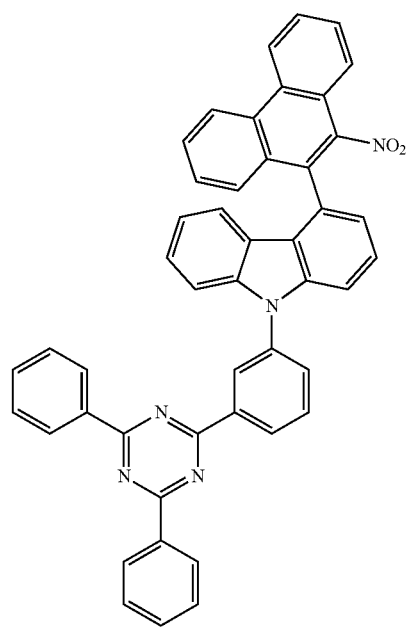

One equivalent of Intermediate 225-3, 1.2 equivalents of 2-(3-bromophenyl)-4,6-diphenyl-1,3,5-triazine, 0.05 equivalents of copper iodide, 0.1 equivalents of 1,10-phenanthroline, and 2 equivalents of potassium carbonate were dissolved in dimethylformamide with a 0.25 molar concentration of the starting materials in a 500 mL round-bottomed flask. The reaction solution was heated and refluxed for 17 hours and then, cooled down. The reaction solution was diluted with 300 mL of methanol, and a solid produced therein was filtered. The filtered solid was recrystallized in dichlorobenzene to obtain Intermediate 227-2 (17 g, a yield of 88%).

LC-Mass (theoretical value: 695.23 g/mol, measured value: M+1=636.25 g/mol)

Step 2: Synthesis of Intermediate 227-1

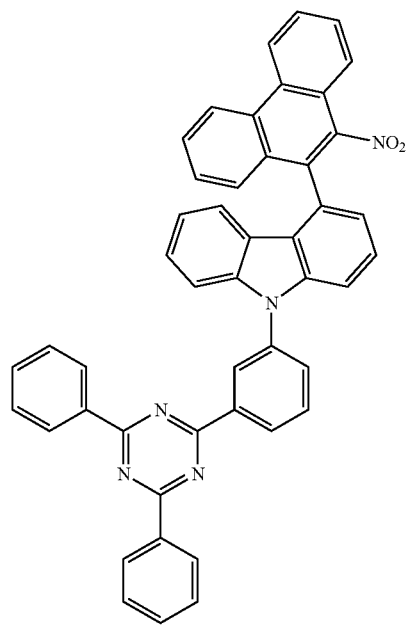

227-2

P(OEt)₃ / DCB →

Step 3: Synthesis of Compound 227

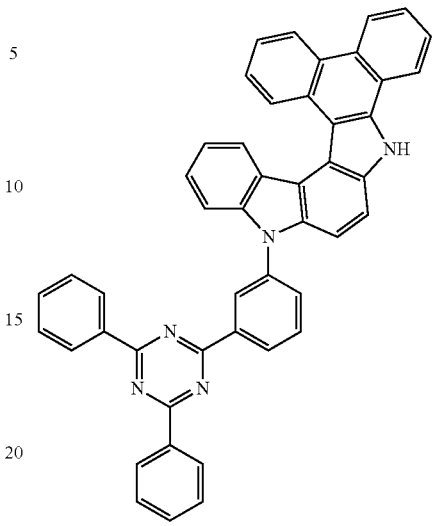

227-1

Bromobenzene
Pd(dba)₂
P(t-Bu)₃
NaOt-Bu
Xylene
→

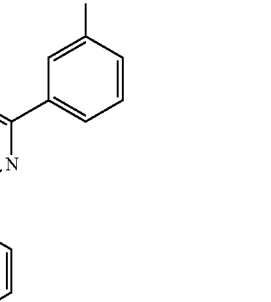

227-1

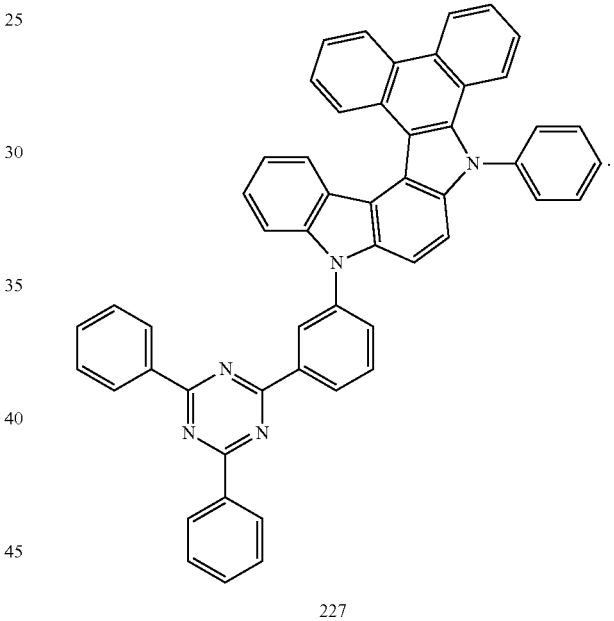

227

One equivalent of Intermediate 227-2 and 5 equivalents of triethyl phosphate were dissolved in dichlorobenzene with a 0.25 molar concentration of the starting materials. The reaction solution was heated and refluxed for 6 days. Then, the reaction solution was cooled down and then, concentrated. The concentrated residue was purified through silica gel column to obtain Intermediate 227-1 (15 g, a yield of 72%).

LC-Mass (theoretical value: 663.24 g/mol, measured value: M+1=664.55 g/mol)

One equivalent of Intermediate 227-1, 1.2 equivalents of bromobenzene, 0.03 equivalents of bis dibenzylidene acetone palladium, 0.1 equivalents of tris butylphosphine, and 2 equivalents of sodium tertiarybutoxide were diluted in xylene with a 0.25 molar concentration of the starting materials. The reaction solution was heated and refluxed for 19 hours and then, cooled down. Subsequently, the reaction solution was diluted with 200 mL of methanol, and a solid produced therein was filtered. The solid was gathered and then, recrystallized with dichlorobenzene to obtain Compound 227 (13 g, a yield of 78%).

LC-Mass (theoretical value: 739.27 g/mol, measured value: M+1=740.28 g/mol)

Synthesis Example 3: Synthesis of Compound 221

Compound 221 was obtained according to the same method as Synthesis Example of Compound 227 except for using 2-chloro-4,6-diphenyl-1,3,5-triazine instead of the 2-(3-bromophenyl)-4,6-diphenyl-1,3,5-triazine in the synthesis of Intermediate 227-2 in Step 1 of Synthesis Example 2.

LC-Mass (theoretical value: 663.24 g/mol, measured value: M+1=664.25 g/mol)

Synthesis Example 4: Synthesis of Compound 237

Compound 237 was obtained according to the same method as Synthesis Example of Compound 227 except for using 4-([1,1'-biphenyl]-4-yl)-2-chloro-6-phenyl-1,3,5-triazine instead of the 2-(3-bromophenyl)-4,6-diphenyl-1,3,5-triazine in the synthesis of Intermediate 227-2 in Step 1 of Synthesis Example 2.

LC-Mass (theoretical value: 739.27 g/mol, measured value: M+1=740.28 g/mol)

Synthesis Example 5: Synthesis of Compound 241

Compound 237 was obtained according to the same method as Synthesis Example of Compound 225 except for using 4-([1,1'-biphenyl]-4-yl)2-chloroquinazoline instead of the 2-chloro-4-phenylquinazoline in the synthesis of Intermediate 225-2 in Step 4 of Synthesis Example 1.

LC-Mass (theoretical value: 636.23 g/mol, measured value: M+1=637.24 g/mol)

Synthesis Example 6: Synthesis of Compound 264

Compound 264 was obtained according to the same method as Synthesis Example of Compound 225 except for using 4-bromo dibenzothiophene instead of the 4-bromocarbazole as a starting material in the synthesis of Intermediate 225-5 in Step 2 of Synthesis Example 1.

LC-Mass (theoretical value: 577.16 g/mol, measured value: M+1=578.16 g/mol)

Synthesis Example 7: Synthesis of Compound 265

Compound 265 was obtained according to the same method as Synthesis Example of Compound 227 except for using 4-bromo dibenzothiophene instead of the 4-bromocarbazole as a starting material in the synthesis of Intermediate 225-5 in Step 2 of Synthesis Example 2.

LC-Mass (theoretical value: 680.20 g/mol, measured value: M+1=681.26 g/mol)

Second Compound for Organic Optoelectric Device

Synthesis Example 8: Synthesis of Compound E-4

Step 1: Synthesis of Intermediate E-4-1

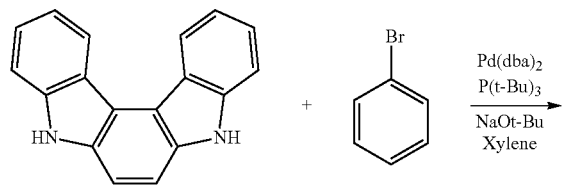

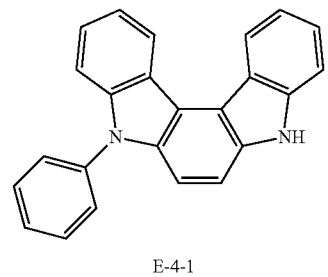

E-4-1

One equivalent of 5,8-dihydroindolo[2,3-c]carbazole, 1.2 equivalents of bromobenzene, 0.03 equivalents of bis dibenzylidene acetone palladium, 0.1 equivalents of tris butylphosphine, and 2 equivalents of sodium tertiarybutoxide were diluted in xylene with a 0.25 molar concentration of the starting materials. The reaction solution was heated and refluxed for 18 hours. Then, the reaction solution was concentrated. The concentrated residue was purified through silica gel column to obtain Intermediate E-4-1 (a yield of 54%).

Step 2: Synthesis of Intermediate E-4-2

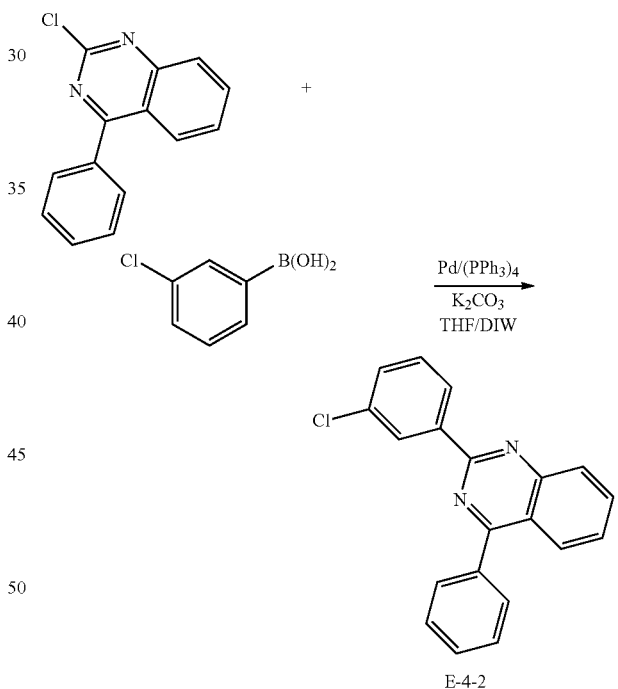

E-4-2

One equivalent of 2-chloro-4-phenyl quinazoline and 1.2 equivalents of 2-chloro phenyl boronic acid were dissolved in a mixed solution of tetra hydrofuran and distilled water (3:1) with a 0.25 molar concentration, 0.03 equivalents of tetrakis triphenyl phosphine and 2 equivalents of carbonate potassium were added thereto, and the mixture was heated and refluxed for 19 hours. The reaction solution was cooled down to separate layers, and an organic layer among them was gathered and concentrated. The concentrated residue was purified through silica gel column to obtain Intermediate E-4-2 (a yield of 88%).

Step 3: Synthesis of Compound E-4

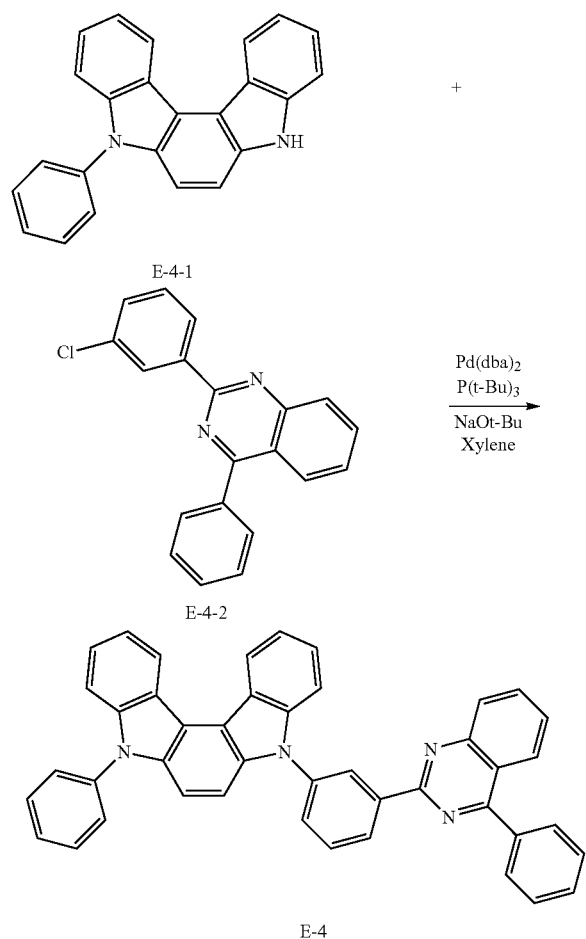

One equivalent of Intermediate E-4-1, 1.1 equivalents of Intermediate E-4-2, 0.03 equivalents of bisdibenzylidene acetone palladium, 0.1 equivalents of tris butylphosphine, and 2 equivalents of sodium tertiarybutoxide were diluted in xylene with a 0.25 molar concentration of the starting materials. The reaction solution was heated and refluxed for 19 hours. Then, the reaction solution was cooled down and then, concentrated. The concentrated residue was purified through silica gel column to obtain a product E-4 (a yield of 64%).

LC-Mass (theoretical value: 612.23 g/mol, measured value: M+1=613.22 g/mol)

Synthesis Example 9: Synthesis of Compound E-163

Step 1: Synthesis of Intermediate E-161

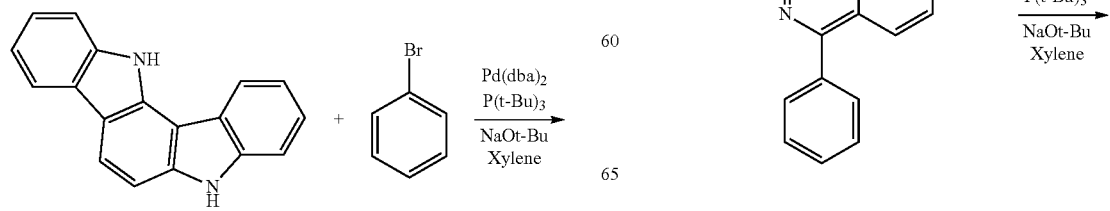

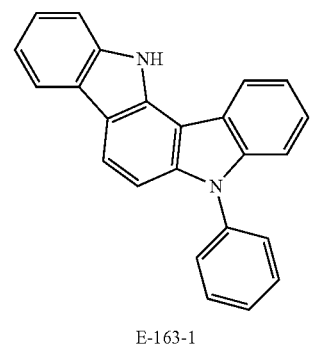

One equivalent of 5,12-dihydroindolo[3,2-a]carbazole, 1.2 equivalents of bromobenzene, 0.03 equivalents of bis dibenzylidene acetone palladium, 0.1 equivalents of tris butylphosphine, and 2 equivalents of sodium tertiarybutoxide were diluted in xylene with a 0.25 molar concentration of the starting materials. The reaction solution was heated and refluxed for 18 hours. Then, the reaction solution was cooled down and concentrated. The concentrated residue was purified through silica gel column to obtain Intermediate E-163-1 (a yield of 64%).

Step 2: Synthesis of Compound E-163

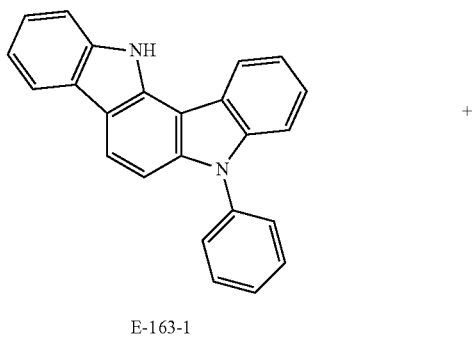

-continued

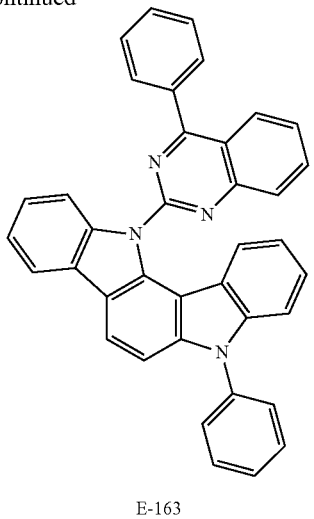

E-163

One equivalent of Intermediate E-163-1, 1.1 equivalents of 2-chloro-4-phenyl quinazoline, 0.03 equivalents of bis dibenzylidene acetone palladium, 0.1 equivalents of tris butylphosphine, and 2 equivalents of sodium tertiarybutoxide were diluted in xylene with a 0.25 molar concentration of the starting materials. The reaction solution was heated and refluxed for 19 hours. Then, the reaction solution was cooled down and concentrated. The concentrated residue was purified through silica gel column to obtain Compound E-163 (a yield of 56%).

LC-Mass (theoretical value: 536.20 g/mol, measured value: M+1=537.21 g/mol)

Manufacture of Organic Light Emitting Diode

Example 1

ITO (indium tin oxide) was coated to be 1500 Å thick on a glass substrate, and the coated glass was ultrasonic wave-washed with a distilled water. After washed with distilled water, the glass substrate was ultrasonic wave-washed with a solvent such as isopropyl alcohol, acetone, methanol, and the like and dried, moved to a plasma cleaner, cleaned with oxygen plasma for 10 minutes, and moved to a vacuum depositor. This obtained ITO transparent electrode was used as an anode, Compound A was vacuum-deposited on the ITO substrate to form a 700 Å-thick hole injection layer, Compound B was deposited to be 50 Å thick on the injection layer, and Compound C was deposited to be 1020 Å thick to form a hole transport layer. A 400 Å-thick light emitting layer was formed on the hole transport layer by vacuum-depositing Compound 225 and Compound D-31 simultaneously as a host and 5 wt % of tris(2-phenylpyridine)iridium (III) [Ir(piq)$_2$acac] as a dopant. Herein, Compound 225 and Compound D-31 were used in a 7:3 weight ratio, and in the following Examples, each ratio was described separately. Subsequently, Compound D and Liq were vacuum-deposited simultaneously in a 1:1 ratio on the light emitting layer to form a 300 Å-thick electron transport layer and a cathode was formed by sequentially vacuum-depositing Liq to be 15 Å thick and Al to be 1200 Å thick on the electron transport layer, manufacturing an organic light emitting diode.

The organic light emitting diode had a five-layered organic thin layer, and specifically a structure of ITO/Compound A (700 Å)/Compound B (50 Å)/Compound C (1020 Å)/EML [Compound 225:D-31:[Ir(piq)$_2$acac]=63 wt %:27 wt %:5 wt %] (400 Å)/Compound D:Liq (300 Å)/Liq (15 Å)/Al (1200 Å).

Compound A: N4,N4'-diphenyl-N4,N4'-bis(9-phenyl-9H-carbazol-3-yl)biphenyl-4,4'-diamine Compound B: 1,4,5,8,9,11-hexaazatriphenylene-hexacarbonitrile (HAT-CN), Compound C: N-(biphenyl-4-yl)-9,9-dimethyl-N-(4-(9-phenyl-9H-carbazol-3-yl)phenyl)-9H-fluoren-2-amine Compound D: 8-(4-(4,6-di(naphthalen-2-yl)-1,3,5-triazin-2-yl)phenyl)quinoline Examples 2 to 14

Each diode of Example 2 to Example 14 was manufactured according to the same method as Example 1 by respectively using the first hosts and the second hosts shown in Table 1.

Comparative Examples 1 and 2

Each diode of Comparative Examples 1 and 2 was manufactured according to the same method as Example 1 by respectively using the first hosts alone shown in Table 1.

Comparative Examples 3 to 5

Each diode of Comparative Examples 3 to 5 was manufactured according to the same method as Example 1 by respectively using the second hosts alone shown in Table 1.

EVALUATION

Luminous efficiency and driving voltages of each organic light emitting diode according to Examples 1 to 14 and Comparative Examples 1 to 5 were evaluated.

Specific measurement methods are as follows, and the results are shown in Table 1.

(1) Measurement of Current Density Change Depending on Voltage Change

Current values flowing in the unit device of the obtained organic light emitting diodes were measured, while increasing the voltage from 0 V to 10 V using a current-voltage meter (Keithley 2400), and the measured current values were divided by areas to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Luminous Efficiency

Current efficiency (cd/A) at the same current density (10 mA/cm$^2$) were calculated by using the luminance, current density, and voltages (V) from the items (1) and (2).

(4) Measurement of Driving Voltage

A driving voltage of each diode was measured using a current-voltage meter (Keithley 2400) at 15 mA/cm$^2$.

TABLE 1

| Examples | First host | Second host | First host:Second host (wt/wt) | Color | Driving voltage (V) | Luminous efficiency (cd/A) |
|---|---|---|---|---|---|---|
| Example 1 | 225 | D-31 | 7:3 | red | 3.97 | 21.9 |
| Example 2 | 227 | D-99 | 7:3 | red | 3.95 | 20.1 |

TABLE 1-continued

| Examples | First host | Second host | First host:Second host (wt/wt) | Color | Driving voltage (V) | Luminous efficiency (cd/A) |
|---|---|---|---|---|---|---|
| Example 3 | 241 | D-1 | 7:3 | red | 3.96 | 19.4 |
| Example 4 | 237 | D-31 | 7:3 | red | 4.11 | 19.8 |
| Example 5 | 221 | D-1 | 7:3 | red | 4.03 | 20.1 |
| Example 6 | 264 | D-99 | 7:3 | red | 3.98 | 21.0 |
| Example 7 | 265 | D-31 | 7:3 | red | 3.99 | 20.3 |
| Example 8 | 225 | E-163 | 7:3 | red | 3.91 | 21.7 |
| Example 9 | 227 | E-4 | 7:3 | red | 3.87 | 20.8 |
| Example 10 | 241 | E-163 | 7:3 | red | 3.98 | 20.1 |
| Example 11 | 237 | E-4 | 7:3 | red | 3.87 | 21.1 |
| Example 12 | 221 | E-163 | 7:3 | red | 3.85 | 19.8 |
| Example 13 | 264 | E-163 | 7:3 | red | 3.99 | 21.5 |
| Example 14 | 265 | E-4 | 7:3 | red | 3.89 | 20.4 |
| Comparative Example 1 | 225 | — | — | red | 4.97 | 17.8 |
| Comparative Example 2 | 227 | — | — | red | 4.87 | 16.1 |
| Comparative Example 3 | — | D-31 | — | red | 5.06 | 11.0 |
| Comparative Example 4 | — | E-4 | — | red | 5.97 | 10.2 |
| Comparative Example 5 | — | E-163 | — | red | 5.87 | 11.3 |

*Life-spans of diodes having luminance of 6000 cd/m² or less was unmeasurable.

Referring to Table 1, it was confirmed that the organic light emitting diodes using a combination of the first hosts and the second hosts exhibited a lower driving voltage and higher efficiency than the organic light emitting diodes using each of the first hosts or the second hosts alone.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present disclosure in any way.

DESCRIPTION OF SYMBOLS 100, 200: organic light emitting diode
105: organic layer
110: cathode
120: anode
130: light emitting layer

What is claimed is:

1. A composition for an organic optoelectric device, comprising:
at least one first compound for an organic optoelectric device represented by Chemical Formula 1; and
at least one second compound for an organic optoelectric device including a carbazole moiety represented by Chemical Formula 2:

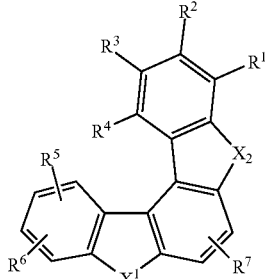

[Chemical Formula 1]

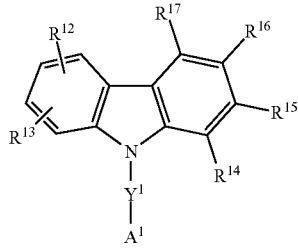

[Chemical Formula 2]

wherein, in Chemical Formula 1,
$X^1$ and $X^2$ are independently N-$L^a$-$R^a$, O, or S,
at least one of $X^1$ and $X^2$ is N-$L^a$-$R^a$,
$R^a$ is independently a substituted or unsubstituted C6 to C30 aryl group, or a substituted or unsubstituted C2 to C30 heterocyclic group,
at least one of $R^a$ is a substituted or unsubstituted N-containing C2 to C30 heterocyclic group except a carbazolyl group,
$R^1$ to $R^7$ are independently hydrogen, deuterium, a substituted or unsubstituted C1 to C20 alkyl group, a substituted or unsubstituted C6 to C30 aryl group, or a substituted or unsubstituted C2 to C30 heterocyclic group,
adjacent groups of $R^1$ to $R^4$ are linked with each other to form at least one of a substituted or unsubstituted aliphatic, aromatic, or heteroaromatic monocyclic ring or a substituted or unsubstituted aliphatic, aromatic, or heteroaromatic polycyclic ring, and
$L^a$ is independently a single bond, a substituted or unsubstituted C6 to C30 arylene group, or a substituted or unsubstituted C2 to C30 heteroarylene group;
wherein, in Chemical Formula 2,
$Y^1$ is a single bond, a substituted or unsubstituted C6 to C30 arylene group, or a substituted or unsubstituted C2 to C30 heteroarylene group,
$A^1$ is a substituted or unsubstituted C6 to C30 aryl group, or a substituted or unsubstituted C2 to C30 heterocyclic group,
$R^{12}$ to $R^{17}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and
$R^{14}$ to $R^{17}$ are independently present or adjacent groups of $R^{14}$ to $R^{17}$ are linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring;

wherein "substituted" refers to replacement of at least one hydrogen by deuterium, a C1 to C20 alkyl group, a C6 to C30 aryl group, or a C2 to C30 heteroaryl group.

2. The composition as claimed in claim 1, wherein $R^1$ and $R^2$ of Chemical Formula 1 are linked with each other; $R^3$ and $R^4$ are linked with each other; or $R^1$ and $R^2$ are linked with each other and $R^3$ and $R^4$ are linked with each other to form at least one of a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring.

3. The composition as claimed in claim 1, wherein Chemical Formula 1 is represented by one of Chemical Formula 1A to Chemical Formula 1C:

[Chemical Formula 1A]

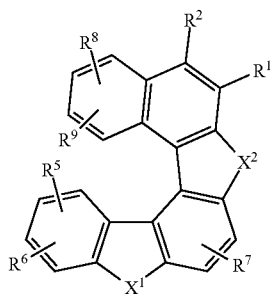

[Chemical Formula 1B]

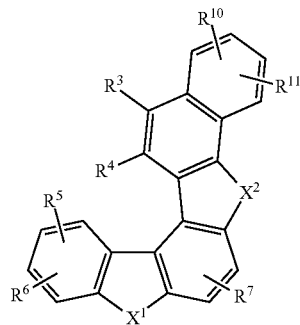

[Chemical Formula 1C]

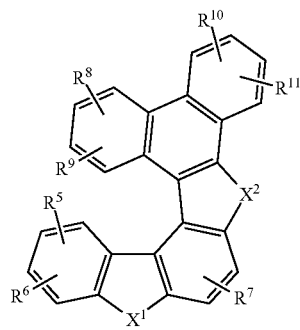

wherein, in Chemical Formula 1A to Chemical Formula 1C, $X^1$ and $X^2$ are independently N-$L^a$-$R^a$, O, or S, at least one of $X^1$ and $X^2$ is N-$L^a$-$R^a$, $R^a$ is independently a substituted or unsubstituted C6 to C30 aryl group, or a substituted or unsubstituted C2 to C30 heterocyclic group, at least one of $R^a$ is a substituted or unsubstituted N-containing C2 to C30 heterocyclic group except a carbazolyl group, $R^1$ to $R^{11}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and $L^a$ is independently a single bond, a substituted or unsubstituted C6 to C30 arylene group, or a substituted or unsubstituted C2 to C30 heteroarylene group.

4. The composition as claimed in claim 1, wherein:

at least one of $R^a$ of Chemical Formula 1 is a substituted or unsubstituted N-containing C2 to C30 heterocyclic group except a carbazolyl group, and the substituted or unsubstituted N-containing C2 to C30 heterocyclic group except the carbazolyl group is a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group.

5. The composition as claimed in claim 1, wherein:

at least one of $R^a$ of Chemical Formula 1 is a substituted or unsubstituted N-containing C2 to C30 heterocyclic group except a carbazolyl group, and the substituted or unsubstituted N-containing C2 to C30 heterocyclic group except the carbazolyl group is selected from substituents of Group I:

[Group I]

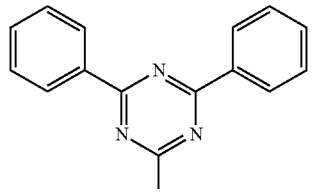

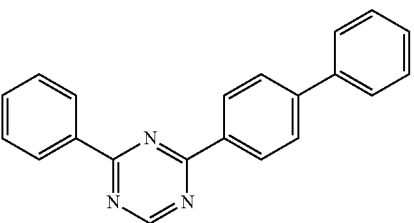

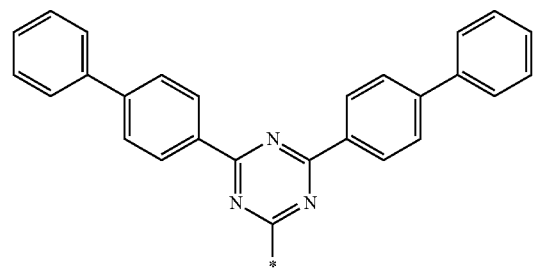

291
-continued
292
-continued
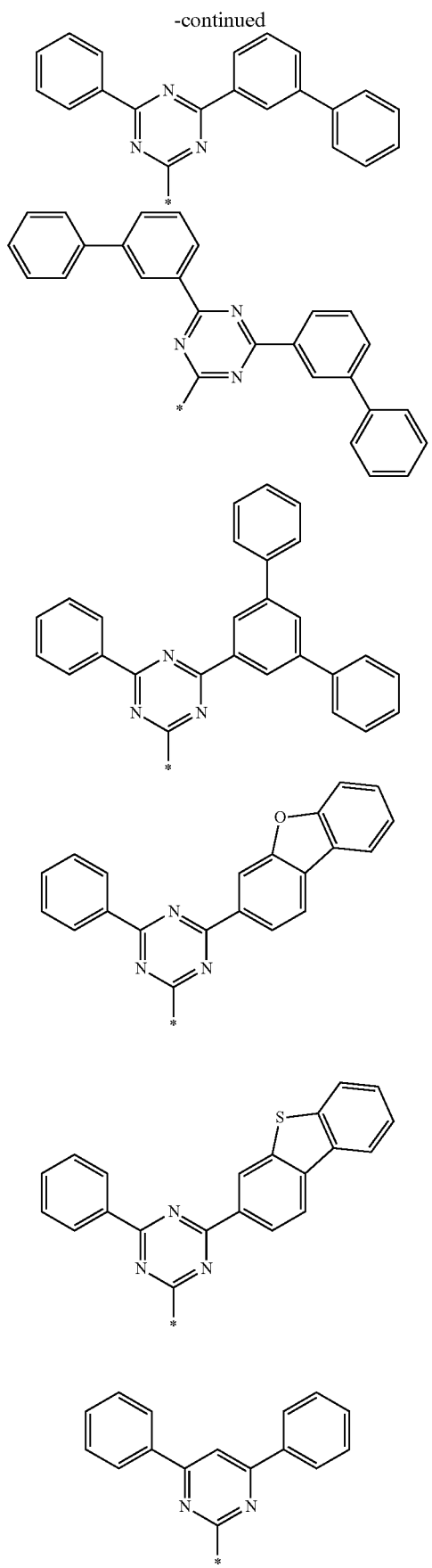
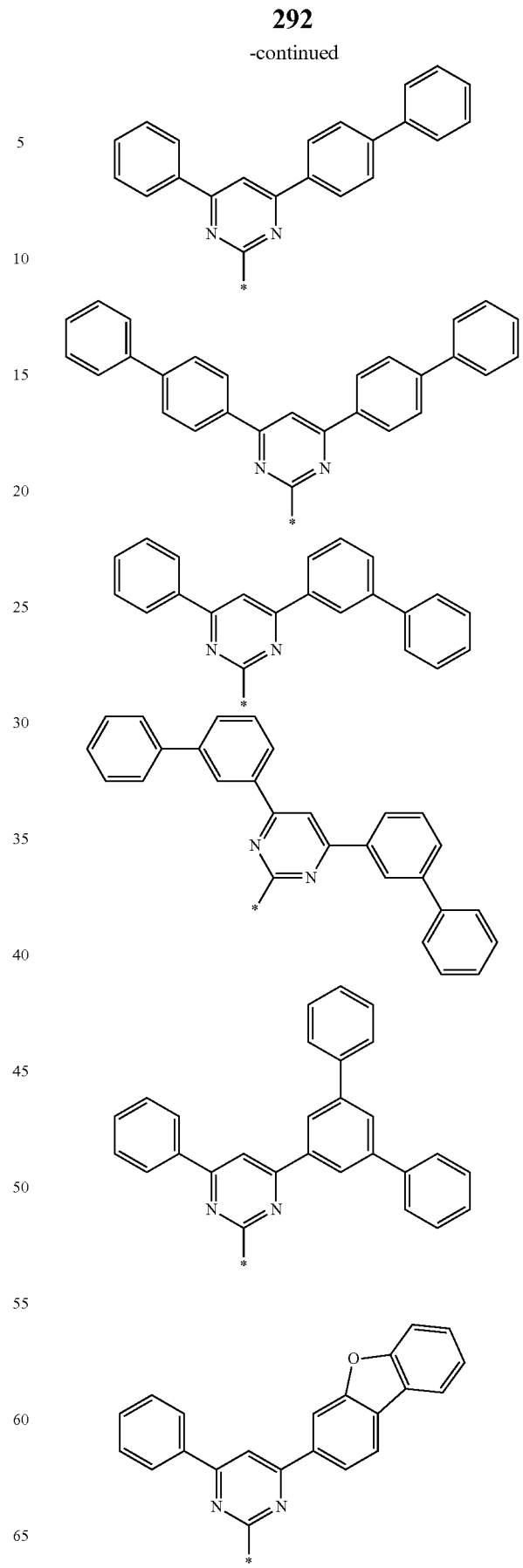

293
-continued
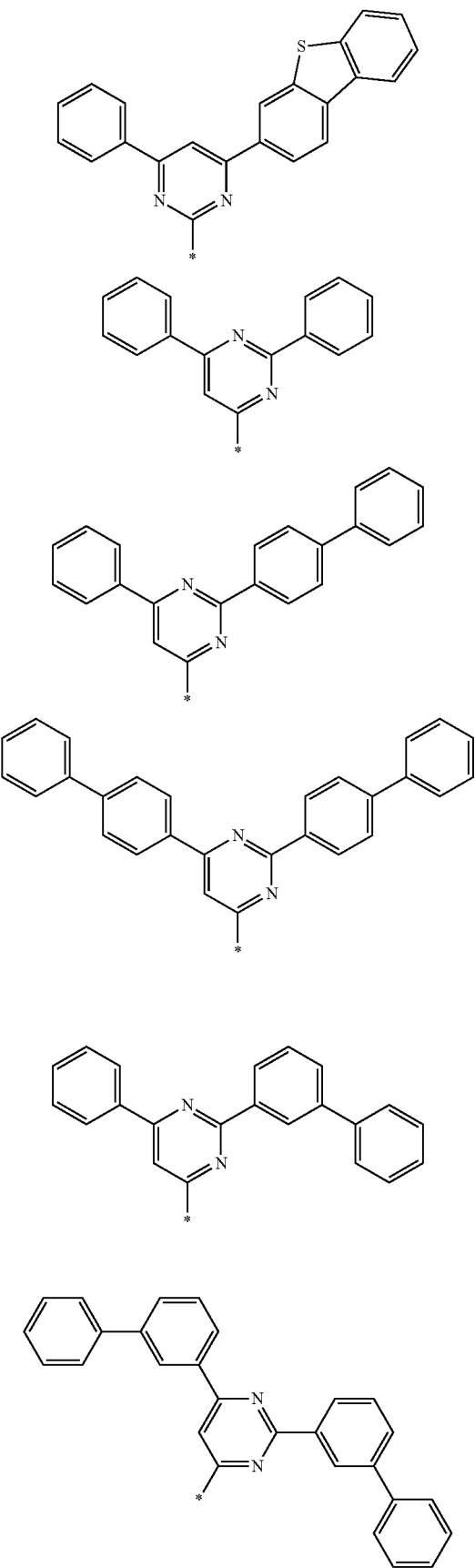
294
-continued
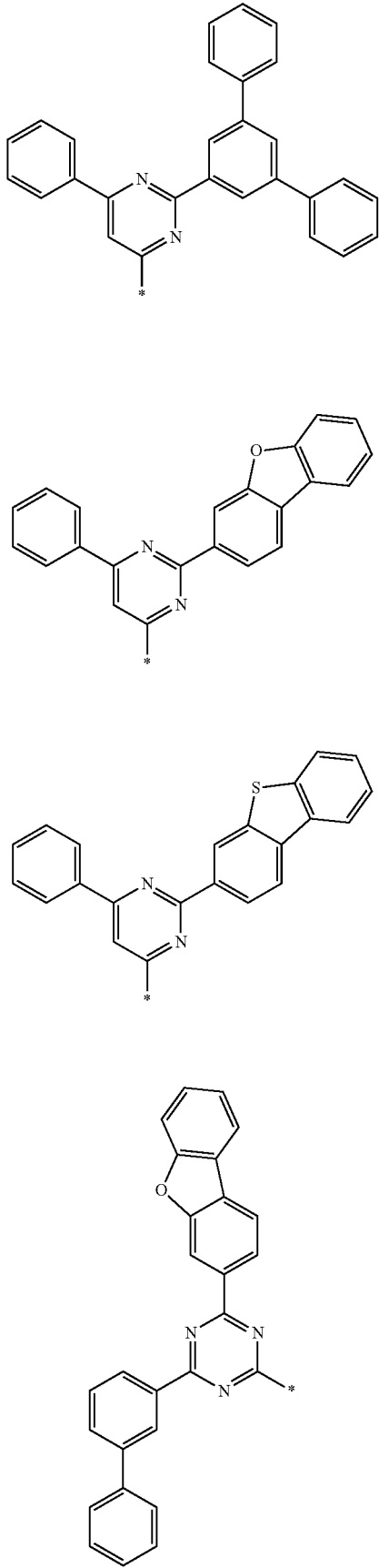

295
-continued
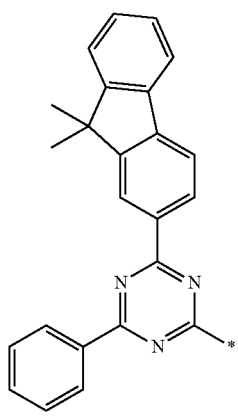
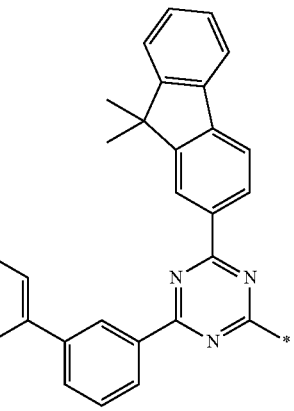
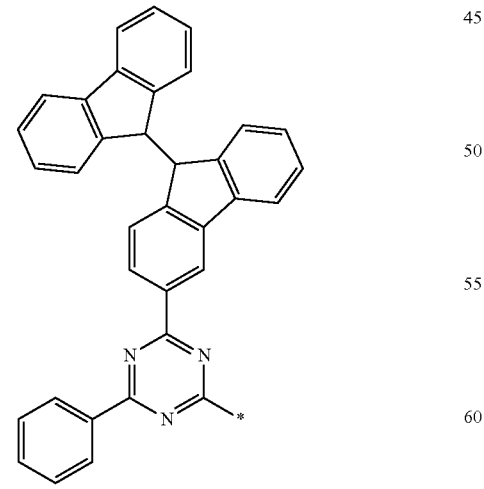
296
-continued
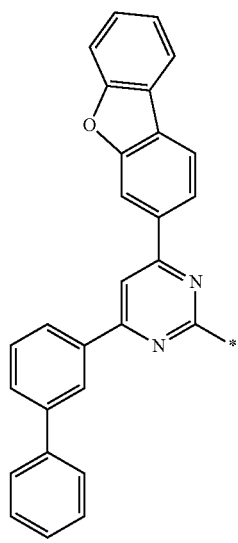
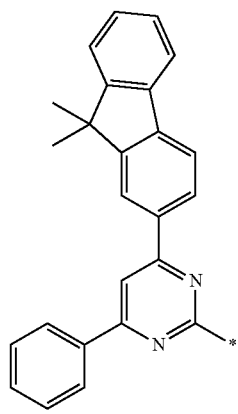
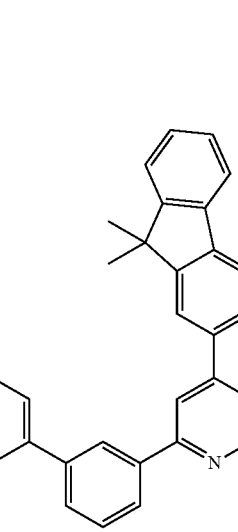

297
-continued
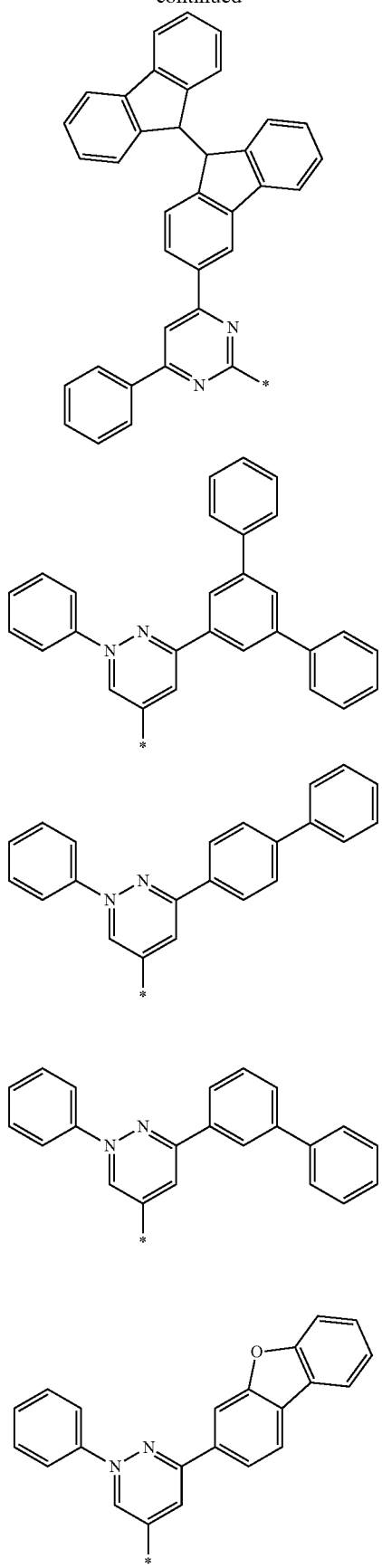
298
-continued
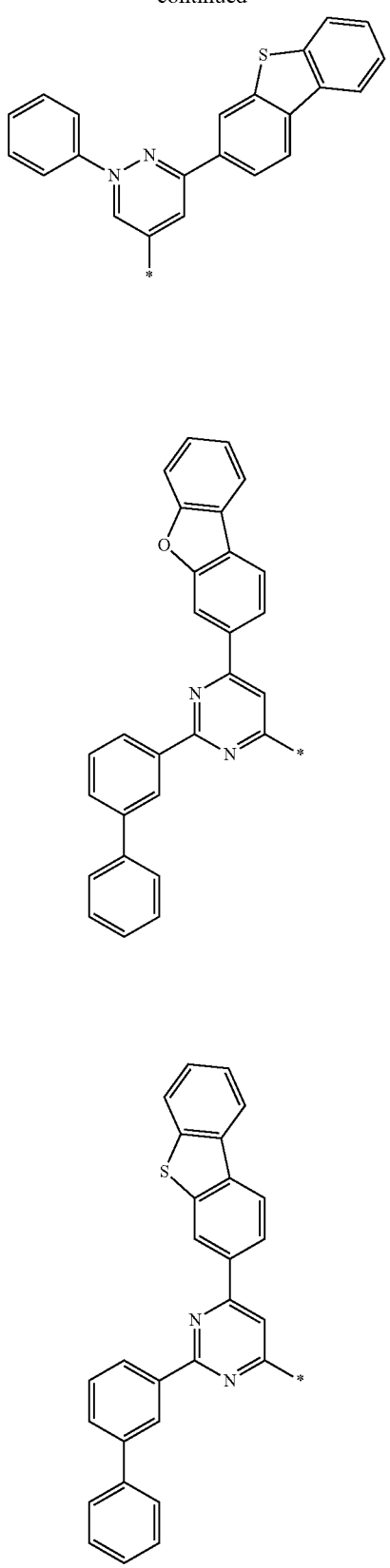

299
-continued
300
-continued
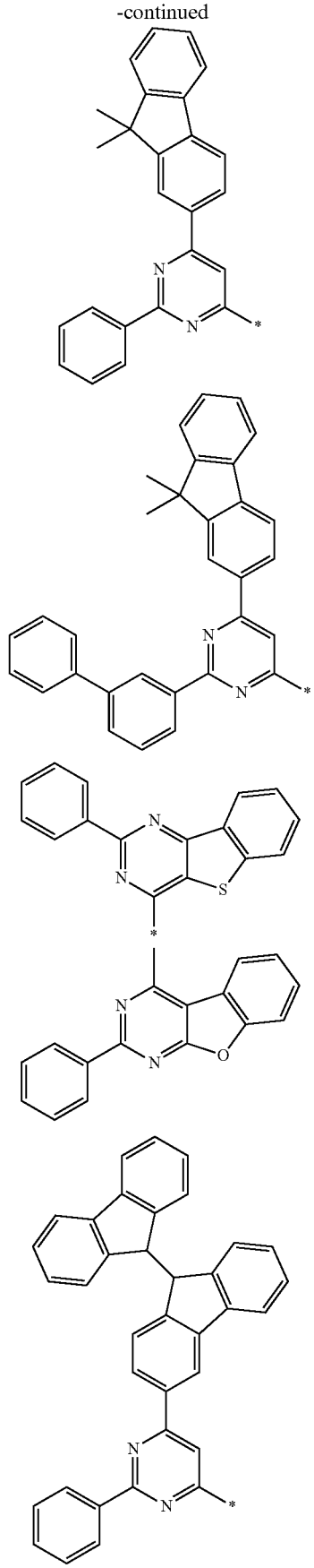
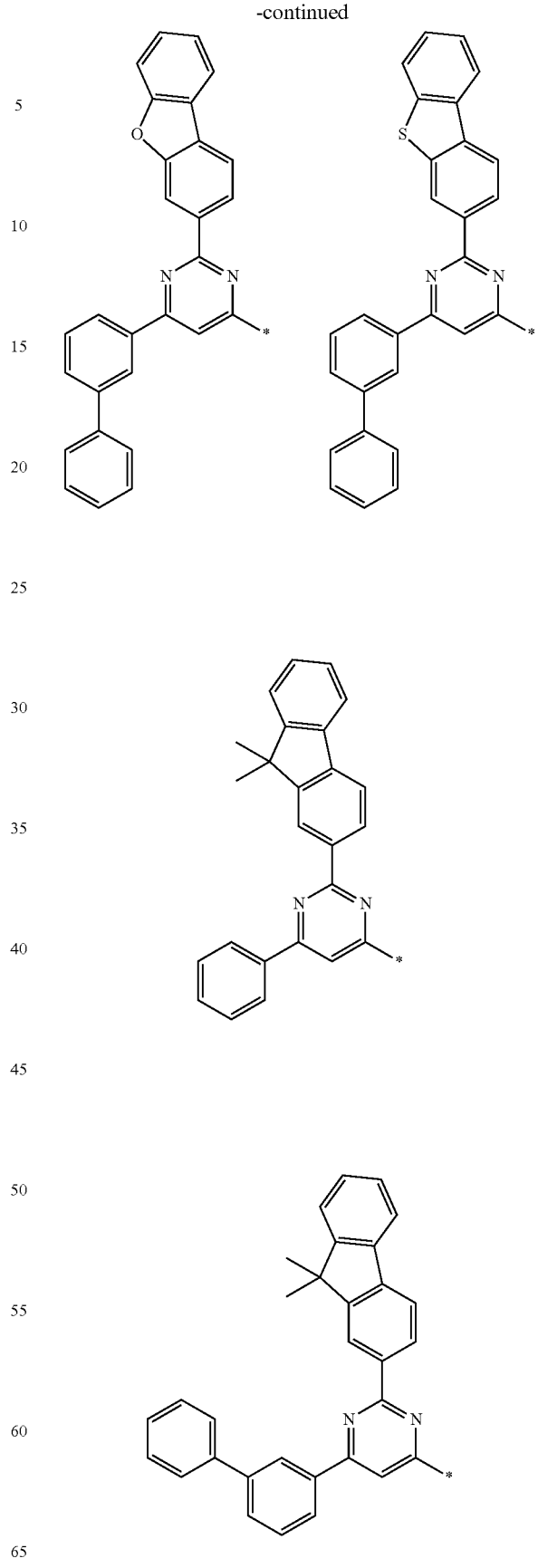

301
-continued
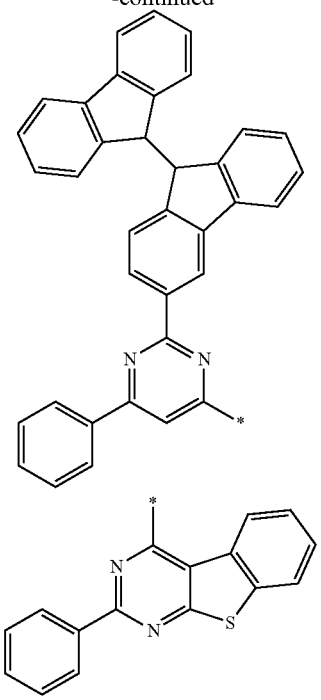
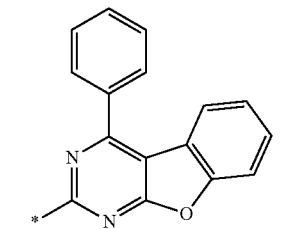
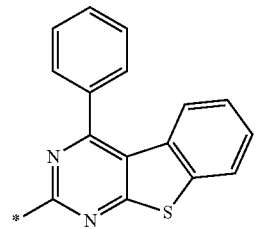
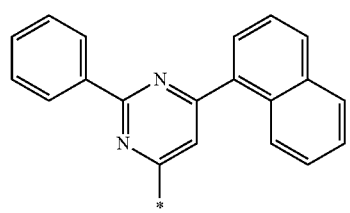
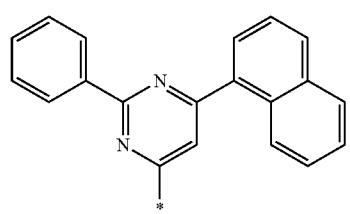
302
-continued
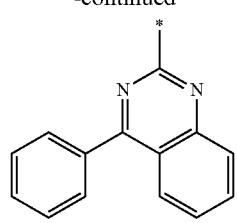
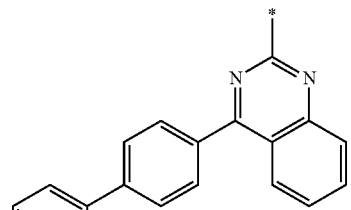
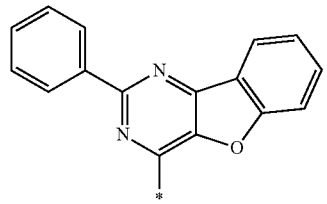
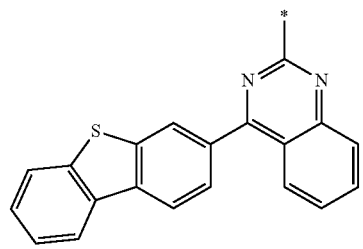
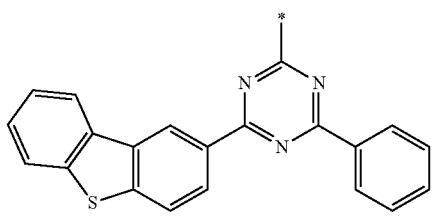
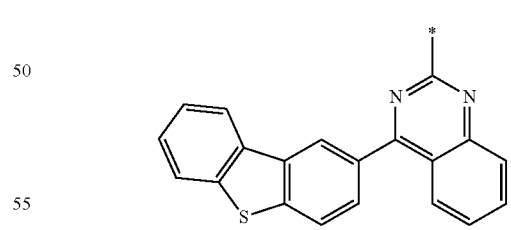
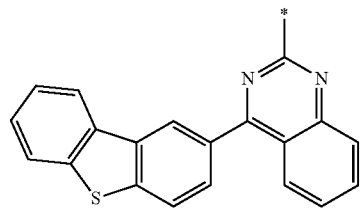

303
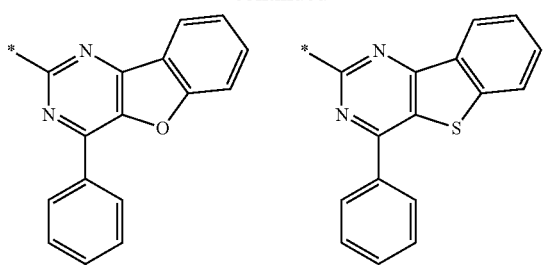
304
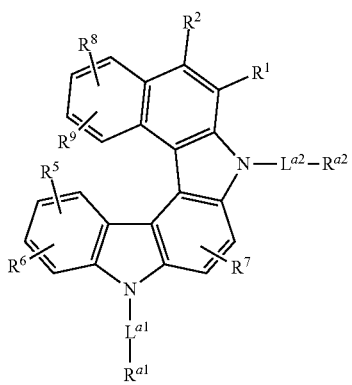
wherein, in Group I,
* is a linking point.
6. The composition as claimed in claim 1, wherein Chemical Formula 1 is represented by one of Chemical Formula 1A-I, Chemical Formula 1B-I and Chemical Formula 1C-I:
[Chemical Formula 1A-I]

[Chemical Formula 1B-I]

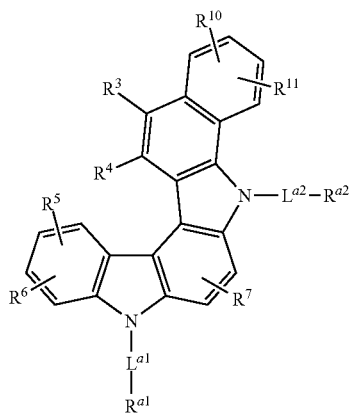

[Chemical Formula 1C-I]

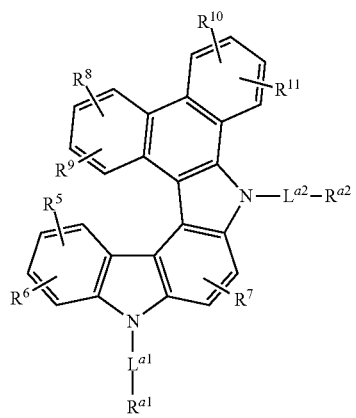

wherein, in Chemical Formula 1A-I, Chemical Formula 1B-I and Chemical Formula 1C-I, $R^{a1}$ and $R^{a2}$ are independently a substituted or unsubstituted C6 to C30 aryl group, a substituted or unsubstituted pyridinyl group, a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, one of $R^{a1}$ and $R^{a2}$ is a substituted or unsubstituted pyridinyl group, a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, $R^1$ to $R^{11}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and $L^{a1}$ and $L^{a2}$ are independently a single bond, a substituted or unsubstituted C6 to C30 arylene group, or a substituted or unsubstituted C2 to C30 heteroarylene group.

7. The composition as claimed in claim 1, wherein Chemical Formula 1 is represented by one of Chemical Formula 1A-II, Chemical Formula 1A-III, Chemical Formula 1A-IV, Chemical Formula 1A-V, Chemical Formula 1B-II, Chemical Formula 1B-III, Chemical Formula 1B-IV, Chemical Formula 1B-V, Chemical Formula 1C-II, Chemical Formula 1C-III, Chemical Formula 1C-IV, and Chemical Formula 1C-V:

[Chemical Formula 1A-II]

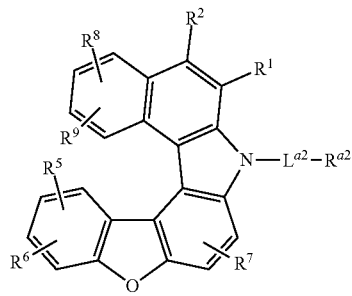

[Chemical Formula 1A-III]

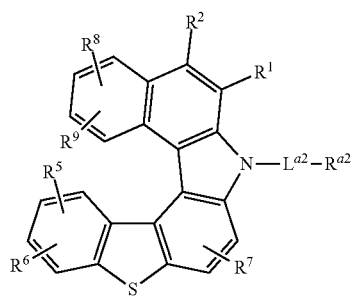

[Chemical Formula 1A-IV]

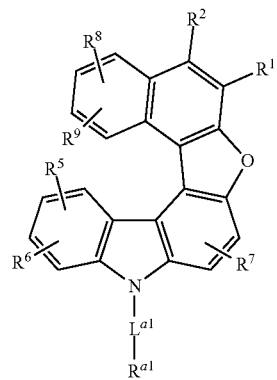

[Chemical Formula 1A-V]

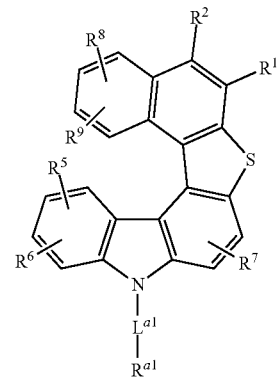

[Chemical Formula 1B-II]
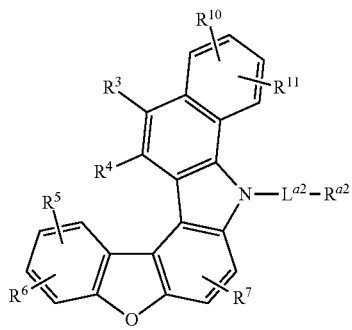
[Chemical Formula 1B-III]
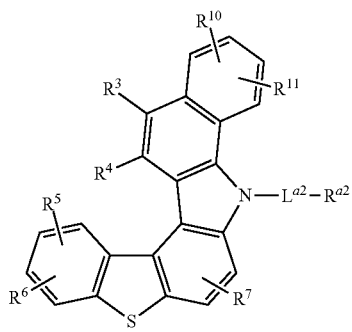
[Chemical Formula 1B-IV]
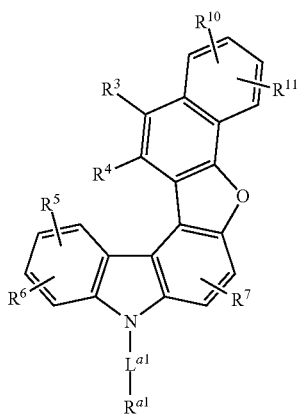
[Chemical Formula 1B-V]
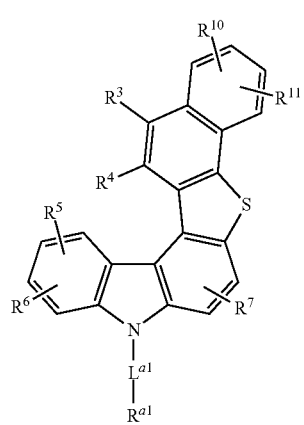
[Chemical Formula 1C-II]
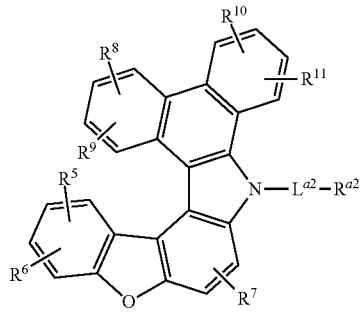
[Chemical Formula 1C-III]
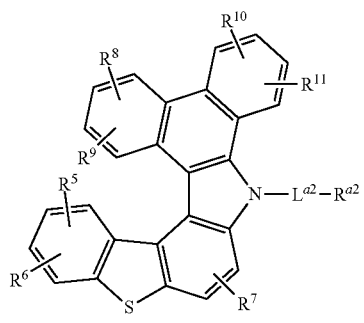
[Chemical Formula 1C-IV]
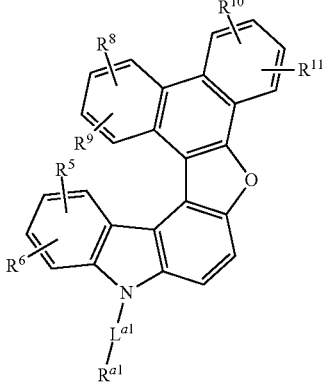
[Chemical Formula 1C-V]
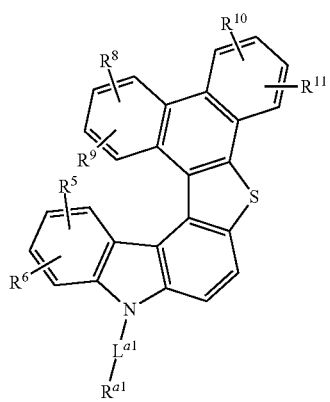
wherein, in Chemical Formula 1A-II, Chemical Formula 1A-III, Chemical Formula 1A-IV, Chemical Formula 1A-V, Chemical Formula 1B-II, Chemical Formula 1B-III, Chemical Formula 1B-IV, Chemical Formula 1B-V, Chemical Formula 1C-II, Chemical Formula 1C-III, Chemical Formula 1C-IV, and Chemical Formula 1C-V, $R^{a1}$ and $R^{a2}$ are independently a substituted or unsubstituted pyridinyl group, a substituted or unsubstituted pyrimidinyl group, a substituted or unsubstituted triazinyl group, a substituted or unsubstituted quinazolinyl group, a substituted or unsubstituted benzofuranpyrimidinyl group, or a substituted or unsubstituted benzothiophenepyrimidinyl group, $R^1$ to $R^{11}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and $L^{a1}$ and $L^{a2}$ are independently a single bond, a substituted or unsubstituted C6 to C30 arylene group, or a substituted or unsubstituted C2 to C30 heteroarylene group.

8. The composition as claimed in claim 1, wherein Chemical Formula 2 is represented by Chemical Formula 2A, Chemical Formula 2B, or Chemical Formula 2C:

[Chemical Formula 2A]

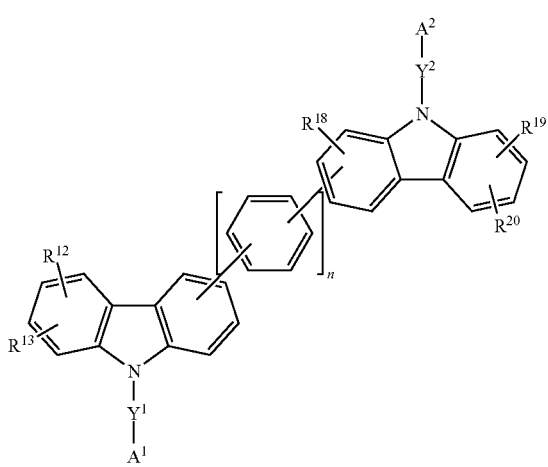

[Chemical Formula 2B]

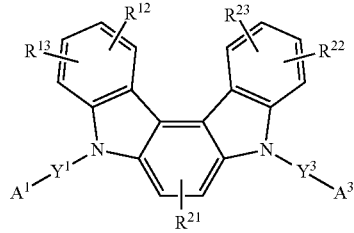

[Chemical Formula 2C]

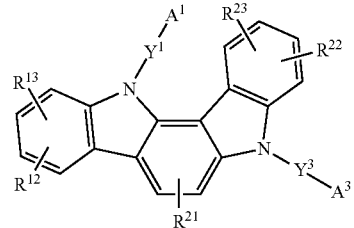

wherein, in Chemical Formula 2A, Chemical Formula 2B, and Chemical Formula 2C, $Y^1$ to $Y^3$ are independently a single bond, a substituted or unsubstituted C6 to C30 arylene group, or a substituted or unsubstituted C2 to C30 heteroarylene group, $A^1$ to $A^3$ are independently a substituted or unsubstituted C6 to C30 aryl group, or a substituted or unsubstituted C2 to C30 heterocyclic group, $R^{12}$, $R^{13}$, and $R^{18}$ to $R^{23}$ are independently hydrogen, deuterium, a substituted or unsubstituted C1 to C20 alkyl group, a substituted or unsubstituted C6 to C30 aryl group, or a substituted or unsubstituted C2 to C30 heterocyclic group, and n is one of integers of 0 to 2.

9. The composition as claimed in claim 8, wherein $A^1$ and $A^2$ of Chemical Formula 2A are independently a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted pyridinyl group, a substituted or unsubstituted pyrimidinyl group, a substituted or unsubstituted dibenzofuranyl group, a substituted or unsubstituted dibenzothiophenyl group, a substituted or unsubstituted carbazolyl group, or a substituted or unsubstituted fluorenyl group.

10. The composition as claimed in claim 8, wherein:

Chemical Formula 2A is one of structures of Group II, and

*—$Y^1$-$A^1$ and *—$Y^2$-$A^2$ are one of substituents of Group III,

[Group II]

C-1

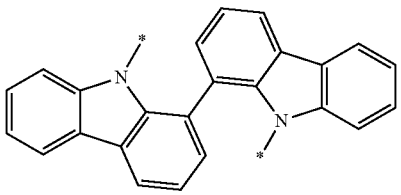

C-2

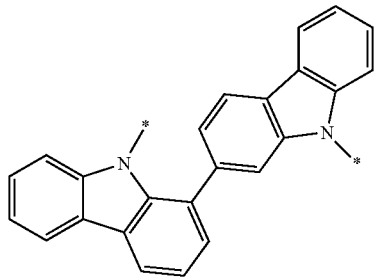

C-3

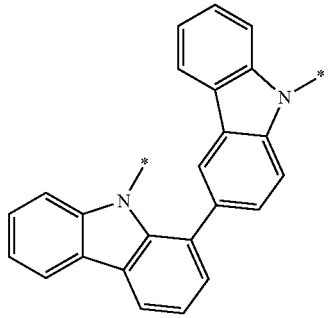

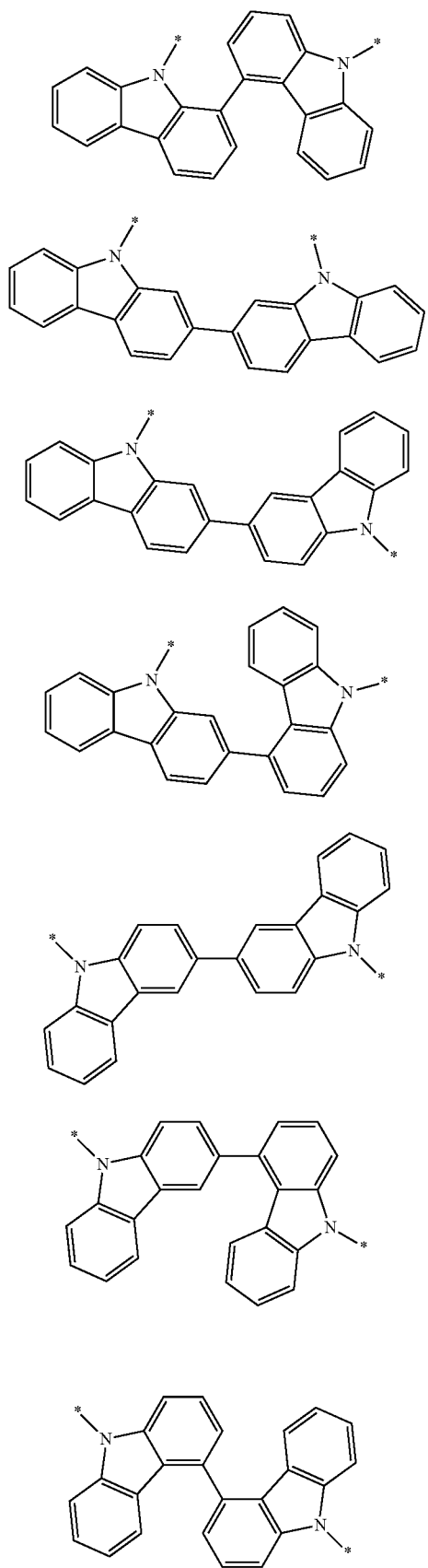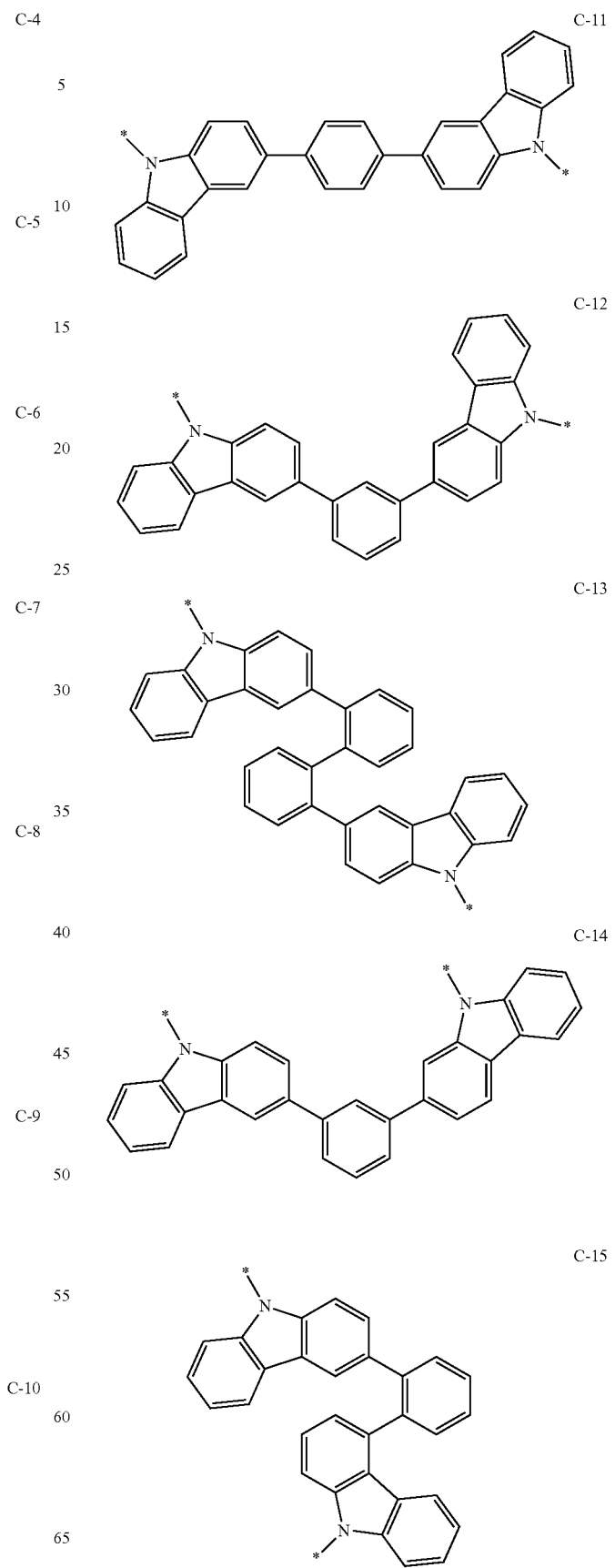

313 -continued
C-16
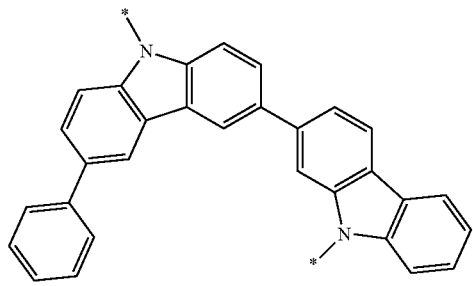
C-17
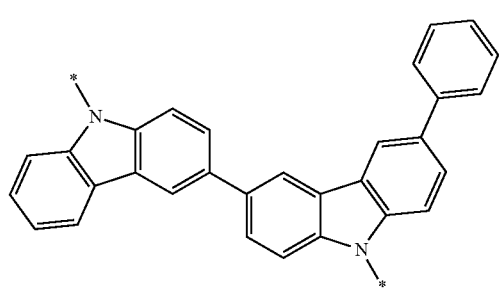
C-18
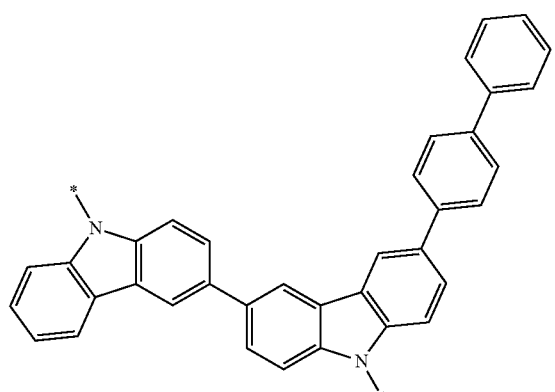
[Group III]
B-1
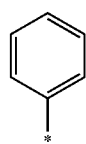
B-2
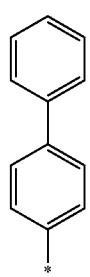
314 -continued
B-3
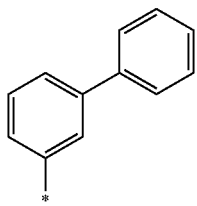
B-4
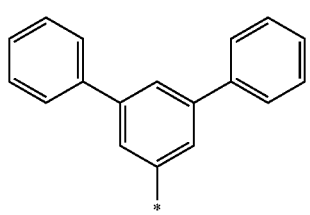
B-5
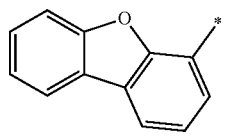
B-6
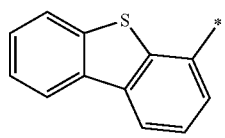
B-7
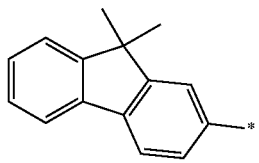
B-8
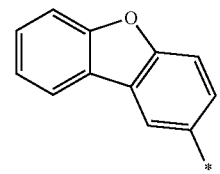
B-9
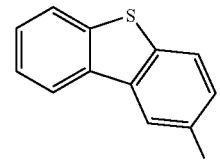
B-10
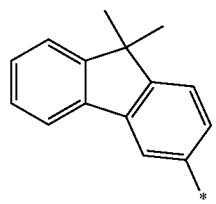

B-11 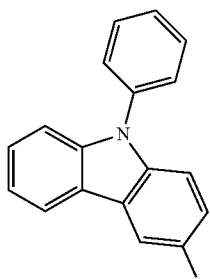
B-12 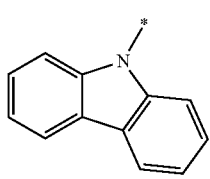
B-13 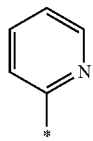
B-14 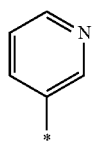
B-15 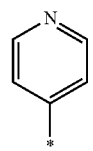
B-16 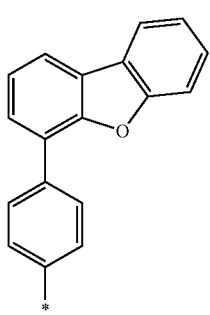
B-17 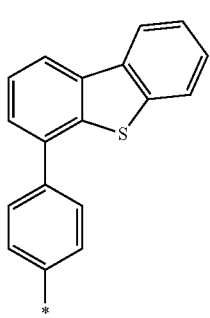
B-18 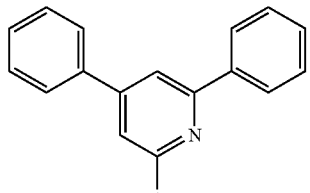
B-19 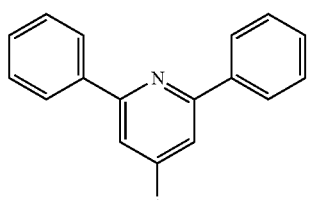
B-20 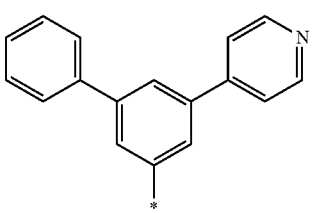
B-21 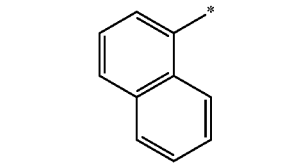
B-22 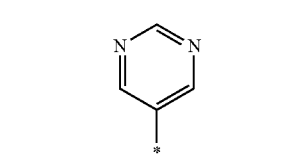
B-23 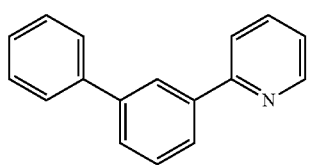
B-24 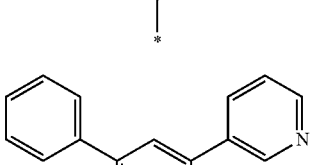
B-25 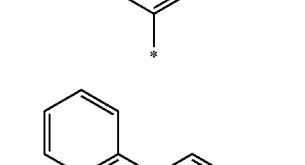

317
-continued

B-26
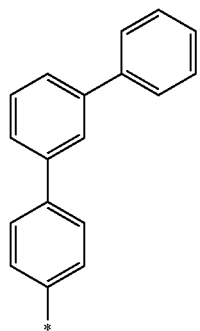

B-27
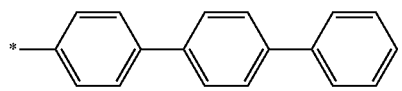

B-28
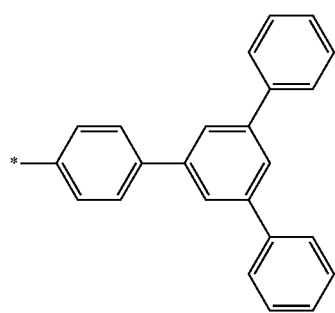

wherein, in Groups II and III, * is a linking point.

11. The composition as claimed in claim 8, wherein at least one of $A^1$ and $A^3$ of Chemical Formula 2B and Chemical Formula 2C is a substituted or unsubstituted N-containing C2 to C30 heterocyclic group except a carbazolyl group.

12. The composition as claimed in claim 1, wherein:
the first compound for an organic optoelectric device is represented by Chemical Formula 1C-I or Chemical Formula 1C-III, and
the second compound for an organic optoelectric device is represented by Chemical Formula 2A-a, Chemical Formula 2B, or Chemical Formula 2C:

[Chemical Formula 1C-I]
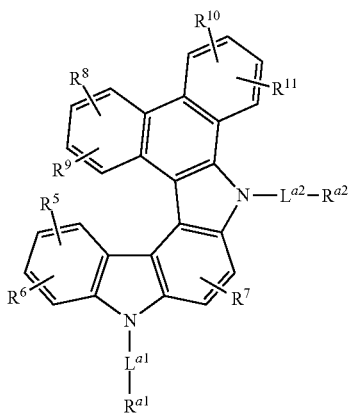

318
-continued

[Chemical Formula 1C-II]
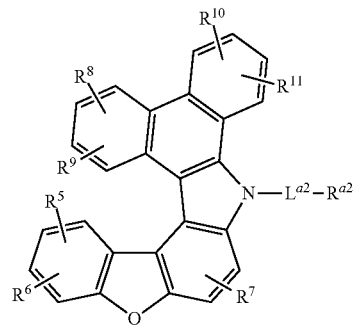

[Chemical Formula 1C-III]
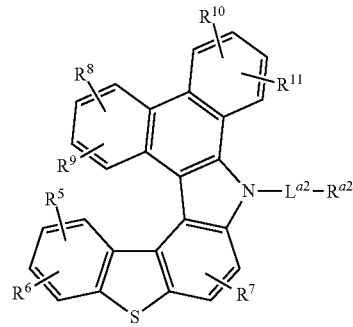

wherein, in Chemical Formula 1C-I, Chemical Formula 1C-II, and Chemical Formula 1C-III, $R^{a1}$ and $R^{a2}$ are independently a substituted or unsubstituted phenyl group, a substituted or unsubstituted biphenyl group, a substituted or unsubstituted pyrimidinyl group, a substituted or unsubstituted triazinyl group, or a substituted or unsubstituted quinazolinyl group, $R^5$ to $R^{11}$ are independently hydrogen, deuterium, a substituted or unsubstituted C1 to C4 alkyl group, or a substituted or unsubstituted C6 to C12 aryl group, and $L^{a1}$ and $L^{a2}$ are independently a single bond, or a substituted or unsubstituted C6 to C30 arylene group;

[Chemical Formula 2A-a]
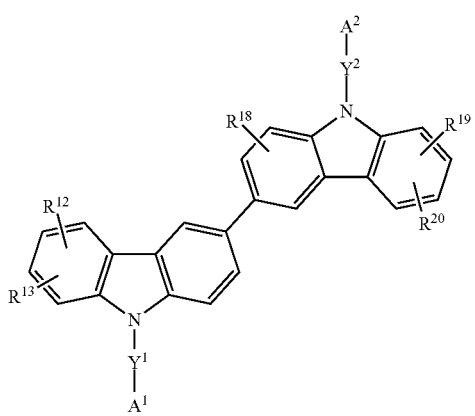

[Chemical Formula 2B]

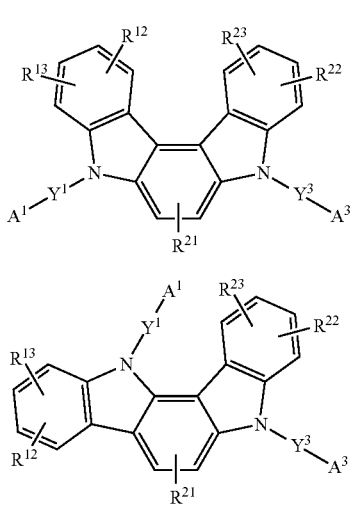

[Chemical Formula 2C]

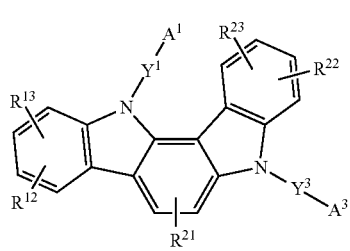

wherein, in Chemical Formula 2A-a, Chemical Formula 2B, and Chemical Formula 2C, $Y^1$ to $Y^3$ are independently a single bond, or a substituted or unsubstituted C6 to C30 arylene group, $A^1$ and $A^2$ of Chemical Formula 2A-a are independently a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted pyridinyl group, a substituted or unsubstituted dibenzofuranyl group, a substituted or unsubstituted dibenzothiophenyl group, a substituted or unsubstituted carbazolyl group, or a substituted or unsubstituted fluorenyl group, $A^1$ and $A^3$ of Chemical Formula 2B and Chemical Formula 2C are independently a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted triphenylene group, a substituted or unsubstituted phenanthrenyl group, a substituted or unsubstituted fluorenyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group, and one of $A^1$ and $A^3$ of Chemical Formula 2B and Chemical Formula 2C is a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted quinolinyl group, a substituted or unsubstituted isoquinolinyl group, a substituted or unsubstituted quinazolinyl group, a substituted or unsubstituted benzofuranpyrimidinyl group, or a substituted or unsubstituted benzothiophenepyrimidinyl group.

13. An organic optoelectric device, comprising
an anode and a cathode facing each other, and
at least one organic layer interposed between the anode and the cathode,
wherein the composition for an organic optoelectric device as claimed in claim 1.

14. The organic optoelectric device as claimed in claim 13, wherein
the organic layer includes a light emitting layer, and
the composition for an organic optoelectric device is included as a host of the light emitting layer.

15. A display device comprising the organic optoelectric device as claimed in claim 13.

* * * * *